(12) United States Patent
Shiraishi

(10) Patent No.: US 6,897,942 B2
(45) Date of Patent: May 24, 2005

(54) PROJECTION EXPOSURE APPARATUS AND METHOD

(75) Inventor: Naomasa Shiraishi, Saitama (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/759,603

(22) Filed: Jan. 20, 2004

(65) Prior Publication Data

US 2004/0233411 A1 Nov. 25, 2004

Related U.S. Application Data

(62) Division of application No. 10/202,007, filed on Jul. 25, 2002, now Pat. No. 6,710,855, which is a continuation-in-part of application No. 08/376,676, filed on Jan. 20, 1995, which is a continuation of application No. 08/122,318, filed on Sep. 17, 1993, now abandoned, which is a continuation of application No. 07/791,138, filed on Nov. 13, 1991, now abandoned, said application No. 08/376,676, filed on Jan. 20, 1995, is a continuation-in-part of application No. 08/257,956, filed on Jun. 10, 1994, now Pat. No. 5,638,211, which is a continuation of application No. 08/101,674, filed on Aug. 4, 1993, now abandoned, which is a continuation of application No. 07/847,030, filed on Apr. 15, 1992, now abandoned, said application No. 10/202,007, filed on Jul. 25, 2002, is a continuation-in-part of application No. 10/124,362, filed on Apr. 18, 2002, which is a division of application No. 09/246,853, filed on Feb. 9, 1999, now Pat. No. 6,392,740, which is a division of application No. 08/940,198, filed on Sep. 29, 1997, now abandoned, which is a division of application No. 08/549,325, filed on Oct. 27, 1995, now Pat. No. 5,719,704, which is a continuation of application No. 08/371,895, filed on Jan. 12, 1995, now abandoned, which is a continuation of application No. 07/942,193, filed on Sep. 9, 1992, now abandoned.

(30) Foreign Application Priority Data

| Nov. 15, 1990 | (JP) | 2-309458 |
|---|---|---|
| Nov. 15, 1990 | (JP) | 2-309459 |
| Dec. 27, 1990 | (JP) | 2-408093 |
| Dec. 27, 1990 | (JP) | 2-408094 |
| Dec. 27, 1990 | (JP) | 2-408095 |
| Dec. 27, 1990 | (JP) | 2-408096 |
| Sep. 11, 1991 | (JP) | 3-231531 |
| Oct. 4, 1991 | (JP) | 3-258049 |
| Oct. 4, 1991 | (JP) | 3-258050 |
| Jan. 31, 1992 | (JP) | 4-016590 |

(51) Int. Cl.$^7$ .............. G03B 27/54; G03B 27/42; G03B 27/72
(52) U.S. Cl. .............. 355/67; 355/53; 355/71; 359/558
(58) Field of Search .............. 355/53, 67, 71; 359/558, 618, 619, 621, 622; 362/268

(56) References Cited

U.S. PATENT DOCUMENTS 3,492,635 A 1/1970 Farr .............. 340/15.5

(Continued)

FOREIGN PATENT DOCUMENTS

EP 0 282 593 9/1988

(Continued)

OTHER PUBLICATIONS

"Extended Focal Depth Optical Microlithography", IBM Technical Disclosure Bulletin, vol. 32, Jun. 1989, pp. 125–127.

(Continued)

*Primary Examiner*—Alan Mathews
(74) *Attorney, Agent, or Firm*—Miles & Stockbridge P.C.

(57) ABSTRACT

An exposure apparatus and method to expose an object with an illumination beam irradiated on a mask from a light source disposes an optical unit between the light source and an optical integrator of an illumination optical system to illuminate the mask with an illumination beam, of which an intensity distribution on a Fourier transform plane with respect to a pattern on the mask has an increased intensity portion apart from the optical axis relative to a portion of the intensity distribution on the optical axis.

18 Claims, 46 Drawing Sheets

U.S. PATENT DOCUMENTS

| | | | |
|---|---|---|---|
| 3,630,598 A | 12/1971 | Little, Jr. | 350/157 |
| 3,639,039 A | 2/1972 | Rhodes, Jr. | 350/162 |
| 3,658,420 A | 4/1972 | Axelrod | 356/71 |
| 3,729,252 A | 4/1973 | Nelson | 350/162 |
| 3,770,340 A | 11/1973 | Cronin et al. | 350/162 |
| 3,776,633 A | 12/1973 | Frosch et al. | 355/132 |
| 4,132,479 A | 1/1979 | Dubroeucq et al. | 355/71 |
| 4,179,708 A | 12/1979 | Sheng et al. | 358/128 |
| 4,207,370 A | 6/1980 | Liu | 428/204 |
| 4,241,389 A | 12/1980 | Heimer | 362/297 |
| 4,249,793 A | 2/1981 | Uehara | 359/727 |
| 4,275,288 A | 6/1981 | Makosch et al. | 219/121 |
| 4,291,938 A | 9/1981 | Wagner | 350/91 |
| 4,370,026 A | 1/1983 | Dubroeucq et al. | 355/71 |
| 4,370,034 A | 1/1983 | Nohda | 351/206 |
| 4,389,701 A | 6/1983 | Phillips | 362/308 |
| 4,472,023 A | 9/1984 | Yamamoto | 350/162.11 |
| 4,476,519 A | 10/1984 | Hayamizu | 362/32 |
| 4,497,013 A | 1/1985 | Ohta | 362/268 |
| 4,497,015 A | 1/1985 | Konno et al. | 362/268 |
| 4,498,742 A | 2/1985 | Uehara | 359/727 |
| 4,547,037 A | 10/1985 | Case | 350/3.75 |
| 4,566,765 A | 1/1986 | Miyauchi et al. | 350/167 |
| 4,585,315 A | 4/1986 | Sincerbox et al. | 350/525 |
| 4,619,508 A | 10/1986 | Shibuya et al. | 355/67 |
| 4,637,691 A | 1/1987 | Uehara et al. | 359/727 |
| 4,668,077 A | 5/1987 | Tanaka | 355/53 |
| 4,739,373 A | 4/1988 | Nishi et al. | 355/53 |
| 4,749,278 A | 6/1988 | van der Werf | 356/401 |
| 4,769,750 A | 9/1988 | Matsumoto et al. | 362/268 |
| 4,778,275 A | 10/1988 | van den Brink et al. | 356/401 |
| 4,780,747 A | 10/1988 | Suzuki et al. | 355/68 |
| 4,780,749 A | 10/1988 | Schulman | 357/12 |
| 4,789,222 A | 12/1988 | Ota et al. | 350/167 |
| 4,814,829 A | 3/1989 | Kosugi et al. | 355/43 |
| 4,828,392 A | 5/1989 | Nomura et al. | 356/401 |
| 4,841,341 A | 6/1989 | Ogawa et al. | 355/43 |
| 4,851,882 A | 7/1989 | Takahashi et al. | 355/46 |
| 4,851,978 A | 7/1989 | Ichihara | 355/67 |
| 4,853,756 A | 8/1989 | Matsuki | 355/71 |
| 4,854,669 A | 8/1989 | Birnbach et al. | 350/162.12 |
| 4,918,583 A | 4/1990 | Kudo et al. | 362/268 |
| 4,931,830 A | 6/1990 | Suwa et al. | 355/71 |
| 4,936,665 A | 6/1990 | Whitney | 350/451 |
| 4,939,630 A | 7/1990 | Kikuchi et al. | 362/268 |
| 4,947,413 A | 8/1990 | Jewell et al. | 378/34 |
| 4,952,815 A | 8/1990 | Nishi | 250/548 |
| 4,970,546 A | 11/1990 | Suzuki et al. | 355/53 |
| 4,974,919 A | 12/1990 | Muraki et al. | 362/268 |
| 4,988,188 A | 1/1991 | Ohta | 352/122 |
| 4,992,825 A | 2/1991 | Fukuda et al. | 355/53 |
| 5,004,348 A | 4/1991 | Magome | 356/401 |
| 5,016,149 A | 5/1991 | Tanaka | 362/268 |
| 5,048,926 A | 9/1991 | Tanimoto | 359/487 |
| 5,091,744 A | 2/1992 | Omata | 355/53 |
| 5,098,184 A | 3/1992 | vanden Brandt et al. | 353/38 |
| 5,121,160 A | 6/1992 | Sano et al. | 355/53 |
| 5,153,419 A | 10/1992 | Takahashi | 250/201.1 |
| 5,153,773 A | 10/1992 | Muraki et al. | 362/268 |
| 5,191,374 A | 3/1993 | Hazama et al. | 355/43 |
| 5,208,629 A | 5/1993 | Matsuo et al. | 355/53 |
| 5,237,367 A | 8/1993 | Kudo | 355/67 |
| 5,245,384 A | 9/1993 | Mori | 355/67 |
| 5,264,898 A | 11/1993 | Kamon et al. | 355/67 |
| 5,286,963 A | 2/1994 | Torigoe | 250/201.2 |
| 5,300,971 A | 4/1994 | Kudo | 355/67 |
| 5,305,054 A | 4/1994 | Suzuki et al. | 355/53 |
| 5,307,207 A | 4/1994 | Ichihara | 367/259 |
| 5,309,198 A | 5/1994 | Nakagawa | 355/67 |
| RE34,634 E | 6/1994 | Konno et al. | 362/268 |
| 5,329,336 A | 7/1994 | Hirano et al. | 355/53 |
| 5,337,097 A | 8/1994 | Suzuki et al. | 353/101 |
| 5,363,170 A | 11/1994 | Muraki | 355/67 |
| 5,392,094 A | 2/1995 | Kudo | 355/67 |
| 5,440,426 A | 8/1995 | Sandstrom | 359/559 |
| 5,446,587 A | 8/1995 | Kang et al. | 359/562 |
| 5,463,497 A | 10/1995 | Muraki et al. | 359/618 |
| 5,638,211 A | 6/1997 | Shiraishi | 359/559 |
| 5,673,102 A | 9/1997 | Suzuki et al. | 355/53 |
| 5,719,704 A | 2/1998 | Shiraishi et al. | 359/558 |
| 6,100,961 A | 8/2000 | Shiraishi et al. | 355/67 |
| 6,211,944 B1 | 4/2001 | Shiraishi | 355/53 |
| 6,233,041 B1 | 5/2001 | Shiraishi | 355/53 |
| 6,252,647 B1 | 6/2001 | Shiraishi | 355/53 |
| 6,377,336 B1 | 4/2002 | Shiraishi et al. | 355/67 |
| 6,392,740 B1 | 5/2002 | Shiraishi et al. | 355/53 |
| 6,636,293 B1 | 10/2003 | Shiraishi | 355/53 |
| 6,665,050 B2 | 12/2003 | Shiraishi | 355/53 |
| 6,704,092 B2 | 3/2004 | Shiraishi | 355/53 |
| 6,710,854 B2 | 3/2004 | Shiraishi et al. | 355/67 |
| 6,710,855 B2 | 3/2004 | Shiraishi | 355/67 |

FOREIGN PATENT DOCUMENTS

| | | |
|---|---|---|
| EP | 0 346 844 | 12/1989 |
| EP | 0 352 975 | 1/1990 |
| GB | 1137243 | 12/1968 |
| JP | 56-12615 | 2/1981 |
| JP | 58-16214 | 1/1983 |
| JP | 59-49514 | 3/1984 |
| JP | 59-83165 | 5/1984 |
| JP | 61-41150 | 2/1986 |
| JP | 61-91662 | 5/1986 |
| JP | 62-50811 | 10/1987 |
| JP | 1-295215 | 11/1989 |
| JP | 2-50417 | 2/1990 |
| JP | 2-48090 | 10/1990 |
| WO | WO 88/08932 | 11/1988 |
| WO | WO 92/03842 | 3/1992 |

OTHER PUBLICATIONS

Delmer L. Fehrs et al., "Illuminator Modification of an Optical Aligner", *KTI Microelectronics Seminar*, Nov. 6–7, 1989, pp. 217–230.

David J. Cronin et al., "Dynamic Coherent Optical System", *Optical Engineering*, Mar./Apr. 1973, vol. 12, pp. 50–55.

Victor Pol et al., "Excimer laser based lithography: a deep–ultraviolet wafer stepper for VLSI processing", *Optical Engineering*, vol. 26, Apr. 1987, pp. 311–318.

D. H. Barry, "Pattern recognition automatic fine alignment", *SPIE*, vol. 334, 1982, pp. 10–16.

S. T. Yang et al., "Effect of central obscuration on image formation in projection lithography", *SPIE*, vol. 1264, 1990, pp. 477–485.

Naomasa Shiraishi et al., "Optical/Laser Microlithography V", *SPIE—The International Society for Optical Engineering*, vol. 1674, Mar. 11–13, 1992, pp. 741–752.

George O. Reynolds, "A Concept for a High Resolution Optical Lithographic System for Producing One–Half Micron Linewidths", *SPIE*, vol. 633, 1986, pp. 228–238.

A. Szegvári, "On the use of an Illumination azimuth diaphragm during coaxial dark field illumination", Jan. 28, 1923, pp. 1–11.

George Needham, "The Practical Use of the Microscope Including Photomicrography", 1958, pp. 315–327 and 97.

John Strong, "Concepts of Classical Optics", 1958, pp. 525–536.

Akira Imai et al., "Lens aberration measurement technique using attenuated phase–shifting mask", Device Development Center, Hitachi Ltd.

Miyoko Noguchi et al., "Subhalf Micron Lithography System with Phase–Shifting Effect", *SPIE,* vol. 1674, 1992, pp. 92–104.

N. Nomura et al., "Heterodyne Holographic Nanometer Alignment for a Wafer Stepper", *Microelectronic Engineering 11,* 1990, pp. 133–136.

Emi Tamechika et al., "Investigation of single sideband optical lithography using oblique incidence illumination", J. Vac. Sci. Technol. B, Nov./Dec. 1992, pp. 3027–3031.

Keiichiro Tounai et al., "Resolution improvement with annular illumination", VLSI Development Division, NEC Corporation, 1992.

H. Fukuda et al., "Characterization of Super–Resolution Photolithography", *IEEE,* 1992, pp. 3.2.1.–3.2.4.

Hiroshi Fukuda et al., "A New Pupil Filter for Annular Illumination in Optical Lithography", *Jpn. J. Appl. Phys.,* vol. 31, 1992, pp. 4126–4130.

Maksymilian Pluta, "Principles and Basic Properties" *Advanced Light Microscopy,* vol. 1, 1988, pp. 460–463.

H. Wolfgang Zieler, "Physical Optical Aspects of Image Formation", *The Optical Performance of the Light Microscope,* 1974, pp. 32–55.

James R. Sheats et al., "Optical Lithography Modeling", *Microlithography Science and Technology,* Chapters 2–4, 1998, pp. 109–271.

Joseph W. Goodman, "Frequency Analysis of Optical Imaging Systems", *Introduction to Fourier Optics,* Chapter 6, 1968, pp.101–197.

Maksymilian Pluta, "Specialized Methods", *Advanced Light Microscopy,* vol. 2, 1989, pp. 100–113.

Satoru Asai, et al., "Improving projection lithography image illumination by using sources far from the optical axis", *J. Vac. Sci. Technol.,* vol. 9, Nov./Dec. 1991, pp. 2788–2791.

B. J. Lin, "Optical Methods for Fine Line Lithography", *Fine Line Lithography,* Chapter 2, 1980, pp. 107–232.

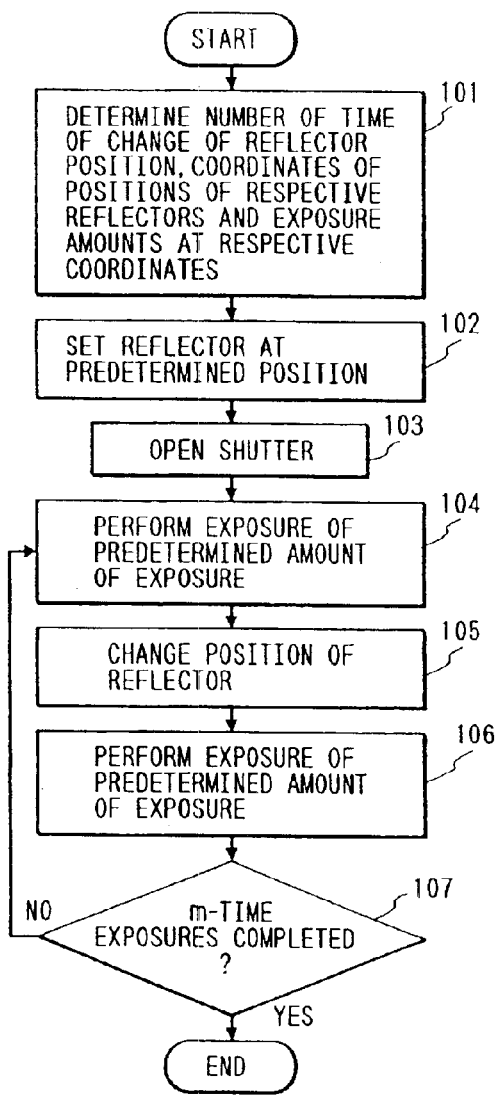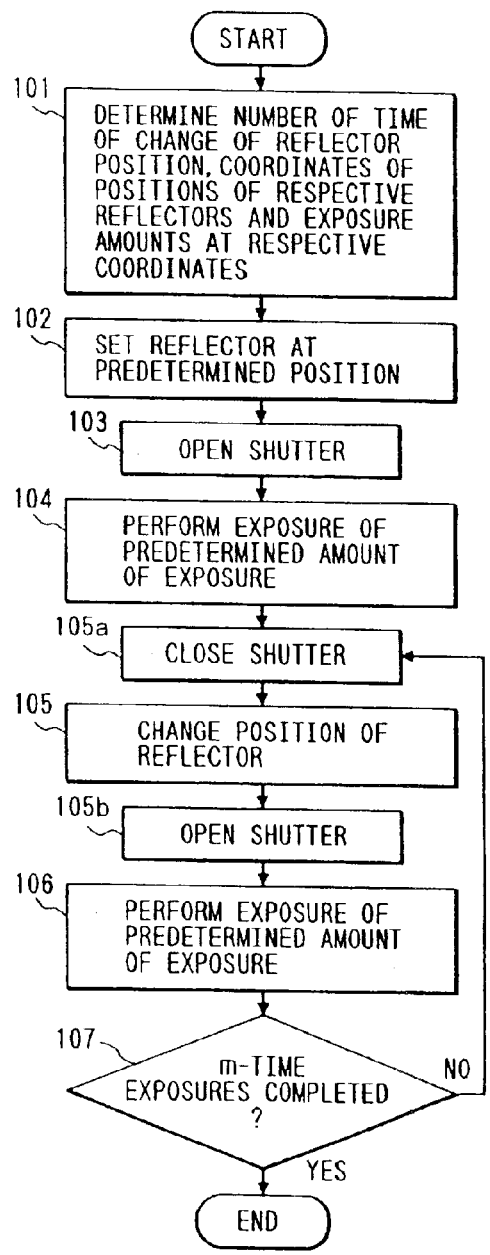

PROJECTION EXPOSURE APPARATUS AND METHOD

CROSS-REFERENCE TO RELATED APPLICATIONS

This application is a division of application Ser. No. 10/202,007 filed Jul. 25, 2002, now U.S. Pat. No. 6,710,855, (incorporated herein by reference). Application Ser. No. 10/202,007 is a continuation-in-part of application Ser. No. 08/376,676 filed Jan. 20, 1995, which is a continuation of application Ser. No. 08/122,318 filed Sep. 17, 1993, now abandoned, which is a continuation of application Ser. No. 07/791,138 filed Nov. 13, 1991, now abandoned. In addition, application Ser. No. 08/376,676 is also a continuation-In-Part of application Ser. No. 08/257,956 filed Jun. 10, 1994, now U.S. Pat. No. 5,638,211, which is a continuation of application Ser. No. 08/101,674 filed Aug. 4, 1993, now abandoned, which is a continuation of application Ser. No. 07/847,030 filed Apr. 15, 1992, now abandoned. Application Ser. No. 10/202,007 is also a continuation-in-part of application Ser. No. 10/124,362 filed Apr. 18, 2002, which is a division of application Ser. No. 09/246,853 filed Feb. 9, 1999, now U.S. Pat. No. 6,392,740, which is a division of application Ser. No. 08/940,198 filed Sep. 29, 1997, now abandoned, which is a division of application Ser. No. 08/549,325 filed Oct. 27, 1995, now U.S. Pat. 5,719,704 issued Feb. 17, 1998, which is a continuation of application Ser. No. 08/371,895 filed Jan. 12, 1995, now abandoned, which is a continuation of application Ser. No. 07/942,193 filed Sep. 9, 1992, now abandoned.

BACKGROUND OF THE INVENTION

1. Field of the Invention

The present invention is directed generally to an exposure method and an exposure apparatus for use to form a pattern of a semiconductor integrated circuit, or a liquid crystal device, or the like, and more particularly, to a projection exposure method and a projection exposure apparatus which are employed in a lithography process for liquid crystal elements and semiconductor memory cells having regular hyperfine patterns.

2. Related Background Art

A method of transferring mask patterns on a substrate typically by the photolithography method is adopted in manufacturing semiconductor memories and liquid crystal elements. In this case, the illumination light such as ultraviolet rays for exposure strikes on the substrate having its surface formed with a photosensitive resist layer through a mask formed with the mask patterns. The mask patterns are thereby photo-transferred on the substrate. In a projection exposure apparatus (for example, a stepper), the image of a circuit pattern drawn on the mask so as to be transferred is projected on the surface of the substrate (wafer) via a projection optical system so as to be imaged.

The typical hyperfine mask patterns of the semiconductor memory and the liquid crystal element can be conceived as regular grating patterns arrayed vertically or horizontally at equal spacings. Formed, in other words, in the densest pattern region in this type of mask patterns are the grating patterns in which equally-spaced transparent lines and opaque lines, formable on the substrate, for attaining the minimum line width are arrayed alternately in X and/or Y directions. On the other hand, the patterns having a relatively moderate degree of fineness are formed in other regions. In any case, the oblique patterns are exceptional.

A typical material for the photosensitive resist exhibits a non-linear photosensitive property. A chemical variation thereof quickly advances on giving an acceptance quantity greater than a certain level. If smaller than this level, however, no chemical variation advances. Hence, there exists a background wherein if a difference in light quantity between a light portion and a shade portion is sufficiently secured with respect to a mask pattern projected image on the substrate, a desired resist image according to the mask patterns can be obtained even when a boundary contrast between the light portion and the shade portion is somewhat low.

In recent years, a projection exposure apparatus such as a stepper, etc. for transferring the mask pattern on the substrate by reductive projection has been often employed with a hyperfiner pattern construction of the semiconductor memory and the liquid crystal element. Special ultra-violet rays having a shorter wavelength and narrower wavelength distributing width are employed as illumination light for exposure. The reason why the wavelength distribution width is herein narrowed lies in a purpose for eliminating a deterioration in quantity of the projected image due to a chromatic aberration of the projection optical system of the projection exposure apparatus. The reason why the shorter wavelength is selected lies in a purpose for improving the contrast of the projected image. Shortening of the wavelength of the illumination light induces a limit in terms of constraints of lens materials and resist materials in addition to the fact that no appropriate light source exists for the much hyperfiner mask patterns required, e.g., for the projection exposure of line widths on the submicron order. This is the real situation.

In the hyperfine mask patterns, a required value of the pattern resolution line width is approximate to the wavelength of the illumination light. Hence, it is impossible to ignore influences of diffracted light generated when the illumination light penetrates the mask patterns. It is also difficult to secure a sufficient light-and-shade contrast of the mask pattern projected image on the substrate. In particular, the light-and-shade contrast at the pattern line edges remarkably declines.

More specifically, respective diffracted light components, a 0th-order diffracted light component, (±) primary diffracted light components and those greater than (±) secondary diffracted light components that are generated at respective points on the mask patterns due to the illumination light incident on the mask from above pass through the projection optical system. These light components are converged again at the respective points on the substrate conjugate these points, thereby forming the image. However, the (±) primary diffracted light components and those larger than the (±) secondary diffracted light components have a much larger diffraction angle than that of the 0th-order diffracted light component with respect to the hyperfiner mask patterns and are therefore incident on the substrate at a shallower angle. As a result, a focal depth of the projected image outstandingly decreases. This causes a problem in that a sufficient exposure energy can not be supplied only to some portions corresponding to a part of thickness of the resist layer.

It is therefore required to selectively use the exposure light source having a shorter wavelength or the projection optical system having a larger numerical aperture in order to transfer the hyperfiner patterns. As a matter of course, an attempt for optimizing both of the wavelength and the numerical aperture can be also considered. Proposed in Japanese Patent Publication. No. 62-50811 was a so-called phase shift reticle in which a phase of the transmitted light from a specific portion among the transmissive portions of reticle circuit patterns deviates by $\pi$ from a phase of the transmitted light from other transmissive portions. When using this phase shift reticle, the patterns which are hyperfiner than in the prior art are transferable.

In the conventional exposure apparatus, however, it is presently difficult to provide the illumination light source with a shorter wavelength (e.g., 200 nm or under) than the present one for the reason that there exists no appropriate optical material usable for the transmission optical member.

The numerical aperture of the projection optical system is already approximate to the theoretical limit at the present time, and a much larger numerical aperture can not be probably expected.

Even if the much larger numerical aperture than at present is attainable, a focal depth expressed by $\pm\lambda/2NA^2$ is abruptly reduced with an increase of the numerical aperture. There becomes conspicuous the problem that the focal depth needed for an actual use becomes smaller and smaller. On the other hand, a good number of problems inherent in the phase shift reticle, wherein the costs increase with more complicated manufacturing steps thereof, and the inspecting and modifying methods are not yet established.

In an irradiation optical system for irradiating the reticle with light, an optical integrator such as a fly-eye type optical integrator (a fly-eye lens) and a fiber is used so as to uniform the distribution of the intensities of irradiation light with which the surface of the reticle is irradiated. In order to make the aforesaid intensity distribution uniform optimally, a structure which employs the fly-eye lens is arranged in such a manner that the reticle-side focal surface (the emission side) and the surface of the reticle (the surface on which the pattern is formed) hold a substantially Fourier transform relationship. Also the focal surface adjacent to the reticle and the focal surface adjacent to the light source (the incidental side) hold the Fourier transform relationship. Therefore, the surface of the reticle, on which the pattern is formed, and the focal surface of the fly-eye lens adjacent to the light source (correctly, the focal surface of each lens of the fly-eye lens adjacent to the light source) hold an image formative relationship (conjugated relationship). As a result of this, irradiation light beams from respective optical elements (a secondary light source image) of the fly-eye lens are added (superposed) because they pass through a condenser lens or the like so that they are averaged on the reticle. Hence, the illuminance uniformity on the reticle can be improved. Incidentally, there has been disclosed an arrangement capable of improving the illuminance uniformity in U.S. Pat. No. 4,497,015 in which two pairs of optical integrators are disposed in series.

In a conventional projection exposure apparatus, the light quantity distribution of irradiation beams to be incident on the optical integrator, such as the aforesaid fly-eye lens, has been made to be substantially uniform in a substantially circle area (or in a rectangular area), the center of which is the optical system of the irradiation optical system.

FIG. 54 illustrates a schematic structure of a conventional projection exposure apparatus (stepper) of the above described type. Referring to FIG. 54, irradiation beams L340 pass through a fly-eye lens 241c, a spatial filter (an aperture diaphragm) 205a and a condenser lens 208 so that a pattern 210 of a reticle 209 is irradiated with the irradiation beams L340. The spatial filter 205a is disposed on, or adjacent to a Fourier transform surface 217 (hereinafter abbreviated to a "pupil surface or plane") and also referred to as a Fourier transform plane with respect to the reticle side focal surface 614c of the fly-eye lens 241c, that is, with respect to the reticle pattern 210. Furthermore, the spatial filter 205a has a substantially circular opening centered at a point on optical axis AX of a projection optical system 211 so as to limit a secondary light source (plane light source) image to a circular shape. The irradiation light beams, which have passed through the pattern 210 of the reticle 209, are imaged on a resist layer of a wafer 213 via the projection optical system 211. In the aforesaid structure, the numerical aperture of the irradiation optical system (241c, 205a and 208) and the reticle-side numerical aperture formed in the projection optical system 211, that is σ value is determined by the aperture diaphragm (for example, by the diameter of an aperture formed in the spatial filter 205a), the value being 0.3 to 0.6 in general.

The irradiation light beams L340 are diffracted by the pattern 210 patterned by the reticle 209 so that 0-order diffracted light beam Do, +1-order diffracted light beam Dp and −1-order diffracted light beam Dm are generated from the pattern 210. The diffracted light beams Do, Dp and Dm, thus generated, are condensed by the projection optical system 211 so that interference fringes are generated. The interference fringes, thus generated, correspond to the image of the pattern 210. At this time, angle θ (reticle side) made by the 0-order diffracted light beam Do and ±1-order diffracted light beams Dp and Dm is determined by an equation expressed by sin θ=λ/P (λ: exposure wavelength and P: pattern pitch).

It should be noted that sin θ is enlarged in inverse proportion to the length of the pattern pitch, and therefore if sin θ has become larger than the numerical aperture ($NA_R$) formed in the projection optical system 211 adjacent to the reticle 209, the ±1-order diffracted light beams Dp and Dm is limited by the effective diameter of a pupil (a Fourier transform surface) 212 in the projection optical system 211. As a result, the ±1-order diffracted light beams Dp and Dm cannot pass through the projection optical system 211. At this time, only the 0-order diffracted light beam Do reaches the surface of the wafer 213 and therefore no interference fringe is generated. That is, the image of the pattern 210 cannot be obtained in a case where sin θ>$NA_R$. Hence, the pattern 210 cannot be transferred to the surface of the wafer 213.

It leads to a fact that pitch P, which holds the relationship sin Θ=λ/P≅$NA_R$, has been given by the following equation.

$$P \cong \lambda/NA_R$$

Therefore, the minimum pattern size becomes about 0.5 λ/$NA_R$ because the minimum pattern size is the half of the pitch P. However, in the actual photolithography process, some considerable amount of focal depth is required due to an influence of warp of the wafer, an influence of stepped portions of the wafer generated during the process and the thickness of the photoresist. Hence, a practical minimum resolution pattern size is expressed by k·λ/$NA_R$, where k is a process factor which is about 0.6 to 0.8. Since the ratio of the reticle side numerical aperture $NA_R$ and the wafer side numerical aperture $NA_W$ is the same as the imaging magnification of the projection optical system, the minimum resolution size on the reticle is k·λ/$NA_R$ and the minimum pattern size on the wafer is k·λ/$NA_W$=k·λ/B·$NA_R$ (where B is an imaging magnification (contraction ratio)).

Therefore, a selection must be made whether an exposure light source having a shorter wavelength is used or a projection optical system having a larger numerical aperture is used in order to transfer a more precise pattern. It might, of course, be considered feasible to study to optimize both the exposure wavelength and the numerical aperture.

However, as pointed out earlier, it is so far difficult for the projection exposure apparatus of the above described type to shorten the wavelength of the irradiation light source (for example, 200 nm or shorter) because a proper optical material to make a transmissive optical member is not present and so forth. Furthermore, the numerical aperture formed in the projection optical system has approached its theoretical limit at present and therefore it is difficult to further enlarge the numerical aperture. Even if the numerical aperture can be further enlarged, the focal depth expressed by $\pm\lambda/2NA^2$ rapidly decreases with an increase in the numerical aperture, causing a critical problem to take place in that the focal depth required in a practical use further decreases.

As pointed out earlier, by using a phase shift reticle of the type described above, a further precise pattern can be transferred. However, the phase shift reticle has a multiplicity of unsolved problems because of a fact that the cost cannot be reduced due to its complicated manufacturing process and inspection and modification methods have not been established even now.

Hence, an attempt has been made as projection exposure technology which does not use the phase shift reticle and with which the transference resolving power can be improved by modifying the method of irradiating the reticle with light beams. One irradiation method of the aforesaid type is a so-called annular zone irradiation method, for example; arranged in such a manner that the irradiation light beams which reach the reticle 209 are given a predetermined inclination by making the spatial filter 205*a* shown in FIG. 54 an annular opening so that the irradiation light beams distributed around the optical axis of the irradiation optical system are cut on the Fourier transform surface 217.

In order to establish projection exposure having a further improved resolving power and a larger focal depth, an inclination irradiation method or a deformed light source method has been previously disclosed in PCT/JP91/01103 (filed on Aug. 19, 1991). The aforesaid irradiation method is arranged in such a manner that a diaphragm (a spatial filter) having a plurality (two or four) openings, which are made to be eccentric with respect to the optical axis of the irradiation optical system by a quantity corresponding to the precision (the pitch or the like) of the reticle pattern, is disposed adjacent to the emission side focal surface of the fly-eye lens so that the reticle pattern is irradiated with the irradiation light beams from a specific direction while inclining the light beams by a predetermined angle.

However, the above mentioned inclination irradiation method and the deformed light source method have a problem in that it is difficult to realize a uniform illuminance distribution over the entire surface of the reticle because the number of effective lens elements (that is, the number of secondary light sources capable of passing through the spatial filter) decreases and therefore an effect of making the illuminance uniform on the reticle deteriorates. What is worse, the light quantity loss is excessively large in the system which has a member, such as the spatial filter, for partially cutting the irradiation light beams. Therefore, the illumination intensity (the illuminance) on the reticle or the wafer can, of course, deteriorate excessively, causing a problem to take place in that the time taken to complete the exposure process becomes long with the deterioration in the irradiation efficiency. Furthermore, a fact that light beams emitted from the light source concentrically pass through the Fourier transform plane in the irradiation optical system will cause the temperature of a light shielding member, such as the spatial filter, to rise excessively due to its light absorption and a measure (air cooling or the like) must be taken to prevent the performance deterioration due to change in the irradiation optical system caused from heat.

In a case where a diaphragm of the aforesaid type is disposed adjacent to the emission side focal surface of the fly-eye lens, some of the secondary light source images formed by a plurality of the lens elements are able to superpose on the boundary portion between the light transmissive portion of the diaphragm and the light shielding portion of the same. This means a fact that the secondary light source image adjacent to the aforesaid boundary portion is shielded by the diaphragm or the same passes through the boundary portion on the contrary. That is, an unstable factor, such as the irradiation light quantity, is generated and another problem arises in that the light quantities of the light beams emitted from the aforesaid diaphragm and that are incident on the reticle become different from one another. Furthermore, in the inclination irradiation method, the positions of the four openings (in other words, the light quantity distribution in the Fourier transform plane) must be changed in accordance with the degree of precision of the reticle pattern (the line width, or the pitch or the like). Therefore, a plurality of diaphragms must be made to be exchangeable in the irradiation optical system, causing a problem to arise in that the size of the apparatus is enlarged.

When a secondary light source formed on the reticle side focal surface of the fly-eye lens is considered in a case where the light source comprises a laser such as an excimer laser having a spatial coherence, the irradiation light beams corresponding to the lens elements have some considerable amount of coherence from each other. As a result, random interference fringes (speckle interference fringes) are formed on the surface of the reticle or the surface of the wafer which is in conjugate with the surface of the reticle, causing the illuminance uniformity to deteriorate. When its spatial frequency is considered here, a Fourier component corresponding to the minimum interval between the lens elements is present in main. That is, the number of combinations of light beams contributing to the interference is the largest. Therefore, fringes having a relatively low frequency (having a long pitch) in comparison to the limit resolution and formed to correspond to the configuration direction of the lens elements are observed on the surface of the reticle or the surface of the wafer. Although the formed interference fringes have low contrast because the KrF excimer laser has a relatively low spatial coherence, the interference fringe acts as parasite noise for the original pattern. The generation of the interference fringes causes a problem when the illuminance uniformity, which will be further required in the future, is improved. In the case where the annular zone irradiation method is considered, the aforesaid noise concentrically superposes in the vicinity of the limit resolution, and therefore the influence of the noise is relatively critical in comparison to the ordinary irradiation method (see FIG. 54).

Disclosed, on the other hand, in U.S. Pat. No. 4,947,413 granted to T. E. Jewell et al is the projection lithography method by which a high contrast pattern projected image is formed with a high resolving power on the substrate by making the 0th-order diffracted light component coming from the mask patterns and only one of the (+) and (−) primary diffracted light components possible of interference by utilizing a spatial filter processing within the Fourier transform plane in the projection optical system by use of an off-axis illumination light source. Based on this method, however, the illumination light source has to be off-axis-disposed obliquely to the mask. Besides, the 0th-order diffracted light component is merely interfered with only one of the (+) and (−) primary diffracted light components. Therefore, the light-and-shade contrast of edges of the pattern image is not yet sufficient, the image being obtained by the interference due to unbalance in terms of a light quantity difference between the 0th-order diffracted light component and the primary diffracted light component.

SUMMARY OF THE INVENTION

An object of the present invention is to provide a projection exposure apparatus and method capable of obtaining high resolution and a large focal depth and revealing excellent illuminance uniformity even if an ordinary reticle is used.

It is a further object of the present invention, which has been devised in the light of the foregoing problems, to attain the exposure with a high resolving power and large focal depth even when using an ordinary reticle by making the illumination light incident on a mask at a predetermined angle inclined to the optical axis of an illumination optical axis or a projection optical system, providing a member for making the illumination light incident obliquely on the mask in the illumination optical system and illuminating the mask without any loss in light quantity.

It is another object of the present invention to provide such an arrangement that passage positions of a 0th-order diffracted light component and (±) primary diffracted light components within a Fourier transform plane for mask patterns in the projection optical system are set as arbitrary positions symmetric with respect to the optical axis of the projection optical system.

To accomplish the objects described above, according to one aspect of the present invention, there is provided, in the illumination optical system, a luminous flux distributing member such as a prism, etc. for distributing the illumination light into at least four luminous fluxes penetrating only a predetermined region on the Fourier transform plane for the mask patterns.

According to another aspect of the present invention, there is provided a movable optical member such as a movable mirror or the like in the illumination optical system to concentrate the luminous fluxes in predetermined positions on the Fourier transform plane for the mask patterns. The movable optical member is drivable to cause at least two beams of illumination light to pass through only the predetermined region on the Fourier transform plane with time differences from each other.

According to still another aspect of the present invention, there are provided the luminous flux distributing member or the movable optical member between an optical integrator such as a fly eye lens, etc. and the mask or between the light source and the optical integrator.

According to a further aspect of the present invention, the optical integrator is divided into a plurality of optical integrator groups which are set in discrete positions eccentric from the optical axis. At the same time, the illumination light is focused on the plurality of optical integrator groups, respectively.

According to still a further aspect of the present invention, the luminous flux distributing member is movable and exchangeable. The position in which the luminous flux passes above the Fourier transform plane for the mask patterns is arbitrarily set.

According to yet another aspect of the present invention, in a method of effecting the exposure while deviating a substrate position in the optical-axis direction of the projection optical system from an image forming surface of the mask patterns, the exposure is performed by making the illumination light incident on the mask at an inclined angle.

By virtue of the present invention, it is possible to actualize a projection type exposure apparatus exhibiting a higher resolving power and larger focal depth than in the prior art even by employing the ordinary reticle. Further, although the effect of improving the resolving power competes with a phase shifter, the conventional photo mask can be used as it is. It is also feasible to follow the conventional photo mask inspecting technique as it is. Besides, when adopting the phase shifter, the effect of increasing the focal depth is obtained, but it is hard to undergo influences of a wavefront aberration due to defocus even in the present invention. For this reason, a large focal depth (focal tolerance) is obtained.

In accordance with one form of the present invention, the emission side focal surface is disposed on a Fourier transform surface 217 with respect to a mask in the optical path of the irradiation optical system or on a plane adjacent to the same as shown in FIG. 41. Furthermore, there are a plurality of first fly-eye lenses 241a and 241b the centers of which are disposed at a plurality of positions which are eccentric from optical axis AX of the irradiation optical system, a plurality of second fly-eye lenses 240a and 240b having the emission side focal plane located on the Fourier transform surface with respect to each incidental end of a plurality of the first fly-eye lenses 241a and 241b or on a surface adjacent to the same and disposed to correspond to the first fly-eye lenses 241a and 241b and light dividers for dividing the irradiation light beams from the light source to be incident on a plurality of the second fly-eye lenses 240a and 240b. Furthermore, a guide optical element is disposed so as to cause the light beams emitted from one of a plurality of the second fly-eye lenses to be incident on one of a plurality of the first fly-eye lenses. In a case where a laser represented by an excimer laser is used as the light source, an optical path difference generating member 270 is disposed between a plurality of the light beams emitted from the light dividers 220 and 221 shown in FIG. 57, the optical path difference generating member 270 causing an optical path difference (the phase difference) longer than the coherent distance (the coherent length) of the irradiation light beams to be given.

As shown in FIGS. 64 and 67, in one of its forms the present invention comprises, in an irradiation optical path, a plane light source forming optical system 300 or 306 and 307 for forming a plurality of light sources, a converging optical system 302 or 308 for converging the light beams from the plane light source forming optical system, a polyhedron light source forming optical system 303 having a plurality of lens elements 303a to 303d for forming a plurality of plane light source images on the Fourier transform surface with respect to the reticle by the light beams from the converging optical system or on a plane adjacent to the same and having the centers of the optical axes disposed at a plurality of positions which are eccentric from the optical axis of the irradiation optical system, and a condenser for converging the light beams from the plurality of plane light source images formed by the polyhedron light source forming optical system onto the reticle.

In the aforesaid structure, assuming that half of the distance between the optical axes of the lens elements in a direction of the pattern of said reticle is L, the focal distance on the emission side of said condenser lens is f, the wavelength of said irradiation light beams is λ and the cyclic pitch of said pattern of said mask is P, it is preferable to arrange the structure to satisfy the following condition:

$$L=\lambda f/2P$$

In a case where the reticle has a two-dimensional pattern, the polyhedron light source forming optical system is composed of four lens elements disposed in parallel and, assuming that the numerical aperture on the reticle side of said projection optical system is $NA_R$, half of the distance between the optical axes of said lens elements 303a to 303d in a direction of the pattern of the reticle is L, and the emission side focal distance of the condenser lens 208 is f, it is preferable that the following conditions are satisfied:

$$0.35NA_R \leq L/f \leq 0.7NA_R$$

As shown in FIG. 69, in one of its forms the present invention comprises light dividers 400 and 401 for dividing the irradiation light beams in the optical path of the irradiation optical system, polyhedron light source forming optical systems 402a, 402b, 403a, 403b, 404a and 404b for forming a plurality of plane light sources which correspond to each light beam divided by the light dividers on the Fourier transform surface with respect to the reticle 209 or on a plane adjacent to the same at a plurality of positions which are eccentric from the optical axis of the irradiation optical system and a condenser lens 208 for converging the light beams from a plurality of the plane light sources onto the reticle, wherein the polyhedron light source forming optical system includes at least rod type optical integrators 403a and 403b.

In the aforesaid structure, the polyhedron light source forming optical system may have a plurality of rod type optical integrators the centers of which are disposed at a plurality of positions which are eccentric from the optical axis of the irradiation optical system.

Furthermore, the polyhedron light source forming optical system may comprise a first converging lens for converging light beams divided by the light dividing optical system, a rod type optical integrator having the incidental surface disposed at the focal point of the converging lens and a second converging lens for converging the light beams from the rod type optical integrator to form a plurality of plane light sources on the Fourier transform surface with respect to the reticle or on a plane adjacent to the same.

In accordance with one form of the present invention, irradiation light beams emitted from the light source are divided into a plurality of light beams before they are introduced into each fly-eye lens. Therefore, the light beams emitted from the light source can be efficiently utilized while reducing loss, so that a projection exposure system revealing high resolution and a large focal depth can be realized.

Although an irradiation system for use in the present invention may become complicated in comparison to an ordinary system, the uniformity of the illuminance on the reticle surface and on the wafer surface can be improved because the fly-eye lenses are disposed to form two stages in the direction of the optical axis. By virtue of the two stage fly-eye lens structure, the illuminance uniformity on the reticle and the wafer surfaces can be maintained even if the fly-eye lens is moved on a plane perpendicular to the optical axis.

In a system in which the light dividing optical system or a portion of the same is made to be movable, the optimum dividing optical system (dividing into two portions and that into four portions can be selected) can be used in accordance with the division conditions.

In a system in which at least a portion of the light dividing optical system can be moved or rotated, the condition of dividing the light beams can be varied by, for example, changing the interval between the polyhedron prisms or by rotating the polyhedron prism. Therefore, a variety of division states can be created by using a small number of optical members.

Also in a case where a rod type optical integrator is used in place of the fly-eye type optical integrator (the fly-eye lens), or in a case where they are combined to each other, an effect similar to the aforesaid structures can be obtained.

Furthermore, in one of its forms the present invention is arranged in such a manner that the irradiation light beams emitted from the light source are divided into a plurality of light beams before a phase difference (the difference in the length of the optical path) which is an ordinary system, the uniformity of the illuminance on the reticle surface and on the wafer surface can be improved because the fly-eye lenses are disposed to form two stages in the direction of the optical axis. By virtue of the two stage fly-eye lens structure, the illuminance uniformity on the reticle and the wafer surfaces can b maintained even if the fly-eye lens is moved on a plane perpendicular to the optical axis.

Since the light dividing optical system efficiently introduces the irradiation light beams to the first stage fly-eye lens, the irradiation light quantity loss can be satisfactorily prevented. Therefore, the exposure time can be shortened and the processing performance (throughput) cannot deteriorate.

In a system in which the second stage fly-eye lens adjacent to the reticle is made movable as in an embodiment (see FIG. 45), optimum irradiation can be performed in accordance with the reticle pattern.

In a system arranged in such a manner that the first, the second fly-eye lenses and the guide optical system are integrally held while making them to be movable, the movable portion can be decreased and therefore the structure can be simplified. As a result, the manufacturing and adjustment cost can be reduced.

Also in a case where a plurality of the guide optical system and the corresponding first fly-eye lens are respectively made movable, the light dividing optical system and the second fly-eye lens group are integrally held. Therefore, the structure can be simplified and as well as the manufacturing cost and the adjustment cost can be reduced.

Furthermore, one system of the present invention is arranged in such a manner that the irradiation light beams emitted from the light source are divided into a plurality of light beams before a phase difference (the difference in the length of the optical path) which is longer than the coherent distance (coherent length) of the irradiation light beams is given to a portion between a plurality of the light beams. The coherent length LS of the irradiation light beam can be expressed by:

$$LS=\lambda 2/D1$$

(where the wave length of the irradiation light beam is λ and its vector width is D1).

That is, if a difference in the optical path length longer than the coherent length L is present between two light beams emitted from one light source, the two light beams do not interfere with each other. In a case where the light source is a narrow band KrF excimer laser, the coherent length L is about 20 mm and therefore an optical path difference can be relatively easily given to a plurality of light beams. Therefore, even if a laser having a certain coherence is used, the speckle interference fringe which can be superposed on the desired pattern as noise can be effectively reduced. That is, the illuminance uniformity on the reticle and the wafer can be improved by necessitating a simple structure in which the optical path difference generating member is disposed in the irradiation optical path.

Other objects, advantages, and aspects of the present invention will become apparent during the following discussion taken in conjunction with the accompanying drawings.

BRIEF DESCRIPTION OF THE DRAWINGS

FIGS. 19A and 19B are flowcharts showing an exposure method in the second embodiment of the present invention;

DETAILED DESCRIPTION OF THE PREFERRED EMBODIMENTS

Figure 1:
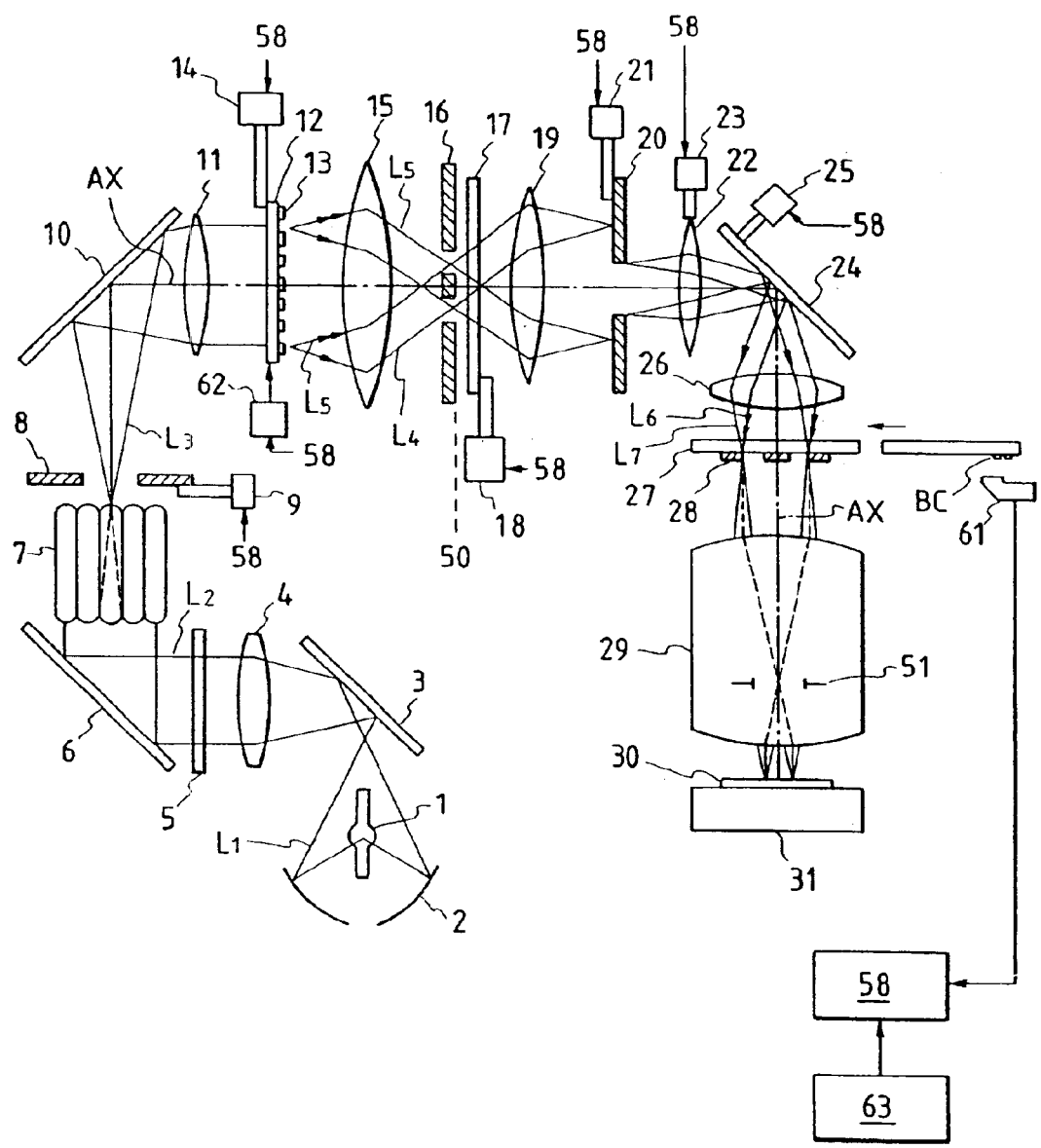
FIG. 1 is a view schematically illustrating a projection type exposure apparatus in a first embodiment of the present invention.

Embodiments of the present invention will hereinafter be described in detail with reference to the accompanying drawings. FIG. 1 is a block diagram illustrating a whole projection type exposure apparatus in accordance with a first embodiment of the present invention. A luminous flux L1 emitted from an exposure light source 1 such a mercury lamp or the like and converged by an elliptical mirror 2 is reflected by a mirror 3. The luminous flux reflected by the mirror 3 passes through a relay lens 4 and is monochromatized by a wavelength selection element 5. A monochromatized luminous flux L2 is refracted by a mirror 6 and is incident on a fly eye lens 7. At this moment, an incident surface of the fly eye lens 7 is provided in a position substantially conjugate to reticle patterns 28. An exit surface of the fly eye lens 7 is formed on a Fourier transform corresponding plane (Fourier transform plane) of the reticle patterns 28 or in the vicinity of this plane. An aperture stop 8 is provided in close proximity to the exit surface of the fly eye lens 7. A numerical aperture of illumination light L3 is determined by a drive unit 9 for making variable a size of an opening of the aperture stop 8. The illumination light L3 is reflected by a mirror 10. Illuminated with the illumination light through a condenser lens 11 is a diffraction grating pattern plate (light transmissive flat plate) 12 incised with diffraction grating patterns 13a. This diffraction grating pattern plate 12 functions as a luminous flux distribution member in the present invention. This plate 12 is attachable/detachable and interchangeable. At this time, the diffraction grating pattern plate 12 is provided on a surface substantially conjugate to the hyperfine reticle pattern surfaces 28 formed on a reticle 27. The reticle patterns 28 may be herein isolated patterns or patterns having a periodic structure.

As described above, an optical integrator such as the fly eye lens and fibers is used in an illumination optical system for illuminating the reticle with the light. Made uniform is an intensity distribution of the illumination light with which the reticle is illuminated. In the case of employing the fly eye lens to optically effect this homogenizing process, a reticle side focal surface and a reticle surface are linked based substantially on a relation of Fourier transform. The reticle side focal surface and a light source side focal surface are also linked based on the relation of Fourier transform. Hence, the pattern surface of the reticle and the light source side focal surface (precisely the light source side focal surface of each individual lens element of the fly eye lens) are linked based on an image forming relation (conjugate relation). For this reason, on the reticle, the illumination beams from the respective elements (secondary illuminant image) of the fly eye lens are added (overlapped) and thereby averaged. An illuminance homogeneity on the reticle can be thus enhanced.

Figure 2:
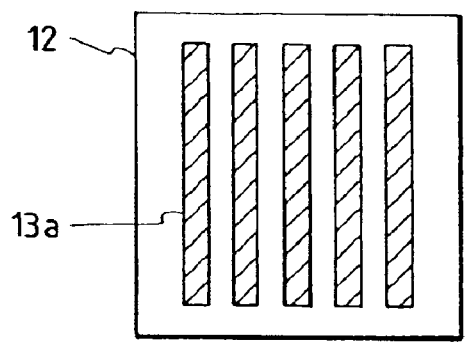
FIG. 2 is a view depicting a light transmissive substrate (luminous flux distributing member) including patterns of periodic structure in the first embodiment of the present invention.

FIG. 2 is a plan view showing one example of the diffraction grating pattern plate. The diffraction grating pattern plate 12 is a transparent substrate of fused quartz or the like and is formed with the diffraction grating pattern 13a. The Diffraction grating patterns 13a are conceived as line-and-space patterns formed of a metal thin film of Cr and the like. Note that at this time, a pitch Pg of the diffraction grating patterns 13a is desirably substantially given by Pg=2PrxM (m is the magnification of image formation between the diffraction grating pattern 13a and the reticle patterns 28) with respect to a pitch Pr of the reticle patterns 28. A duty ratio thereof is not necessarily 1:1 but may be arbitrary.

Now, returning to the description of FIG. 1, (−) primary diffracted light L4 and (+) primary diffracted light L5 generated by the diffraction grating pattern plate 12 are separated from each other by a condenser lens 15 on a Fourier transform plane 50 in the illumination optical system. The beams of light are then condensed in a position eccentric from the optical axis of the illumination optical system (or a projection optical system (29)). The positions through which the beams of (±) primary diffracted light L4, L5 pass above the Fourier transform plane are symmetric with respect to an optical axis AX. A spatial filter 16 is provided on the Fourier transform plane or on a plane in the vicinity of the Fourier transform plane. Light transmissive positions (openings) are provided in such positions as to transmit only the beams of diffracted light ((+) primary diffracted light L4, L5 in this embodiment) of the specific order among the beams of diffracted light generated from the diffraction grating patterns 13a. Note that this spatial filter 16 may be such a variable type filter as to make variable a position and a configuration of the transmissive portion or may be a filter of such a type that the spatial filter 16 itself is attachable/detachable and interchangeable. The spatial filter 16 is preferably provided with, when the 0th-order diffracted light is generated from the diffraction grating pattern 13a, a Cr thin film having a size enough to shield the 0th-order diffracted light. Beams of light of unnecessary orders can be also shielded.

Figure 3:
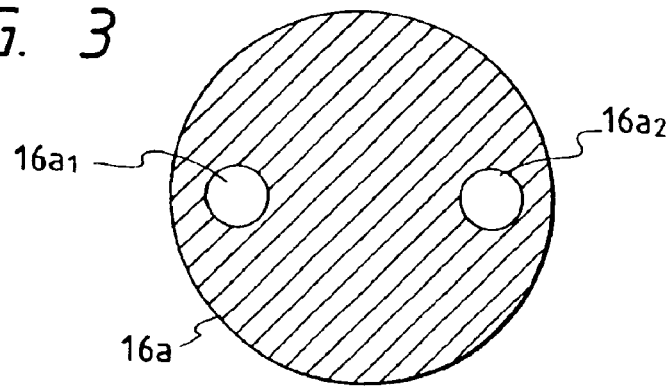
FIG. 3 is a view depicting a spatial filter corresponding to the patterns shown in FIG. 2.

FIG. 3 depicts a spatial filter 16a suitable when using the diffraction grating patterns 13a shown in FIG. 2. An oblique line portion indicates a light shielding portion. A radius of the spatial filter 16a is set greater than a total numerical aperture of the illumination optical system. Two light transmissive portions (openings) 16a1, 16a2 are provided in portions symmetric with respect to the central point of the spatial filter 16a.

An intensity distribution (positions of luminous fluxes) on the Fourier transform plane of the illumination optical system required differs depending on the directivity of the reticle pattern 28. It is, however, desirable that the directivity of the diffraction grating patterns 13a be equal to the directivity of the reticle patterns 28. In this case, it is not necessary that the directivities be identical. The directivity of the diffraction grating patterns 13a projected on the reticle pattern 28 may be coincident with a large proportion of the directivity of the reticle patterns 28. To implement these requirements, intrinsic diffraction grating patterns determined for the respective reticle patterns 28 are incised in individual diffraction grating pattern plates. Simultaneously when replacing a reticle 27, the reticle 27 may be replaced while matching it with the diffraction grating pattern plate.

The diffraction grating patterns 13a are determined by the pitch or line width and the directivity of the reticle patterns 28. Hence, the same diffraction grating patterns plate may be used in common to a plurality of reticles having patterns in which the pitches, line widths and the directivities are substantially equal.

If the directivities of the plurality of reticles are different, they may be made coincident with the directivities of the patterns on the respective reticles by rotating the diffraction grating pattern plate 12 within a plate vertical to the optical axis. Further, if the diffraction grating pattern plate 12 is rotatable (through, e.g., 90°), a correspondence can be given to such a case that the line-and-space pattern directions of the reticle patterns 13a are different from directions x, y. The relay lens 15 is set as a zoom lens (afocal zoom expander and the like) composed of a plurality of lens elements, wherein a condensing distance is variable by changing a focal distance. In this case, however, the conjugate relation between the diffraction grating pattern plate 12 and the reticle 27 should be kept. Further, an image of the pattern 13a may be rotated by use of an image rotator.

For instance, the diffraction grating patterns 13a may be employed in a state of being rotated about the optical axis of the illumination optical system to obtain an arbitrary angle in accordance with the directivity of the reticle patterns 28.

Now, as illustrated in FIG. 1, the luminous fluxes L4, L5 passing through the spatial filter 16 are led to a reticle blind 20 via a condenser lens 19. The reticle blind 20 is provided on a surface substantially conjugate to the reticle pattern surfaces 28 and is a field stop for illuminating only the specific area on the reticle 27 with the light. This reticle blind 20 has an aperture openable and closable, with the aid of a drive system 21 and is capable of adjusting a size of the illumination area on the reticle 27. The reticle 27 is illuminated with luminous fluxes L6, L7 passing through the reticle blind 20 through condenser lenses 22, 26 and a mirror 24 disposed substantially in the vicinity of the Fourier transform plane. The luminous fluxes L6, L7 are incident on the reticle patterns 28. The beams of diffracted light generated from the reticle patterns 28 are condensed to form an image on a wafer 30 by means of a projection optical system 29. The wafer 30 is two-dimensionally movable within the plane vertical to the optical axis. The wafer 30 is placed on a wafer stage 31 movable in the optical-axis direction.

Figure 40:
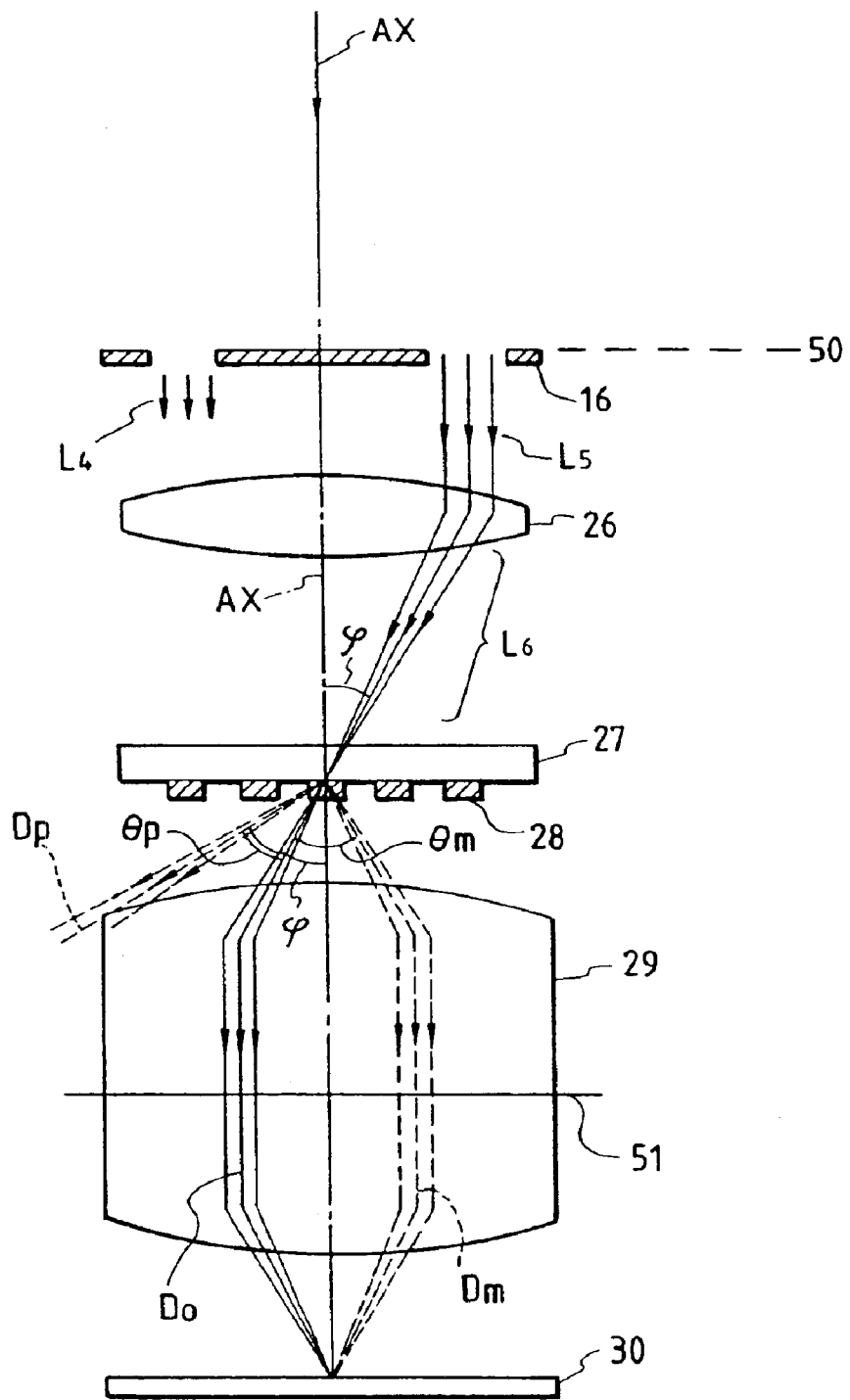
FIG. 40 is a view schematically showing a fundamental construction of a light path in the first embodiment of the present invention.

FIG. 40 schematically illustrates a fundamental configuration of light paths for illumination beams in an exposure apparatus in this embodiment. Referring to FIG. 40, the light transmissive portions (openings) of the spatial filter 16 are disposed in position eccentric from the optical axis AX of the projection optical system or the illumination optical system on the Fourier transform plane. A coordinate position of the luminous fluxes passing through the Fourier transform plane is eccentric from the optical axis AX.

Now, the illumination light L5 emitted from the of the spatial filter 16 is incident on the reticle 27 via the condenser lens 26. The reticle patterns 28 depicted on the reticle (mask) 27 typically contain a large number of periodic patterns. Therefore, a 0th-order diffracted light component DO, (±) primary diffracted light components Dp, Dm or other higher-order diffracted light components are generated in directions corresponding to degrees of fineness of the patterns from the reticle patterns 28 illuminated with the light. At this moment, the illumination luminous fluxes (central line) are incident on the reticle 27 at an inclined angle. Hence, the diffracted light component of the respective orders are also generated from the reticle patterns 28 with an inclination (angular deviation) as compared with the vertical illumination. The illumination light L6 shown in FIG. 40 is incident on the reticle 27 with an inclination $\Phi$ to the optical axis.

The illumination light L6 is diffracted by the reticle patterns 28, thereby generating a 0th-order diffracted light component Do traveling in a direction with the inclination $\Phi$ to the optical axis AX, a (+) primary diffracted light component Dp with an inclination $\theta p$ to the 0th-order diffracted light component and a (−) primary diffracted light component Dm traveling with an inclination $\theta m$ to the 0th-order diffracted light component Do. The illumination light L6 is, however, incident on the reticle patterns at the inclined angle $\Phi$ to the optical axis AX of the projection optical system 29 both sides of which are telecentric. For this reason, the 0th-order diffracted light component Do also travels in the direction inclined at the angle $\Phi$ to the optical axis AX of the projection optical system.

Hence, the (+) primary diffracted light component Dp travels in a direction of $(\theta p+\Phi)$ to the optical axis AX, while the (−) primary diffracted light component Dm goes in a direction of $(\theta m-101)$ to the optical axis AX.

At this time, the diffracted angles Op, Om are expressed such as:

$$\sin(\theta p+\Phi)-\sin\Phi=\lambda/P \quad (1)$$

$$\sin(\theta m-\Phi)+\sin\Phi=\lambda/P \quad (2)$$

where it is assumed that both of the (+) primary diffracted light component Dp and (−) primary diffracted light component Dm penetrate a pupil plane (the Fourier transform surface of the reticle patterns) 51 of the projection optical system 29.

When the diffracted angle increases with finer reticle patterns 28, the (+) primary diffracted light component Dp traveling in the direction inclined at the angle of (θp+Φ) at first becomes incapable of penetrating the pupil surface 51 of the projection optical system 29. Namely, there is developed a relation such as sin (θp+Φ)>$NA_R$. A beam of illumination light L6 is incident with an inclination to the optical axis AX, and hence the (−) primary diffracted light component Dm is capable of incidence on the projection optical system 29 even at the diffracted angle of this time. Namely, there is developed a relation such as sin (θm−Φ) <$NA_R$.

Produced consequently on the wafer 30 are interference fringes by two luminous fluxes of the 0th-order diffracted light component Do and the (−) primary diffracted light component Dm. The interference fringes are conceived as an image of the reticle patterns 28. A contrast of approximately 90% is obtained when the reticle patterns 28 have a line-and-space of 1:1, and patterning of the image of the reticle patterns 28 can be effected on a resist applied over the wafer 30.

A resolving limit at this moment is given by:

$$\sin(\theta m - \Phi) = NA_R \tag{3}$$

Hence, a reticle-side pitch of the transferable minimum pattern is given by:

$$NA_R + \sin \Phi = \lambda/P \quad P = \lambda/(NA_R + \sin \Phi) \tag{4}$$

Now, supposing that sin Φ is set to approximately 0.5×$NA_R$ as one example, the minimum pitch of the pattern on the transferable reticle is given by:

$$P = \lambda/(NA_R + 0.5 NA_R) = 2\lambda/3 NA_R \tag{5}$$

On the other hand, in the case of a known projection exposure apparatus in which a distribution of illumination light on the pupil plane 51 of the Fourier transform plane falls within a circular range (rectangular range) about the optical axis AX, the resolving limit is expressed by sin θm=λ/p≅$NA_R$. The minimum pitch is given by P≅λ/$NA_R$. It can be therefore understood that the projection type exposure apparatus in this embodiment attains a higher resolving power than in the known exposure apparatus.

The following is an elucidation about why a focal depth becomes large on the basis of a method of forming image forming patterns on the wafer by use of the 0th-order diffracted light component and the primary diffracted light component while the reticle patterns are irradiated with the exposure light in a specific incident direction at a specific incident angle.

As illustrated in FIG. 40, when the wafer 30 is coincident with the focal position (the best image forming surface) of the projection optical system 29, all the individual diffracted light components emerging from one point of the reticle patterns 28 and reaching one point on the wafer 30, even if they pass through any part of the projection optical system 29, have an equal length of light path. For this reason, even when the 0th-order diffracted light component penetrates substantially the center (in the vicinity of the optical axis) of the pupil surface 51 of the projection optical system 29, the 0th-order diffracted light component and other diffracted light components are equal in terms of lengths of their light paths, and a mutual wavefront aberration is zero. When the wafer 30 is in a defocus state (the wafer 30 does not coincide with the focal position of the projection optical system 29), however, the lengths of the high-order diffracted light components obliquely falling thereon are short in front of the focal point as compared with the 0th-order diffracted light component passing in the vicinity of the optical axis. Whereas in rear of the focal point (closer to the projection optical system 29), the lengths increase. A difference therebetween corresponds to a difference between the incident angles. Hence, the 0th-order, primary, . . . diffracted light components mutually form the wavefront aberration, resulting in creation of unsharpness in front and in rear of the position of the focal point.

The wavefront aberration caused by the defocus described above is defined as a quantity given by $\Delta F r^2/2$, where ΔF is the amount of deviation from the focal point position of the wafer 30, and r (r=sin θw) is the sine of an incident angle θw in the case of (−) incidence of the individual diffracted light component. (At this time, r represents a distance from the optical axis AX on the pupil plane 51.) In the conventional known projection type exposure apparatus, the 0th-order diffracted light component Do passes in the vicinity of the optical axis AX, and hence r (0th-order)=0. On the other hand, in the (±) primary diffracted light components Dp, Dm, r (primary)=M·λ/P (M is the magnification of the projection optical system).

Therefore, the wavefront aberration due to defocusing of the 0th-order diffracted light component Do and the (+) primary diffracted light components Dp, Dm is given by:

$$\Delta F \cdot M^2 (\lambda/P)^2/2.$$

On the other hand, in the projection type exposure apparatus according to this invention, as illustrated in FIG. 40, the 0th-order diffracted light component Do is generated in the direction inclined at the angle Φ to the optical axis AX. Thus, the distance of the 0th-order diffracted light component from the optical axis AX on the pupil plane 51 is expressed such as r (0th-order)=M·sin Φ.

Further, the distance of the (−) primary diffracted light component Dm from the optical axis on the pupil surface is expressed such as r ((−) primary)=M·sin Φ(θm−Φ). At this time, if sin Φ=sin(θm−Φ), a relative wavefront aberration due to defocusing of the 0th-order diffracted light component Do and the (−) primary diffracted light component Dm becomes zero. Even when the wafer 30 deviates slightly in the optical-axis direction from the position of the focal point, it follows that the unsharp image of the patterns 28 does not become larger than in the prior art. Namely, the focal depth increases. As shown in the formula (2), sin(θm−Φ)+sin Φ=λ/P, and hence it is possible to remarkably increase the focal depth on condition that the incident angle Φ of the illumination luminous flux L6 to the reticle 27 is made to have a relation such as sin Φ=λ/2P with respect to the patterns having the pitch P.

Herein, as discussed above, each of the luminous fluxes L6, L7 is incident on the reticle 28 at the inclined angle Φ in symmetry with respect to the optical axis of the projection optical system or the illumination optical system. Generated from the patterns 28 are the 0th-order diffracted light component Do, a (−) primary light component Dm and a (+) primary light component Dp.

The incident angle Φ is prescribed by a numerical aperture NA of the projection optical system as well as by the reticle patterns 28. As expressed in the formula (4), this incident angle is selectively set to an incident angle corresponding to the minimum value of the reticle pattern pitch. The incident direction is desirably set to a pitch array direction of the reticle patterns. The optimum conditions of the incident angle will be explained later.

Herein, as described above, the diffraction grating pattern plate 12 is disposed in the position substantially conjugate to the reticle patterns 28. The diffraction grating patterns 13a are therefore projected on the reticle patterns 28 via the illumination optical system. For this reason, a light-and-shade image assuming the diffraction grating configuration is formed on the reticle patterns 28, and the uniformity in amount of illumination light is thereby deteriorated. However, the diffraction grating pattern plate 12 incised with the diffraction grating patterns 13a is oscillated or shifted by one pitch of the diffraction grating patterns 13a or by approximately an integer multiple or greater during an exposure period (while an unillustrated shutter is opened) per shot by a drive member 14 such as a motor, a piezoelement and the like. The light-and-shade image is thereby shifted by approximately one pitch or larger during the exposure period per shot. The luminance is averaged (homogenized) in terms of time, thereby keeping well the uniformity in quantity of the illumination light. The direction in which the light-and-shade image is shifted or oscillated is preferably set to exhibit a less correlation with the direction of the diffraction grating patterns 13a. For instance, the image is allowed to make a circular motion (synthesized with the oscillations in the directions x and y) wherein a diameter is set to a value which exceeds the pitch Pg of the patterns 13a within the plane vertical to the optical axis.

At this time, one or more optical members closer to the reticle 27 than the diffraction grating pattern plate 12 may be shifted, oscillated or allowed to make the circular motion under the same conditions within the illumination optical system in place of the diffraction grating pattern plate 12. FIG. 1 shows an example where drive members 23, 25 are attached to the condenser lens 22 and the mirror 24.

The light-and-shade image is averaged within the exposure period by giving the above-described shifting, oscillating or circular motion. The illumination light quantity on the reticle patterns 28 can be kept uniform.

There is, however, a possibility to cause unevenness in the light quantity on the reticle pattern surfaces 28 due to a dispersion in diffraction efficiency or in transmissivity within the pattern plane which is derived from a manufacturing error of the diffraction grating patterns 13a. To prevent this phenomenon, a light scattering member 17 such as a diffusion plate of a lemon skin and the like may be disposed in close proximity to the Fourier transform plane 50.

The light emerging from one point on the diffraction grating patterns 13a is scattered by the light scattering member 17 and serves for illumination over a wide area of the reticle pattern surfaces 28. In other words, the light from the wide area of the diffraction grating patterns 13a reaches one point on the reticle pattern surfaces 28. A local error in manufacture of the diffraction grating patterns 13a is relieved. At this time, the light scattering member 17 is shifted, oscillated or rotated by a motor 18 during the exposure period per shot, whereby a time averaging effect is produced. This makes it easier to eliminate the dispersion in the quantity of the illumination light.

Note that when shifting, oscillating or rotating the light scattering member 17, the optical members such as the diffraction grating pattern plate 12 or the condenser lens 22 and the mirror 24 may not be shifted, oscillated or rotated.

This light scattering member 17 provided in the vicinity of the Fourier transform plane deteriorates the image of the diffraction grating patterns 13a but does not cause extreme fluctuations in the angular range of the incident angles of the illumination light incident on the reticle pattern surface 28.

In addition, the fiber bundles may be laid leastwise larger than the spot beams on the Fourier transform plane or over the entire Fourier transform plane in place of the light scattering member 17 to deteriorate the light fluxes. Further, the effect to deteriorate the image can be enhanced by a combination with the light scattering member 17.

Incidentally, the device depicted in FIG. 1 includes: a main control system 58 for generalizing/controlling the device; a bar code reader 61 for reading bar codes BC representing the names prepared on a side of the reticle patterns 28 in the course of carrying the reticle 27 just above the projection optical system 29; and a keyboard 63 for inputting commands and data from the operator. Registered beforehand in the main control system 58 are the names of a plurality of reticles dealt with by this stepper and stepper operation parameters corresponding to the respective names. The main controller system 58 outputs, when the bar code reader 61 reads the reticle bar code BC, the previously registered information on the shift and the rotation of the diffraction grating pattern plate 12 to the drive member 14 as one of the operation parameters which corresponds to that name. The optimum distribution of the light quantity can be thereby formed on the Fourier transform surface 50 in accordance with the reticle patterns on the reticle. As one of the parameters corresponding to the names of the reticles, the information on the replacement of the diffraction grating pattern plate 12 is inputted to a diffraction grating replacing member 62. The diffraction grating pattern plate 12 optimal to the reticle patterns 28 formed on the reticle is thereby selectable. The operations discussed above are executable by the operator's inputting the commands and data directly to the main control system 58 from the keyboard 63.

Now, in order to intensify the effect of improving the resolving power in this embodiment, preferably $\sigma=0.1$ to 0.3 by adjusting the numerical aperture 8 of the illumination system. The reason for this is that the improvements of the resolving power and of the focal depth are not attainable if the value $\sigma$ is too large, and whereas if too small, a fidelity declines. Hence, when an exit area of the fly eye lens 7 of the above-described illumination optical system is set to 1, it is desirable to manufacture a fly eye lens having an exit area of, e.g. 0.3 in contrast with that value. The illumination optical system from the elliptical mirror 2 to the fly eye lens 7 may preferably be constructed to maximize the light quantity with respect to $\sigma \approx 0.3$. In addition, the value $\sigma$ may be variable by changing the width of luminous fluxes incident on the fly eye lens 7 with the lens system 4 being composed of a zoom lens (afocal zoom lens).

The foregoing positions of the respective mirrors are not limited to the above-mentioned. For instance, the mirror 24 fitted with the drive member 25 may be disposed closer to the spatial filter 16 than the reticle blind 20.

Next, there will be explained a case where the reticle patterns 28 are not oriented uniformly over the entire surface of the reticle but oriented partially in different directions.

Figure 4:
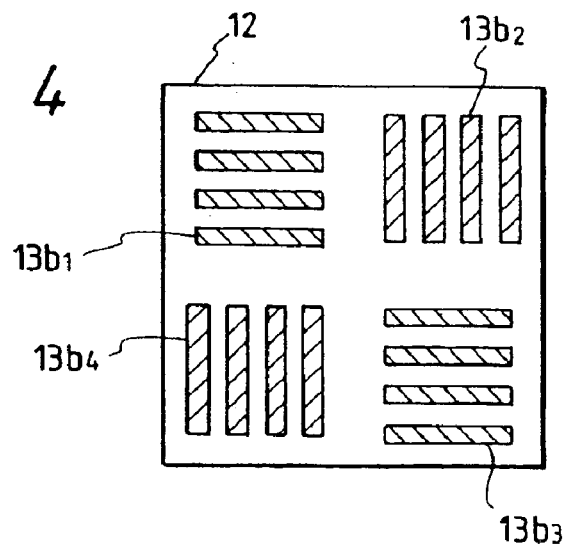
FIGS. 4 and 6 are views each showing a variant form of the periodic structural patterns in the first embodiment of the present invention.

For example, a case where the reticle patterns 28 have the periodic structure in two directions x, y will be described. Where the reticle patterns 28 have the periodic structure in the two directions x, y, there may be employed the diffraction grating pattern plate 12 formed with diffraction grating patterns 13b arrayed partially in different directions as shown in FIG. 4. Referring to FIG. 4, diffraction grating patterns 13b1, 13b3 correspond to the reticle patterns 28 having the periodic structure in the direction y. Diffraction grating patterns 13b2, 13b3 correspond to the reticle patterns 28 having the periodic structure in the direction x. At this time, the pitch array direction of the diffraction grating patterns 13b1, 13b3 is equalized to the pitch array direction of the reticle patterns 28 having the periodic structure in the direction y. The pitch array direction of the diffraction grating patterns 13b2, 13b3 is equalized to the pitch array direction of the reticle patterns 28 having the periodic structure in the direction y.

Figure 5:
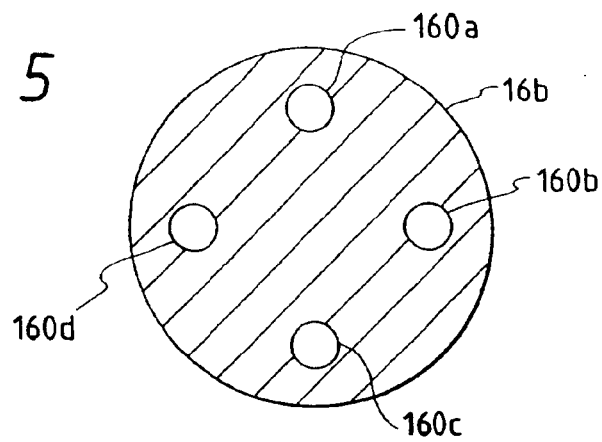
FIG. 5 is a view illustrating a spatial filter corresponding to the patterns shown in FIG. 4.

FIG. 5 is a diagram illustrating a spatial filter 16b corresponding to the diffraction grating pattern 13b depicted in FIG. 4. The spatial filter 16b includes light transmissive portions (openings) 160a, 160b, 160c, 160d. The oblique line portion indicates a light shielding portion. The light transmissive portions 160a, 160c transmit the diffracted light generated from the diffraction grating patterns 13b1, 13b3. A spacing between the light transmissive portions 160a, 160b is determined by a pitch of the diffraction grating patterns 13b1, 13b3. A direction and an angle of the diffracted light incident on the reticle patterns are determined by positions of the beams of refracted light at the spatial filter 16, i.e., by positions of the light transmissive portions 160a, 160c.

Similarly, the light transmissive portions 160b, 160d transmit the diffracted light from the diffraction grating patterns 13b2, 13b4. A direction and an angle of the luminous flux incident on the reticle patterns 28 are determined by the position of the refracted light on the spatial filter 16 which is conditional to the pitch of the diffraction grating patterns 13b2, 13b4.

Figure 6:
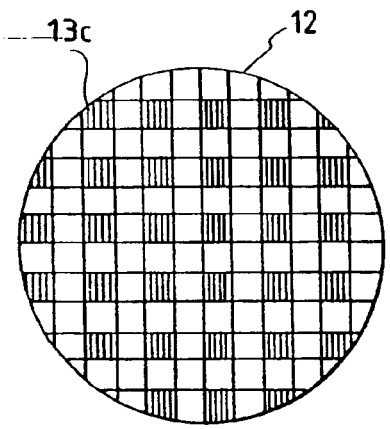

A configuration of the diffraction grating pattern 13b is not limited to the line-and-space depicted in FIG. 4 but may be a checked grating pattern 13c illustrated in FIG. 6. The pitch array direction is desirably matched with the array direction of the reticle patterns 28. As discussed above, if the periodic patterns on the reticle are arrayed in the two directions x, y, as illustrated in FIG. 6, the pitches of the checked grating pattern 13c may be set in the directions x, y. A duty ratio thereof is not limited to 1:1.

Figure 7:
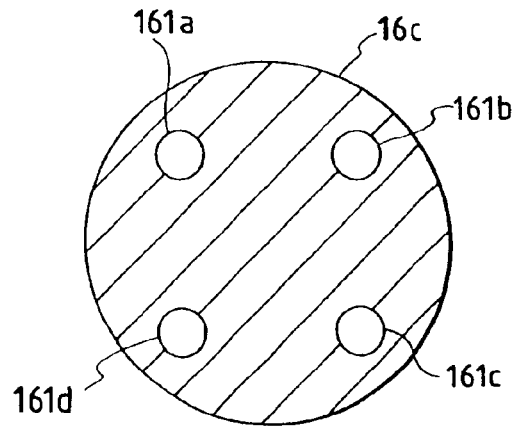
FIG. 7 is a view depicting a spatial filter corresponding to the patterns shown in FIG. 6.

FIG. 7 illustrates a spatial filter 16c for the checked grating pattern 13c shown in FIG. 6. The spatial filter 16c includes light transmissive portions 161a, 161b, 161c, 161d. The oblique line portion indicates the light shielded portion.

Spacings between the light transmissive portions 161a, 161b and 161d, 161c are determined by the x-directional pitch of the diffraction grating pattern 13c shown in FIG. 6. Spacings between the light transmissive portions 161a, 161d and 161b, 161c are determined by the y-directional pitch of the diffraction grating pattern 13c shown in FIG. 6. Where the reticle patterns 28 have the periodic structure in the two directions x, y, the illumination light penetrating the light transmissive portions 161a, 161d is incident on the reticle patterns 28 having the x-directional periodic structure, thereby generating the (+) primary diffracted light component. This diffracted light component passes through substantially the same position as that of the 0th-order diffracted light component of the illumination light which has penetrated the light transmissive portions 161b, 161c respectively on the pupil surface 51 of the projection optical system 29. Reversely, the illumination light penetrating the light transmissive portions 161b, 161c is incident on the reticle patterns 28 having the x-directional periodic structure, thereby generating the (−) primary diffracted light component. This diffracted light component passes through substantially the same position as that of the illumination light which has penetrated the light transmissive portions 161a, 161d respectively on the pupil surface 51 of the projection optical system. Distances from the optical axis to the respective light transmissive portions 161a, 161b, 161c, 161d are equally set. Therefore, the 0th-order diffracted light component and the (+) primary diffracted light component or the (−) primary diffracted light component pass through the positions having substantially equal distances from the optical axis on the pupil surface of the projection optical system. Four beams of illumination light passing through the light transmissive portions 161a to 161d are incident on the reticle patterns 28, thereby generating (+) or (−) primary diffracted light component. Combined light components of any one of these primary diffracted light components and the 0th-order diffracted light component all reach the wafer 30, whereby an image having, as described above, a contrast of approximately 90%, is formed. Further, the 0th-order diffracted light component and the primary diffracted light components travel through the positions having substantially equal distances from the optical axis AX on the pupil surface 51 of the projection optical system 29, and hence the focal depth is also great.

The case of the patterns having the periodicity in the direction x has been described so far. The patterns having the periodicity in the direction y are, however, available. The directions of the gratings are not limited to the above-mentioned but may include, e.g., a slant direction in accordance with the reticle patterns. Two pieces of light transmissive substrates formed with the repetitive diffraction grating patterns 13a shown in FIG. 2 are disposed so that the pattern surfaces confront each other. Two flat plates are relatively rotated about the optical axis of the illumination optical system, and arbitrary patterns may be formed by a adjusting the relative positions of the respective patterns. Further, the repetitive patterns assuming other arbitrary configurations may also be available. The diffraction grating patterns 13 may be not only the rectilinear patterns but also patterns having the periodic structure, e.g., homocentric grating patterns (Fresnel zone plate, etc.) and homocentric elliptical patterns. Additionally, the patterns having arbitrary light-and-shade portions in the two direction x, y may also be created by use of liquid crystal and the like. In these cases also, the spatial filter 16 having the transmissive portions determined based on the positions of diffracted light may be used.

The diffraction grating pattern plate 12 may be the one in which a light shielding film of Cr and the like undergoes patterning on the surface of a transmissive substrate, e.g., a glass substrate. Alternatively, the plate 12 may be the one provided with so-called phase gratings in which a dielectric film of $SiO_2$ or the like is subjected to patterning. The phase gratings exhibit such advantages that the 0th-order diffracted light component can be restrained, the spatial filter 16 can be also omitted, and a loss of the light quantity is small.

As discussed above, the incident directions and the incident angles of the (plurality of) illumination luminous fluxes incident on the reticle patterns 28 are prescribed corresponding to the reticle patterns 28. The incident directions and angles can be adjusted arbitrarily by changing the directivity and the pitch of the diffraction grating patterns 13a. For example, as explained earlier, the diffraction grating pattern plate 12 is replaced with the one having the different pitches, thereby making variable the positions of the luminous fluxes incident on the Fourier transform plane. It is therefore possible to attain an arbitrary distribution of the illumination light quantity on the Fourier transform plane without causing a considerable loss of the illumination light quantity. As stated before, the transmitting positions of the luminous fluxes on the Fourier transform plane are made variable, whereby the incident angle of the illumination light to the reticle patterns 28 is also made variable (the angle of the luminous fluxes incident on the projection optical system is adjustable to a desired angle). For this reason, it is feasible to obtain the projection exposure apparatus having a high resolving power and a smaller loss of the light quantity. The luminous flux transform member is intended to generate the light quantity distribution assuming an arbitrary configuration in accordance with the incident angle to the reticle patterns 28 on the Fourier transform plane or in the vicinity of this Fourier transform plane. Eliminated is an adjustment of the relative positional relation with the reticle patterns.

Note that there will be mentioned in detail the determination about the positions (on which the light quantity distributions concentrate on the entire Fourier transform plane) of the luminous fluxes incident on the Fourier transform plane 50.

The following is an explanation of a method of deteriorating the image by providing optical elements in the light transmissive portions of the spatial filter 16 by way of an example of variant form of the means for deteriorating the image.

Transmissive flat plates having different thicknesses and refractive indices are adhered to the respective light transmissive portions of the spatial filter 16. The beams of light penetrating the individual light transmissive portions travel along the light paths which are each longer by a value of (diffraction grating pattern plate thickness×refractive index). If a difference between the lengths of the light paths of the luminous fluxes penetrating the respective transmissive portions is larger than a coherent length of the illumination light, the beams of light penetrating the respective transmissive portions do not interfere with each other on the reticle pattern surfaces.

Namely, it implies that no image of the diffraction grating patterns is formed. For instance, if the illumination light is an i-beam (wavelength=0.365 μm, wavelength width=0.005 μm) of the mercury lamp, the coherent length of the illumination light is approximately 27 μm. Where the glass having a refractive index of 1.5 is used as the above-described diffraction grating pattern plate, a difference (Δt) between the thicknesses of the flat plates adhered to the respective openings is expressed such as:

$$\Delta t \times (1.5-1) \geqq 27 \, \mu m$$

where the refractive index of the air is 1. The difference defined by $\Delta t \geqq 54 \, \mu m$ may suffice.

Hence, if the glasses individually having a refractive index of, e.g., 1.5 and thicknesses of 1000 μm, 1060 μm (thickness-difference is 60 μm) are adhered to the respective openings of the spatial filter illustrated in, e.g., FIG. 3, the interference fringes on the reticle pattern surfaces—i.e., the image of the diffraction grating patterns—disappear (deterioration).

Where the light transmissive flat plates having the different thicknesses and refractive indices are adhered to the openings of the spatial filter 16 in this manner, the diffraction grating patterns 13 and the optical member or the light scattering member 17 may not be oscillated, shifted or rotated.

If a coherence length of the illumination light is large, and when using, e.g., a laser beam source, preferably an optical rotatory element such as crystal may be adhered to one opening of the spatial filter 16 to rotate a polarizing direction of the transmission light through approximately 90°. Adhered to other openings are the transmissive flat plates of glass and the like having substantially equal length of the light path as that of the optical rotary element. Where the spatial filter described above is employed, almost a half of the luminous fluxes with which the reticle pattern surfaces are irradiated are orthogonal (alternatively, circularly polarized light in the reverse direction) to each other in terms of their polarizing directions. Therefore, the interference fringes—viz., the image of the diffraction grating patterns—are deteriorated. The diffraction grating patterns 13 are positioned with slight deviations in the optical-axis direction from the conjugate position to the reticle patterns 28, with the result that the image of the diffraction grating patterns 13 projected on the reticle patterns 28 may be deteriorated (defocused).

Deteriorated (homogenized) by the image deteriorating means on the basis of the above-described construction are the unnecessary light-and-shade fringes (the image of the diffraction grating patterns) which are produced by projecting (image-forming) the diffraction grating patterns serving as the luminous flux distributing member on the reticle pattern surfaces through the illumination optical system. Alternatively, the fringes are averaged in time and then homogenized in terms of the distribution of the image surface light quantity. An unevenness of illuminance on the reticle pattern surfaces can be prevented. Further, it is feasible to remarkably reduce the manufacturing costs for the luminous flux transform members without being influenced by the defects in manufacturing the luminous flux distributing members.

Figure 8:
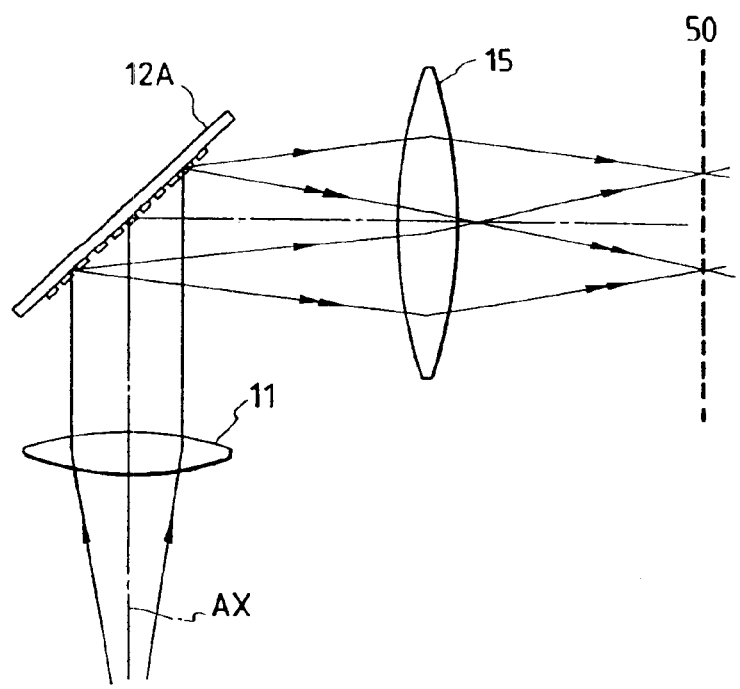
FIGS. 8, 9, 10, 11 and 12 are views each showing a variant form of the luminous flux distributing member in the first embodiment.

The diffraction grating pattern plate 12 may be not only the transmissive pattern plate but also a reflective pattern plate shown in FIG. 8. The optical member for transforming the illumination light described above into a plurality of luminous fluxes and forming an arbitrary light quantity distribution on the Fourier transform plane 50 is not limited to the diffraction grating pattern plate 12 or 12A.

Figure 9:
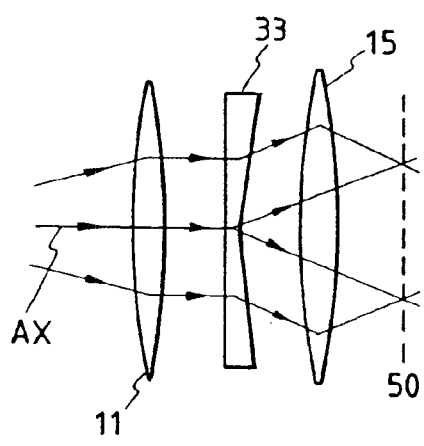

FIG. 9 is a schematic diagram showing an arrangement in which a prism 33 formed with a plurality of refractive surfaces is employed as a member (luminous flux distributing member) for guiding a plurality of luminous fluxes onto the Fourier transform plane 50 and forming an arbitrary light quantity distribution on the Fourier transform plane. The configurations toward the light source from a relay lens 11 and toward the reticle from a relay lens 15 are the same as those shown in FIG. 1. The prism 33 in FIG. 9 is divided into two refractive surfaces with the optical axis AX serving as a boundary. The illumination light incident upwardly of the optical axis AX is refracted upwards, whereas the illumination light incident downwardly of the optical axis AX is refracted downwards. Hence, the illumination luminous fluxes can be incident on the Fourier transform plane in accordance with a refracting angle of the prism 33. The dividing number of the refractive surfaces is not limited to 2 but may be any number in accordance with a desired light quantity distribution on the Fourier transform plane. The dividing positions are not necessarily symmetric positions with respect to the optical axis AX.

The incident positions of the illumination luminous fluxes incident on the Fourier transform plane 50 are made variable by exchanging the prism 33.

Further, the prism 33 at this time may be a polarization beam splitter such as wollaston prism, etc. In this case, however, the polarizing directions of the split luminous fluxes are different, and hence the polarization properties may be arranged in one direction, considering the polarization property of the resist of the wafer 30. The device, as a matter of course, incorporates a function to exchange the prism and the like.

Figure 10:
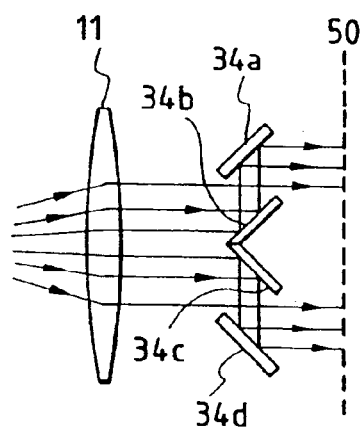

FIG. 10 shows an example where a plurality of mirrors 34a, 34b, 34c, 34d are employed as luminous flux distributing members. The illumination light passing through the relay lens system 11 is so reflected as to be separated into two directions through the primary mirrors 34b, 34c and guided by the secondary mirrors 34a, 34d. The illumination light is again reflected and reaches the Fourier transform plane. Each of the mirrors 34a, 34b, 34c, 34d is provided with a position adjusting mechanism and a mechanism for adjusting an angle of rotation about the optical axis AX. Based on these mechanisms, the illumination light quantity on the Fourier transform surface 50 is arbitrarily made variable. Further, the mirrors 34a, 34b, 34c, 34d may be plane, convex or concave mirrors. As depicted in FIG. 10, it is permitted that some luminous fluxes are not reflected once by the mirrors but are incident directly on the Fourier transform plane 50 from the relay lens 4. Besides, lenses may be interposed between the secondary mirrors 34a, 34d and the Fourier transform plane.

Prepared by twos in FIG. 10 are the primary mirrors 34b, 34c and the secondary mirrors 34a, 34d. The numerical quantity is not limited to this value. The mirrors may be disposed appropriately corresponding to the desired illumination light incident on the Fourier transform plane in accordance with the reticle patterns 28. All the mirrors are, as the necessity arises, constructed to retreat up to such positions that the illumination luminous fluxes strike on the mirrors.

Figure 11:
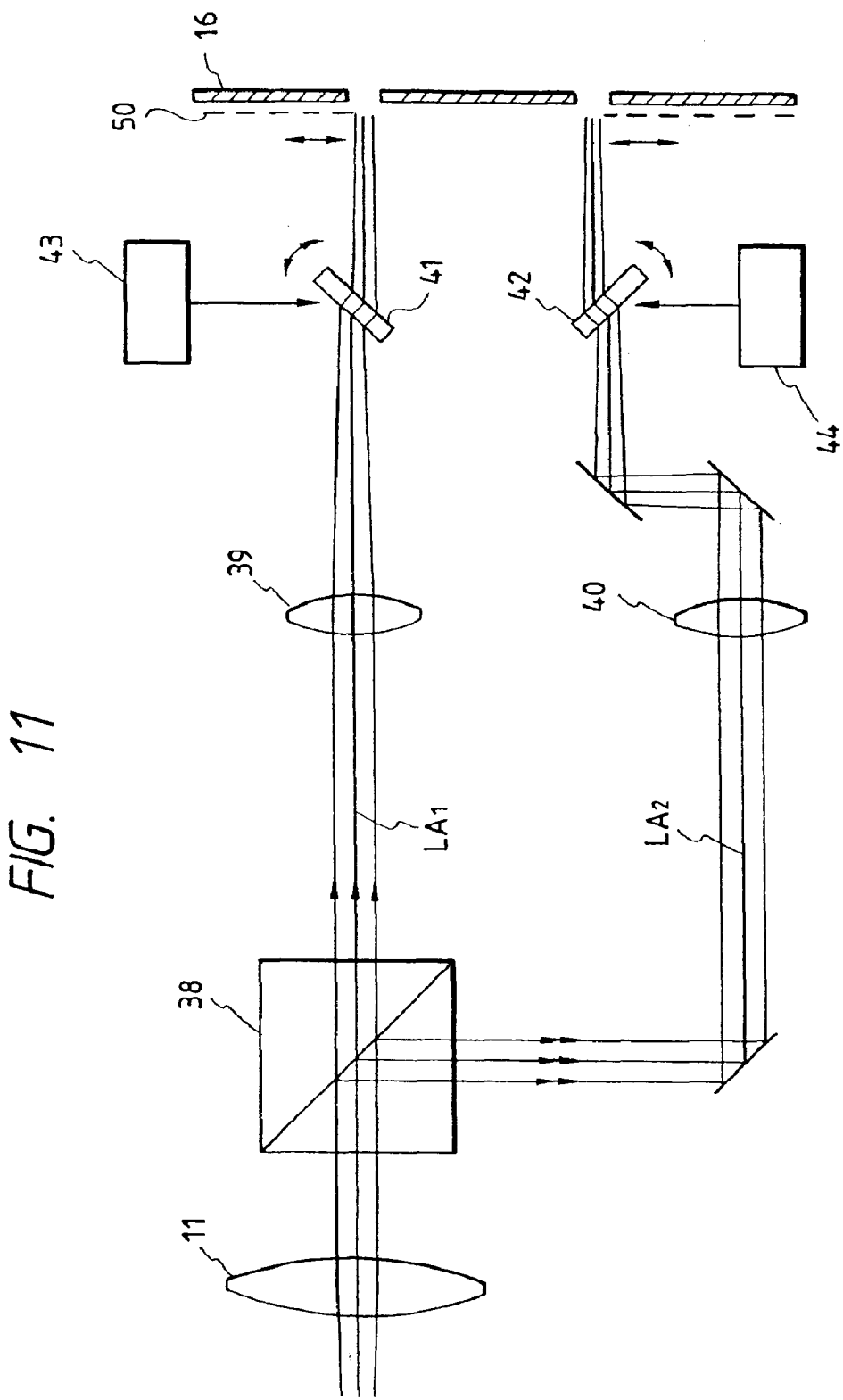

FIG. 11 illustrates an example where a beam splitter is employed as a luminous flux distributing member. The configurations toward the light source from the relay lens 11 and towards the reticle from the spatial filter 16 are the same as those shown in FIG. 1. As illustrated in FIG. 11, the illumination light traveling through the relay lens 11 is split into two luminous fluxes LA1, LA2 by means of a beam splitter 38 provided in the illumination optical system. The luminous fluxes LA1, LA2 are distributed as those having a certain magnitude (thickness) on the Fourier transform plane 50 through lens systems 39, 40 and plane parallels 41, 42. The lens systems 39, 40 are properly selected, whereby a magnitude of the illumination light quantity distribution on the Fourier transform plane 50 can be arbitrarily set. The plane parallels 41, 42 are minutely movable (inclinable) by drive systems 43, 44. The distributed positions of the luminous fluxes distributed on the Fourier transform plane 50 can be minutely adjustable. The drive systems 43, 44 are constructed of motors, gears or piezoelements and so on.

Figure 12:
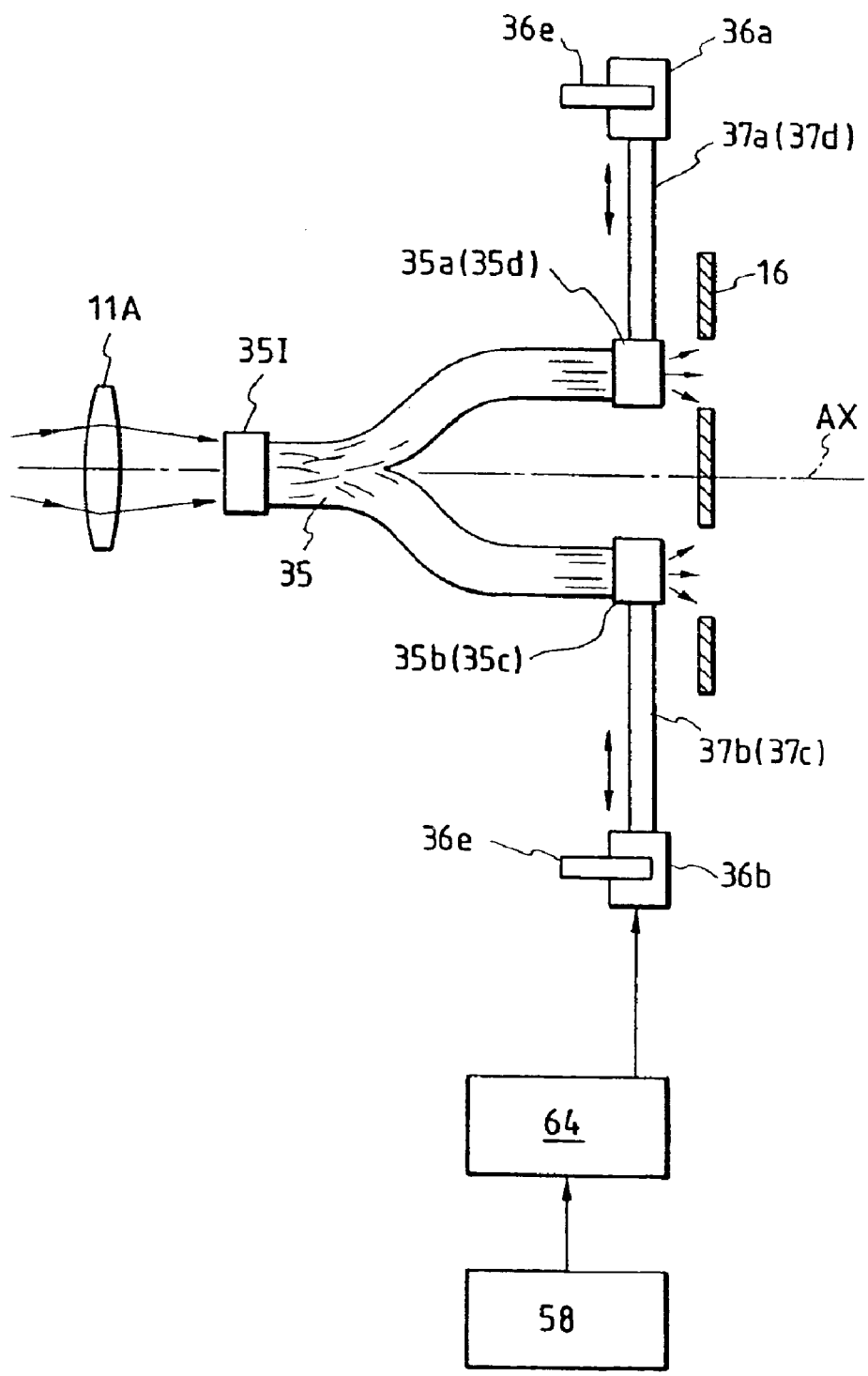

The luminous flux distributing member may involve the use of a waveguide member such as optical fibers and the like. FIG. 12 is a schematic diagram in a case where an optical fiber bundle 35 is used as a luminous flux distributing member. The configurations towards the light source from the relay lens 11A and towards the reticle from the spatial filter 16 are the same as those shown in FIG. 1. The illumination light emerging from the light source and penetrating the relay lens 11A is incident via an incident portion 351 on the optical fiber bundle 35 while being adjusted to a predetermined numerical aperture (NA). The illumination luminous fluxes incident via the incident portion 351 on the optical fiber bundle 35 are split into a plurality of luminous fluxes and exit a plurality of exit portions 35a, 35b. The plurality of exit portions 35a, 35b are provided in positions eccentric from the optical axis AX on the Fourier transform plane (pupil plane of the illumination optical system) 50. Only the luminous fluxes which exit only the exit portions 35a, 35b are formed in close proximity to the Fourier transform plane.

It is therefore possible to form an arbitrary distribution of the illumination light quantity in the vicinity of the Fourier transform plane even by using the optical fiber bundle 35 as in the same way with the above-mentioned diffraction grating pattern plate 12.

At this time, lenses (e.g., field lenses) may be interposed between the exit portions 35a, 35b of the optical fiber bundle 35 and the spatial filter 16.

As discussed above, the incident angles of the illumination light falling on the reticle 27 and the reticle patterns 28 are determined by the positions (eccentric from the optical axis AX) of the exit portions 35a, 35b within the plane vertical to the optical axis AX. For this reason, the exit portions 35a, 35b are independently movable with the aid of movable members 36a, 36b for adjusting the positions of the exit portions 35a, 35b within the Fourier transform surface.

Figure 13:
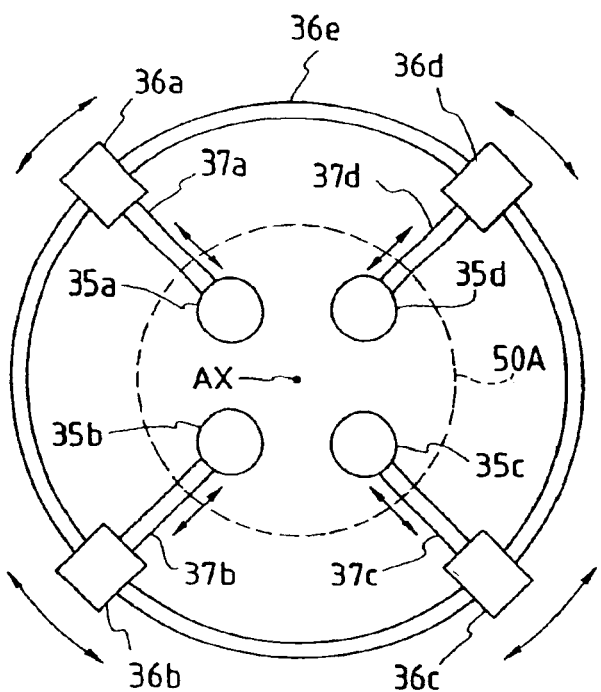
FIG. 13 is a view of a drive unit for the luminous flux distributing member of FIG. 12.

Next, an embodiment of the movable portions movable on the fiber exit portions will be explained with reference to FIGS. 12 and 13. FIG. 12 is a sectional view, as in FIG. 1, taken substantially in the direction vertical to the optical axis. FIG. 13 is a plan view taken substantially in the optical-axis direction.

Employed herein are four fiber exit portions 35a, 35b, 35c, 35d as a means for creating an arbitrary light quantity distribution on the Fourier transform plane 50. The respective fiber exit portions are in discrete positions eccentric from the optical axis AX and are disposed at substantially equal distances from the optical axis AX. Turning to FIGS. 12 and 13, the fiber exit portions 35a, 35b, 35c, 35d are stretchable and contractible in the direction perpendicular to the optical axis by means of drive elements such as motors and gears which are incorporated into the movable members 36a, 36b, 36c, 36d through support bars 37a, 37b, 37c, 37d. The movable members 36a, 36b, 36c, 36d themselves are also movable in the circumferential direction about the optical axis along a fixed guide 36e. Therefore, the individual fiber exit portions 35a, 35b, 35c, 35d are independently movable in the intra-plane direction vertical to the optical axis. Namely, these exit portions are independently movable to arbitrary positions (so as not to overlap with each other). The respective positions (within the plane vertical to the optical axis AX) of the fiber exit portions 35a, 35b, 35c, 35d shown in FIGS. 12 and 13 are changed preferably in accordance with the reticle patterns to be transferred. Exit surfaces of the exit portions 35a, 35b may be formed with the light scattering members such as diffusion plates and with aperture spots for regulating the apertures.

The luminous flux distributing member may be replaced with the spatial filter 16 provided in the vicinity of the Fourier transform plane. In this case, however, a loss of the light quantity increases.

Note that the foregoing luminous flux distributing means (such as the optical fibers and the beam splitter) depicted in FIGS. 9 through 12 are all intended to prepare the light quantity distribution in close proximity to the Fourier transform plane of the reticle patterns. The positions (conjugate relation) of the exit portions of the luminous distributing means may be arbitrarily set.

Given is a case where the plural beams of illumination light come from the luminous flux distributing member. However, one luminous flux may be incident on the position eccentric by a predetermined quantity from the optical axis AX on the Fourier transform plane. For instance, one luminous flux may fall on the Fourier transform plane 50 by providing one exit portion of the fiber 35 shown in FIG. 12.

Now, the incident positions of the luminous flux distributing member onto the Fourier transform plane are determined (changed) preferably according to the reticle patterns to be transferred. A method of determining the positions in this case is that, as explained referring to FIG. 40, the incident position (incident angle Φ) of the illumination luminous fluxes from the exit portions to the reticle patterns may be set to obtain the effects of improving the resolving power and focal depth which are optimal to the degree of fineness (pitch) of the patterns to be transferred.

By exemplifying a case where the optical fibers are used herein as a luminous flux transform member, there will be next explained a concrete example of determining the position (gravity position of the light quantity distribution created by one luminous flux incident on the Fourier transform plane) of the luminous flux passing above the Fourier transform plane. The explanation will be given with reference to FIGS. 15A through 15D. FIGS. 15A to 15D are diagrams schematically illustrating the exit surfaces of the elements from the exit portions 35$a$, 35$b$ to the reticle patterns 28. The exit surfaces coincide with the Fourier transform plane 50. At this time, the lenses or a lens group for bringing both of them into a Fourier transform relation are expressed in the form of a single lens 26 FIG. 54. Further, it is assumed that f is the distances from the principal point on the side of the fly eye lens to the exit surface and from the principal point on the side of the reticle of the lens 26 to the reticle patterns 28.

Figure 15A:
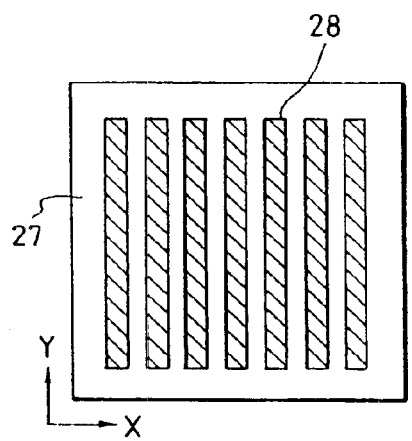
FIGS. 15A and 15C are plan views showing one example of the reticle patterns formed on the mask.
Figure 15C:
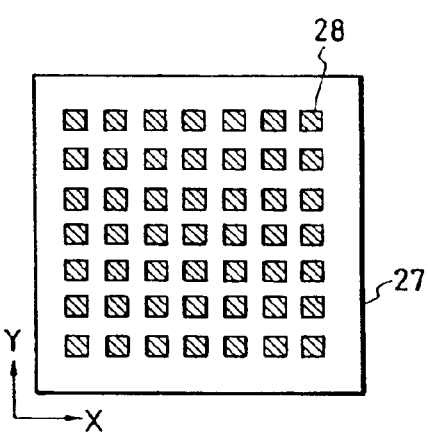
Figure 15B:
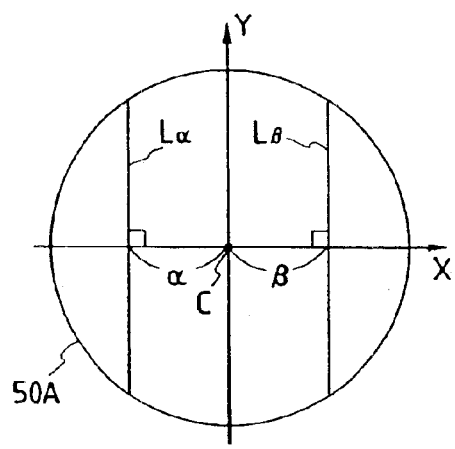
FIGS. 15B and 15D are views of assistance in explaining the placement of respective exit portions (surface illuminant image) on the Fourier transform surface for the reticle patterns corresponding to FIGS. 15A and 15C, respectively.
Figure 15D:
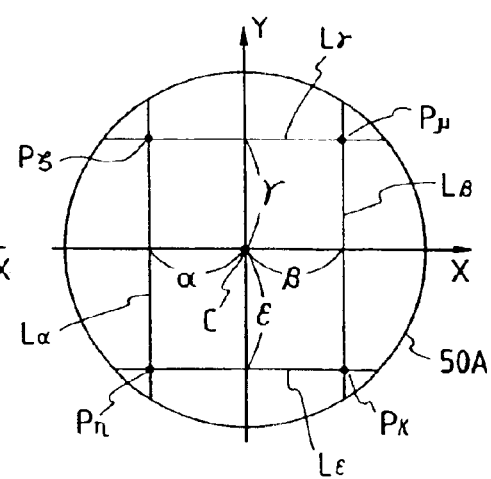

FIGS. 15A and 15C are diagrams each showing an example of some patterns formed in the reticle patterns 28. FIG. 15B illustrates the central position (the optimum position of a peak value of the light quantity distribution on the Fourier transform plane) on the Fourier transform plane (or the pupil plane of the projection optical system) which is optimal to the reticle patterns of FIG. 15A. FIG. 15D is a diagram illustrating the central position (gravity position of the light quantity distribution created by one luminous flux incident on the Fourier transform plane) of the exit portions optimal to the reticle patterns of FIG. 15C. FIG. 15A depicts so-called one-dimensional line-and-space patterns wherein the transmissive portions and light shielding portions are arranged with equal widths to assume a striped configuration in the direction Y and also regularly arranged at pitches P in the direction X. At this time, the central position of one exit portion (surface illuminant) is, as illustrated in FIG. 15B, in an arbitrary position on a line segment L$\alpha$ or L$\beta$ in the direction Y which is presumed within the Fourier transform plane. FIG. 15B is a diagram showing a Fourier transform plane 50A associated with the reticle patterns 28 which is viewed substantially in the optical-axis direction AX. Coordinate systems X, Y within the Fourier transform plane 50A are identical with those in FIG. 15, wherein the reticle patterns 28 are observed in the same direction. Now, the distances $\alpha,\beta$ from the center C through which the optical axis AX passes to the respective line segments L$\alpha$, L$\beta$ have a relation such as $\alpha=\beta$. These distances are equal such as: $\alpha=\beta=f\cdot(\frac{1}{2})\cdot(\lambda/P)$, where $\lambda$ is the exposure wavelength. When the distances $\alpha,\beta$ are expressed as $f\cdot\sin\Phi$, $\sin\Phi=\lambda/2P$. This is identical with the numerical value explained in FIG. 40. Hence, the plurality of exit portions are provided, and the respective central positions of the individual exit portions are on the line segments L$\alpha$., L$\beta$. On this assumption, it follows that the two diffracted light components i.e., the 0th-order diffracted light component generated from the illumination light coming from the respective exit portions and any one of the (+) primary diffracted light components pass through the position having almost equal distances from the optical axis AX on the pupil plane 51 of the projection optical system with respect to the line-and-space patterns. Therefore, as discussed above, the focal depth with respect to the line-and-space patterns (FIG. 15A) can be maximized, and the high resolving power is also obtainable. Note that one exit portion (surface illuminant) to be formed on the line segments L$\alpha$, L$\beta$ may suffice if a positional deviation concomitant with the defocus of the wafer 30 is ignored.

Next, FIG. 15C shows a case where the reticle patterns are so-called isolated spatial patterns, wherein Px is the X-directional (crosswise) pitch of the patterns, and Py is the Y-directional (vertical) pitch thereof. FIG. 15D is a diagram illustrating the optimum position of the exit portion in that case. The positional/rotational relationship associated with FIG. 15C are the same as those of FIGS. 15A and 15B. As seen in FIG. 15C, when the illumination light falls on the two-dimensional patterns, the diffracted light components are generated in the two-dimensional directions corresponding to periodicity (X:Px, Y:Py) in the two-dimensional directions of the patterns. Even in the two-dimensional patterns shown in FIG. 15C, if the 0th-order diffracted light component and any one of the (±) primary diffracted light components in the diffracted light have almost equal distances from the optical axis AX on the projection optical system pupil plane 51, the focal depth can be maximized. In the patterns of FIG. 15C, the X-directional pitch is Px. Therefore, as shown in FIG. 15, if the centers of the respective exit portions are on the line segments L$\alpha$, L$\beta$ defined such as $\alpha=\beta=f\cdot(\frac{1}{2})\cdot(\lambda/Px)$, the focal depth can be maximized with respect to the X-directional elements of the patterns. Similarly, if the centers of the respective exit portions are on line segments L$\gamma$, L$\epsilon$ defined such as $\gamma=\epsilon=f\cdot\frac{1}{2}\cdot(\lambda/Py)$, the focal depth can be maximized with respect to the Y-directional elements of the patterns.

When the illumination luminous fluxes corresponding to the exit portions disposed in the respective positions shown thus in FIGS. 15B and 15D are incident on the reticle patterns 28, the 0th-order diffracted light component Do and any one of a (+) primary diffracted light component Dp and a (−) primary diffracted light component Dm pass through the light paths having the equal distances from optical axis AX on the pupil plane 51 within the projection optical system 29. Consequently, as stated in conjunction with FIG. 4, it is possible to actualize a projection type exposure apparatus with a high resolving power and a large focal depth. Only two examples of the reticle patterns 28 shown in FIGS. 15A and 15B have been considered so far. Even in other patterns, however, the attention is paid to the periodicity (degree of fineness) thereof. The respective exit portions may be disposed in such positions that two luminous fluxes i.e., the 0th-order diffracted light component and any one of the (+) primary diffracted light component and the (−) primary diffracted light component travel through the light paths having the substantially equal distances from the optical axis AX on the pupil plane 51 within the projection optical system. Provided in the pattern examples of FIGS. 15A and 15C are the patterns having a ratio (duty ratio), 1:1, of the line portion to the spatial portions. Consequently, (±) primary diffracted light components become intensive in the diffracted light generated. For this reason, the emphasis is placed on the positional relation between one of the (±) primary diffracted light components and the 0th-order diffracted light component. In the case of being different from the duty ratio of 1:1, however, the positional relation between other diffracted light components, e.g., one of (±) secondary diffracted light components and the 0th-order diffracted light component may be set to give the substantially equal distances from the optical axis AX on the projection optical system.

If the reticle patterns 28, as seen in FIG. 15D, contain the two-dimensional periodic patterns, and regarding one specific 0th-order diffracted light component, there probably exist higher-order diffracted light components including the primary diffracted light components of which the order is higher than the 0th-order diffracted light component, which are distributed in the X-direction (the first direction) and in the Y-direction (the second direction) about the single 0th-order diffracted light component on the pupil plane 51 of the projection optical system. Supposing that the image of the two-dimensional patterns is formed well with respect to one specific 0th-order diffracted light component, the position of the specific 0th-order diffracted light component may be adjusted so that three light components i.e., one of the higher-order diffracted light components distributed in the first direction, one of the higher-order diffracted light components and one specific 0th-order diffracted light component are distributed at the substantially equal distances from the optical axis AX on the pupil plane 51 of the projection optical system. For instance, the central position of the exit portion in FIG. 15D is arranged to coincide with any one of points Pξ, Pη, PK, Pμ. The points Pξ, Pη, PK, Pμ are all intersections of the line segment Lα or Lβ (the optimum position to the X-directional periodicity, i.e., the position in which the 0th-order diffracted light component and one of the (±) primary diffracted light components in the X-direction have the substantially equal distances from the optical axis on the pupil plane 51 of the projection optical system) and line segments, Lγ, Lε (the optimum positions to the Y-direction periodicity). Therefore, those positions are the light source positions optimal to either the pattern direction X or the pattern direction Y.

Presumed in the above-described arrangement are the patterns as two-dimensional patterns having the two-dimensional directivities at the same place on the reticle. The aforementioned method is applicable to a case where a plurality of patterns having different directivities exist in different positions in the same reticle patterns.

Where the patterns on the reticle have the plurality of directivities and degrees of fineness, the optimum position of the secondary illuminant image, as explained earlier, corresponds to the respective directivities and degrees of fineness of the patterns. Alternatively, however, the secondary illuminant image may be in the averaged position of the respective optimum positions. Besides, this averaged position may also undergo load averaging in which a weight corresponding to the significance and degree of fineness of the pattern is added.

One of or a plurality of luminous fluxes with which the reticle 27 is irradiated are incident on the reticle 27 with an inclination to the optical axis AX of the projection optical system 29. At this time, if the direction of the light quantity gravity of those illumination luminous fluxes is inclined to the optical axis AX, there arises such a problem that the position of a transferred image shifts in the intra-wafer-surface direction during minute defocusing of the wafer 30. To prevent this problem, the direction of the light quantity gravity of the illumination luminous fluxes distributed on the Fourier transform plane is made perpendicular to the reticle patterns 28, i.e., parallel to the optical axis AX. For example, where the optical fibers are employed as a luminous flux transform member, the arrangement is effected to make zero a vector sum (integration) of a product of the exit portion's position (positional vector within the Fourier transform plane from the optical axis AX of the gravity of the light quantity distribution created by the exit portions) and the transmission light quantity. Note that when using the diffraction grating pattern plate 12 as a member for forming the light quantity distribution on the Fourier transform plane, this condition is automatically satisfied. The following is a definite example of the above-mentioned distribution of the illumination light quantity. The number of luminous fluxes is set to 2 m (m is the natural number), and positions of the m-number luminous fluxes are arbitrarily set, while positions of remaining m-numbered luminous fluxes may be set in symmetry with respect to the optical axis AX and the former m-numbered luminous fluxes as well.

Besides, the exit surfaces of the exit portions 35*a*, 35*b* may be formed with aperture stops for regulating the apertures and with light scattering members such as diffusion plates, etc.

The number of the plurality of the exit portions is not limited to 4 but may be arbitrarily set corresponding to the reticle patterns 28. For instance, three exit portions are available. The center of a single secondary illuminant image formed by one exit portion is set in the position eccentric by a quantity corresponding to the reticle patterns 28 from the optical axis AX. The secondary illuminant image may be changed depending on the time.

In addition, if necessary, the reticle 27 may be arranged so as not to undergo an irradiation of the illumination light from a specific one of the exit portions. For example, supposing that a broken line circle 50A in FIG. 13 is formed corresponding to a size of the pupil plane 51 of the projection optical system 29, the light shielding member is provided outwardly of this broken line circle 50A in combination with the Fourier transform plane 50 (FIG. 1) of the illumination system. When the unnecessary exit portions retreat to this light shielding portion (outside the broken line circle 50A of FIG. 13), it is possible to obtain a desired number of exit portions.

A diameter (numerical aperture of one beam of illumination light on the Fourier transform plane of the illumination system) of opening of each exit portion is preferably set so that a so-called σ-value (a ratio of the numerical aperture of the illumination optical system which is estimated in the projection optical system to the numerical aperture of the projection optical system) becomes approximately 0.1 to 0.3 per luminous flux. If the σ-value is 0.1 or under, the image fidelity declines, whereas if this value is 0.3 or above, the increasing effect of the focal depth is reduced.

Figure 16:
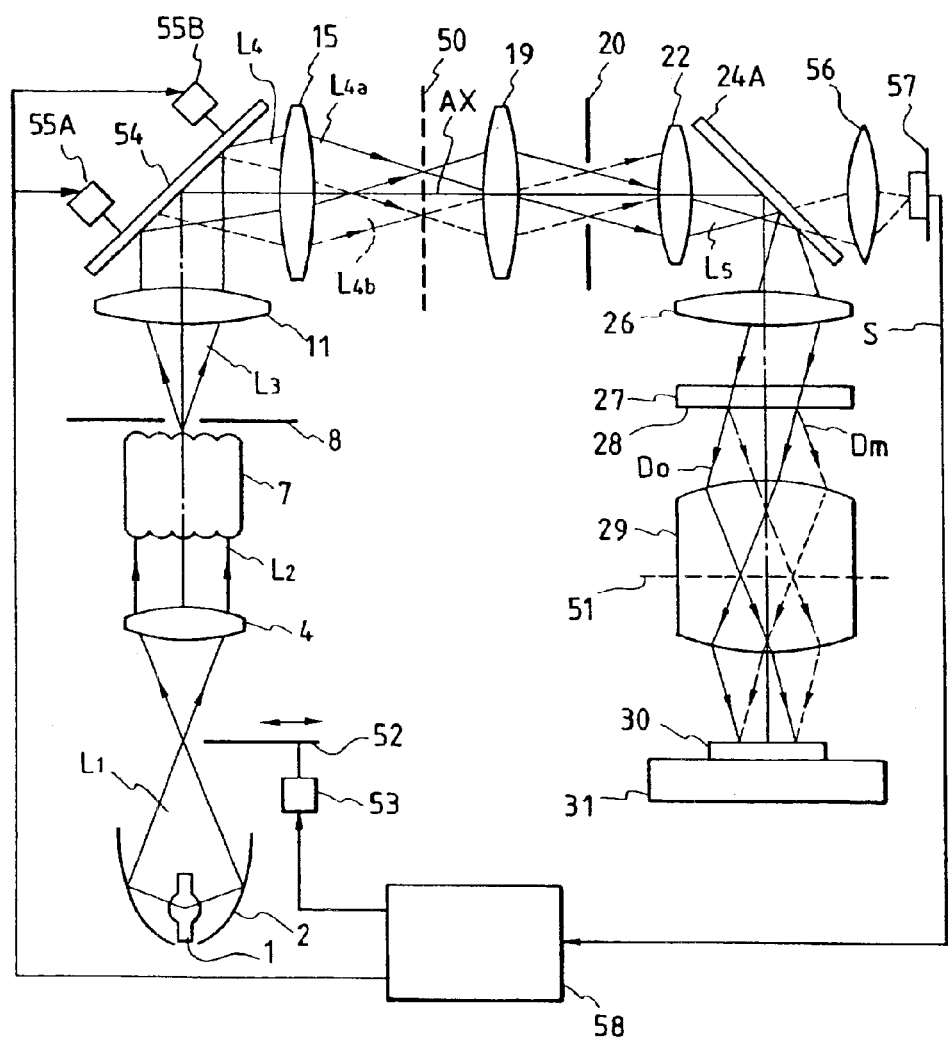
FIG. 16 is a view schematically illustrating a projection type exposure apparatus in a second embodiment of the present invention.

FIG. 16 is a diagram schematically illustrating a construction of the projection type exposure apparatus in accordance with a second embodiment of this invention. The principal configuration of the aligner is the same as that of FIG. 1. The same members as those in FIG. 1 are marked with the same reference numbers. In this embodiment, the means for forming an arbitrary light quantity distribution on the Fourier transform plane involves the use of a movable optical member such as a reflection mirror and the like in place of the luminous flux distributing member used in the first embodiment.

The lens system 4 is irradiated with a luminous flux L1 emitted from the light source 1 via the elliptical mirror 2. The luminous flux L1 is shaped into a substantially collimated luminous flux L2 by means of the lens system 4 and becomes a luminous flux L3 through the fly eye lens 7 and the aperture stop 8. A reflector 54 is irradiated with the luminous flux L3 via the lens system 11. A field stop 20 is irradiated with a luminous flux L5 reflected by the reflector 54 through lens systems 15, 19. Further, a half-mirror 24A is irradiated with a luminous flux L5 passing through the field stop 20 via a lens system 22. The luminous flux L5 reflected by the half-mirror 24A then falls on the reticle 27 at a predetermined incident angle through a lens system (principal condenser lens) 26. The configuration towards the wafer from the lens system 26 is the same as that of FIG. 1 (the first embodiment), and the description is therefore omitted. Note that the aperture stop 8 is a stop for determining a coherent factor σ of the illumination luminous flux as in the first embodiment.

On the other hand, the luminous flux penetrating the half-mirror 24A is condensed by a lens system 56 and undergoes a photoelectric conversion in a light quantity meter 57 such as a semiconductor sensor and the like. A light quantity signal S obtained from the light quantity meter 57 is transmitted as an electric signal to a control circuit 58. Based on the light quantity signal S, the control circuit 58 gives instructions to a shutter drive unit 53 for driving a shutter 52 and to drive elements 55A, 55B for driving the reflector 54. When the shutter drive unit 53 is operated, the luminous flux 2 is cut off by the shutter 52, thereby stopping the exposure. Note that this embodiment has a construction to control the shutter drive unit 53 and the drive elements 55A, 55B by use of the light quantity meter 57. The effects of the present invention are not varied by the arrangement that the control is performed simply in accordance with the exposure time without providing the light quantity meter 57.

Based on the construction given above, the incident surface of the fly eye lens 7, the field stop 20, the reticle patterns 28 (pattern surfaces) of the reticle 27 and the wafer 30 are conjugate to each other. Further, the exit surface of the fly eye lens 7, the Fourier transform plane 50 of the reticle 27 and the pupil plane 51 of the projection optical system 29 are also conjugate to each other.

Note that for making the illuminance on the reticle surface 27 homogeneous, the incident surface of the fly eye lens 7 is positioned to have an image forming relation with the reticle 27. On the other hand, the exit surface of the fly eye lens 7 is positioned corresponding to the Fourier transform plane (pupil plane) with the reticle patterns 28 of the reticle 27 serving as object surfaces.

The reflector 54 is, as described above, in the position substantially conjugate to the reticle 27 and rotatable about two axes orthogonal to each other on, e.g., a reflecting surface. the reflector 54 is rotated by the drive elements 55A, 55B such as motors, piezoelements and the like.

In FIG. 16, the reflected light L5 is shown by a solid line. The reflected luminous flux L5 is allowed to travel in the direction of, e.g., a luminous flux L4 by changing a rotary angle of the reflector 54. That is, one secondary illuminant image at the exit end of the fly eye lens 7 is shifted on the Fourier transform plane 50. It is also, as a matter of course, possible to provide a component movable in the direction perpendicular to the sheet of FIG. 16.

In the thus constructed exposure apparatus, the reflector 54 is driven by the drive elements 55A, 55B and set in predetermined positions. Thereupon, the luminous flux L3 whose principal beam is coaxial with the optical axis AX of the illumination optical system is changed into luminous fluxes L5, L4 whose principal beams are inclined to the optical axis AX. These luminous fluxes L5, L4 are condensed respectively in positions different from the optical axis AX in the vicinity of the Fourier transform plane 50 of the reticle 27. For this reason, a luminous flux L5 with which the reticle 27 is irradiated is obliquely incident on the reticle 27. As explained in FIG. 40, the high resolving power and the large focal depth are attainable. Turning to FIG. 16 supposing that an illumination luminous flux L5 for illuminating the reticle 27 is always incident on the reticle 27 at a constant incident angle, however, the light quantity gravity (in other words, the principal beam of the luminous flux L5) in the incident direction of the luminous flux L5 by which the image is formed on the wafer 30 comes to assume a slant state (non-telecentric state) to the wafer 30. Namely, it may happen that the image position deviates sideways within the wafer surface with a minute deviation (defocus) of the wafer 30 in the direction of the optical axis AX. Taken in this embodiment is such a measure for preventing this lateral deviation that the incident angle of the illumination luminous flux on the reticle 27 is changed by the reflector 54. Hence, after performing the illumination with a predetermined amount of exposure by use of the luminous flux L5 incident at a certain incident angle $\Phi$, the reflector 54 is moved. The illumination is effected this time to have the same amount of exposure as the above-mentioned by using the luminous flux incident at an incident angle $-\Phi$. The lateral deviation of the light quantity gravity incident on the wafer from a normal line of the wafer surface is thereby offset with the exposure at incident angle $+\Phi$ and the exposure at the incident angle $-\Phi$ The projection type exposure apparatus in this embodiment is provided with the light quantity meter 57 for measuring the quantity of light with which the reticle is irradiated. It is therefore feasible to easily make constant the exposure quantity at the incident angle $-\Phi$ and the exposure quantity at the incident angle $-\Phi$ and further equalize these values. Even in the case of controlling the exposure time instead of providing the light quantity meter, it is similarly possible to make the respective exposure quantities constant and equalize these values. An arbitrary light quantity distribution on the Fourier transform plane 50 can be formed in this manner by use of the movable reflector.

In accordance with this embodiment, the reflector 54 defined as a movable optical member existing in the position substantially conjugate to the reticle 27 is moved. It can be therefore considered that if the field stop 20 is disposed closer to the light source than the reflector 54, a positional relation between the reticle 27 and the field stop 20, though small, deviates with the movement of the reflector 54. Hence, the field stop 20 is desirably is placed closer to the reticle 27 than the reflector 54.

If there is an insufficient compensation of chromatic aberration of the optical elements in the projection optical system 29 and the illumination optical system (from the lens system 26 to the light source 1 in the Figure), a wavelength selecting element such as a band-pass filter is used in the illumination luminous flux, e.g., the luminous flux L2. Alternatively, the reflection member such as the elliptical mirror 2 may involve the use of a multilayer dielectric mirror to enhance a reflectivity of only the specific wavelength.

It is to be noted that even in the case of transferring circuit patterns by the projection type exposure apparatus in this embodiment, as in the first embodiment, the ratio, i.e., a so-called coherent factor σ, of the numerical aperture of the illumination luminous flux to the numerical aperture on the part of the photo mask of the projection optical system is preferably 0.1 to 0.3. Hence, the fly eye lens 7 and the aperture stop 8 are set so that σ=0.1 to 0.3.

Figure 17:
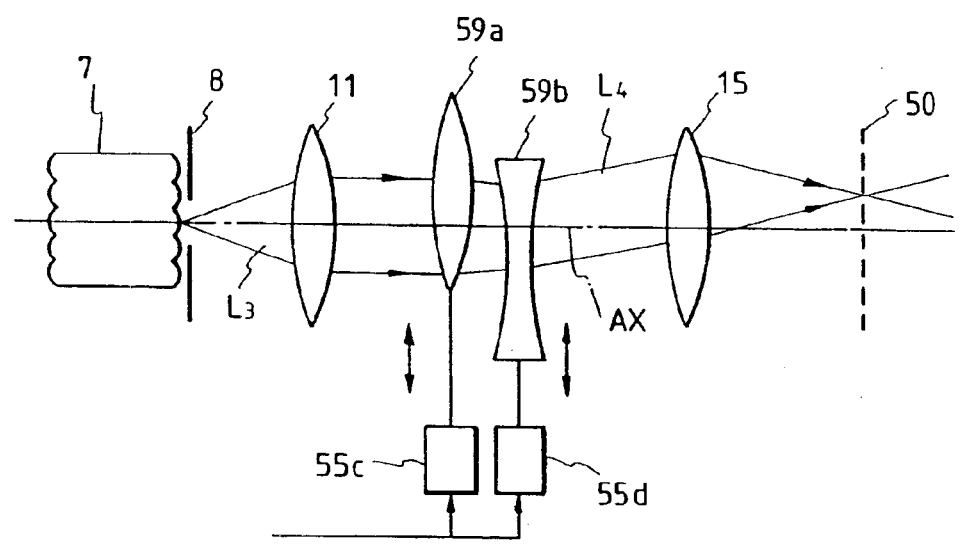
FIGS. 17 and 18 are views showing a variant form of the movable optical member according to the present invention.

FIG. 17 is a diagram depicting a configuration of a variant form 1 of the projection type exposure apparatus in this embodiment. This variant form employs a lens system as a movable optical member. However, the constructions toward the light source from the fly eye lens 7 and toward the reticle from the Fourier transform plane (pupil plane of the illumination optical system) 50 are the same as those in FIG. 16, and the description is therefore omitted. The luminous flux emerging from the fly eye lens falls on a lens system 59a having a positive power via the lens system 11 on a lens system 59b having a negative power. The lens systems 59a, 59b are disposed in close proximity to the surface conjugate to the reticle 27. A sum of the powers of the lens systems 59a, 59b becomes 0. The lens systems 59a, 59b are movable respectively by the lens drive members 55c, 55d within the surface vertical to the optical axis AX.

The luminous flux penetrating the lens systems 59a, 59b movably by the drive members 55c, 55d becomes a luminous flux having the principal beam different from the optical axis AX of the illumination optical system. The luminous flux is condensed in a position different from the optical axis AX on the Fourier transform surface 50.

Referring to FIG. 17, the lens systems 59a, 59b are moved almost an equal distance in opposite directions perpendicular to the optical axis. As a result, the luminous flux penetrating the lens systems 59a, 59b is incident on the lens system 15 at a given angle inclined to the optical axis AX. If the positions of the glens systems 59a, 59b are changed by the lens drive members 55c, 55d, the luminous flux exited can be oriented in an arbitrary direction. Note that the lens drive members 55c, 55d are controlled by a control circuit 58.

A new lens system having a positive power is disposed closer to the reticle 27 than the lens system 59b and movably by the lens drive member. Further, a total of powers of the lens systems 59a, 59b and of the newly added lens system having the positive power may be arranged to be 0. Similarly, a lens system having a negative power is disposed closer to the light source than the lens system 59a. A total of powers of the lens systems 59a, 59b and of the newly added lens system having the negative power may be also arranged to be 0. Note that the arrangement of the lens system in which position is variable is not limited to only the combinations given above. A permissible arrangement is that the lens group composed of a plurality of lens elements has a power total of 0, and the illumination luminous flux can be oriented in an arbitrary direction by moving the respective lens elements. The lens elements to be driven are not specified. Similarly, the lens elements capable of orienting the illumination luminous flux in an arbitrary direction are satisfactory.

Figure 18:
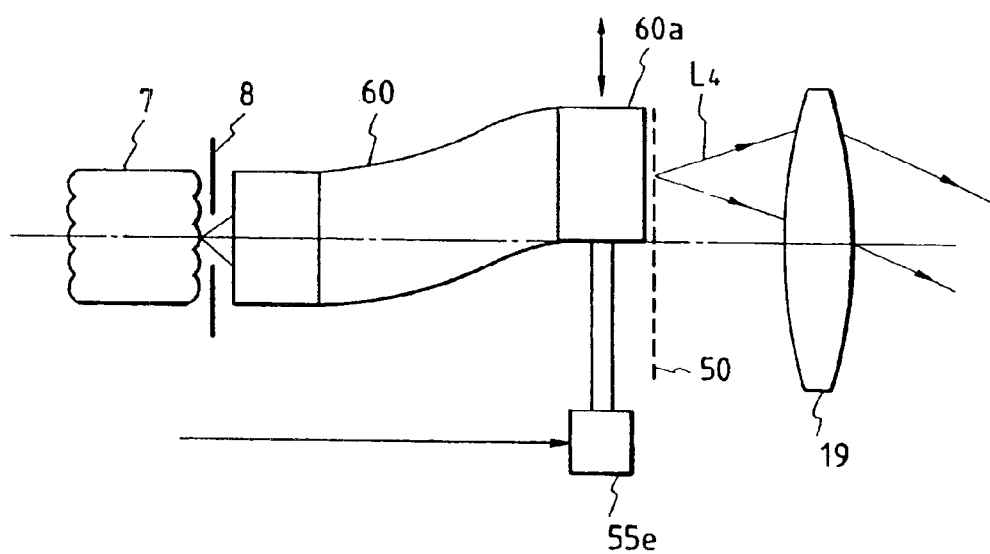

FIG. 18 is a diagram schematically illustrating a second variant form of the projection type exposure apparatus in this embodiment. In this variant form, the movable optical element involves the use of a photo transmitting means such as fibers. An arbitrary light quantity distribution is formed on the Fourier transform plane. However, the constructions toward the light source from the fly eye lens 7 and toward the reticle from the lens system 19 are the same as those in FIG. 16, and the description is therefore omitted. The Fourier transform plane 50 is linked via the photo transmitting means such as optical fibers 60 to the exit side of the fly eye lens 7. Hence, the exit surface of the fly eye lens 7 corresponds to the Fourier transform plane 50. The exit side of the optical fibers 60, i.e., the portion on the side of the Fourier transform plane 50, is movable by a drive member 55e. The illumination luminous flux (illuminant image) can be thereby distributed in arbitrary positions within the Fourier transform plane 50. The drive member 55e is, as in the same way with the variant form 1 of this embodiment, controlled by the control circuit 58.

Next, an exposure method by use of the exposure apparatus in the second embodiment will be described with reference to FIGS. 19A and 19B.

FIGS. 19A and 19B are flowcharts each showing the exposure method in the embodiment of this invention. A difference between FIGS. 19A and 19B lies in whether the exposure is stopped or not when driving the reflector 54. In advance of the exposure, the shutter 52 is in such a status as to cut off the luminous flux L2. Determined herein are the number of positional changes of the reflector 54, coordinates of the respective positions of the reflector and exposure quantities for the respective coordinates (step 101). As stated before, however, if a so-called light quantity gravity of the illumination light when the luminous flux L5 corresponding to each position of the reflector 54 falls on the reticle 27 deviates from the optical axes AX of the illumination optical system and the projection optical system 29, there exists a possibility of causing a lateral deviation of the transferred image due to a very small defocus of the wafer 30. It is thus required to determine the respective positions of the reflector 54 and the illumination light quantities (exposure quantities) for illumination according to the respective positions of the reflector 54 so that the light quantity gravity coincides with the optical axis AX. This may be accomplished by determining, when one pattern exposure is completed by effecting 2m-time (m is the natural number) exposing processes, the coordinates of the reflector 54 effecting the m-time exposures thereof. Further, the coordinates of the reflector effecting the remaining m-time exposures may be set in symmetry with respect to the optical axis AX and the incident luminous flux in a case where the incident luminous flux is associated with the former m-time exposures. Incidentally, a method of determining the coordinates of the reflector 54 which is performing the exposing processes at respective angles in a plurality of positions may be prescribed so that the light quantity distribution (positional coordinates of the luminous fluxes) on the Fourier transform plane 50 has the conditions explained in the first embodiment with reference to FIGS. 14 and 15. More specifically, the position of the reflector 54 may, when transferring the patterns depicted in FIG. 15A, be determined so that the center (principal beam) of the illumination luminous flux L5 or L4 reflected by the reflector 54 coincides on the line segment Lα or Lβ on the Fourier transform surface 50. When transferring the patterns shown in FIG. 15B, the central position of the illumination luminous flux reflected by the reflector 54 may be determined to coincide on the line segment Lα or Lβ and the line segment Lγ or Lε. The optimum position in this case includes four points pξ, pη, pκ, pμ.

Next, operating instructions are issued from the control circuit 58 to the drive members 55a, 55b, and the reflector 54 is set in a predetermined first position (step 102). The operator inputs the first position by means of an input unit incorporated into the control circuit 58. Alternatively, the control circuit 58 is allowed to determine the first position of the reflector 54 on the basis of the information on the circuit patterns 28 on the reticle 27, the information being inputted by the operator through the input unit. A necessary total exposure quantity E is likewise inputted by the operator through the input unit. The control circuit 58 is, even when being inputted by the operator, permitted to decide specific degrees of exposures which are effected in the respective positions of the reflector 54. As in the first embodiment, the information described above may be obtained-by reading the bar codes BC provided on the mask.

Subsequently, the action enters the actual exposing process. The reflector 54 is almost fixed in the first position previously determined. In this state, the control circuit 58 issues an instruction of "Open shutter" to the shutter drive unit 53. A shutter 52 is opened, and the exposure is started (step 103). The reticle is illuminated with the illumination luminous flux. Consequently, the reticle patterns 28 are transferred on the wafer 30. At this moment, some illumination luminous fluxes passing through the half-mirror 24A are received and converted photoelectrically by the light quantity meter 57. When an integrated value of the light quantity signal S thereof reaches a predetermined value, i.e., an exposure quantity corresponding to the previously determined first position (step 104), or just before reaching that value, the control circuit 58 gives the operating instructions to the drive members 55a, 55b. The position of the reflector 54 is thereby changed to a predetermined second position (step 105). Note that when the integrated value (integrated light quantity) of the light quantity signal S, as shown in FIG. 19B, reaches the predetermined value, the shutter 52 is temporarily stopped (step 105a). The reflector 54 is moved after stopping the exposure. The reflector 54 is substantially fixed in the predetermined position, and thereafter the shutter 52 is opened (step 105b). Then, the exposure may resume.

When the integrated value of the light quantity signal S comes to the predetermined value in the second position of the reflector 54 (step 106), or just before reaching this value, the reflector 54 is moved in the same manner as before. The reflector 54 is substantially fixed in a third position, and the exposure continues. At this time also, the shutter 52 is temporarily closed as in the previous case, and the exposure may be stopped.

Thereafter, the position of the reflector 54 is likewise changed to m-numbered positions, thus performing the exposures. When the integrated value of the light quantity signal S somes to the preset total exposure quantity E in the m-th position of the reflector 54 (step 107), the shutter 52 is closed, thus completing the exposure.

Incidentally, where $E_1, E_2, \ldots, E_m$ ($\Sigma E_i = E$, $1 \leq i \leq m$) are the exposure quantities in the respective positions, the exposure in the first position is ended when the integrated value of the light quantity signal S reaches $E_1$ or just before reaching it. The exposure in the second position is ended when the integrated value reaches $(E_1+E_2)$ or just before reaching it. Namely, the exposure in the arbitrary n-th position among the exposures in the first through m-th positions comes to an end when the integrated value reaches $\Sigma E_i$ ($1 \leq i \leq n$).

Adopted is a method of stopping the exposure by closing the shutter 52 during a movement of the reflector 54. In this case, the integrated value is reset to 0 during a stoppage of the exposure. Thereafter, the exposure resumes, and when the integrated value of the light quantity signal S reaches the predetermined value En, the exposure in the arbitrary n-th position may be ended.

The exposures in accordance with the second embodiment of this invention are thus completed. Therefore, the wafer 30 is carried in parallel within the surface vertical to the optical axis AX by a wafer stage 31. The exposures may be newly effected in other exposure regions of the wafer 30. Besides, the exposures may be performed in the exposed region by replacing the reticle 27 while superposing other circuit patterns thereon. Note that when newly effecting the exposures in other positions of the wafer 30, the sequence of positions of the reflector 54 may be so reversed as to start with the m-th position and end up with the first position.

Based on the above-described exposure method, the reflector 54 is moved while making the exposure continue. In this case, the illumination light emerging from directions other than the predetermined one is incident on the reticle 27 during the movement of the reflector 54. This causes a possibility where the effects to obtain the foregoing high resolving power and large focal depth will decline. For preventing this, a space filter having transmissive portions only in predetermined positions is provided in the vicinity of the Fourier transform plane 50 between the lens systems 15, 19 shown in FIG. 16. In this spatial filter, the transmissive portions are formed in the predetermined positions eccentric from the optical axis AX on the Fourier transform plane 50, while the light shielding portions are formed in other positions. The predetermined positions of the transmissive portions are those through which the illumination luminous fluxes L5, L4 generated from the reflector 54 in the respective positions for obtaining the desired resolving power and focal depth pass above the Fourier transform plane 50. Diameters of the respective transmissive portions serve to determine σ-values of the individual illumination luminous fluxes. Hence, this diameter is optically equivalent to the aperture stop 8 on the surface of the exit side of the fly eye lens 7 which has been previously determined; viz., the diameter is set considering a relation in magnification between the surface (conjugate to the Fourier transform plane 50) on the exit side of the fly eye lens 7 and the Fourier transform plane 50. The diameter of the specific transmissive portion may be smaller than the above-mentioned (equivalent) diameter. Namely, the σ-value of the specific luminous flux among the luminous fluxes incident on the reticle 27 may be decreased.

A light scattering member such as a lemon skin filter and the like may be provided on the Fourier transform plane 50. This light scattering member is capable of making unsharp defects and dusts on the movable optical member. It is therefore possible to prevent the unevenness of illuminance on the reticle 27 which is caused by the dusts and defects. Note that an image forming relation between the reticle 27 and the movable optical member (reflector 54) becomes unsharp due to the light scattering member but does not exert any adverse influence on the effects of the present invention.

A third embodiment of the present invention will next be explained with reference to the drawings. In accordance with the first and second embodiment described above, the luminous flux transform member for forming an arbitrary light quantity distribution on the Fourier transform plane and the movable optical member are interposed between the reticle and the optical integrator of the fly eye lens or the like. In this embodiment, however, the luminous flux transform member and the movable optical member are interposed between the optical integrator and the light source, thereby improving the illuminance homogenizing effect.

Figure 20:
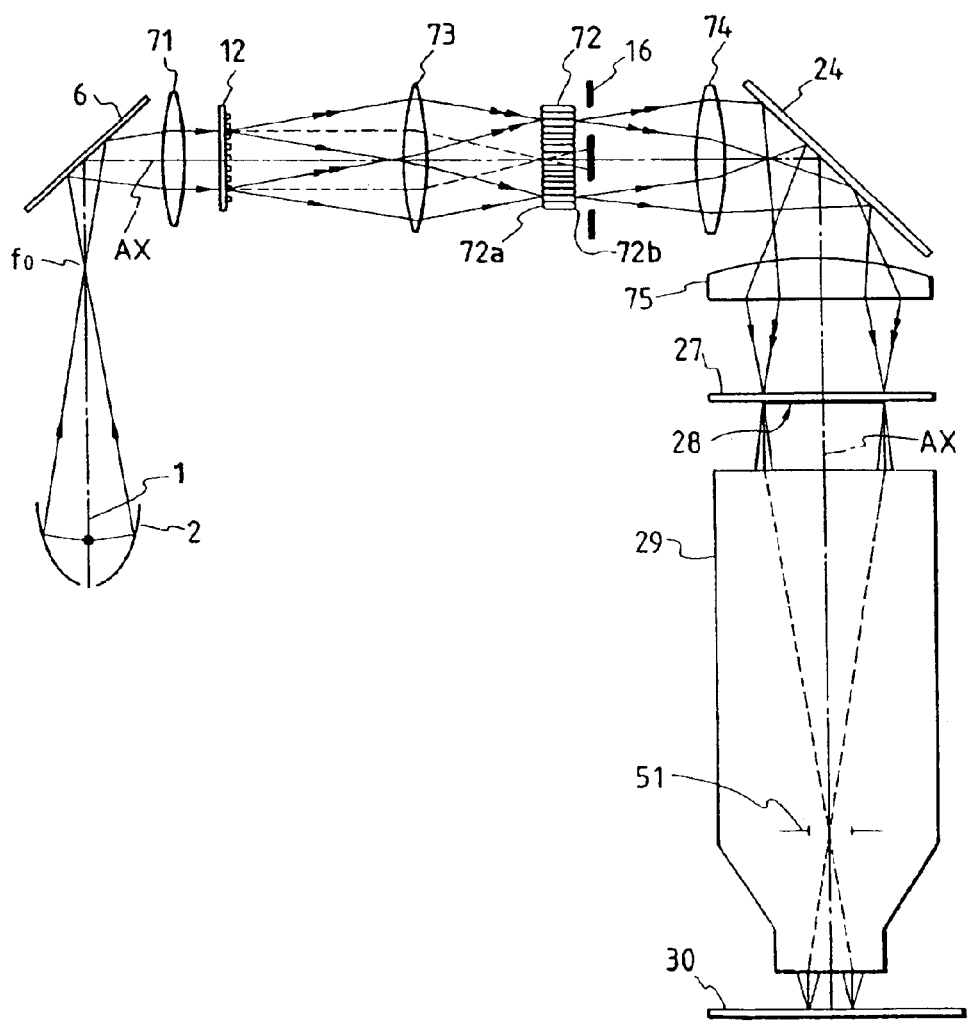
FIG. 20 is a view schematically illustrating a projection type exposure apparatus in a third embodiment of the present invention.

FIG. 20 illustrates an outline of a projection type exposure apparatus (stepper) suitable for the third embodiment of this invention. Provided is a diffraction grating pattern plate 12 as an optical member (a part of an input optical system of this invention) for concentrating the illumination light on a light-source-side focal surface 72a of a fly eye lens 72. Note that the same members as those in the first and second embodiments are marked with the like symbols.

The illumination luminous fluxes emerging from the mercury lamp 1 are condensed at a second focal point of the elliptical mirror 2. Thereafter, the diffraction grating pattern plate 12 is irradiated with the condensed luminous flux via a mirror 6 and a lens system 71 of a relay system. An illumination method at this time may be the Kohler illumination method or the critical illumination method. However, the critical illumination method is desirable in terms of obtaining a more intensive light quantity. The diffracted light generated from the diffraction grating pattern plate 12 is incident in concentration on the position eccentric from the optical axis AX of the light-source-side focal surface 72a (incident surface) of the fly eye lens 72 with the aid of the relay lens 73. It is herein assumed that the 0th-order and (±) primary diffracted light components are generated. At this moment, the light-source-side focal surface 72a of the fly eye lens 72 and the diffraction grating pattern plate 12 have substantially a Fourier transform relation through the relay lens 73. Note that the illumination light on the diffraction grating pattern plate 12 is illustrated as collimated luminous fluxes in FIG. 20, but they are actually divergent luminous fluxes. Hence, the luminous flux incident on the light-source-side focal surface 72a of the fly eye lens 72 has a certain magnitude (thickness). Correspondingly, the exit luminous flux from a reticle-side focal surface 72b of the fly eye lens 72 in accordance with the incident light flux on the light-source-side focal surface 72a also has a certain magnitude.

On the other hand, the reticle-side focal surface 72b of the fly eye lens 72 is so disposed as to be substantially coincident with the Fourier transform plane (pupil conjugate plane) of the reticle patterns 28.

The respective lens elements of the fly eye lens 72 depicted in FIG. 20 are double convex lens elements, shown therein is a case where the light-source-side focal surface 72a coincides with the incident surface, and the reticle-side focal surface 72b coincides with the exit surface. The lens elements of the fly eye lens do not strictly fulfill this relationship. Those lens elements may be plane-convex lens elements, convexo-plane lens elements or plane-concave lens elements. The fly eye lens is composed of one or more lens elements.

Note that the light-source-side focal surface 72a of the fly eye lens 72 and the reticle-side focal surface 72b have, as a matter of course, the Fourier transform relation. Hence, in the example of FIG. 1, the reticle-side focal surface 72b of the fly eye lens 72, i.e., the fly eye lens exit surface, has the image forming (conjugate) relation with the diffraction grating pattern plate 12.

Now, the reticle 27 is illuminated to have a homogeneous illuminating distribution with the luminous flux emerging from the reticle-side focal surface 72b of the fly eye lens 72 via condenser lenses 74, 75 and a mirror 24. In accordance with this embodiment, the spatial filter 16 composed of a metal plate or the like and bored with two openings corresponding to the (±) primary diffracted light components from the diffraction grating pattern plate 12 is disposed in the vicinity of the reticle-side focal surface 72b (exit side) of the fly eye lens 72. The 0th-order diffracted light component from the diffraction grating pattern plate 12 is thereby cut off. The illumination light with which the reticle patterns 28 are illuminated are therefore limited to the one having two secondary illuminant images in the positions eccentric from the optical axis AX on the reticle-side focal surface 72b of the fly eye lens 72. The diffraction grating pattern plate 12 is employed as an optical member for concentrating the illumination light on the light-source-side focal surface 72a of the fly eye lens 72. Formed are the two secondary illuminant images symmetric with respect to the optical axis AX. Hence, the illumination light with which the reticle patterns 28 are illuminated is limited to only the luminous fluxes having specific incident angles on the reticle patterns 28. As discussed above, the image of the diffraction grating pattern plate 12 is formed on the reticle-side focal surface 72b of the fly eye lens 72. The reticle-side focal surface 72b and the reticle pattern surfaces 28 have the Fourier transform surface relation. This eliminates such possibilities that the image of the diffraction grating pattern plate 12 itself is formed on the reticle 27 to deteriorate the illuminance homogeneity, and further there is produced the ununiformity due to dust and the defects of the diffraction grating pattern plate 12. Note that the spatial filter 16 is provided in close proximity to the light-source-side focal surface 72b of the fly eye lens 72, i.e., on the side of the exit surface of the fly eye lens 72; but this filter may be provided on the surface 72 a, i.e., on the side of the incident surface.

The diffracted light generated from the reticle patterns 28 on the thus illuminated reticle 27 is, as in the same way explained with reference to FIG. 40, condensed and image-formed by the telecentric projection optical system 29. The image of the reticle patterns 28 is transferred on the wafer 30.

Figure 21:
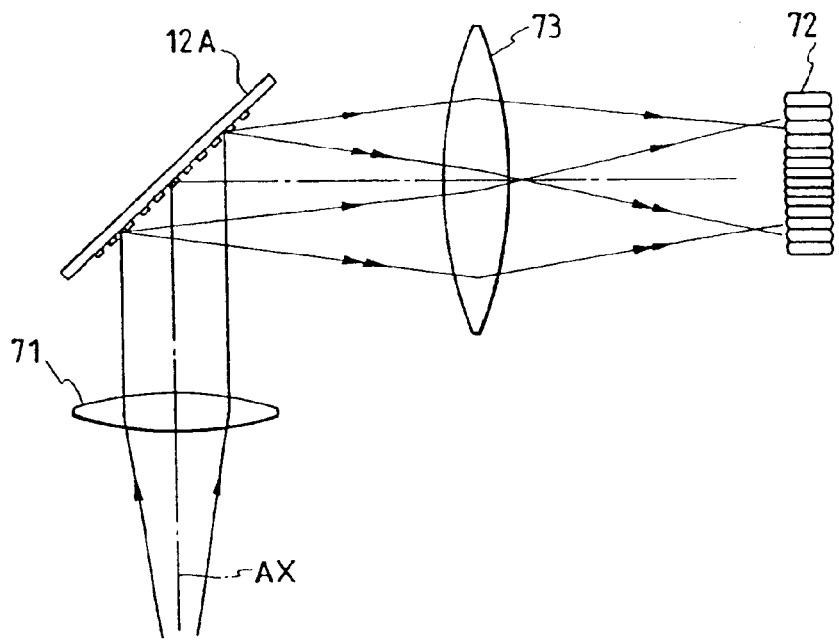
FIGS. 21, 22, 23, 24 and 25 are views each showing a part of an input optical system.

The diffraction grating pattern plate 12 may be not only the transmissive pattern plate similar to that in the first embodiment but also a reflective pattern plate. If the diffraction grating pattern plate 12 exhibits a reflective property, as illustrated in FIG. 21, a reflective diffraction grating pattern plate 12A is, as depicted in FIG. 8, illuminated with the illumination luminous flux from the relay lens 71. The diffracted light reflected and diffracted therein may be incident on the fly eye lens 72. The constructions toward the light source from the relay lens 71 and toward the reticle from the fly eye lens 72 are the same as those of FIG. 20. At this time, as in the first embodiment, the incident directions and incident angles of the illumination luminous fluxes (plural) incident on the reticle patterns 28 of the reticle 27 are determined depending on the reticle patterns 28. The incident directions and angles are arbitrarily adjustable by changing directivities and pitches of the diffraction grating pattern plates 12, 12A. For instance, diffraction grating plates 12, 12A, are replaced with those having different pitches, thereby making variable the illumination light incident on the light-source-side focal surface 72a of the fly eye lens 72 and further making variable a distance of the secondary illuminant image from the optical axis AX on the reticle-side focal surface 72b of the fly eye lens 72. It is therefore feasible to make variable the incident angle of the illumination light on the reticle patterns 28 of the reticle 27. As in the first embodiment, when the diffraction grating pattern plates 12, 12A are made rotatable (e.g., through 90°) in an arbitrary direction within the surface vertical to the optical axis AX, it is possible to correspond to the case where the pitch direction of the line-and-space patterns of the reticle patterns 28 is different from the directions x, y. Further, the relay lens 73 may come under a zoom lens system (such as an afocal zoom expander, etc.) consisting of a plurality of lens elements, and the condensing position can be varied by changing the focal distance. At this time, however, it is required to keep substantially the Fourier transform relation between the diffraction grating pattern plate 12 or 12A and the light-source-side focal surface 72a of the fly eye lens 72.

The optical member for concentrating the illumination light on the light-source-side focal surface 72a of the fly eye lens 72 described above is not limited to the diffraction grating pattern plate 12 or 12A.

Figure 22:
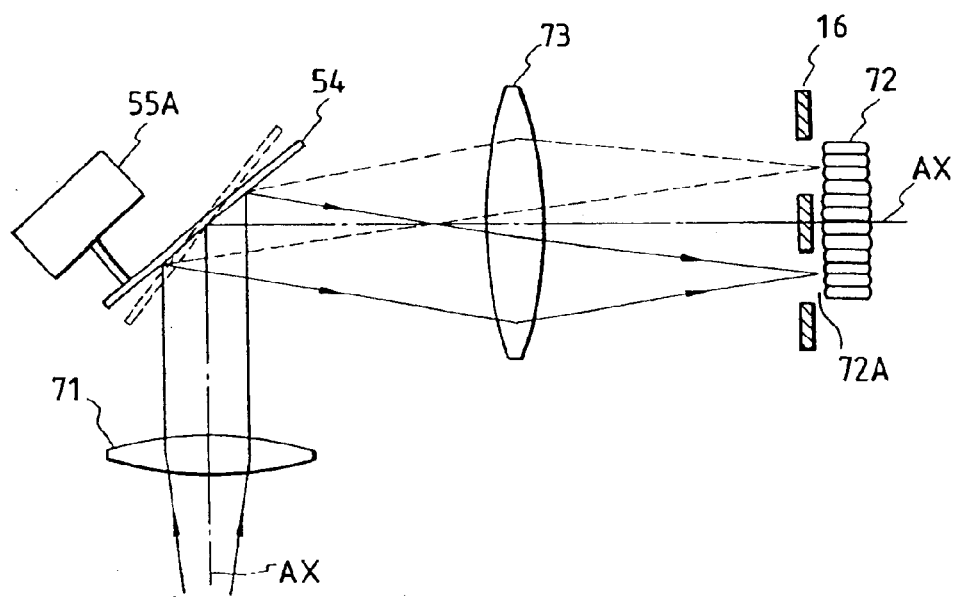

As depicted in FIG. 22, the movable optical member shown in the second embodiment, e.g., a movable plane mirror 54 is disposed instead of the reflective diffraction grating pattern plate 12A illustrated in FIG. 21. Provided also is a drive member 55a such as a motor for making the plane mirror 54 rotatable. The plane mirror 54 is rotated or oscillated by the drive member 55a. The illumination light is incident on the light-source-side focal surface 72a of the fly eye lens 72, whereby the secondary illuminant image of the reticle-side focal surface 72b of the fly eye lens 72 can be varied according to the time. If the plane mirror 54 is rotated to a plurality of proper angular positions during the exposing process, the secondary illuminant image of the reticle-side focal surface 72b of the fly eye lens 72 can be formed in arbitrary configurations. Note that when using this type of movable reflection mirror 54, the relay lens system 73 may be omitted. By the way, the spatial filter 16 depicted in FIG. 22 is provided on the side of the incident surface of the fly eye lens 72 but may be, as in the same way with FIG. 20, provided on the side of the exit surface.

The optical member for concentrating the illumination light on the light-source-side focal surface 72a of the fly eye lens 72 may involve the use of the beam splitter shown in FIG. 11, the optical fibers of FIGS. 12 and 19, the prism of FIG. 9, the plurality of mirrors of FIG. 10 and the optical member of FIG. 17.

Figure 23:
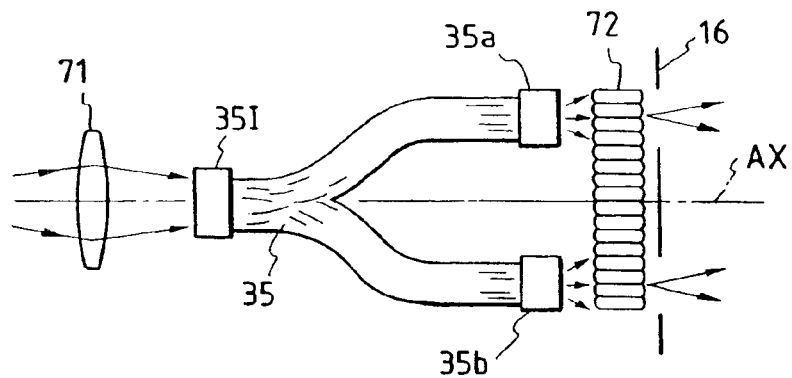

FIG. 23 is a schematic diagram wherein an optical fiber bundle 35 is employed. The constructions toward the light source from the relay lens 71 and toward the reticle from the fly eye lens 72 are the same as those shown in FIG. 20. Respective exit portions 35a, 35b of the optical fiber bundle 35 are disposed in positions corresponding to the reticle patterns 28 in the vicinity of the light-source-side focal surface 72a of the fly eye lens. At this time, lenses (e.g., field lenses) may be interposed between the respective exit portions 35a, 35b of the optical fiber bundle 35 and the fly eye lens 72. Further, there may be given the Fourier transform relation between the light-source-side focal surface 72a of the fly eye lens and the light exit surfaces of the optical fiber exit portions 35a, 35b owing to the lenses interposed therebetween. As in the first embodiment, the respective exit portions (or the lenses between the exit portions 35a, 35b and the fly eye lens 72) are made movable one-dimensionally or two-dimensionally within the surface perpendicular to the optical axis by means of the drive member such as a motor, etc. The illumination light incident on the light-source-side focal surface of the fly eye lens is thereby made variable. The secondary illuminant image on the reticle-side focal surface 72b of the fly eye lens is also made variable.

Figure 24:
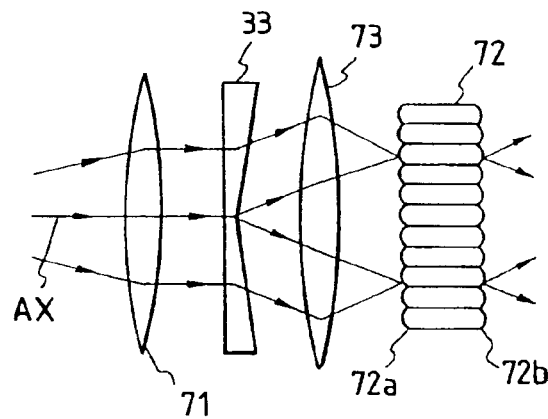

FIG. 24 shows an example of using a prism 33 having a plurality of refraction surfaces as an optical member for concentrating the illumination light on the light-source-side focal surface 72a of the fly eye lens 72. The illumination luminous fluxes can be incident on the light-source-side focal surface 72a of the fly eye lens 72 in accordance with refraction angles of the prism 33. The constructions toward the light source from the relay lens 71 and toward the reticle from the fly eye lens 72 are the same as those of FIG. 20. The incident position of the illumination luminous flux incident on the light-source-side focal surface 72a of the fly eye lens is made variable by replacing the prism 33. In place of the prism 33, a reflection mirror having differently-angled reflection surfaces is used and, as illustrated in FIG. 22, disposed, thereby eliminating the necessity for the drive member 55a. The device, as a matter of course, incorporates a function to exchange the prism and the like. When employing this type of prism also, the relay lens system 73 may be omitted.

Figure 25:
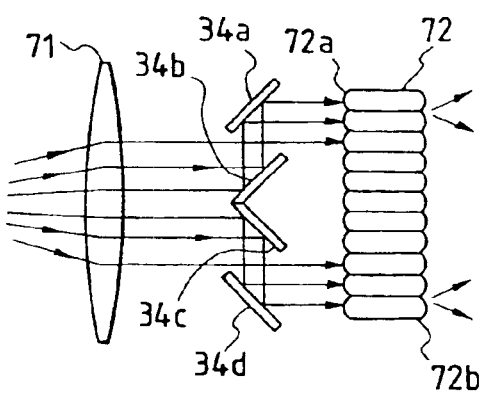

FIG. 25 shows an example where a plurality of mirrors 34a–34d are used as optical members for condensing the illumination light on the light-source-side focal surface 72a of the fly eye lens 72. The constructions toward the light source from the relay lens 71 and toward the reticle from the fly eye lens 72 are the same as those of FIG. 20. Provided in the respective mirrors 34a-34d are position adjusting mechanisms and mechanisms for adjusting an angle of rotation about the optical axis AX by which a illumination light quantity distribution on the light-source-side focal surface 72a of the fly eye lens 72 is made arbitrarily variable. Besides, the prism 33 may be combined with the movable plane mirror 54 or with the mirrors 34a–34d.

Further, the optical member for concentrating the illumination light on the light-source-side focal surface 72a of the fly eye lens 72 may be replaced with the spatial filter 16 provided in the vicinity of the light-source-side focal surface 72a of the fly eye lens. The components in the embodiments shown in FIGS. 20 through 25 may be combined with the spatial filter 16. At this time, the number of openings of the spatial filter 16 is not 1 but may be arbitrary numbers corresponding to the reticle patterns 28.

Figure 26:
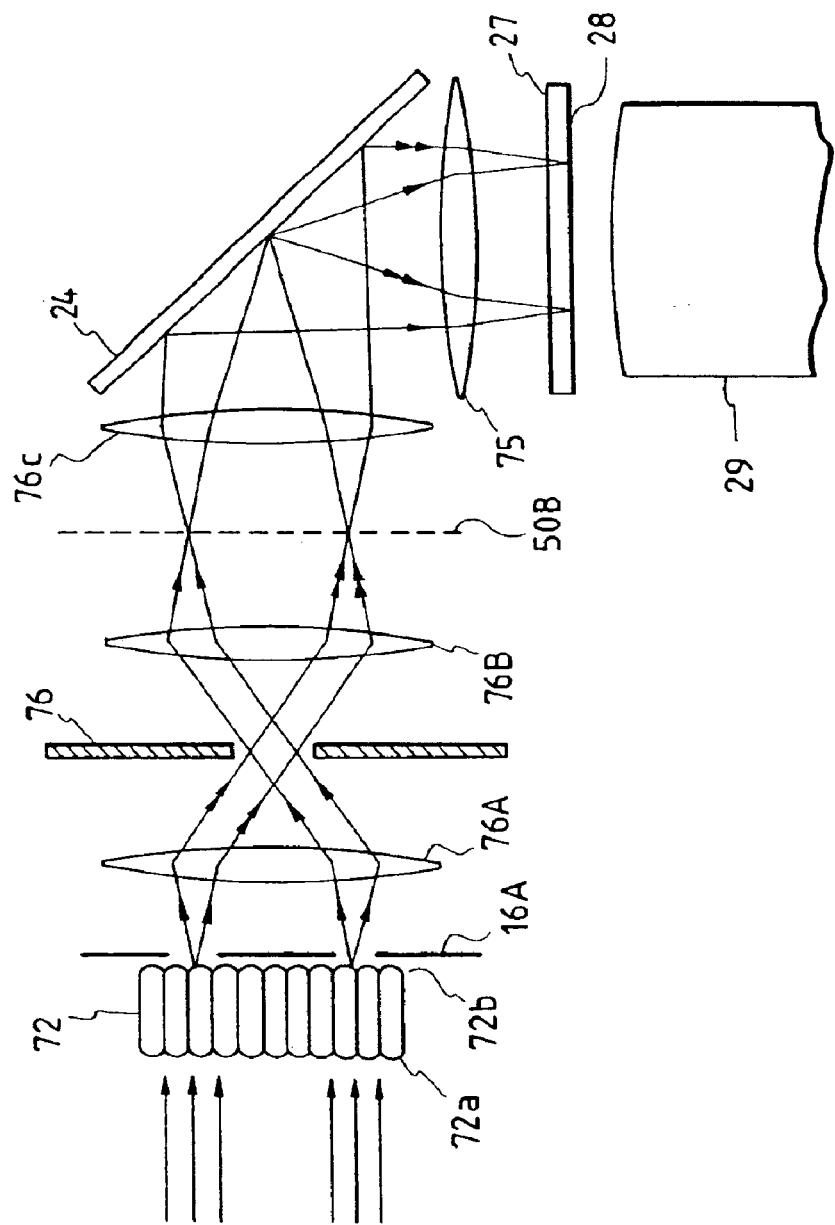
FIG. 26 is a view showing an illumination system when incorporating a reticle blind into the exposure apparatus of FIG. 20.

FIG. 26 is a diagram depicting a construction of the projection type exposure apparatus in a further embodiment of this invention. The mirror 24, the condenser lens 75, the reticle 27 and the projection optical system 29 are the same as those shown in FIG. 20. As a construction toward the light source from the fly eye lens 72, any one of the examples shown in FIGS. 20 through 25 and the example in which the spatial filter 16 is provided in the vicinity of the light-source-side focal surface 72a of the fly eye lens 72 may be used. A spatial filter 16A formed with arbitrary openings (transmissive portions, or further semitransmissive portions) is provided in close proximity to the reticle-side focal surface 72b of the fly eye lens 72. The illumination luminous flux emerging from the fly eye lens 72 is thereby regulated. The Fourier transform surface of a reticle-side focal plane 72b of the fly eye lens 72 with respect to a relay lens 76A is defined as a conjugate plane to the reticle patterns 28, and hence a variable field stop (reticle blind) 76 is provided therein. The illumination luminous flux is Fourier-transform again by the relay lens 76B and reaches a conjugate plane (Fourier transform plane) 50B of the reticle-side focal surface 72B of the fly eye lens 72. The above-mentioned spatial filter 16A may be provided on the Fourier transform plane 50B. The illumination luminous flux from the fly eye lens 72 is further guided to the reticle 27 with the aid of the condenser lenses 76C, 75 and the mirror 24. Note that if there exists a system for condensing the illumination light on the position eccentric by a quantity from the optical axis which is determined corresponding to the reticle patterns 28 on the light-source-side focal surface 72A of the fly eye lens 72, the spatial filter may not be disposed in the position of the optical member 16A or 50B.

In this case also, the field stop (reticle blind) 76 is usable.

Shown is the example where the plural beams of illumination light come from the optical member for concentrating the illumination light on the light-source-side focal surface 72a of the fly eye lens 72 described above. However, one luminous flux may be incident on the position eccentric by a predetermined quantity from the optical axis AX. For example, one exit portion of the fiber bundle 35 shown in FIG. 23 is prepared, while one luminous flux may be incident on the light-source-side focal surface 72A of the fly eye lens 72.

In all the embodiments of FIGS. 20 through 26, a diameter of one opening of the spatial filters 16, 16A is desirably set so that a ratio, a so-called σ-value, of a numerical aperture for the reticle 27 associated with the illumination luminous fluxes penetrating the openings to a reticle-side numerical aperture ($NA_R$) of the projection optical system 29 is approximately 0.1 to 0.3.

For satisfying the condition of the σ-value determined by one illumination luminous flux incident on the light-source-side focal surface 72a of the fly eye lens 72, a function to make the σ-value variable may be given to an optical member for concentrating the illumination light on the light-source-side focal surface 72a of the fly eye lens and making variable a light quantity distribution in the vicinity of the focal surface 72a in place of the spatial filter 16A disposed close to the reticle-side focal surface 72b of the fly eye lens 72. For instance, the spatial filter 16 is disposed on the light-source-side focal surface 72a of the fly eye lens, and the σ-value per luminous flux may be determined by the diameter of the opening thereof. Concomitantly, it is possible to further optimize the σ-value and NA in the form of the projection system by providing a variable aperture stop (NA regulating stop) in the vicinity of the pupil (incident pupil or exit pupil) 51 within the projection optical system 29. The spatial filter 16 also exhibits an effect to shield unnecessary luminous fluxes among the fluxes generated from the optical member for condensing the illumination light on the light-source-side focal surface 72a of the fly eye lens 72. This filter further exhibits an effect to reduce the quantity of light which reaches the wafer by decreasing a transmissivity of the opening with respect to specific luminous fluxes.

It is preferable to determine (change) the incident position (position of the secondary illuminant image on the light-source-side focal surface 72a of the fly eye lens 72) of (one or plural) illumination luminous flux(es) on the light-source-side focal surface 72a of the fly eye lens 72 in accordance with the reticle patterns to be transferred. In this case, the method of determining the position is that, as stated earlier, the incident position (incident angle Φ) of the illumination luminous flux from the fly eye lens 72 on the reticle patterns may be set to obtain the effect of improving the resolving power and focal depth that are optimal to the degree of fineness (pitch) of the patterns to be transferred. A concrete example of the positional determination of the secondary illuminant image (surface illuminant image) is the same as the determining method explained in the first embodiment with reference to FIGS. 14 and 15. It is assumed that the central position (the optimum position of the gravity of the light quantity distribution created by one secondary illuminant image) of one secondary illuminant image is, as illustrated in FIG. 15B, on the Y-directional line segment Lα presumed within the Fourier transform plane. Alternatively, it is assumed that the centers of the respective secondary illuminant images are placed on arbitrary positions on the line segment Lβ, or, as illustrated in FIG. 15D, on the line segments Lα, Lβ defined such as $\alpha=\beta=f\cdot(\frac{1}{2})\cdot(\lambda/Px)$ or on the line segments Lγ, Lε defined such is $\gamma=\epsilon=f\cdot(\frac{1}{2})\cdot(\lambda/Py)$. Based on these assumptions, the focal depth can be maximized. As in the first embodiment, the 0th-order diffracted light component Do coming from the reticle patterns 28 and any one of the (+) primary diffracted light component Dp and the (−) primary diffracted light component Dm may be arranged to pass through the light paths having equal distances from the optical axis AX on the pupil plane 51 within the projection optical system 29. If the reticle patterns 28, as seen in FIG. 15D, contain the two-dimensional periodic patterns, and when paying attention to one specific 0th-order diffracted light component, there probably exist higher-order diffracted light components including the primary diffracted light components of which the order is higher than the 0th-order diffracted light component, which are distributed in the X-direction (the first direction) and in the Y-direction (the second direction) about the single 0th-order diffracted light component on the pupil plane 51 of the projection optical system. Supposing that the image of the two-dimensional patterns is formed well with respect to one specific 0th-order diffracted light component, the position of the specific 0th-order diffracted light component may be adjusted so that three light components i.e., one of the higher-order diffracted light components distributed in the first direction, one of the higher-order diffracted light components distributed in the second direction and one specific 0th-order diffracted light component are distributed at substantially equal distances from the optical axis AX on the pupil plane 51 of the projection optical system. For instance, the central position of the exit portion in FIG. 15D is arranged to coincide with any one of points pξ, pη, pκ, pμ. The points pξ, pη, pκ, pμ are all intersections of the line segment Lα or Lβ (the optimum position to the X-directional periodicity, i.e., the position in which the 0th-order diffracted light component and one of the (±) primary diffracted light components in the X-direction have substantially equal distances from the optical axis on the pupil plane 51 of the projection optical system) and line segments Lγ, Lε (the optimum positions to the Y-directional periodicity). Therefore, those positions are the light source positions optimal to either the pattern direction X or the pattern direction Y.

Note that in this embodiment, an arbitrary light quantity distribution can be, as in the first embodiment, formed on the Fourier transform plane by controlling the luminous flux transform member and the movable optical member on the basis of the information of bar codes and the like.

A light scattering member such as a diffusion plate and an optical fiber bundle are provided in close proximity to the light-source-side focal surface 72a of the fly eye lens 11, thereby homogenizing the illumination light. Alternatively, the illumination light may be homogenized by employing an optical integrator such as a further fly eye lens (hereinafter referred to as the other fly eye lens) separately from the fly eye lens 72 used in the embodiments of the present invention. At this time, the other fly eye lens is disposed preferably closer to the light source (lamp) 1 than the optical member e.g., the diffraction grating pattern plate 12 or 12A shown in FIGS. 20 and 21 for making variable the illumination light quantity distribution in the vicinity of the light-source-side focal surface 72a of the fly eye lens 72. A sectional configuration of each lens element of the other fly eye lens is desirably a regular hexagon rather than a square (rectangle).

Figure 27:
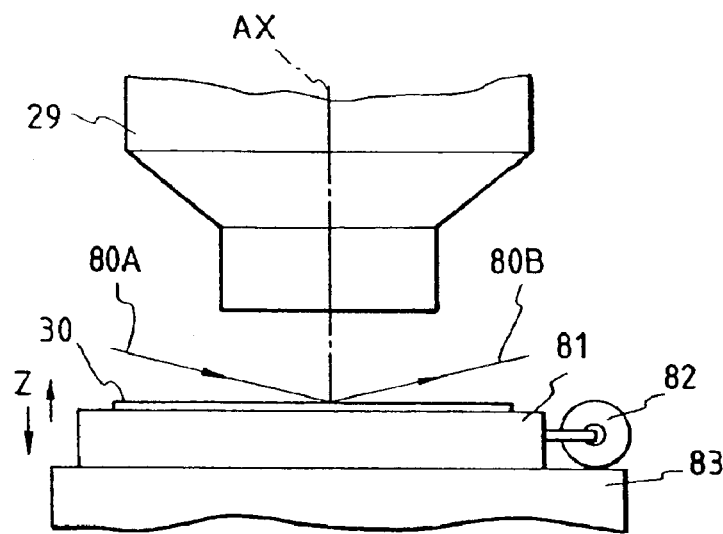
FIG. 27 is a view depicting a configuration about a wafer stage of the projection type exposure apparatus in the third embodiment of the present invention.

FIG. 27 illustrates a configuration adjacent to a wafer stage of the projection exposure apparatus applied to the respective embodiments of this invention. A beam 80A obliquely strikes on an interior of a projection field region on the wafer 30 in the projection optical system 29. Provided is an auto-focus sensor of an oblique incidence system which receives a reflected beam 80B. This focus sensor detects a deviation in the optical-axis direction AX between the surface of the wafer 30 and the best image forming surface of the projection optical system 29. A motor 82 of a Z-stage 81 mounted with the wafer 30 is servo-controlled so that the deviation becomes zero. The Z-stage 81 is thereby moved slightly in the vertical directions (optical-axis directions) with respect to an XY-stage 83, wherein the exposure is executed invariably in the best focus state. In the exposure apparatus capable of this focus controlling process, the Z-stage 81 is moved with such a velocity characteristic as to be controlled in the optical-axis directions during the exposing process. An apparent focal depth can be thereby further enlarged. This method is attainable by any type of steppers on condition that the image side (wafer side) of the projection optical system 29 is telecentric.

Figures 28A, 28B:
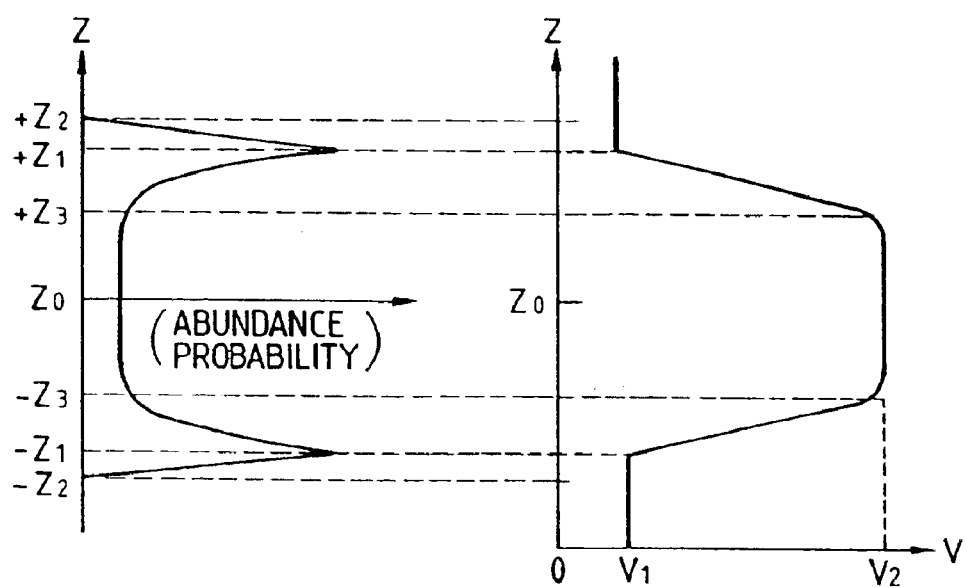
FIGS. 28A and 28B are graphic charts each showing velocity characteristics of a Z-stage and abundance probabilities of the exposure quantity when executing a cumulative focal point exposure method by use of the Z-stage of the wafer stage.

FIG. 28 shows light quantity (dose) distributions in the optical-axis directions which are obtained within the resist layers with a movement of the Z-stage 81 during the exposure, or abundance probabilities. FIG. 28B shows velocity characteristics of the Z-stage 81 for obtaining the distribution illustrated in FIG. 28A. Referring to FIGS. 28A and 28B, the axis of ordinate indicates wafer positions in Z-direction (optical-axis direction). The axis of abscissa of FIG. 28A indicates the abundance probability. The axis of abscissa of FIG. 28B indicates a velocity of the Z-stage 81. In the same Figures, a position Zo is the best focus position.

The abundance probabilities are herein arranged to be substantially equal maximal values in two positions +Z1, −Z1 spaced vertically from the position Z0 by a theoretical focal depth ±ΔDof of the projection optical system 29. In a range from +Z3 to −Z3 therebetween, the abundance probabilities are restrained down to small values. For this purpose, the Z-stage 81 moves up and down equally at a low velocity V1 in the position −Z2 when starting a release of the shutter within the illumination system. Immediately after the shutter has been fully opened, the Z-stage is accelerated up to a high velocity V2. While the Z-stage 81 moves up and down at the velocity V2, the abundance probabilities are restrained down to the small values. Just when reaching the position +Z3, the Z-stage 81 starts decelerating down to the low velocity V1. The abundance probability comes to the maximal value in the position +Z1. At this moment, a closing command of the shutter is outputted almost simultaneously. The shutter is completely closed in the position +Z2.

In this manner, the velocity of the Z-stage 81 is controlled so that the optical-axis-directional light quantity distributions (abundance probabilities) of the exposure quantities imparted to the resist layers of the wafer 30 are arranged to be the maximal values at the two points spaced away by approximately a width $(2\Delta D_0 f)$ of the focal depth. Although a contrast of the patterns formed on the resist layers is a little bit reduced, the uniform resolving power can be obtained over a wide range in the optical-axis directions.

The above-described cumulative focal point exposure method is applicable in much the same manner to the projection exposure apparatus which adopts the special illumination method shown in this embodiment. The apparent focal depth is enlarged by a quantity corresponding substantially to a product of an enlarged portion obtained by the illumination method of this invention and an enlarged portion obtained by the cumulative focal point exposure method. Besides, since the special illumination method is adopted, the resolving power itself also increases. For instance, the minimum line width possible to exposure by combining an i-beam stepper (NA 0.42 of the projection lens) which is contracted one-fifth that of the prior art with a phase shift reticle, is approximately 0.3 to 0.35 μm. An enlargement rate of the focal depth is about 40% at the maximum. In contrast, the special illumination method according to the present invention is incorporated into the i-beam stepper, and a test is carried out with the ordinary reticle. As a result, the minimum line width of 0.25~0.3 μm is obtained. Obtained also is much the same enlargement rate of the focal depth as that in using the phase shift reticle.

Figure 29:
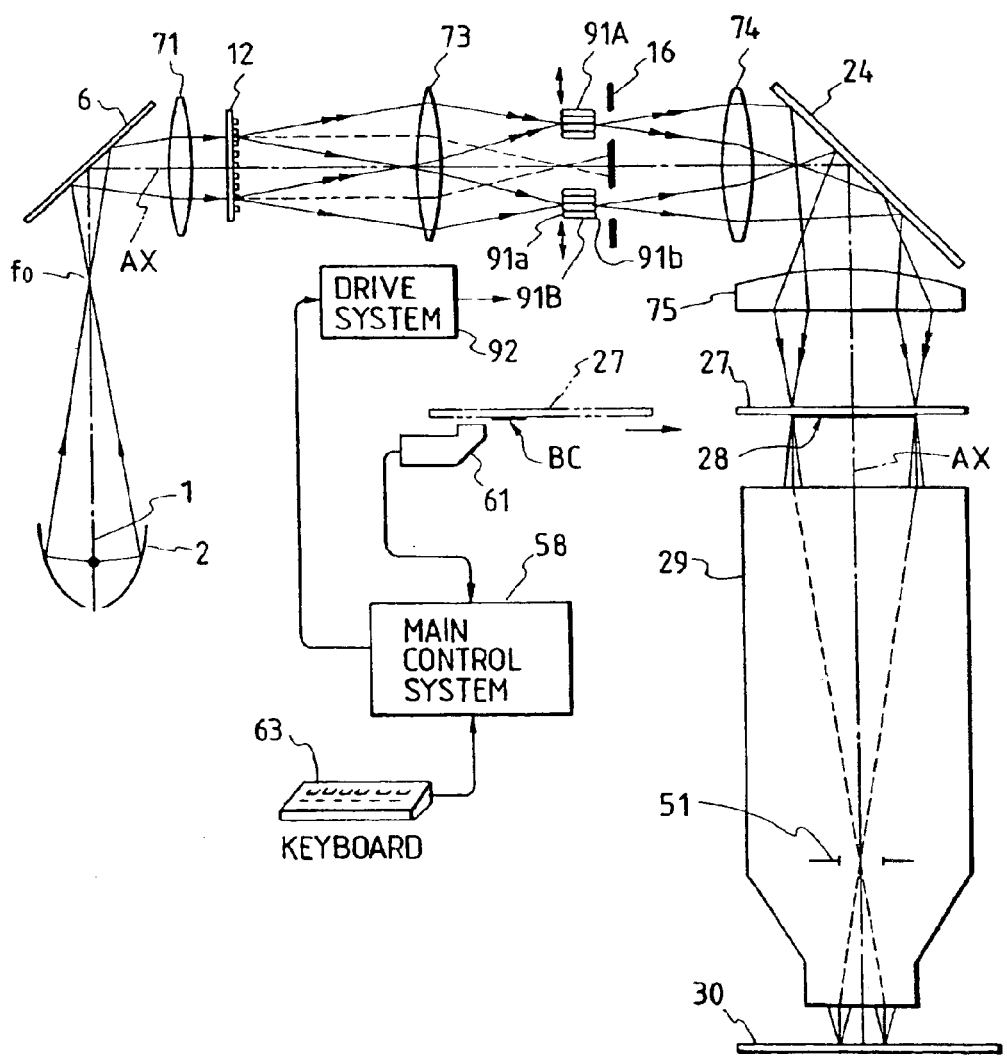
FIG. 29 is a view schematically illustrating a projection type exposure apparatus in a fourth embodiment of the present invention.

A fourth embodiment of the present invention will next be described. FIG. 29 depicts a projection type exposure apparatus (stepper) in the fourth embodiment of this invention. The fly eye lens is divided into a plurality of fly eye lens groups. The light quantity distribution is focused on each of the fly eye lens groups. The diffraction grating pattern plate 12 is provided as an optical member (a part of the input optical system of this invention) for focusing the light quantity distribution of the illumination light on each of light-source-side focal surfaces 91a of the fly eye lens groups 91A, 91B. Note that the constructions toward the light source from the relay lens system 71 and toward the wafer 30 from the spatial filter 16 are the same as those of FIG. 20, and the same members are marked with the like symbols.

The diffracted light generated from the diffraction grating pattern plate 12 is incident in concentration on each of the fly eye lens groups 91A, 91B via the relay lens 73. At this moment, the light-source-side focal surfaces 91a of the fly eye lens groups 91A, 91B and the diffraction grating pattern plate 12 have substantially the Fourier transform relation through the relay lens 73.

On the other hand, reticle-side focal surfaces 91b of the fly eye lens groups 91A, 91B are disposed in an intra-surface direction perpendicular to the optical axis AX so as to coincide substantially with the Fourier transform plane (pupil conjugate plane) of the reticle patterns 28. Each of the fly eye lens groups 91A, 91B is independently movable in the intra-surface direction vertical to the optical axis AX and held by a movable member (position adjusting member in the present invention) for making the lens group movable. The detailed explanation thereof will be given later.

The individual fly eye lens groups 91A, 91B desirably assume the same configuration and are composed of the same material (refractive index). Respective lens elements of the individual fly eye lens groups 91A, 91B are double-convex lenses as in the third embodiment. Given therein is the example where the light-source-side focal surfaces 91a coincide with the incident surfaces, and the reticle-side focal surface 91b coincide with the exit surface. The fly eye lens elements may not strictly satisfy this relation but may be plano-convex lenses, convexo-plane lenses or plano-concave lenses. Note that the light-source-side focal surfaces 91a of the fly eye lens groups and the reticle-side focal surfaces thereof have, as a matter of course, the Fourier transform relation. Hence, in the example of FIG. 29, the reticle-side focal surfaces 91b of the fly eye lens groups— i.e., the exit surfaces of the fly eye lens groups 91A, 91B—have an image forming (conjugate) relation to the diffraction grating pattern plate 12.

Now, the reticle 27 is illuminated in a homogeneous illuminance distribution with the luminous fluxes emitted from the reticle-side focal surfaces 91b of the fly eye lens groups 91A, 91B through the condenser lenses 74, 75 and the mirror 24. In accordance with this embodiment, the spatial filter 16 is disposed on the exit side of the fly eye lens groups 91A, 91B, thereby cutting off the 0th-order diffracted light components from the diffraction grating pattern plate 12. The openings of the spatial filter 16 correspond to the respective positions of the fly eye lens groups 91A, 91B. For this reason, the illumination light quantity distributions in the vicinity of the reticle-side focal surfaces 91b of the fly eye lens groups 91A, 91B can be made zero in portions other than the positions of the fly eye lens groups 91A, 91B. Therefore, the illumination light with which the reticle patterns 28 are illuminated is limited to the luminous fluxes (from the secondary illuminant images) emitted from the respective fly eye lens groups 91A, 91B. Hence, the luminous fluxes incident on the reticle patterns are limited to those having specific incident angles (plural) thereon.

Note that in the embodiment, each of the fly eye lens groups 91A, 91B is movable, and the openings of the spatial filter 16 are correspondingly movable; or alternatively the spatial filter 16 itself has to be exchangeable (the spatial filter 16 will be mentioned later). The illumination luminous fluxes are diffracted by use of the foregoing diffraction grating pattern plate 12. The diffracted light components are concentrated on the specific positions (fly eye lens groups) within the light-source-side focal surfaces of the fly eye lens groups 91A, 91B. On this occasion, the concentrated positions are varied depending on the pitch and the directivity of the diffraction grating pattern plate 12. Therefore, the pitch and the directivity of the diffraction grating pattern plate 12 are determined to concentrate the illumination light on the positions of the fly eye lens groups 91A, 91B.

As discussed above, the image of the diffraction grating pattern plate 12 is formed on the reticle-side focal surface 91*b* of the fly eye lens 91. As in the third embodiment described above, however, the reticle pattern surfaces 28 and the reticle-side focal surfaces 91*b* of the fly eye lens groups 91A, 91B have the Fourier transform relation. There is no possibility wherein the illumination intensity distribution on the reticle 27 is unhomogenized, or the illuminance homogeneity is deteriorated.

The diffraction grating pattern plate 12 may, as explained in the third embodiment referring to FIG. 21, be not only the transmissive pattern plate but also the reflective pattern plate.

Figure 30:
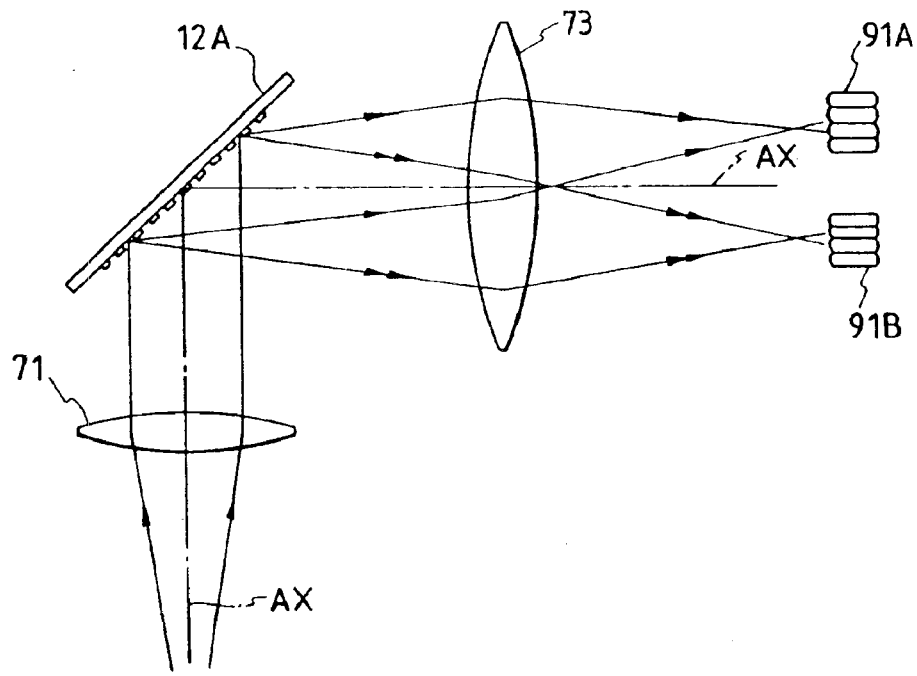
FIGS. 30, 31, 32, 33 and 34 are views showing variant forms of the input optical system.

If the diffraction grating pattern plate 12 is reflective, as illustrated in FIG. 30, the diffracted light components reflected by the reflective diffraction grating pattern plate 12A are concentrated in the vicinity of the fly eye lens groups 91A, 91B through the relay lens 73. Incidentally, the diffraction grating pattern plate 12 or 12A is exchangeable with a plate having a different pitch so that the illumination light can be concentrated in the vicinity of the respective fly eye lens groups 91A, 91B even when the individual fly eye lens groups 91A, 91B move. The diffraction grating pattern plate 12 or 12A may be rotatable in an arbitrary direction within the surface vertical to the optical axis AX. In this case, however, the Fourier transform relation between the diffraction grating pattern plate 12 or 12A and the light-source-side focal surfaces 91*a* of the fly eye lens groups 91A, 91B should be kept.

By the way, referring to FIG. 29, as in the first embodiment, there are provided a main control system 58 for generalizing and controlling the device, a bar code reader 61, a keyboard 63 and a drive system 92 (motor, gear train, etc.) such as movable members for moving the fly eye lens groups 91A, 91B. Registered beforehand in the main control system 58 are names of a plurality of reticles dealt with by the stepper and stepper operating parameters corresponding to these names. When the bar code reader 61 reads reticle bar codes BC, the main control system 58 outputs, to the drive system 92, the previously registered information on the moving positions (within the Fourier transform plane) of the fly eye lens groups 91A, 91B as one of the operating parameters corresponding to the names. The positions of the fly eye lens groups 91A, 91B are thereby adjusted to form the optimum light quantity distributions described in the first embodiment. The operations given above can be also executed even by inputting the commands and data directly from the keyboard 63.

The optical members (input optical system) are not limited to the diffraction grating pattern plates 12, 12A, these optical members being intended to concentrate the light quantity distributions over the light-source-side focal surfaces of the fly eye lens groups 91A, 91B on the portions in the vicinity of the individual fly eye lens positions. As in the cases shown in FIGS. 22–25 in accordance with the third embodiment, the movable plane mirror, the optical fibers, the prism and the reflection mirror are available.

Figure 31:
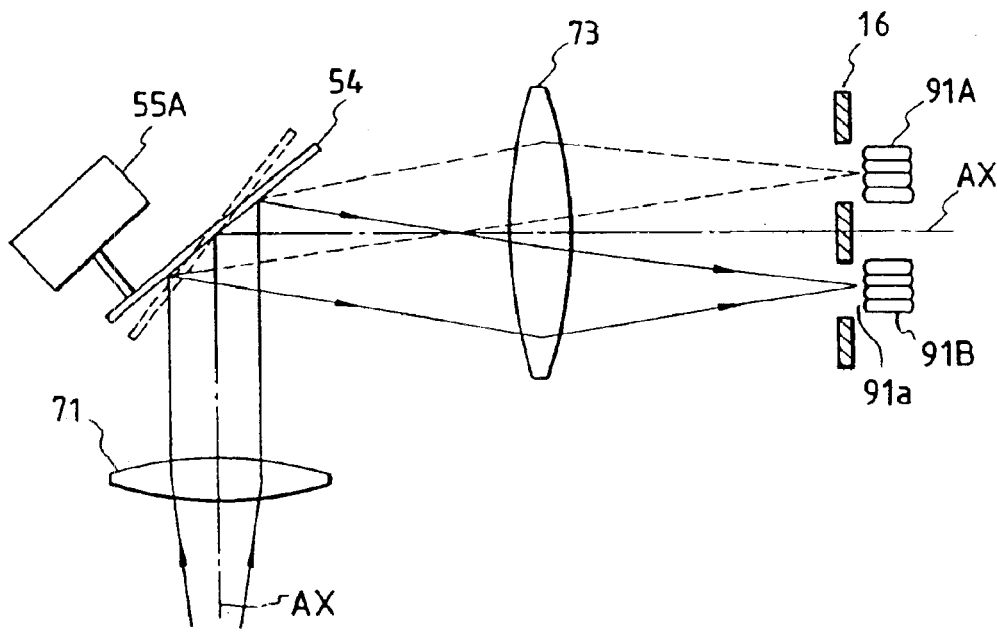

FIG. 31 shows the case where the movable plane mirror 54 is employed as an input optical system. The constructions toward the light source from the relay lens system 71 and toward the reticle from the fly eye lens group 91 are the same as those of FIG. 29. The plane mirror 54 is rotated to a plurality of angular positions during the exposure, thereby making it possible to concentrate the light quantity distributions over the light-source-side focal surfaces 91*a* of the fly eye lens groups 91A, 91B on only the portion vicinal to the position of one fly eye lens group of the plurality of the fly eye lens groups. Note that when using this type of movable plane mirror 54, the relay lens system 73 may be omitted. Further, when each of the fly eye lens groups 91A, 91B moves, angular coordinates of the plurality of angular positions of the plane mirror 54 are changed, and the reflected luminous fluxes may be concentrated in the vicinity of the position of the fly eye lens group in a new position. Incidentally, the spatial filter 16 illustrated in FIG. 31 is provided on the side of the incident surfaces of the fly eye lens groups 91A, 91B but may be provided on the side of the exit surfaces as seen in FIG. 29.

Figure 32:
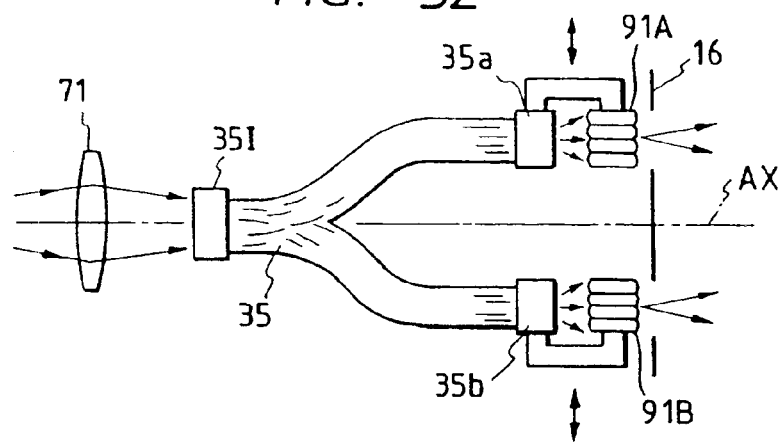

FIG. 32 shows a case of using the optical fibers of the input optical system. The exit portions 35A, 35B provided corresponding to the number of the fly eye lens groups 91A, 91B are constructed integrally with the respective fly eye lens groups in the close proximity to the light-source-side focal surfaces 91*a* of the fly eye lens groups 91A, 91B.

The exit portions 35A, 35B (or the lenses between the exit portions 35 and the fly eye lens groups 91) are one-dimensionally or two-dimensionally movable within the surface vertical to the optical axis by means of the drive members such as motors. Even when the individual fly eye lens groups 91A, 91B are gathered up, the illumination luminous fluxes can be concentrated in the vicinity of the position of each of the fly eye lens groups after being moved.

Figure 33:
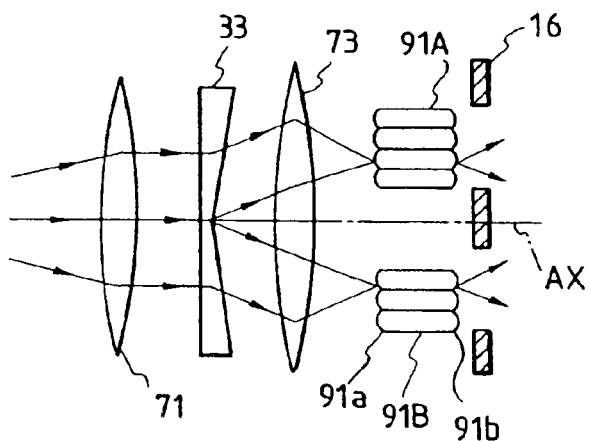

FIG. 33 shows a case of employing the prism 33 formed with a plurality of refractive surfaces as an input optical system. The illumination light can be concentrated in the vicinity of each of the fly eye lens groups 91A, 91B in accordance with a refractive angle of the prism 33 on the light-source-side focal surfaces 91*a* of the fly eye lens groups 91A, 91B. Even when the respective fly eye lens groups 91A, 91B move by exchanging the prism 33, the illumination light can be exactly concentrated on the position of each of the fly eye lens groups 91A, 91B. The device, as a matter of course, incorporates a function to exchange the prism or the like. Where this type of prism is employed, the relay lens system 73 can be omitted.

Figure 34:
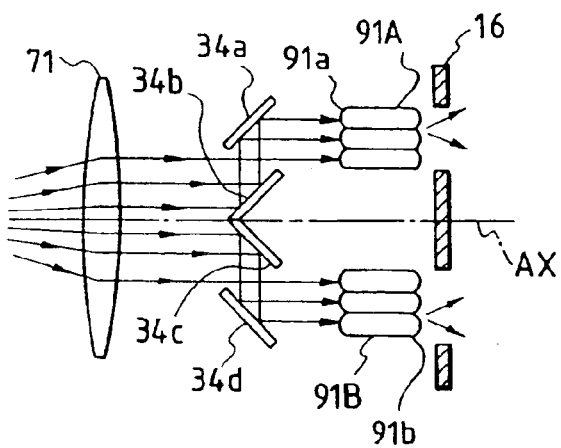

FIG. 34 shows a case where a plurality of mirrors are used as an input optical system. When each of the mirrors 34A–34D is provided with a position adjusting mechanism and a mechanism for adjusting an angle of rotation about the optical axis AX, and even after the individual fly eye lens groups 91A, 91B have moved, the illumination luminous fluxes can be focused in the vicinity of the respective fly eye lens groups 91A, 91B. A numerical value of the mirrors is not limited. The mirrors may be disposed depending on a numerical value of the fly eye lens groups.

Two groups of the fly eye lenses are provided throughout the fourth embodiment described above, however, three or more groups of the fly eye lenses may be of course provided. Stated also is the optical member for concentrating the illumination light mainly on the two portions of the individual fly eye lens groups. The illumination light is, as a matter of course, concentrated on a plurality of positions corresponding to the number of the fly eye lens groups. In all the embodiments given above, the illumination light can be concentrated on arbitrary positions (corresponding to the positions of the fly eye lens groups). The optical member for concentrating the illumination light on the respective fly eye lens groups is not limited to the types exemplified in the embodiments but may adopt any other types.

The spatial filter 16 provided in close proximity to the light-source-side focal surfaces 91*a* of the fly eye lenses may be employed in combination with the respective embodiments shown in FIGS. 29 through 34. Spatial filter, 16 can be, though not limited to the reticle-side focal surfaces 91b and light-source-side focal surfaces 91a of the fly eye lens groups, disposed in arbitrary positions. For example, the spatial filter is disposed suitably between the above-described two focal surfaces 91a, 91b.

The optical member for concentrating the illumination light only in the vicinity of the individual fly eye lens groups 91A, 91B is intended to prevent a loss in quantity of the illumination light with which the reticle 27 is illuminated. The optical member is not associated directly with the constitution for obtaining the effects of the high resolving power and large focal depth that are characteristic of the projection type exposure apparatus according to the present invention. Hence, the optical member may be only a lens system having a diameter large enough to make the illumination light incident in flood on each of the fly eye lens groups after being adjusted in terms of position.

As in the construction, depicted in FIG. 26, of the third embodiment, the spatial filter 16A may be provided, or a variable field stop 76 may also be provided as in the same way with the third embodiment. The spatial filter 16A is placed on the reticle-side focal surface 91b of the fly eye lens group 91 or in the vicinity of the conjugate surface thereof, thereby regulating the illumination luminous fluxes emerging from the fly eye lens groups 91A, 91B. Note that if there is a system capable of focusing the illumination luminous fluxes incident on the fly eye lens groups 91A, 91B only thereon effectively, the spatial filter 16 may not be provided on the reticle-side focal surface 91b or in the vicinity of the conjugate surface thereof.

For satisfying the condition of the σ-value ($0.1 \leq \sigma \leq 0.3$) determined by one of the fly eye lens groups, a magnitude (in the intra-surface direction vertical to the optical axis) of the exit end areas of each of the fly eye lens groups 91A, 91B may be determined to match with the illumination luminous fluxes (exit luminous fluxes).

A variable aperture stop (equivalent to the spatial filter 16) is provided in the vicinity of the reticle-side focal surface 91b of each of the fly eye lens groups 91A, 91B, and the numerical aperture of the luminous flux from each of the fly eye lens groups is made variable, thus changing the σ-value. Correspondingly, the variable aperture stop (NA regulating stop) is disposed close to the pupil (incident pupil or exit pupil) 51 of the projection optical system 29, thereby further optimizing the σ-value with respect to NA in the projection system.

The illumination of the luminous fluxes incident on the respective fly eye lens groups expands to some extent outwardly of the incident end surfaces of the fly eye lens groups. Besides, if the distributions in quantity of the light incident on the respective fly eye lens groups are uniform, the illuminance homogeneity on the reticle pattern surfaces can be preferably further enhanced.

Next, an embodiment of the movable portions for making the fly eye lens groups movable will be explained in conjunction with FIGS. 35 and 36.

Figure 35:
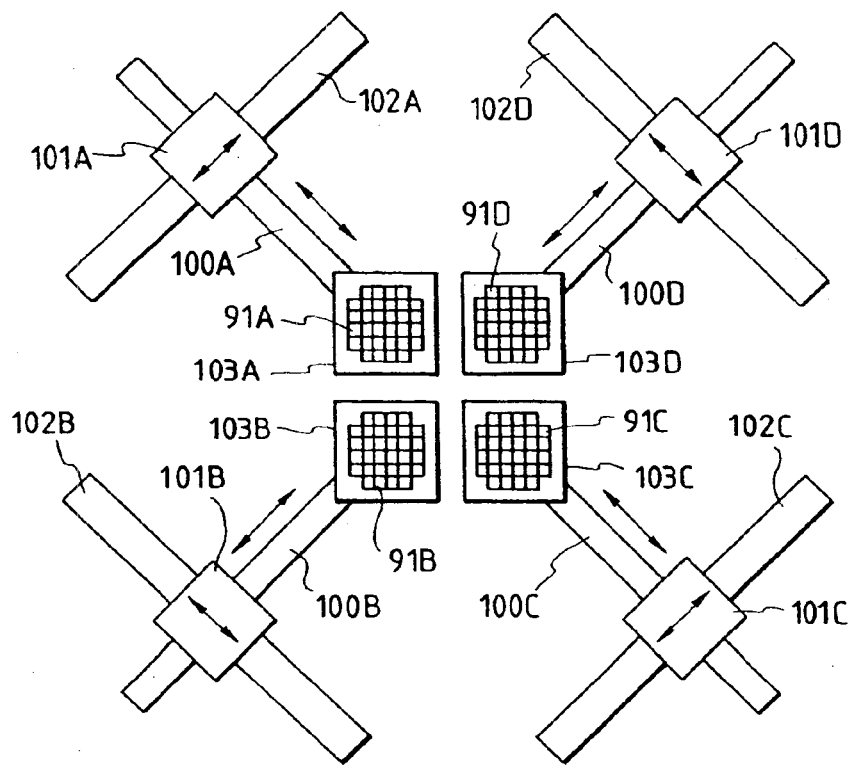
FIG. 35 is a plan view taken substantially in the optical-axis direction, showing a placement of movable fly eye lens groups and a construction of a movable member thereof.

FIG. 35 is a diagram illustrating the movable portions viewed from the optical-axis direction. FIG. 36 is a diagram showing the same viewed from the direction vertical to the optical axis.

A plurality of, i.e., four fly eye lens groups 91A, 91B, 91C, 91D are disposed at substantially equal distances from the optical axis in FIG. 35. Each of the fly eye lens groups 91A, 91B, 91C, 91D is, as illustrated in FIG. 35, composed of, though not limited to this, 32 pieces of lens elements. In an extreme case, the fly eye lens group may be constructed of one lens element. Now, turning to FIGS. 35 and 36, the fly eye lens groups 91A, 91B, 91C, 91D are held by jigs 103a, 103b, 103c, 103d. These jigs 103a, 103b, 103c, 103d are further supported on movable members 101a, 101b, 101c, 101d through support bars 100a, 100b, 100c, 100d. These support bars 100a, 100b, 100c, 100d are stretchable and contractible in the optical-axis direction with the aid of drive elements such as motors and gears incorporated into the movable members 101a, 101b, 101c, 101d. The movable members 101a, 101b, 101c, 101d themselves are movable along fixed guides 102a, 102b, 102c, 102d. The individual fly eye lens groups 91A, 91B, 91C, 91D are therefore independently movable in the intra-surface direction perpendicular to the optical axis.

Figure 36:
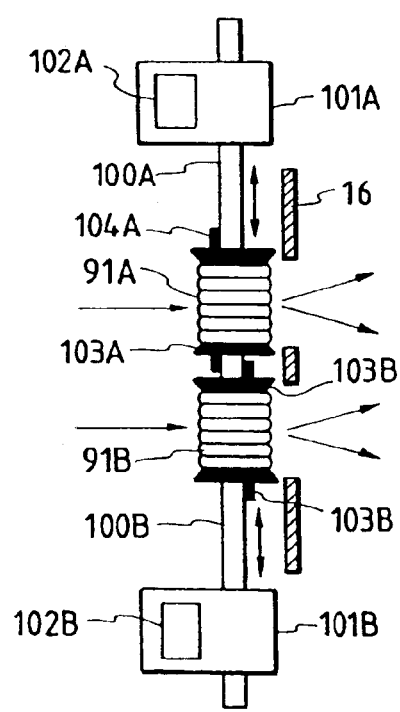
FIG. 36 is a view taken substantially in the direction vertical to the optical axis, showing the construction of FIG. 35.

Respective positions (within the surface vertical to the optical axis) of the fly eye lens groups 91A, 91B, 91C, 91D depicted in FIG. 36 are determined (changed) preferably depending on the reticle patterns to be transferred.

Figure 14:
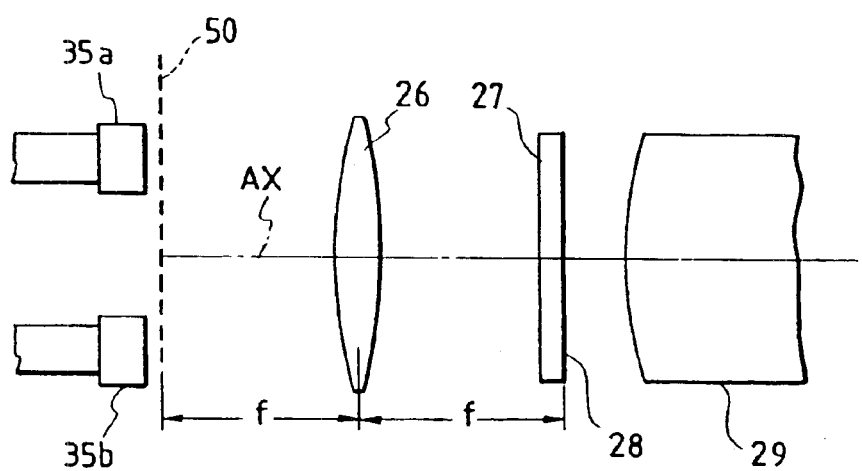
FIG. 14 is a view schematically showing a light path from the Fourier transform plane for the reticle to the projection optical system in the projection type exposure apparatus according to the first embodiment of the present invention.

The optimum positions of the respective fly eye lens groups are set under the same conditions as those explained referring to FIGS. 14 and 15 in the first embodiment.

A concrete example of the positional determination of each of the fly eye lens groups is the same as the determining method explained in the first embodiment with reference to FIGS. 14 and 15. It is assumed that the central position (the optimum position of the gravity of the light quantity distribution of the secondary illuminant image which is created by each of the fly eye lens groups) of each of the fly eye lens groups is, as illustrated in FIG. 15B, on the Y-directional line segment Lα presumed within the Fourier transform plane. Alternatively, it is assumed that the center of each of the fly eye lens groups is placed on an arbitrary position on the line segment Lβ, or, as illustrated in FIG. 15D, on the line segments Lα, Lβ. defined such as $\alpha=\beta=f \cdot (1/2) \cdot (\lambda/Px)$ or on the line segments Lγ, Lε defined such as $\gamma=\epsilon=f \cdot (1/2) \cdot (\lambda/Py)$. Based on these assumptions, the focal depth can be maximized. As in the first embodiment, the 0th-order diffracted light component Do coining from the reticle patterns 28 and any one of the (+) primary diffracted light component Dp and the (−) primary diffracted light component Dm may be arranged to pass through light paths having the equal distances from the optical axis AX on the pupil surface 51 within projection optical system 29. If the reticle patterns 28, as seen in FIG. 15D, contain the two-dimensional periodic patterns, and when paying attention to one specific 0th-order diffracted light component, there probably exist order diffracted light components including the primary diffracted light components of which the order is higher than the 0th-order diffracted light component, which are distributed in the X-direction (the first direction) and in the Y-direction (the second direction) about the single 0th-order diffracted light component on the pupil surface 51 of the projection optical system. Supposing that the image of the two-dimensional patterns is formed well with respect to one specific 0th-order diffracted light component, the position of the specific 0th-order diffracted light component may be adjusted so that three light components i.e., one of the higher-order diffracted light components distributed in the first direction, one of the higher-order diffracted light components distributed in the second direction and one specific 0th-order diffracted light component are distributed at substantially equal distances from the optical axis AX on the pupil plane 51 of the projection optical system. For instance, the central position of the exit portion in FIG. 15D is arranged to coincide with any one of points Pξ, Pη, Pκ, Pμ. The points Pξ, Pη, Pκ, Pμ are all intersections of the line segment Lα or Lβ (the optimum position to the X-directional periodicity, i.e., the position in which the 0th-order diffracted light component and one of the (±) primary diffracted light components in the X-direction have substantially equal distances from the optical axis on the pupil surface 51 of the projection optical system) and line segments Lγ, Lε (the optimum positions to the Y-directional periodicity). Therefore, those positions are the light source positions optimal to either the pattern direction X or the pattern direction Y.

Note that in this embodiment, an arbitrary light quantity distribution can be, as in the first embodiment, formed on the Fourier transform plane by controlling the luminous flux transform member and the movable optical member on the basis of the information of bar codes and the like. In this case, the fly eye lens groups 91A to 91D are disposed not only discretely but also integrally about the optical axis, whereby a changeover to the ordinary illumination can be performed.

A light scattering member such as a diffusion plate and an optical fiber bundle are provided in close proximity to the light-source-side focal surface 91*a* of the fly eye lens 91, thereby homogenizing the illumination light. Alternatively, the illumination light may be homogenized by employing an optical integrator such as a further fly eye lens (hereinafter referred to as the other fly eye lens) separately from the fly eye lens 72 used in the embodiments of the present invention. At this time, the other fly eye lens is disposed preferably closer to the light source (lamp) 1 than the optical member e.g., the diffraction grating pattern plate 12 or 12A shown in FIGS. 29 and 30 for making variable the illumination light quantity distribution in the vicinity of the light-source-side focal surface 91*a* of the fly eye lens 91. A sectional configuration of each lens element of the other fly eye lens is desirably a regular hexagon rather than a square (rectangle). In this case, the σ-value may be made variable by making the numerical aperture of the illumination system variable while providing an aperture stop on the reticle-side focal surface of the other fly eye lens. Further, the σ-value may be also made variable by changing a magnitude of the luminous flux incident on the other fly eye lens while providing a zoom lens (afocal zoom lens) on the light path leading from the light source up to the other fly eye lens.

Given above is the example of determining the positions of the plurality of fly eye lens groups. The illumination luminous fluxes are concentrated corresponding to the moving positions of the respective fly eye lens groups by means of the foregoing optical members (the diffraction grating pattern plate, the movable mirror, the prism or the fibers). The optical member for this concentrating process may not be provided.

The luminous fluxes emitted from the fly eye lens groups are incident obliquely on the reticle. If a direction of the light quantity gravity of the (plural) incident luminous fluxes inclined thereto is not perpendicular to the reticle, there arises a problem in which a position of the transferred image shifts in the intra-surface direction of the wafer during minute defocusing of the wafer 30. In order to prevent this shift, the direction of the light quantity gravity of the (plural) illumination luminous fluxes from the fly eye lens groups is kept vertical to the reticle patterns, viz., parallel to the optical axis AX.

More specifically, on the assumption that the optical axis (central line) is set in the respective fly eye lens groups, it may be sufficient to make zero a vector sum of a product of the intra Fourier transform plane positional vector of the optical axis (central line) on the basis of the optical axis AX of the projection optical system 29 and a quantity of light emitted from each of the fly eye lens groups. An easier method is that 2m-groups (m is the natural number) of fly eye lenses are provided; positions of m-groups of the fly eye lenses are determined by the optimizing method described above; and remaining m-groups and the former m-groups of fly eye lenses are disposed in symmetry with respect to the optical axis AX.

If the device further includes n-groups (n is the natural number), and when the number of groups of the fly eye lenses is set to m smaller than n, the remaining (n–m) groups of fly eye lenses may not be used. To eliminate the use of the (n–m) groups of fly eye lenses, the spatial filter 16 may be provided on the positions of (n–m) groups of fly eye lenses. At this time, the optical member for concentrating the illumination light on the positions of (n–m) groups of fly eye lenses preferably does not concentrate the light on the (n–m) groups of fly eye lenses.

The positions of openings of the spatial filter 16 are desirably variable corresponding to the movements of the fly eye lens groups. Alternatively, there is provided a mechanism for exchanging the spatial filter, 16 in accordance with the positions of the respective fly eye lenses. The device may incorporate some kinds of light shielding members.

As depicted in FIG. 36, each of the jigs 103*a*, 103*b*, 103*c*, 103*d* for holding the respective fly eye lens groups 91A, 91B, 91C, 91D has light shielding blades 104*a*, 104*b*. In this case, the opening of the spatial filter 16 may be formed considerably larger than the diameter of the fly eye lens. Hence, one spatial filter 16 is capable of corresponding to the positions of a variety of fly eye lenses. If the light shielding blades 104*a*, 104*b* deviate slightly in the optical-axis direction, a constraint given to the moving range of the fly eye lens groups is reduced.

Light scattering members such as diffusion plates and optical fibers are employed in the vicinity of the light-source-side focal surfaces 91*a* of the fly eye lens groups 91A, 91B, 91C, 91D, thereby homogenizing the illumination light.

A fifth embodiment will be next explained. Provided in this embodiment is a holding member for integrally holding the plurality of fly eye lens groups. The fly eye lens groups held in the optimum placement are selectable by driving the holding member.

Figure 37:
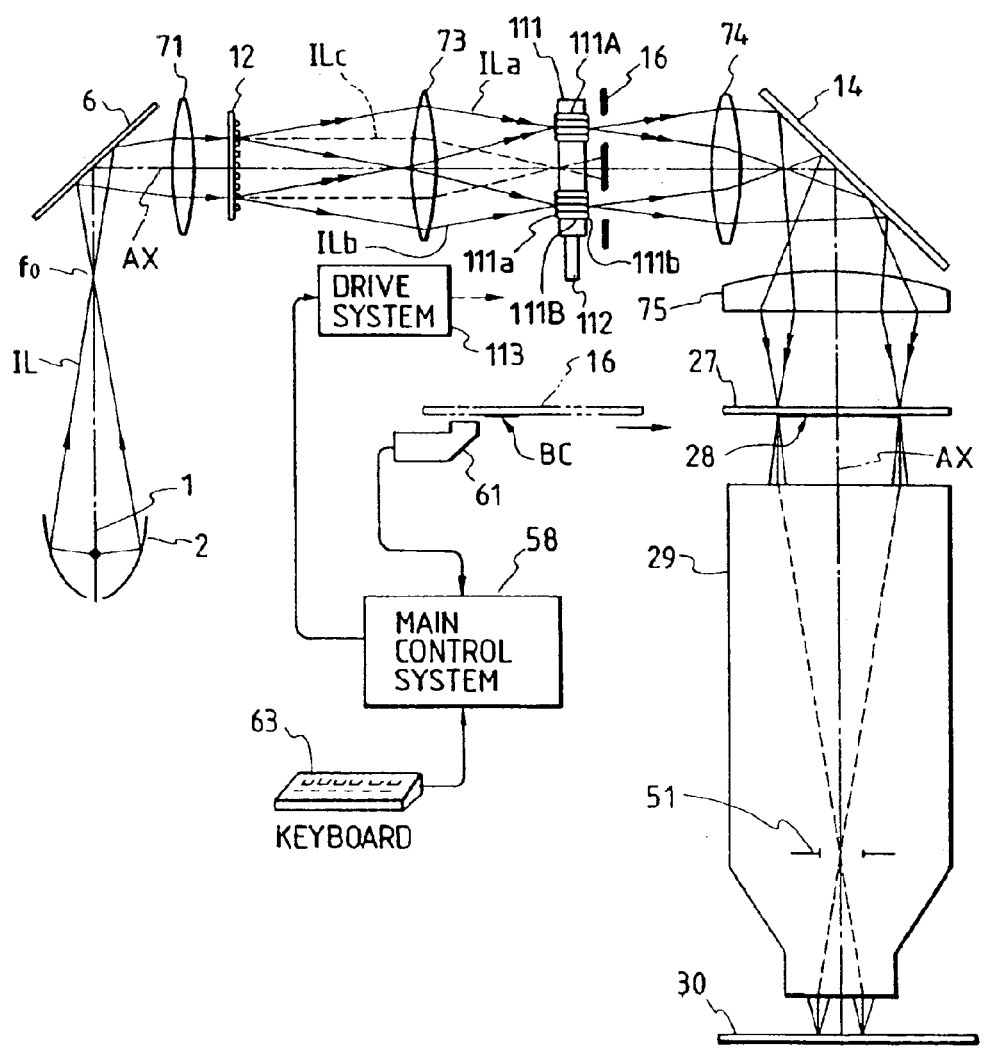
FIG. 37 is a view schematically illustrating a projection type exposure apparatus in a fifth embodiment of the present invention.

FIG. 37 illustrates a construction of the projection type exposure apparatus in the fifth embodiment of the present invention. The diffraction grating pattern plate 12 is given as an optical member (a part of the input optical system) for concentrating the light quantity distributions of the illumination light on the light-source-side focal surfaces of the fly eye lens groups. Note that the same members as those in FIG. 29 are marked with the like symbols.

A holding member 111 integrally holds fly eye lens groups 111A, 111B so that the center (in other words, the gravity of the each of the light quantity distributions created by the secondary illuminant images in the respective fly eye lens groups 111A, 111B) of each of the fly eye lens groups 111A, 111B is set in a discrete position eccentric from the optical axis AX by a quantity determined depending on the periodicity of the reticle patterns. Fixed integrally to a movable member 112 (switching member in this invention) together with the holding member 111 are a plurality of holding members (not illustrated) for holding the plurality of fly eye lens groups while making their eccentric states relative to the optical axis AX different from each other in accordance with a difference in terms of the periodicity of the reticle patterns 28. This movable member 112 is driven, with the result that the plurality of holding members can be so disposed in the light path of the illumination optical system as to be individually exchangeable. The detailed description thereof will be given later.

Each of the plurality of fly eye lens groups (111A, 111B) fixed by the same holding member desirably assumes the same configuration and is composed of the same material (refractive index). In this embodiment, the holding members (fly eye lens groups 111A, 111B) are exchangeable, and hence the openings of the spatial filter 16 have to be variable correspondingly; or alternatively, the spatial filter 16 has to be also exchangeable. For instance, the spatial filter 16 is fixed to the holding member together with the fly eye lens groups 111A, 111B, and desirably they are arranged to be integrally exchangeable. Note that a magnitude (thickness) of the luminous flux incident on each of the fly eye lens groups 111A, 111B is set equal to or smaller than a magnitude of each of the light-source-side focal surfaces 111a of the fly eye lens groups 111A, 111B. In this case, the spatial filter 16 is not particularly, as a matter of course, provided in the illumination optical system (in the vicinity of the fly eye lens groups).

The diffraction grating pattern plate 12 or 12A may be rotatable in an arbitrary direction within the surface vertical to the optical axis AX. With this arrangement, it is possible to correspond to such a case that the pitch direction of the line-and-space patterns of the reticle patterns 28 is different from the directions X, Y (i.e., the fly eye lens groups 111A, 111B move in the pitch direction (rotate about the optical axis AX)).

Provided according to this embodiment, as in the fourth embodiment, the main control system 58 for generalizing and controlling the device, the bar code reader 61, the keyboard 63 and the drive system (motor, gear train, etc.) 113 of movable members for moving the fly eye lens groups 111A, 111B. Registered beforehand in the main control system 58 are names of a plurality of reticles dealt with by the stepper and stepper operating parameters corresponding to the names. Then, the main control system 58 outputs, when the bar code reader 61 reads the reticle bar codes BC, a predetermined drive command to the drive system 113 by selecting one of the plurality of holding members which matches best with the previously registered information (corresponding to the periodicity of the reticle patterns) on the positions (within the pupil conjugate surface) of the fly eye lens groups 111A, 111B as one of the operating parameters corresponding to the names thereof. The fly eye lens groups 111A, 111B held by the previously selected holding member are thereby set in the positions on $L\alpha$, $L\gamma$ shown in FIG. 15B and the positions on $L\alpha$, $L\beta$, $L\gamma$, $L\epsilon$ (especially the positions on $P\xi$, $P\eta$, $P\kappa$, $P\mu$) shown in FIG. 15D in the first embodiment. The operations described above are executable even by the operator's inputting the commands and the data from the keyboard 63 directly to the main control system 58.

The optical member (input optical system) is not limited to the transmissive diffraction grating pattern plate 12, this optical member being intended to concentrate the light quantity distributions over the light-source-side focal surfaces of the fly eye lens groups in the vicinity of the positions of the individual fly eye lenses. As explained in the fourth embodiment with reference to FIGS. 30–34, the reflective diffraction grating pattern plate 12A, the movable plane mirror 54, the optical fibers 35, the prism 33 and the plurality of reflection mirrors 34 may be provided in place of the diffraction grating pattern plate 12. Additionally, the diffraction grating pattern plates 12, 12A and the prism 33 are replaced; or a plurality of angular position coordinates of the movable plane mirror 54 are changed; or the exit portions of the optical fibers are made movable; or each of the reflection mirrors is provided with the position adjusting mechanism and the mechanism for adjusting the angle of rotation about the optical axis AX. With these arrangements, if the fly eye lens groups move with the replacement of the holding member, the illumination luminous fluxes can be concentrated in the vicinity of the positions of the respective fly eye lens groups after being moved.

As in the fourth embodiment, the spatial filter 16, may be disposed in the light-source-side focal surface 111a of the fly eye lens or used in combination with the above. The placement of the spatial filter is not limited to the light-source-side focal surfaces 111b and the reticle-side focal surfaces 111a of the fly eye lens groups but may be disposed in arbitrary positions. Further, the optical member (input optical system) for concentrating the illumination light only in the vicinity of the individual fly eye lens groups 111A, 111B may be only a lens having a diameter large enough to make the illumination light incident in flood on each of the plurality of fly eye lens groups.

As explained in the fourth embodiment in conjunction with FIG. 26, the spatial filter 16A and the field stop may be provided.

Next, a construction of the movable member 112 (switching member in the present invention) for exchanging the holding member will be described referring to FIGS. 38 and 39.

Figure 38:
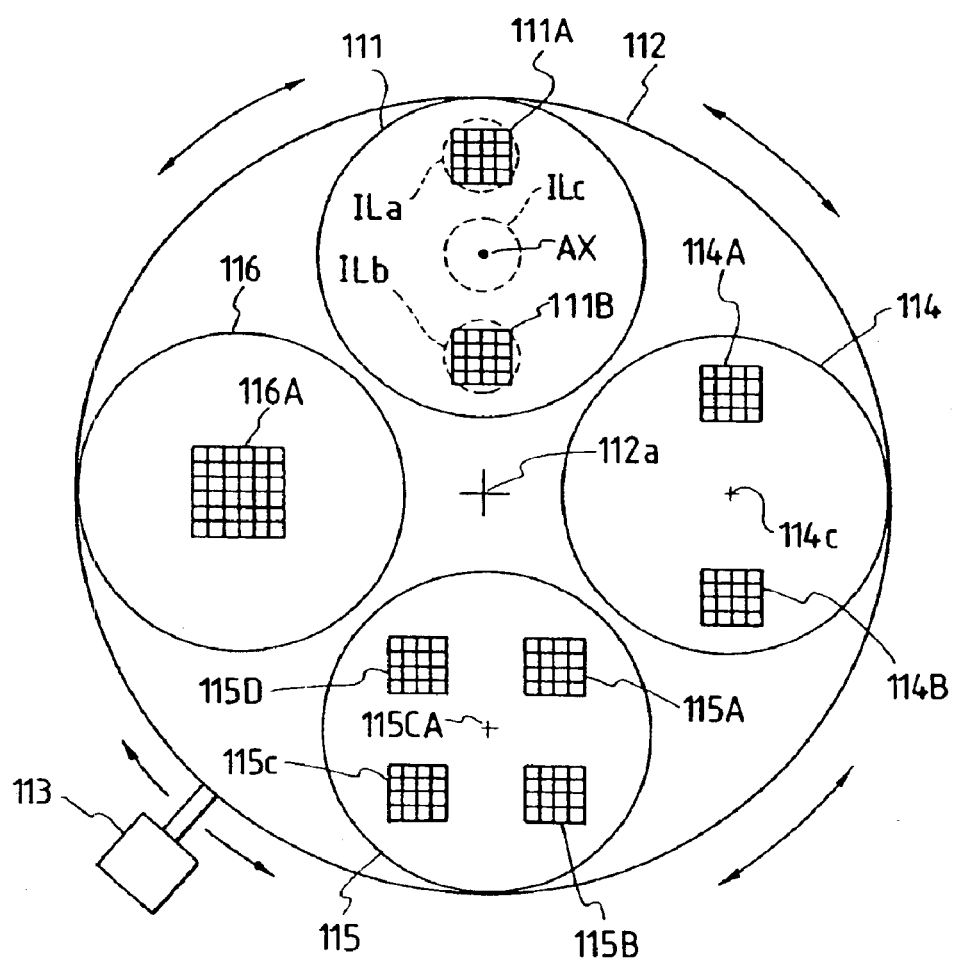
FIG. 38 is a view depicting a concrete construction of the movable member (switching member of this invention) for exchanging four holding members consisting of a plurality of fly eye lens groups.

FIG. 38 shows a concrete construction of the movable member. Four holding members 111, 114, 115, 116 are herein disposed at intervals of approximately 90° on the movable member (turret plate) 112 rotatable about a rotary axis 112a. FIG. 38 illustrates a situation in which illumination luminous fluxes ILa, ILb (dotted lines) are incident on the respective fly eye lens groups 111A, 111B; and the holding member 111 is disposed in the illumination optical system. At this time, the holding member 111 is placed in the illumination optical system so that the center of this member coincides substantially with the optical axis AX. The plurality of fly eye lens groups 111A, 111B are held integrally by the holding member 111 so that the centers of these lens groups are set in discrete positions eccentric from the optical axis AX of the illumination optical system by a quantity determined depending on the periodicity of the reticle patterns. These lens groups are placed substantially in symmetry with respect to the center (optical axis AX) of the holding member 111.

Now, each of the four holding members 111, 114, 115, 116 holds the plurality of fly eye lens groups while making their eccentric states (i.e., positions within the surface substantially perpendicular to the optical axis AX) from the optical axis AX (center of the holding member) different from each other in accordance with a difference in terms of the periodicity of the reticle patterns 28. Both of the holding members 111, 114 have two fly eye lens groups (111A, 111B) and (114A, 114B). These fly eye lens groups are, when being disposed in the illumination optical system, fixed so that their array directions are substantially orthogonal to each other. The holding member 115 places and fixes the four fly eye lens groups 115A–115D substantially at equal distances from the center 115cA (optical axis AX) thereof. In accordance with this embodiment, the holding member 116, which fixes one fly eye lens group 116A substantially at the center, is used for effecting the exposure based on a known method.

As is obvious from FIG. 38, the turret plate 112 is rotated by the drive element 113 consisting of a motor and a gear, as stated earlier, in accordance with the information of the reticle bar codes BC. The four holding members 111, 114, 115, 116 are thereby exchanged, and the desired holding member corresponding to the periodicity (pitch, array direction, etc.) of the reticle patterns can be disposed in the illumination optical system.

Selected, as discussed above, in accordance with the information of the reticle bar codes BC is whether to effect either the known exposure for forming the light quantity distributions substantially about the optical axis on the Fourier transform plane or the exposure by the inclined illumination light explained in this embodiment. In the case of performing the known exposure, the holding member 116 is selected. In the case of performing the exposure based on the inclined illumination light, any one of the holding members 111, 114, 115 may be selected. When executing the known exposure, and if the holding member 116 is selected, it is required that the input optical system be exchanged for effecting the illumination as it used to be done. If the illumination light can be concentrated through the lens 71 on the fly eye lens group 116A, the input optical system such as fibers, retreats from within the light path.

In each of the four holding members, the plurality of fly eye lens groups are herein fixed in a predetermined positional relation, and hence there is no necessity for performing the positional adjustment between the plurality of fly eye lens groups when exchanging the holding member. Therefore, positioning of the holding members as a whole may be effected with respect to the optical axis AX of the illumination optical system. Consequently, there is produced such an advantage that no precise positioning mechanism is needed. At this time, the drive element 113 is used for the positioning process, and it is therefore desirable to provide a rotary angle measuring member such as, e.g., a rotary encoder. Note that each of the plurality of fly eye lens groups constituting the holding members comprises, as shown in FIG. 38, 16 pieces of lens elements (only the fly eye lens group 116A is composed of 36 pieces lens elements). The numerical number is not limited to this. In an extreme case, the fly eye lens group consisting of one lens element may also be available.

Referring to FIG. 37, the spatial filter 16 is disposed in rear (reticle-side) of the holding member 111. In each of the holding members, when the portions other than the fly eye lens groups are formed as light shielding portions, the spatial filter 16 is not particularly provided. At this time, the turret plate 112 may be a transmissive portion or a light shielding portion. The number of the holding members to be fixed to the turret plate 112 and the eccentric states (positions) of the plurality of fly eye lens groups are not limited to those shown in FIG. 38 but may be arbitrarily set corresponding to the periodicity of the reticle patterns to be transferred. If there is a necessity for strictly setting the incident angles and the like of the illumination luminous fluxes on the reticle patterns, each of the plurality of fly eye lens groups may be so constructed as to be minutely movable in the radial directions (radiant directions) about the optical axis AX in the holding member. Further, the holding members (fly eye lens groups 111A, 111B) may be so constructed as to be rotatable about the optical axis AX. On this occasion, if especially the optical fiber bundle 35 is employed as an optical member (input optical system) for concentrating the illumination luminous fluxes in the vicinity of each of the plurality of fly eye lens groups, the exit ends 35A, 35B thereof are arranged to move with movements of the fly eye lens groups. For instance, the exit ends 35A, 35B and the fly eye lens groups may be integrally fixed. In addition, the rectangular fly eye lens groups are relatively inclined with rotation of the holding member. However, when rotating the holding member, it is desirable that only the positions of the fly eye lens groups are moved without causing the above-mentioned inclination.

When exchanging the holding member, it is necessary to exchange the input optical system such as, e.g., the diffraction grating pattern plate 12, the relay lens 73 (FIG. 37) and the optical fiber bundle 35. Desirably, the input optical systems corresponding to the eccentric states of the plurality of fly eye lens groups are integrally constructed for every holding member and fixed to the movable member 112.

Figure 39:
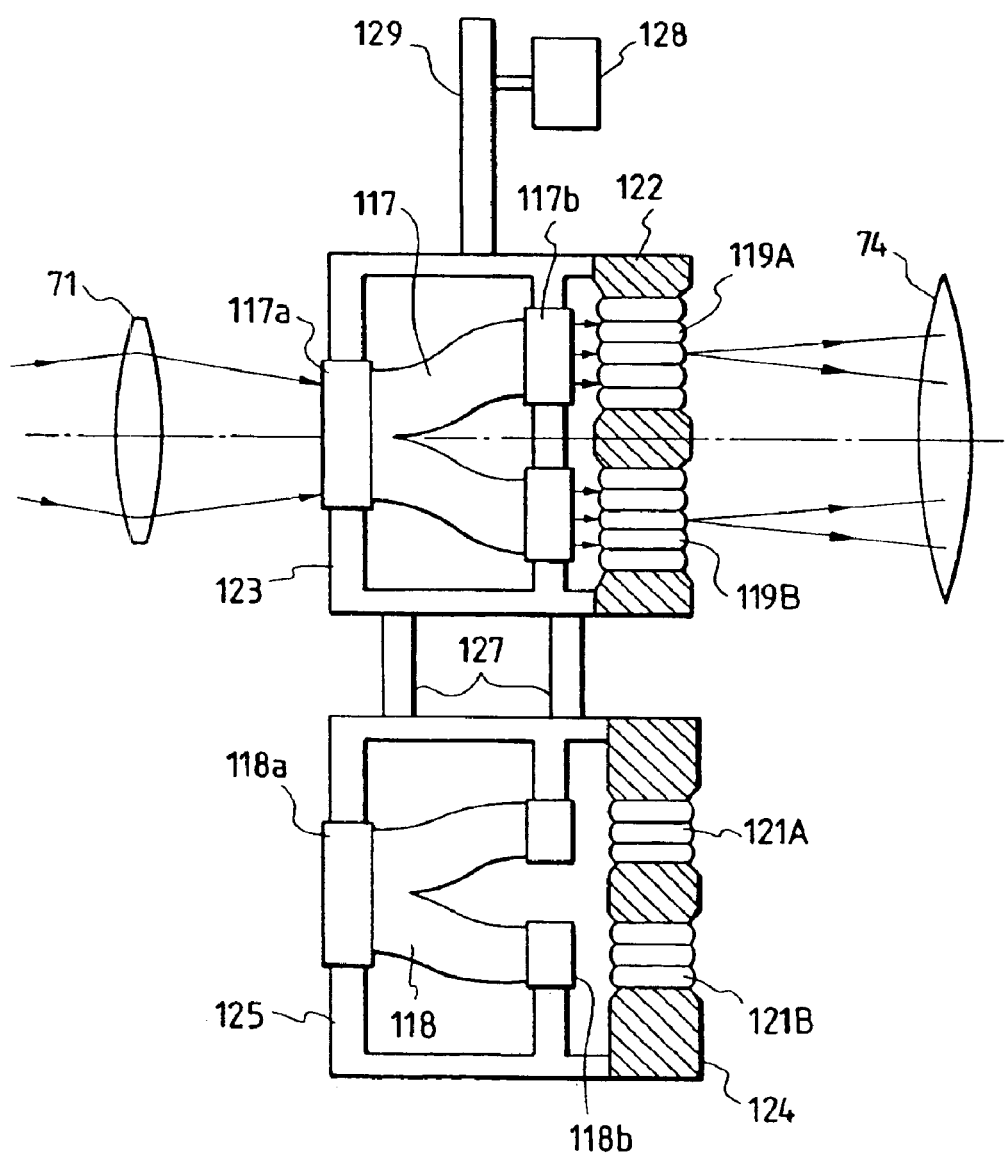
FIG. 39 is a view showing a variant form of the movable member for exchanging the plurality of holding members.

FIG. 39 is a diagram showing a variant form of the movable member for exchanging the holding member. The input optical system (optical fiber bundles 117, 118) and the holding members (122, 124) are integrally fixed to the movable member (support bar 125). It is permitted that the above-described other optical systems, though the optical fiber bundle is exemplified herein, may be employed as an input optical system. Incidentally, the fundamental construction (the example where the optical fiber bundle is used as an input optical system) has been already explained in the fourth embodiment (FIG. 32) and therefore touched briefly herein.

Referring to FIG. 39, the two fly eye lens groups 119A, 119B are integrally held by the holding member 122, while an incident portion 117a and an exit portion 117b of the optical fiber bundle 117 are both held by a fixing tool 123.

At the same moment, the holding member 122 is integrally fixed to the fixing tool 123. Excepting the fly eye lens groups 119A, 119B, the light shielding portions (the illustrated oblique line portions corresponding to, e.g., the spatial filter 16 of FIG. 37) occupy the interior of the holding member. On the other hand, the fly eye lens groups 121A, 121B for the replacement are integrally held by the holding member 124. An incident portion 118a and an exit portion 118b of an optical fiber bundle 118 are both held by a fixing tool 125. Simultaneously, the holding member 124 is integrally fixed to the fixing tool 125. As in the same way described above, the interior of the holding member 124 is formed with the light shielding portions. Further, the fixing tools 123, 125 are connectively fixed by means of a connecting member 127. Therefore, the holding members may be exchanged for every fixing tool. Note that in FIG. 39, the fixing tool 123 (holding member 122) exists in the illumination optical system, whereas the fixing tool 125 for the replacement is set in a position deviating from the illumination optical system. The constructions toward the light source from the relay lens system 71 and toward the reticle from the condenser lens 74 are the same as those shown in FIG. 37.

By the way, the holding member is exchanged by pushing or pulling the support bar 129 with the help of the drive element 128. Hence, as illustrated in FIG. 39, when exchanging the holding member, the fly eye lens groups and the optical fiber bundle are so arranged as to be integrally exchangeable. With this arrangement, it may be sufficient that the fore-going integral member groups (fixing tools) are matched in position with the illumination optical system as a whole. Produced is an advantage of eliminating the necessity for effecting the positional adjustments between the respective members (fly eye lens groups, optical fiber bundle, etc.) per exchanging process. At this time, the drive element 128 is employed also for positioning. It is therefore desirable to provide a position measuring member such as, for example, a linear encoder, a potentiometer, etc.

Note that the number of the fly eye lens groups per holding member shown in FIGS. 38 and 39 and the number of the lens elements constituting the fly eye lens groups may be arbitrarily set. Besides, the configurations of the fly eye lens group and of the incident or exit surface of the lens element are not limited to the rectangle.

Now, the respective positions of the plurality of fly eye lens groups depicted in FIGS. 38 and 39 in other words, the holding member to be selected are preferably determined (changed) depending on the reticle patterns to be transferred. A method of determining (selecting) the positions of the respective fly eye lens groups is the same with the fourth embodiment (the method being identical with that explained in the first embodiment). To be more specific, the holding member including the fly eye lens group may be disposed in the incident position (incident angle) or in the vicinity thereof on the reticle patterns to obtain the effects given by the improved optimum resolving power and focal depth to the degree of fineness (pitch) of the patterns to be transferred using the illumination luminous fluxes coming from the respective fly eye lens groups.

It is to be noted that the openings of the spatial filter 16 are desirably variable corresponding to the movements of the respective fly eye lens groups with the exchange of the holding member. Provided alternatively is a mechanism for exchanging the spatial filter 16 in accordance with the positions of the individual fly eye lenses. Besides, the device may incorporate some kinds of light shielding members.

In the embodiment discussed above, the premise is that the plurality of holding members (fly eye lens groups) are so constructed as to be exchangeable. According to the present invention, as a matter of course, the holding members are not necessarily so constructed as to be exchangeable. For instance, only the holding member 111 depicted in FIG. 38 is merely disposed in the illumination optical system. With this arrangement, there can be of course attained the effects (to actualize the projection type exposure apparatus exhibiting the high resolving power and large focal depth) of the present invention. Incidentally, if it is permitted to cause somewhat a loss in the illumination light quantity from the light source, the optical member (input optical system) for concerning the illumination luminous fluxes on the fly eye lens groups is not particularly disposed.

In this embodiment also, the other fly eye lens may be also provided. The σ-value determined by one if the respective fly eye lens groups is set to preferably 0.1 through 0.3.

The cumulative focal point exposure method described in the third embodiment is, though the first to fifth embodiments have been described so far, applicable to the first, second, fourth and fifth embodiments.

In the first through fifth embodiments discussed above, the explanations have been given by use of the mercury lamp 1 as a light source. The light source may include, however, other bright-line lamps and lasers (excimers, etc.); or a continuous spectrum light source is also available. A large proportion of the optical members in the illumination optical system are composed of lenses. However, mirrors (concave and convex mirrors) are also available. The projection optical system may be a refractive system or reflective system or reflective/refractive system. In the embodiments, the double-side telecentric system is used. However, a one-side telecentric system or non-telecentric system is also available. If the correction of the chromatic aberration of each optical system is insufficient, a band-pass filter and a dichroic mirror intervene in the light path of the illumination system to utilize only the monochromatic light.

Figure 41:
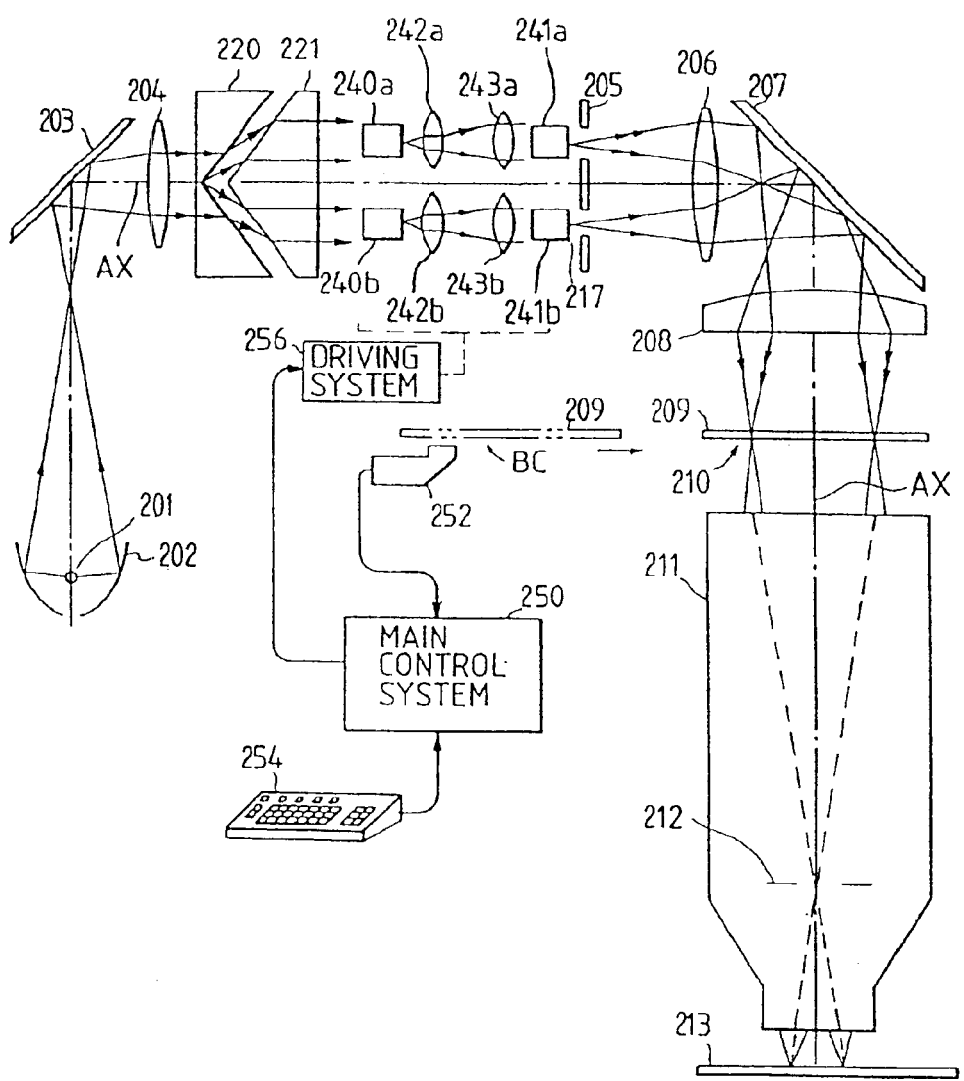
FIG. 41 is a view which illustrates the structure of a sixth embodiment of a projection exposure apparatus according to the present invention.

FIG. 41 illustrates a sixth embodiment of the present invention in which two polyhedron prisms are used to form a light dividing optical system.

Irradiation light beams emitted from a light source 201 such as a mercury lamp are gathered by an elliptical mirror 202 before they are made to be substantially parallel beams by a bending mirror 203 and an input lens 204 so that the light beams are incident on light dividing optical systems 220 and 221. A light divider according to this embodiment comprises a first polyhedron prism 220 having a V-shape concave and a polyhedron prism 221 having a V-shape convex. The irradiation light beams are divided into two light beams by the refraction effect of the aforesaid two prisms 220 and 221. The divided light beams are respectively incident on second fly-eye lenses 240a and 240b.

Although two fly-eye lenses 240a and 240b are used in this embodiment, the quantity of them may be determined arbitrarily. Although the light dividing optical system is arranged to divide the light beams into two sections to correspond to the number of the second fly-eye lens groups, the light beams may be divided into an arbitrary number of sections to correspond to the number of the second fly-eye lens groups. For example, in an arrangement in which the second fly-eye lens group is composed of four lenses, each of the light dividing optical systems 220 and 221 may be composed of a first polyhedron prism 220 having a pyramid concave and a second polyhedron prism 221 having a pyramid convex. The irradiation light beams emitted from the second fly-eye lens groups 240a and 240b are respectively incident on first fly-eye lens groups 241a and 241b by guide optical systems 242a, 243a, 242b and 243b. At this time, the first fly-eye lens 241a receives only the light beam travelled from the second fly-eye lens 240a, while the first fly-eye lens 241b receives only the light beam travelled from the second fly-eye lens 240b.

The light beams emitted from the first fly-eye lenses 241a and 241b are introduced by condenser lenses 206 and 208 and a bending mirror 207 so as to irradiate a pattern 210 formed on the lower surface of a reticle 209. The light beams, which have passed through the pattern 210, are gathered and imaged by a projection optical system 211 so that the image of the pattern 210 is formed on a wafer 213.

It should be noted that reference numeral 212 represents a Fourier transform plane (hereinafter called a "pupil surface or plane of the projection optical system") in the projection optical system 211 with respect to the pattern 210, the arrangement being sometimes arranged in such a manner that the pupil surface of the projection optical system is provided with a variable diaphragm (NA diaphragm).

Also the irradiation optical system includes a pupil surface 217 of the irradiation optical system corresponding to the Fourier transform surface with respect to the pattern 210. The reticle side focal surface (emission side focal surface) of each of the aforesaid first fly-eye lenses 241a and 241b is present at a position which substantially coincides with the pupil surface 217 of the irradiation optical system. The emission sides of the second fly-eye lenses 240a and 240b are Fourier transform surfaces with respect to the incidental surfaces of the first fly-eye lenses 241a and 241b by guide optical systems 242 and 243. However, the necessity of strictly maintaining the Fourier transform relationship can be eliminated if a relationship can be maintained in which the light beams emitted from the respective elements of the second fly-eye lens in each pair of the fly-eye lenses 240a, 241a, and the fly-eye lenses 240b, 241b are superposed on one another on the incidental surface of the first fly-eye lens.

The structure of each fly-eye lens will now be described with reference to FIG. 50. FIGS. 50A to 50D are enlarged views which illustrate an element of the fly-eye lens. Actual fly-eye lenses, for example, fly-eye lenses 240a, 240b, 241a and 241b shown in FIG. 41 are aggregates of the aforesaid elements. Some of the elements are arranged (aggregated) in a direction from the upper portion to the lower portion of FIG. 50 and a vertical direction to the surface of the drawing sheet to form one element.

Figure 50A:
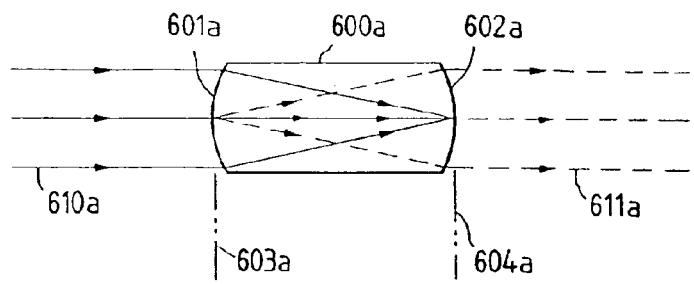
FIGS. 50A, to 50D are views which illustrate some structures of the elements of the fly-eye lens.

FIG. 50A illustrates a state where an incidental surface 401a and the light source side focal surface 403a coincide with each other and an emission surface 402a and a reticle side focal surface 404b coincide with each other. In the embodiment shown in FIG. 41 and in other embodiments hereinafter, the fly-eye lens of the type shown in FIG. 50A is used unless otherwise specified.

Parallel light beams 410a which have been incident from a light source (in the left portion of the drawing) are gathered to a reticle side focal plane 404a as designated by a solid line, while light beams (designated by a dashed line) emitted from one point on the light source side focal surface 403a are made to be parallel light beams after they have been emitted. Types respectively shown in FIGS. 50B to 50D will be described later.

The light side focal surfaces (which coincide with the incidental surfaces here) of the second fly-eye lens groups 240a and 240b and the first fly-eye lens group 241a and 241b shown in FIG. 41 hold the image forming relationship as described above. Therefore, the light beams, which have been incident on the incidental surface of each element of, for example, 240a included by the second fly-eye lens group are imaged and projected on all of the elements of the first fly-eye lens 241a. This means another fact that the light beams from each element of the second fly-eye lens 240a are superposed on one element included by the first fly-eye lens 241a. Therefore, the illuminance distribution on the incidental surface of the first fly-eye lens can be made uniform by an integration effect. Each element included by the first fly-eye lens, thus made uniform, is further integrated (superposed) so as to be used to irradiate the reticle 209. As a result, a satisfactory illuminance uniformity can be realized on the reticle 209.

Furthermore, the focal depth of a projected image of the pattern formed in a specific direction and having a pitch of the reticle pattern 210 can be enlarged extremely because the first fly-eye lens groups 241a and 241b are positioned away from optical axis AX.

Figure 42:
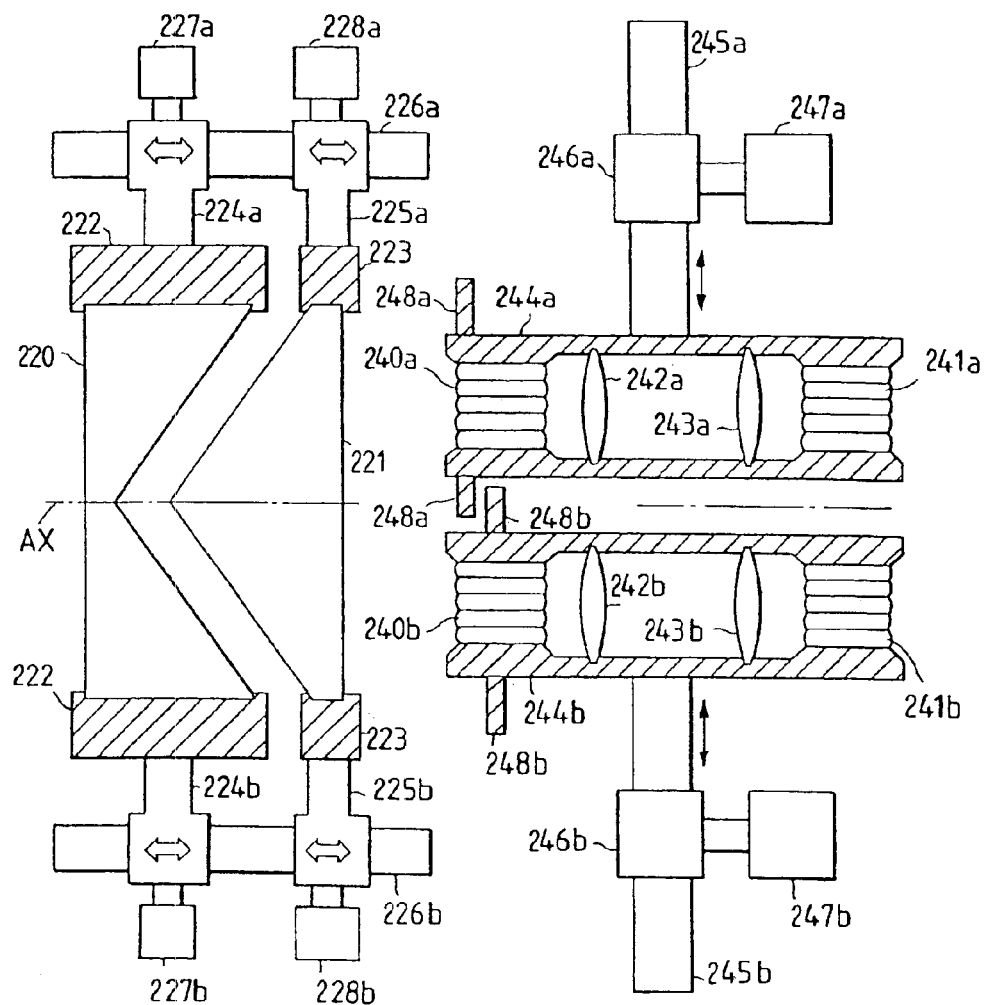
FIG. 42 is a view which illustrates a portion of the structure of the irradiation optical system shown in FIG. 41.

However, it is expected that the direction and the pitch of the reticle pattern 210 become different depending upon the employed reticle 209. Therefore, it is preferable that the direction and the pitch are made optimum with respect to each reticle 209 by arranging the structure in such a manner that the positions of the first fly-eye lens groups 241a and 241b and the guide optical systems 242a, 242b, 243a and 243b can be changed or further the second fly-eye lens groups 240a and 240b and the light dividing optical systems 220 and 221 can be changed by a drive system 256. The drive system 256 is operated in accordance with an operation command issued from a main control system 250 in such a manner that the conditions, such as the position, are set in accordance with an input made by a keyboard 254. As an alternative to this, a bar code reader 252 may be used to read a bar code pattern positioned on the reticle 209 so as to set the conditions in accordance with read information, or the aforesaid irradiation conditions may be written on the bar code pattern on the reticle 209, or the main control system 250 may previously store (previously receive) reticle names and irradiation conditions corresponding to the reticles so as to determine the irradiation conditions by collating the reticle name written on the bar code pattern with the aforesaid contents stored by the main control system 250. FIG. 42 is an enlarged view which illustrates a portion from the light dividing optical systems 220 and 221 shown in FIG. 41 to the first fly-eye lens groups 241a and 241b.

Assumptions are made here that the surface of the first polyhedron prism 220 and that of the second polyhedron prism 221 facing each other are parallel to each other, and the incidental surface of the prism 220 and the emission surface of the prism 221 are perpendicular to optical axis AX. The first polyhedron prism 220 is held by a holding member 222, while the second polyhedron prism 221 is held by a holding member 223. The holding members 222 and 223 are held by a corresponding movable member group 24a, 24b and another group 225a and 225b in such a manner that the holding members 222 and 223 can be moved in a direction from right to left of the drawing sheet, that is along optical axis AX. The aforesaid operation is performed by activating members 227a, 227b, 228a and 228b such as a motor. Since the first polyhedron prism 220 and the second polyhedron prism 221 are capable of individually moving, the interval between the two emitted light beams can be radially changed while being centered at a point on optical axis AX by changing the interval between the two prisms 220 and 221.

A plurality of light beams emitted from the polyhedron prism 221 are incident on the second fly-eye lens groups 240a and 240b. In the structure shown in FIG. 42, a group consisting of one of the second fly-eye lens groups, one of the first fly-eye lens groups, and one of the guide optical systems 242 and 243 is held by one of the corresponding holding member 244a and 244b. Since the holding members 244a and 244b are held by movable members 245a and 245b, they can be moved with respect to the positions of stationary members 246a and 246b. The aforesaid operation is performed by activating members 247a and 247b.

By integrally holding and moving the second fly-eye lens, the first fly-eye lens and the guide optical system, the positions of the light beams emitted from the first fly-eye lens can be arbitrarily changed in a plane perpendicular to optical axis AX while maintaining the optically positional relationship between the first fly-eye lens and the second fly-eye lens. It should be noted that members 248a and 248b projecting from the holding members 244a and 244b are light shielding plates. As a result, stray light beams generated by the light dividing optical system can be shielded and a problem that unnecessary light beams reach the reticle can be prevented. Furthermore, the limit present in the movable range for the holding members 244a and 244b can be reduced since the light shielding plates 248a and 248b are respectively deviated in the direction along optical axis AX.

Figure 43A:
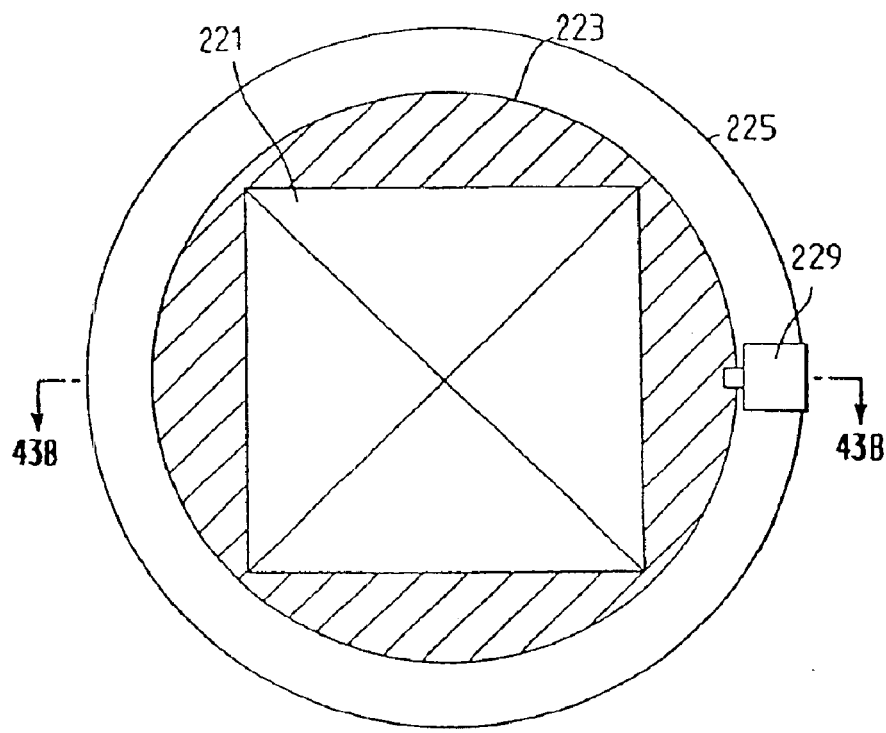
FIGS. 43A and 43B are views which illustrate the structure of a prism for dividing the light divider in the irradiation optical system into four portions.
Figure 43B:
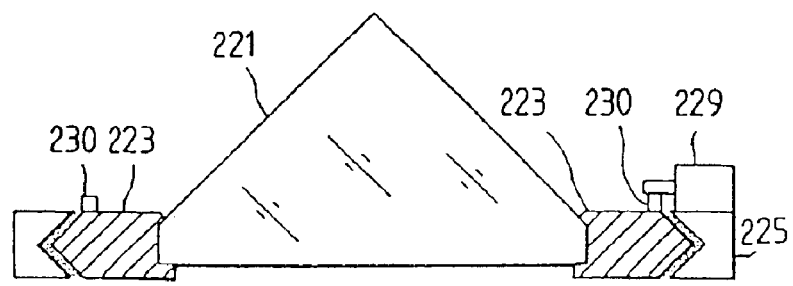

Although the structure shown in FIG. 42 is arranged in such a manner that the position of each of the divided light beams can be radially changed with respect to optical axis AX by changing the optical axial directional interval between the light dividing optical systems (polyhedron prisms) 220 and 221, the directions in which light beam pass may be changed in concentrical directions relative to a position on optical axis AX. FIG. 43 illustrates an embodiment in the aforesaid case in which the holding member 223 for holding the second polyhedron prism (the pyramid prism) 221 is held by a fixing member 225 and the holding member 223 can be rotated with respect to the fixing member 225 within the surface of the drawing sheet drawn on FIG. 43A. The aforesaid rotation is caused by a drive member 229 such as a motor provided for the fixing member 229. Furthermore, a gear 230 is disposed adjacent to the holding member 223 to correspond to the position of the motor 229. FIG. 43B is a cross sectional view taken along arrows 43B shown in FIG. 43A.

The fixing member 225 may be held as shown in FIG. 42 in such a manner that it is able to move in the direction of optical axis AX. Although FIG. 43 illustrates the case where the rotation is enabled with respect to the second polyhedron prism 221, an arrangement may be employed in which the rotation is also enabled with respect to the first polyhedron prism 220 (with respect to optical axis AX). As an alternative to the structure in which the polyhedron prisms 220 and 221 are individually rotated, the stationary members 226a and 226b shown in FIG. 42 may be rotated with respect to another stationary member (for example, an exposure device or the like) relative to optical axis AX. In this case, the rotary mechanism may be arranged, for example, in such a manner that the holding member 223 shown in FIG. 43, in place of the polyhedron prism 221, holds the stationary members 226a and 226b shown in FIG. 41.

Figure 44:
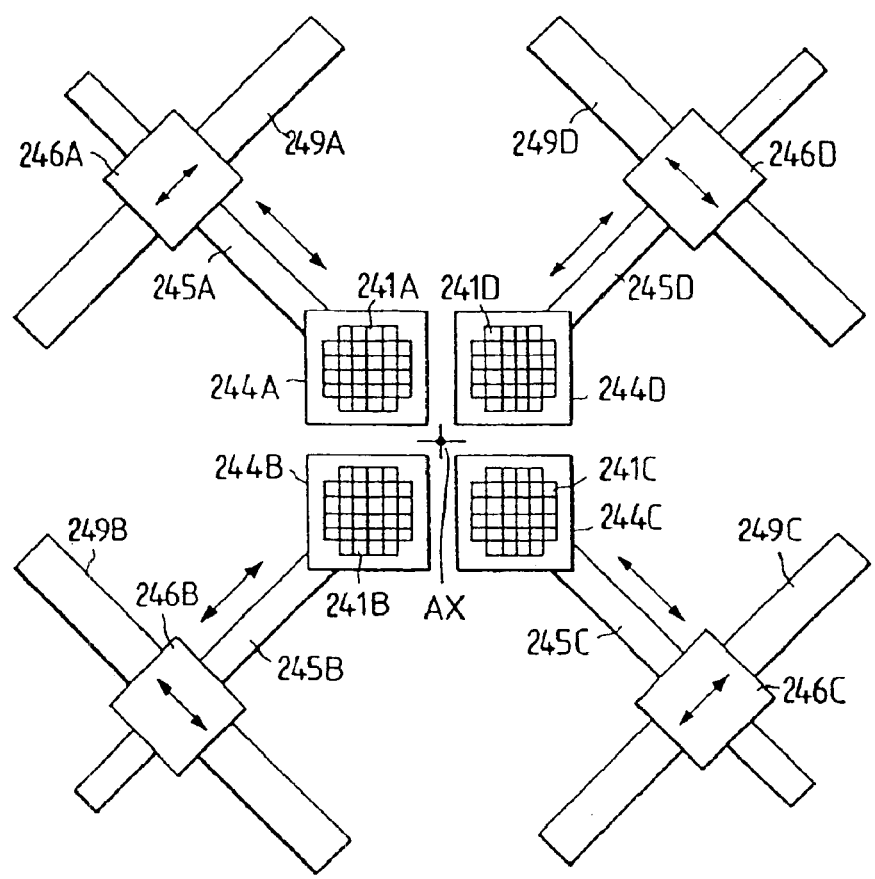
FIG. 44 is a view which illustrates the structure of a moving mechanism for fly-eye lens groups.

As described above, in a case where the positions of a plurality of the light beams emitted from the light dividing optical systems 220 and 221 are radially or concentrically changed relative to optical axis AX, the positions of the second fly-eye lens groups 240a and 240b, on which the aforesaid light beams are incident, must be varied in accordance with the changes in the positions of the light beams. FIG. 44 illustrates an example of mechanism whereby a two dimensional (in a direction on a plane perpendicular to optical axis AX) operation can be performed. FIG. 44 is a view which illustrates the members (the holding members 244a and 244b) for integrally holding the second fly-eye lenses 240a and 240b, the guide optical systems 242a, 242b, 243a and 243b and the first fly-eye lenses 241a and 241b shown in FIG. 42, viewed from a position adjacent to the reticle in a direction along optical axis AX. Synthetic fly-eye lenses 241A, 241B, 241C and 241D are held by corresponding holding members 244A, 244B, 244C and 244D which are held by movable members 245A, 245B, 245C and 245D, the synthetic fly-eye lenses 241A, 241B, 241C and 241D being able to radially move relative to optical axis AX by activating members 86A, 86B, 86C and 86D. The activating members 86A, 86B, 86C and 86D are able to move on the stationary members 89A, 89B, 89C and 89D in directions substantially perpendicular to the aforesaid radial directions (in substantially concentric directions). Therefore, the synthetic fly-eye lenses 241A, 241B, 241C and 241D are able to be two-dimensionally moved on the plane (on the surface of the drawing sheet) perpendicular to optical axis AX. As a result, the light beams divided by the light dividing optical system can be efficiently applied to the reticle.

The directions in which the movable members 245A, 245B, 245C and 245D shown in FIG. 44 are moved are not limited to the radial directions relative to optical axis AX. The directions may be arbitrary directions perpendicular to optical axis AX. Also in a case where a system can be only moved one-dimensionally as shown in FIG. 42, the directions may be arbitrary directions perpendicular to optical axis AX.

Figure 45:
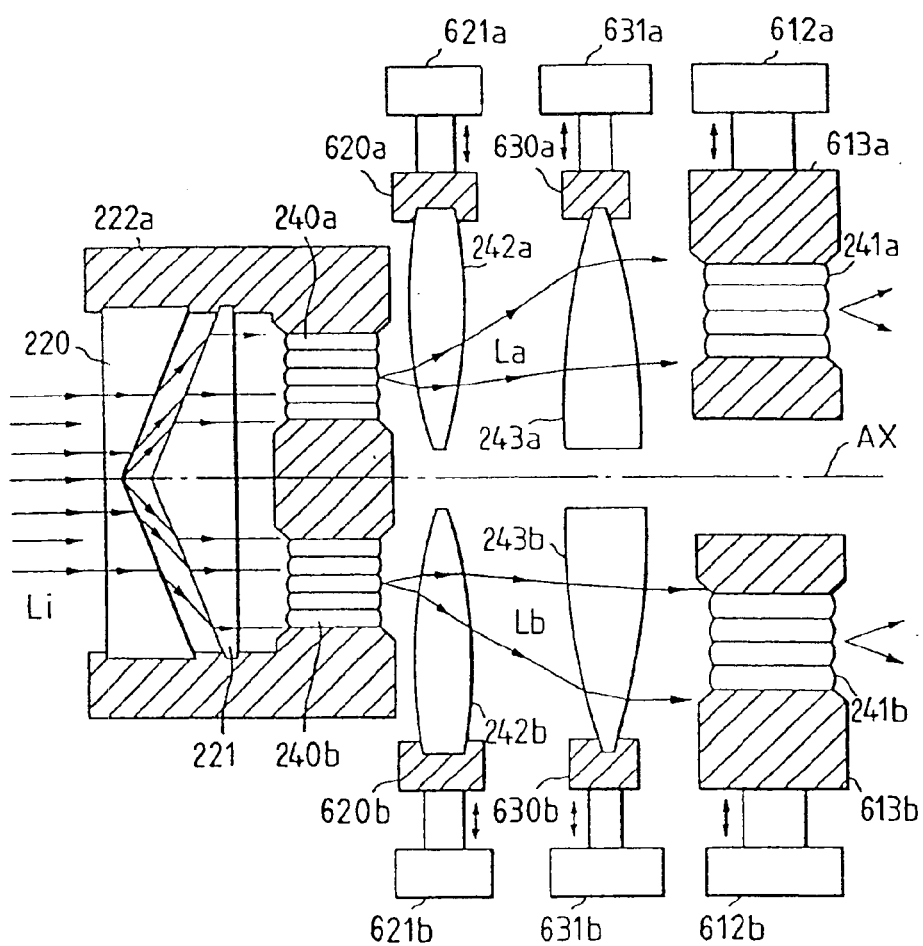
FIG. 45 is a view which illustrates a modification of a partial structure of the irradiation optical system.

FIG. 45 illustrates a modification of the guide optical system, wherein all of the guide optical systems 242a, 242b, 243a and 243b are disposed eccentrically with respect to the centers of the second fly-eye lenses 240a and 240b and the first fly-eye lenses 241a and 241b.

The positions of irradiation light beams emitted from the second fly-eye lenses 240a and 240b are changed on the plane perpendicular to optical axis AX by the eccentric guide optical systems 242a, 242b, 243a and 243b before the irradiation light beams are incident on the first fly-eye lenses 241a and 241b.

Furthermore, the positions (the positions on the plane perpendicular to optical axis AX) of the light beams on the incidental surfaces of the first fly-eye lens groups 241a and 241b can be changed by changing the degree of eccentricity of the guide optical systems 242a, 242b, 243a and 243b. The structure shown in FIG. 45 is arranged in such a manner that the change of the eccentricity amount is performed by activating members 621a, 621b, 631a and 631b. The activating members 621a, 621b, 631a and 631b enable the guide optical systems 242a, 242b, 243a and 243b via holding members 420a, 420b, 430a and 430b. The incidental surfaces (the left end portion of the drawing) of the second fly-eye lenses 240a and 240b and the incidental surfaces (the left end portion of the drawing) of the first fly-eye lenses 241a and 241b hold a substantially image forming relationship. The aforesaid image forming relationship (in a direction along optical axis AX) cannot be out of order if the operations of the guide optical systems 242a, 242b, 243a and 243b are performed on the plane perpendicular to optical axis AX. Also the first fly-eye lenses 241a and 241b are, similarly to the guide optical members, able to move in a direction on the plane perpendicular to optical axis AX by activating members 611a and 611b.

In the system shown in FIG. 45, the light beams emitted from the second fly-eye lenses 240a and 240b can be moved to arbitrary positions on the plane perpendicular to optical axis AX by the guide optical systems 242a, 242b, 243a and 243b. Therefore, the second fly-eye lens groups 240a and 240b and the light dividing optical systems 220 and 221 may be stationarily disposed in place of the arrangement in which they are able to move. In the structure shown in FIG. 45, the aforesaid elements are held by a common holding member 222a. In a case where the arrangement is made to comprise, as shown in FIG. 45, the guide optical systems 242a, 242b, 243a and 243b and the first fly-eye lens groups 241a and 241b, the light dividing optical systems 220 and 221 and the second fly-eye lens groups 240a and 240b may be arranged to be movable as shown in FIGS. 42 and 43. Although the structure shown in FIG. 45 is arranged in such a manner that both the first and the second fly-eye lenses respectively comprise two lenses, the number can be arbitrarily determined.

Figure 46:
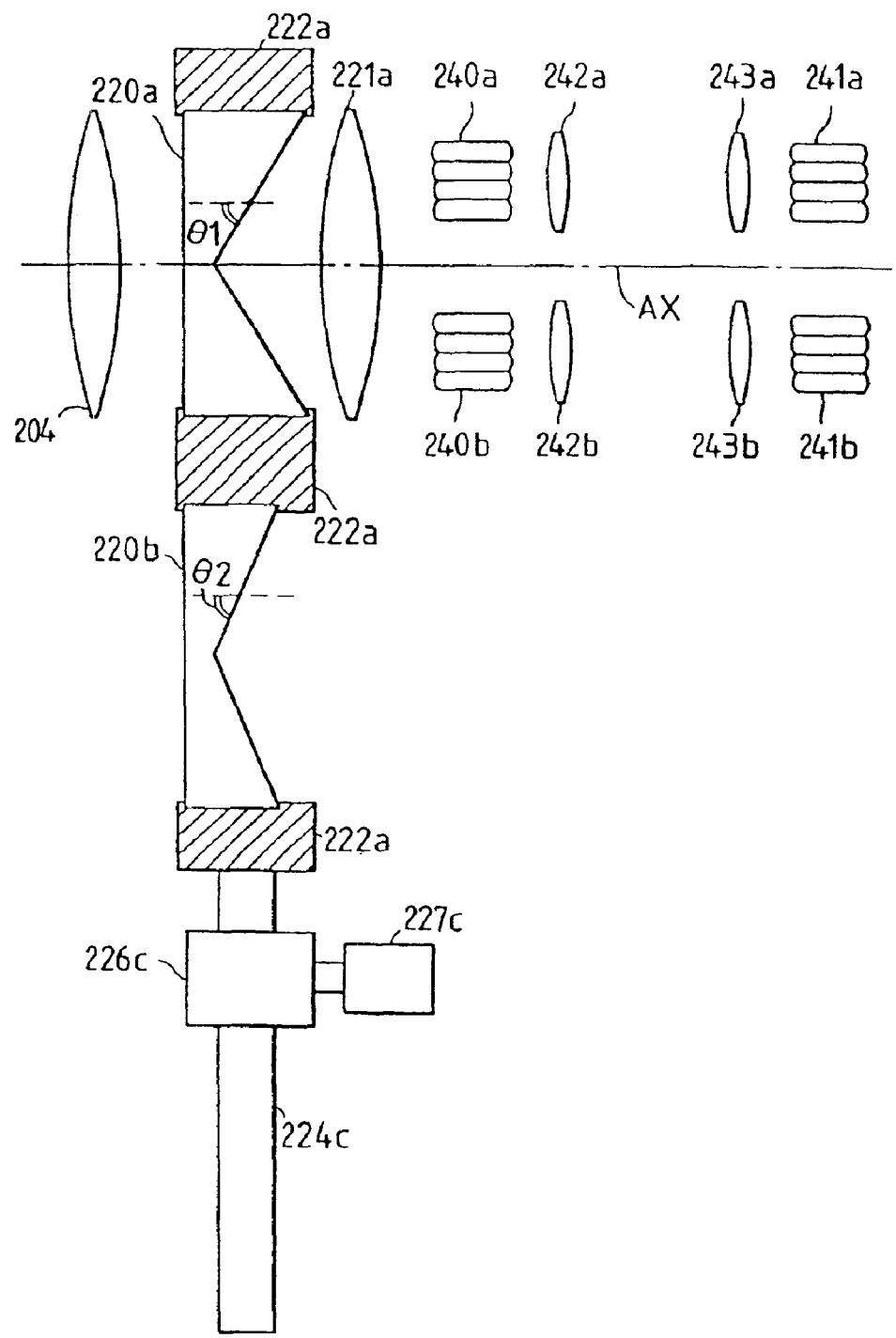
FIG. 46 is a view which illustrates a first modification of the light divider in the irradiation optical system.
Figure 47:
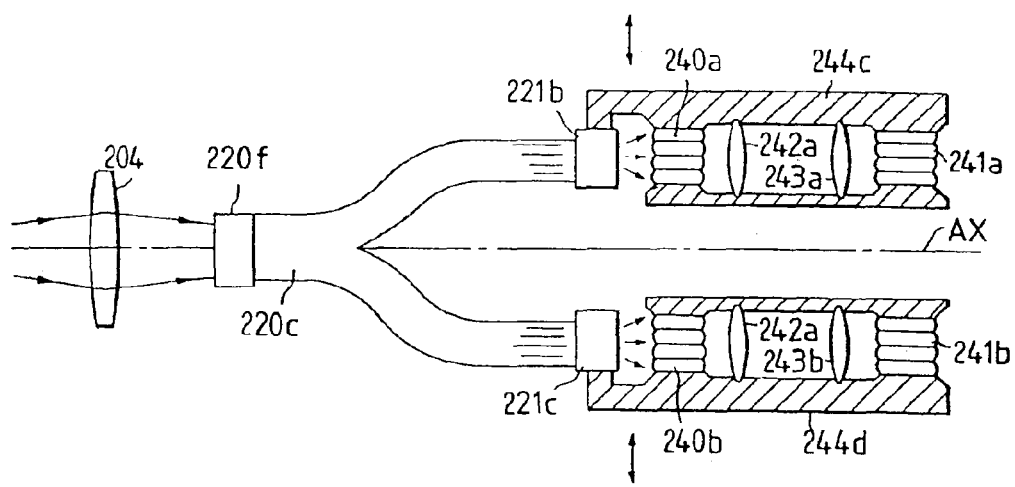
FIG. 47 is a view which illustrates a second modification of the light divider in the irradiation optical system.
Figure 48:
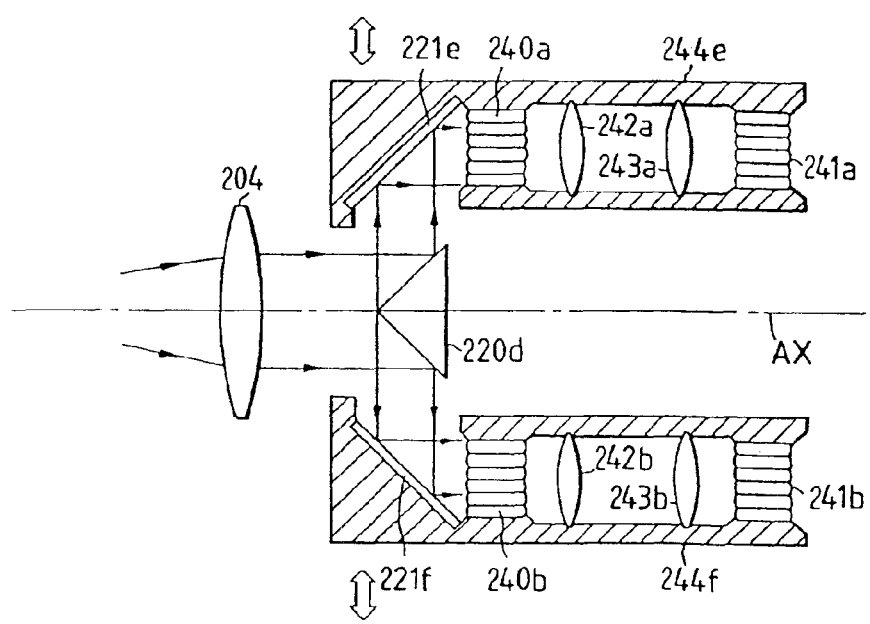
FIG. 48 is a view which illustrates a third modification of the light divider in the irradiation optical system.

FIGS. 46, 47 and 48 illustrate modifications of the light dividing optical system. The structure shown in FIG. 46 is composed of concave polyhedron prism 220a and a convex lens (or a lens group having positive power) 221a. Irradiation light beams emitted from an input lens 204 are divided and scattered by the polyhedron prism 220a, and then they are gathered by the convex lens 221a so that they are incident on the second fly-eye lenses 240a and 240b. It should be noted that change of the angle θ1 of inclination of the inclined surface of the polyhedron prism 220a will, at the positions adjacent to the second fly-eye lenses 240a and 240b, enable the positions of the divided light beams to be changed on the plane perpendicular to optical axis AX. For example, an arrangement may be employed in which two polyhedron prisms 220a and 220b having individual inclination angles θ1 and θ2 are used in such a manner that they can be interchanged by an activating member 227c. In the above mentioned structure, the two polyhedron prisms 220a and 220b are held by an integrated holding member 222a which is held by a movable member 24c. The movable member 24c is able to move with respect to a stationary member 226c by the power of an activating member 227c.

Although the two polyhedron prisms shown in FIG. 46 are arranged in such a manner that they have the inclined surfaces having individual angles but formed in the same direction, the directions may be different from each other. As an alternative to this, either of them may have a bisectioning V-shape recess and the residual one a pyramid recess. The mechanism for holding the second fly-eye lens groups 240a, 240b, the guide optical systems 242a, 242b, 243a and 243b and the first fly-eye lens groups 241 and 241b is formed similarly to those shown in FIGS. 42, 44 and 45.

FIG. 47 illustrates an example in which an optical fiber 220c is used as the light dividing optical system. Irradiation light beams incident on an incidental portion 220b of a fiber are divided into two sections by emitting portions 221b and 221c. The emitting portions 221b and 221c are held by holding members 244c and 244d which also integrally hold the synthetic fly-eye lens shown in FIG. 42. Hence, the positions of the light beams can automatically be moved (caused to follow) when the synthetic fly-eye lenses are moved.

FIG. 48 illustrates an example in which a plurality of mirrors 220d, 221e and 221f are used as the light dividing optical system. A first mirror 220d is a V-shape mirror for dividing the light beams into two sections. Second mirrors 221e and 221f are flat mirrors for introducing the light beams into the first fly-eye lenses 240a and 240b. This example is arranged in such a manner that the second mirrors 221e and 221f are integrally held by holding members 244e and 244f which integrally hold the synthetic fly-eye lens.

In the two examples shown in FIGS. 47 and 48, the holding members 244c, 244d, 244e and 244f for holding the lenses are able to move on a plane in a direction perpendicular to optical axis AX similarly to FIG. 42 or 44. The number of the fly-eye lenses and the number of the divided sections divided by the light dividing optical system are not limited to two and are therefore determined arbitrarily. In the structure shown in FIG. 47, the number of the divided sections of the fiber 220c may be changed, while a pyramid mirror (dividing into four sections) may be employed as the first mirror 220d in the structure shown in FIG. 48.

Figure 49:
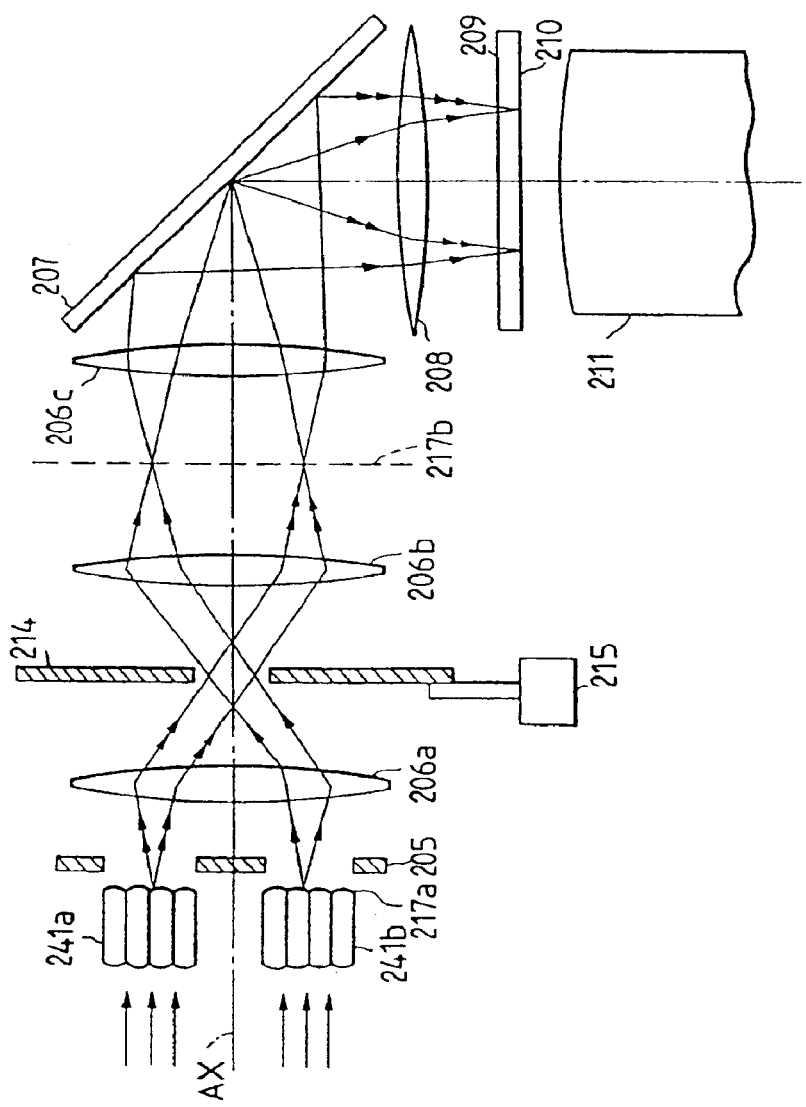
FIG. 49 is a view which illustrates another structure of the irradiation optical system.

The structure of the light dividing optical system is not limited to the aforesaid description. For example, diffraction gratings, in particular, phase diffraction gratings, or a convex lens array can be used in place of the polyhedron prisms 220a and 220b shown in FIG. 46. FIG. 49 illustrates a modification of the system from the first fly-eye lens groups 241a and 241b to the projection optical system 211. Irradiation light beams emitted from the emission surface of the first fly-eye lens, that is, from the Fourier transform surface with respect to the reticle pattern 210, are gathered and shaped by a relay lens 206a. At this time, a plane which holds an image forming relationship with the reticle pattern 210 is formed by the action of the relay lens 206a. Therefore, the irradiation area on the surface of the reticle pattern can be limited by disposing a visual field diaphragm (irradiation area diaphragm) 214 on the aforesaid plane.

Irradiation light beams are applied to the reticle 209 via a relay lens 206b, a condenser lens 206c and 208 and a mirror disposed consecutively to the visual field diaphragm 214. Furthermore, a Fourier transform surface 217b of the reticle pattern 210 appears between the relay lens 206b and the condenser lens 206c.

Although an aperture diaphragm 205 shown in FIG. 49 is disposed adjacent to the emission side of the second fly-eye lens, it may be disposed adjacent to the Fourier transform surface 217b.

Elements of the fly-eye lens for use in the structure according to the present invention will now be described with reference to FIG. 50. FIG. 50A illustrates the aforesaid structure in which the incidental surface 601a, the light source side focal plane 603a, the emission surface 602a and the reticle side focal surface 604a coincide with one another.

However, in the structure shown in FIG. 50A, all of the irradiation light beams in the element of the fly-eye lens pass through a glass element and a light converged point is generated in the glass (fly-eye lens). In a case where a pulse laser such as an excimer laser is used as the light source, energy per pulse becomes excessively large and therefore there arises risk of breakage of the glass element by the optical energy in the converged point if the converged point is present in the glass element.

Figure 50B:
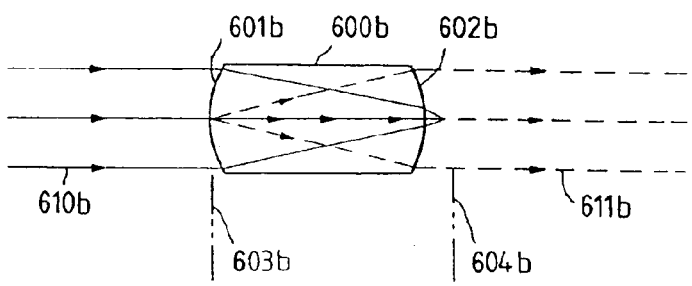
Figure 50C:
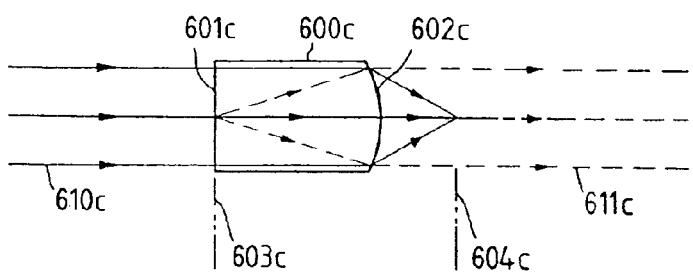

FIGS. 50B and 50C respectively illustrate examples of the fly-eye lenses for preventing the aforesaid problem. FIG. 50B illustrates a structure in which both an incidental surface 601b and an emission surface 602b are made of the surfaces of a convex lens, and a reticle side focal surface 604b is different from an emission surface 602b (a light source side focal surface 603b and an incidental surface 601b coincide with each other). The aforesaid arrangement can be realized by changing the curvature of the incidental surface 601b and that of the emission surface 602b from each other. As a result, the light beams emitted from the light source are converged at a point outside the fly-eye lens element 600b.

FIG. 50C illustrates a modification of the structure shown in FIG. 50B, where a fly-eye lens element 600c has a flat incidental surface 601c. Also in this case, the converged point (a reticle side focal surface 604c) can be located outside the lens 600c. Furthermore, the light beams are not gathered in the lens 600c. However, the light beams except for vertical and parallel beams come in contact with the inner wall of the fly-eye lens 600c and therefore stray beams are generated because the incidental surface 601c has no refraction effect. Therefore, the structure shown in FIG. 50C will enable an excellent effect to be obtained as the second fly-eye lens in a case where the light source comprises the laser beam source. The reason for this lies in that use of the laser beam source will enable the incidental light beams to be parallel beams and to be perpendicularly incident on the first fly-eye lens.

On the contrary, the structure shown in FIG. 50B is suitable when it is used as the first fly-eye lens in a case where the light source is the laser beam similarly to the structure shown in FIG. 50C.

Figure 51:
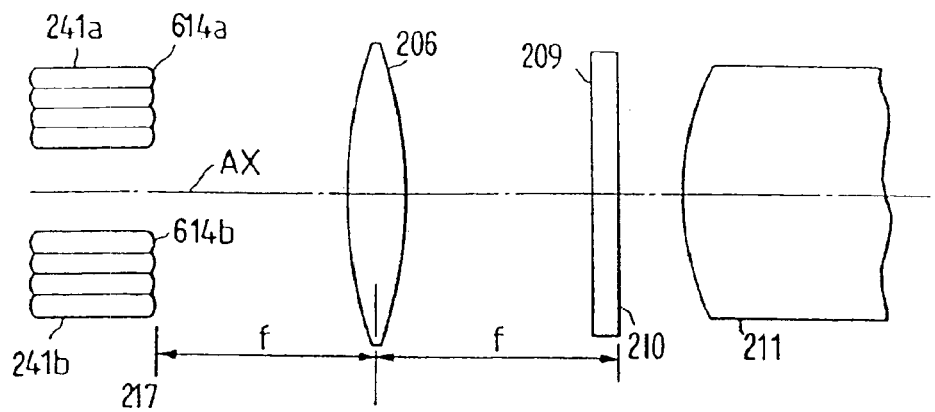
FIG. 51 is a view which illustrates the principle of the configuration of the fly-eye lenses in the irradiation optical system.

Specific examples of determining the positions of each first fly-eye lens group will now be described with reference to FIGS. 51 and 52A to 52D. FIG. 51 is a view which schematically illustrates a portion from the first fly-eye lens groups 241a and 241b to the reticle pattern 210. In the structure shown in FIG. 51, reticle side focal surfaces 614a and 614b of the first fly-eye lens group 241 coincide with the Fourier transform surface 217 of the reticle pattern 210. A lens or a lens group which cause the two elements to hold the Fourier transformation relationship is expressed by one lens 206. Furthermore, an assumption is made that both of the distance from the principal point of the lens 206 facing the fly-eye lens to the reticle side focal surfaces 614a and 614b of the fly-eye lens group 241 and the distance from the principal point of the lens 206 facing the reticle to the reticle pattern 210 are f.

Figure 52A:
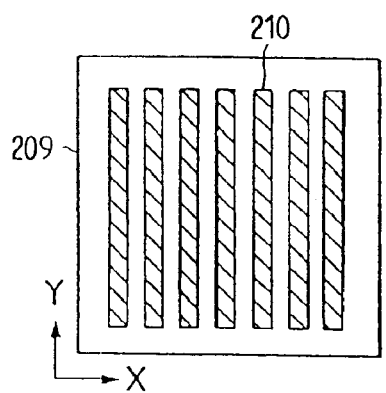
FIGS. 52A to 52D are views which illustrate a method of disposing the fly-eye lenses.
Figure 52B:
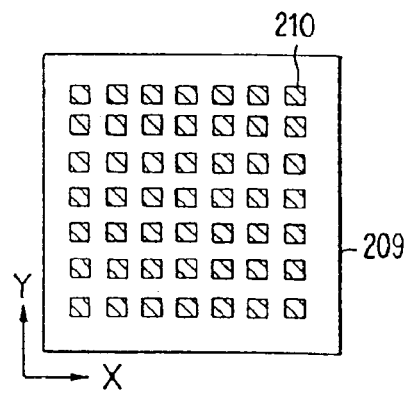
Figure 52C:
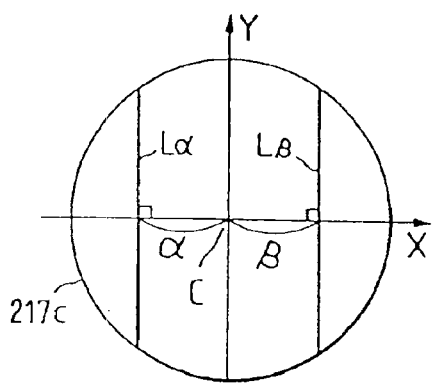
Figure 52D:
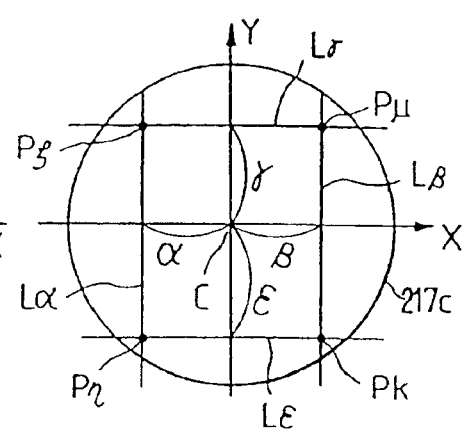

FIGS. 52A and 52C illustrate an example of a portion of a pattern to be formed in the reticle pattern 210. FIG. 52B illustrates a position on the Fourier transform surface 217 (on the pupil surface of the projection optical system) at the center of the first fly-eye lens group which is most suitable in the case of the reticle pattern shown in FIG. 52A. FIG. 52D illustrates the positions (the positions of the centers of the optimum fly-eye lens groups) of the fly-eye lens groups which are most suitable in the case of the reticle pattern shown in FIG. 52C.

Figure 50D:
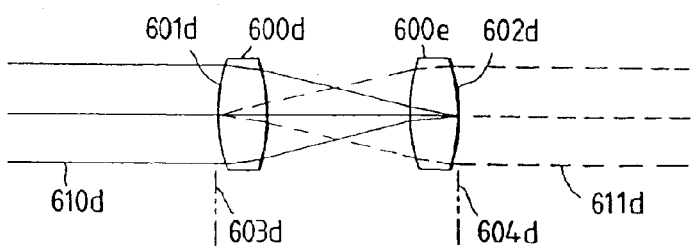

A fly-eye lens element shown in FIG. 50D is composed of two convex lenses 600d and 600e. The structure is arranged to be different from those shown in FIGS. 50A to 50C in such a manner that a space between the two convex lenses 600d and 600e is filled with air or nitrogen or helium gas. In a case where an exposure wavelength of 200 nm or less is used, it is preferable that the volume of a transmissive solid portion made of, for example, glass be minimized as shown in FIG. 50D because a proper lens material having satisfactory transmissivity cannot be available. In this case, it is preferable to constitute the projection optical system by a reflecting optical system (a refractive member may be partially employed) and also the light dividing optical system may use a reflecting mirror arranged as shown in FIG. 48.

A method of optimizing the aforesaid systems to correspond to the reticle pattern to be exposed will now be described. It is preferable that the position (the position on the plane perpendicular to the optical axis) of each first fly-eye lens group be determined (changed) in accordance with the reticle pattern to be transferred. In this case, the position may be determined as described above in such a manner that the irradiation light beams from the first fly-eye lens groups are incident on the reticle pattern at a position at which the optimum resolution and an effect case of the reticle pattern shown in FIG. 52A. FIG. 52D illustrates the positions (the positions of the centers of the optimum fly-eye lens groups) of the fly-eye lens groups which are most suitable in the case of the reticle pattern shown in FIG. 52C.

FIG. 52A illustrates a so-called one-dimensional line-and-space pattern in which transmissive portions and light shielding portions are arranged in direction Y while having the same width and furthermore they are regularly arranged in direction X at pitch P. At this time, the optimum positions for each first fly-eye lens are, as shown in FIG. 52B, arbitrary points on line segments $L\alpha$ and $L\beta$ assumed on the Fourier transform surface. FIG. 52B is a view which illustrates the Fourier transform surface 217 with respect to the reticle pattern 210 when viewed in a direction of optical axis AX, wherein coordinate system X and Y on the surface 217 is made to be the same as that of FIG. 52A which illustrates the reticle pattern when viewed in the same direction.

Referring to FIG. 52B, the distances a and P from center C, through which optical axis AX passes, to line segments La and $L\beta$ hold a relationship expressed by $\alpha=\beta$ which is equal to $f \cdot (\frac{1}{2}) \cdot (\lambda/P)$. Expressing the distances $\alpha$ and $\beta$ by $f \cdot \sin \Phi$, $\sin \Phi = \lambda/2P$ coincides with the aforesaid value. Therefore, if each center (each center of gravity of the light quantity distribution of secondary light source images each of which is formed by the first fly-eye lenses) is positioned on line segments $L\alpha$ and $L\beta$ either of ±1-order diffracted light beams generated from the irradiation light beams from each fly-eye lens and 0-order diffracted light beam pass through positions of a line-and-space pattern shown in FIG. 52A which are the same distance from optical axis AX on the pupil surface 212 of the projection optical system 211. Hence, the focal depth with respect to the line-and-space pattern (see FIG. 52A) can be made largest and therefore high resolution can be obtained.

FIG. 52C illustrates a case where the reticle pattern is a so-called isolated space pattern, wherein the X-directional (in the lateral direction) pitch of the pattern is Px and the Y-directional (in the longitudinal direction) pitch of the same is Py. FIG. 52D is a view which illustrates the optimum position for each first fly-eye lens in the aforesaid case, wherein the positional and rotational relationship with FIG. 52C are the same as that between FIG. 52A and 52B. When the irradiation light beams are incident on the two-dimensional pattern arranged as shown in FIG. 52C, diffracted light beams are generated in the two-dimensional direction which corresponds to the periodicity in the two-dimensional direction of the pattern. Also in the two-dimensional pattern arranged as shown in FIG. 52C, the focal depth can be made maximum by causing either of the ±1-order diffracted light beams and the 0-order diffracted light beams to be the same distance from optical axis AX on the pupil surface 212 of the projection optical system 211. Since the pitch in the direction X is Px in the pattern shown in FIG. 52C, a maximum focal depth of the X-directional component of the pattern can be obtained if the center of each fly-eye lens is positioned on the line segments $L\alpha$ and $L\beta$ which hold the relationship $\alpha=\beta=f \cdot (\frac{1}{2}) \cdot (\lambda/Px)$. Similarly, if the center of each fly-eye lens is present on line segments $L\gamma$ and $L\epsilon$ which hold the relationship $\gamma=\epsilon=f \cdot (\frac{1}{2}) \cdot (\lambda/Py)$, the maximum focal depth of the Y-directional component of the pattern can be obtained.

As described above, when the irradiation light beams from the fly-eye lens groups disposed at the positions shown in FIG. 52B or 52D are incident on the reticle pattern 210, 0-order diffracted light beam component Do and either +1-order diffracted light beam component DR or −1-order diffracted light beam component Dm pass through the optical path on the pupil surface 212 in the projection optical system 211 at the same distance from optical axis AX. Therefore, a projection exposure apparatus revealing high resolution and a large focal depth can be realized.

Although only the two examples as illustrated in FIGS. 52A and 52B have been considered as the reticle pattern 210, another pattern may be used in such a manner that the center of each fly-eye lens is located at a position which causes either of +1-order or −1-order diffracted light beam component from the pattern and the 0-order diffracted light beam component to pass through the optical path which is located at substantially the same distance from optical axis AX on the pupil surface 212 in the projection optical system. In the example of the pattern shown in FIGS. 52A and 52B, the ratio (duty ratio) of the line portion and the space portion is 1:1, and therefore ±1-order diffracted light beams become intensive. Hence, attention is paid to the positional relationship between either of the ±1-order diffracted light beams and the 0-order diffracted light beam. However, in a case where the duty ratio of the pattern is not 1:1 or the like, an arrangement may be employed in which the positional relationship between another diffracted light beam, for example, either of ±2-order diffracted light beams and the 0-order diffracted light beam are allowed to pass through the positions distant, by the same distance, from optical axis AX on the pupil surface 212 of the projection optical system.

In a case where the reticle pattern 210 has, as shown in FIG. 52D, the two-dimensional cyclic pattern, a high order diffracted light beam component higher than 1-order distributed in direction X (in the first direction) with respect to one of the 0-order diffracted light beam components and a high order diffracted light beam component higher than 1-order distributed in direction Y (in the second direction) can be present on the pupil surface 212 of the projection optical system when attention is paid to a specific 0-order diffracted light beam component. Assuming that the image of a two-dimensional pattern is satisfactorily formed with respect to one specific 0-order diffracted light beam component, it is necessary for the position of a specific 0-order diffracted light beam component (one of the first fly-eye lenses) to be adjusted in such a manner that the three components consisting of one of the high-order diffracted light beam component distributed in the first direction, one of the same distributed in the second direction and the specific 0-order diffracted light beam component are distributed by the same distance from optical axis AX on the pupil surface. For example, it is preferable that the center of the first fly-eye lens be made coincide with any one of points Pξ, Pη, Pκ, and Pμ. Since all of the points Pξ, Pη, Pκ, and Pμ are intersections of line segment Lα or Lβ (the optimum portion in terms of the periodicity in the direction X, that is, the position at which the 0-order diffracted light beam and either of the ±1-order diffracted light beam in the direction X are spaced by the same distance from the optical axis on the pupil surface 212 of the projection optical system) and line segments Lγ and Lε (the optimum position in terms of the periodicity in the direction Y), the aforesaid position is the optimum position in either of the directions X and Y.

Although the description has been given while assuming a two dimensional pattern having the two-dimensional directionality at the same point on the reticle, the aforesaid method can be adapted to a case where a plurality of patterns having different directionalities are present in the same reticle pattern.

In a case where the pattern on the reticle has a plurality of directionalities or precisions, the optimum positions for the fly-eye lens groups are the positions which correspond to the directionality of each pattern and the precision. As an alternative to this, the first fly-eye lens may be disposed at the mean position of the optimum positions. The aforesaid mean position may be the mean load position obtained by adding weight to the precision or the significance of the pattern.

The 0-order light beam components emitted from the first fly-eye lens are incident on the wafer while being inclined with respect to the wafer. In this case, a problem arises in that the position of the transferred image is undesirably shifted in a direction on the wafer at the time of finely defocusing the wafer 213 if the direction of the center of gravity of the light quantities of (a plurality of) the inclined incident light beams is not perpendicular to the wafer. In order to prevent this, the direction of the center of gravity of the light quantities on the image forming surface or on its adjacent surface must be perpendicular to the wafer, that is, in parallel to optical axis AX.

That is, assuming an optical axis (the center line) for each first fly-eye lens, the vector sum of the product of the position vector on the Fourier transform surface of the optical axis (the center line) with respect to optical axis AX of the projection optical system 211 and the light quantity emitted from each fly-eye lens must be zero.

A further simple method may be employed in which 2m (m is a natural number) first fly-eye lenses are used, the positions of m first fly-eye lenses are determined by the aforesaid optimizing method (see FIG. 52) and the residual m first fly-eye lenses are disposed symmetrical to optical axis AX. The detailed description about the aforesaid structure has been disclosed in U.S. Pat. Ser. No. 791,138 (filed on Nov. 13, 1991).

As described above, when the position of each first fly-eye lens is determined, the position (see FIG. 45) of the guide optical system and the state (see FIGS. 42, 43 and 46) of the light dividing optical system are determined. The positions and the like of the guide optical system, the light dividing optical system or the second fly-eye lens must be determined so as to cause the irradiation light beams to be incident on the first fly-eye lens most efficiently (in such a manner that the light quantity loss can be prevented).

In the aforesaid system, it is preferable that each moving portion has a position detector such as an encoder. The main control system 250 or the drive system 256 shown in FIG. 41 moves, rotates and exchanges each element in accordance with position information supplied from the aforesaid position detector. As for the shape of the lens element for each fly-eye lens group, the effective area of the reticle or the circuit pattern area are mainly in the form of a rectangle. Therefore, only the pattern portion of the reticle can be efficiently irradiated with light beams in a case where the incidental surface (which holds an image forming relationship with the reticle pattern because the emission surface and the surface of the reticle pattern hold the Fourier transform relationship and also the incidental surface (light source side focal surface) and the emission side (reticle side focal point) hold the Fourier transform relationship) of each element of the first fly-eye lens is formed into a rectangular shape to corresponding to the planar shape of the reticle pattern.

The number of the incidental surfaces of the first fly-eye lens (composed of the aforesaid elements) may be determined arbitrarily. In this case, the light quantity loss can be reduced by forming the total incidental surface into a shape similar to that of the incidental surface of one element of the second fly-eye lens. For example, the total incidental surface of each first fly-eye lens is made to a rectangular shape in a case where the incidental surface of one element of the second fly-eye lens is formed into a rectangular shape. In a case where the incidental surface of one element of the second fly-eye lens is formed into a regular hexagon, the total incidental surface of each first fly-eye lens is formed into a shape which is inscribed in the regular hexagon.

In a case where the image of the shape of the incidental surface of one element of the second fly-eye lens is projected by the guide optical system in such a manner that it is somewhat larger than the total incidental surface of each first fly-eye lens, the effect of making irradiation uniform at the first fly-eye lens can be further improved. As for the size of the emission surface of each first fly-eye lens, it is preferable that the numerical aperture (a single width of the angle distribution on the reticle) per one emitted light beam be about 0.1 to about 0.3 with respect to the reticle side numerical aperture of the projection optical system. If it is smaller than 0.1 times, the correctivity of the pattern transference deteriorates.

If it is larger than 0.3 times, an effect of improving the resolution and that of realizing a large focal depth cannot be obtained.

The apparatus according to the aforesaid embodiment may be arranged in such a manner that the first fly-eye lens groups, the guide optical system and the second fly-eye lens groups (the structure shown in FIG. 42) following the light divider can be exchanged for a portion which corresponds to a conventional irradiation optical system, that is, a structure formed by integrating the relay lens and one fly-eye lens.

Figure 55:
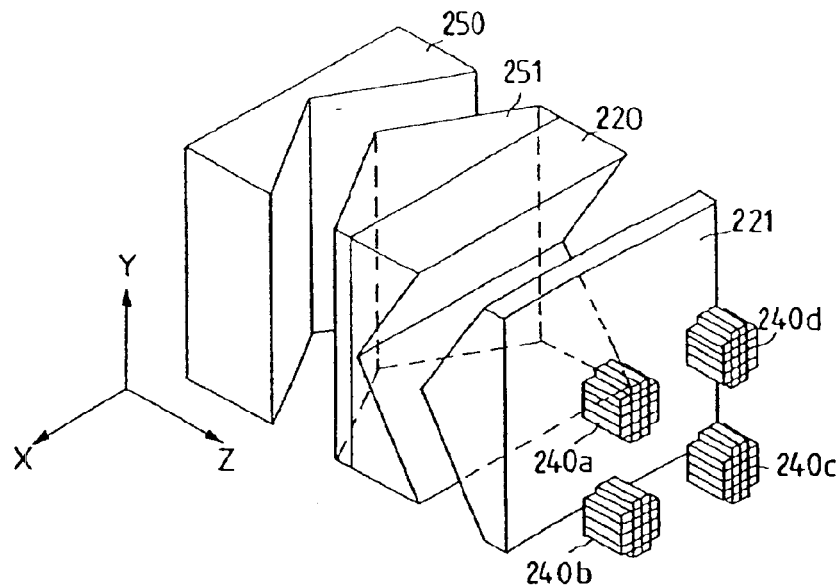
FIG. 55 is a view which illustrates the structure of a prism for dividing the irradiation light beams into four portions in the irradiation optical system.

The sixth embodiment employs a pyramid type prism arranged as shown in FIG. 43 as a light divider for dividing the irradiation light beams emitted from the light source into four portions. However, another light divider except for the pyramid type prism and arranged, for example, as shown in FIG. 55 may be used. The light divider shown in FIG. 55 comprises a polyhedron prism (a first prism) 250 having a V-shaped concave, a prism (a second prism) formed by combining a polyhedron prism 251 having a V-shaped convex and a polyhedron prism 220 having a V-shaped concave, and a polyhedron prism (a third prism) having a V-shaped convex.

That is, two pairs of light dividers, each of which is composed of two V-shaped prisms and which are used in the sixth embodiment (see FIG. 42), are arranged in series. Therefore, the irradiation light beams emitted from the light source 1 are divided into four light beams by the refraction effect of the aforesaid four prisms. Hence, the light beams are incident on corresponding second fly-eye lenses 240a to 240d (FIG. 41 shows only those 240a and 240b).

The first light dividers 250 and 251 divide the irradiation light beams emitted from the light source 201 while making them substantially symmetrical with respect to the direction Y and causing them to have substantially the same light quantity. Furthermore, the first light dividers 250 and 251 emit the two divided light beams in such a manner that they travel in parallel to each other (substantially in parallel to optical axis AX) while being positioned away from each other by a predetermined interval (which corresponds to the X-directional interval between the center of the first fly-eye lens 241a and that of 241d or between those 241b and 241c on the pupil surface with respect to the direction X). On the other hand, the second light dividers 220 and 221 divide the two light beams divided by the first light dividers 250 and 251 while making them substantially symmetrical with respect to the direction X and causing them to have substantially the same light quantity. Furthermore, the second light dividers 220 and 221 emit the four light beams in such a manner that they travel substantially in parallel to one another (substantially in parallel to optical axis AX) while being positioned away from one another by a predetermined interval (which corresponds to the Y-directional interval between the center of the first fly-eye lens 241a and that of 241b or between those 241c and 241d on the pupil surface with respect to the direction Y).

Furthermore, the prisms 250 (251 and 220) and 221 are arranged so as to be capable of individually moving along optical axis AX (in a direction Z in case of FIG. 55). Therefore, by adjusting the interval by relatively moving the first prism 250 and the second prism (251 and 220) in the direction of the optical axis, the X-directional interval between the two light beams emitted from the polyhedron prism 220 can be determined to be an arbitrary value. Similarly, by adjusting the interval between the second prism (251 and 220) and the third prism 221 by relatively moving them in the direction of the optical axis, the Y-directional interval between the two pairs of two light beams emitted from the third prism 221 can be determined to be an arbitrary value.

There is sometimes a necessity of slightly moving the third prism 221 in the direction of the optical axis when the optical directional interval between the first prism 250 and the second prism (251 and 220) is changed because the polyhedron prisms 251 and 220 are integrally formed with each other. Although the polyhedron prisms 251 and 220 are integrally formed by adhesion, an arrangement may be employed in which they are able to individually move in the direction of the optical axis.

As described above, in order to optimize the irradiation condition (in other words, the position of the center of each of the four pairs of the first fly-eye lenses on the pupil surface) in accordance with the precision (the pitch, the linear width, the period and the direction) of the pattern for each reticle, the position and the like of the four pairs of the first fly-eye lenses 241a to 241d can be shifted by the drive system. Therefore, in order to cause the four light beams emitted from the third prism to be correctly incident on the second fly-eye lenses 240a to 240d when the four sets of the first fly-eye lenses 241a to 241d are moved in accordance with the precision of the reticle pattern, the three prisms 250, (251 and 220) and 221 are individually moved in the direction of the optical axis in synchronization (while following) with the aforesaid movement.

An arrangement may be employed in which three prisms 250, (251 and 220) and 221 are made rotative relative to optical axis AX depending upon the positions of four sets of the first fly-eye lenses 241a to 241d on the pupil surface 217 so as to be rotated in synchronization with the mutual adjustment of the three prisms in the optical axial direction so that the four light beams are incident on the second fly-eye lenses 240a to 240d. Another arrangement may be employed in which the three prisms are integrally constituted on a plane (plane XY of FIG. 55) perpendicular to optical axis in such a manner that they can be two-dimensionally moved so as to be relatively moved with respect to the irradiation light beams emitted from the light source on a plane perpendicular to optical axis AX, so that the light quantities of the four light beams emitted from the third prism are finely adjusted so as to be substantially the same. In this case, it is preferable that the light quantity of each of the four light beams to be applied to the reticle 209 is detected by a photoelectric detector and the aforesaid relative movement is controlled in accordance with the result of the detection. As an alternative to the arrangement in which the three prisms are moved, an arrangement may be employed in which the position of the irradiation light beam to be incident on the first prism 250 is finely moved by, for example, inclining the parallel and flat glass disposed between the input lens 204 (FIG. 41) and the first prism 250.

Figure 56:
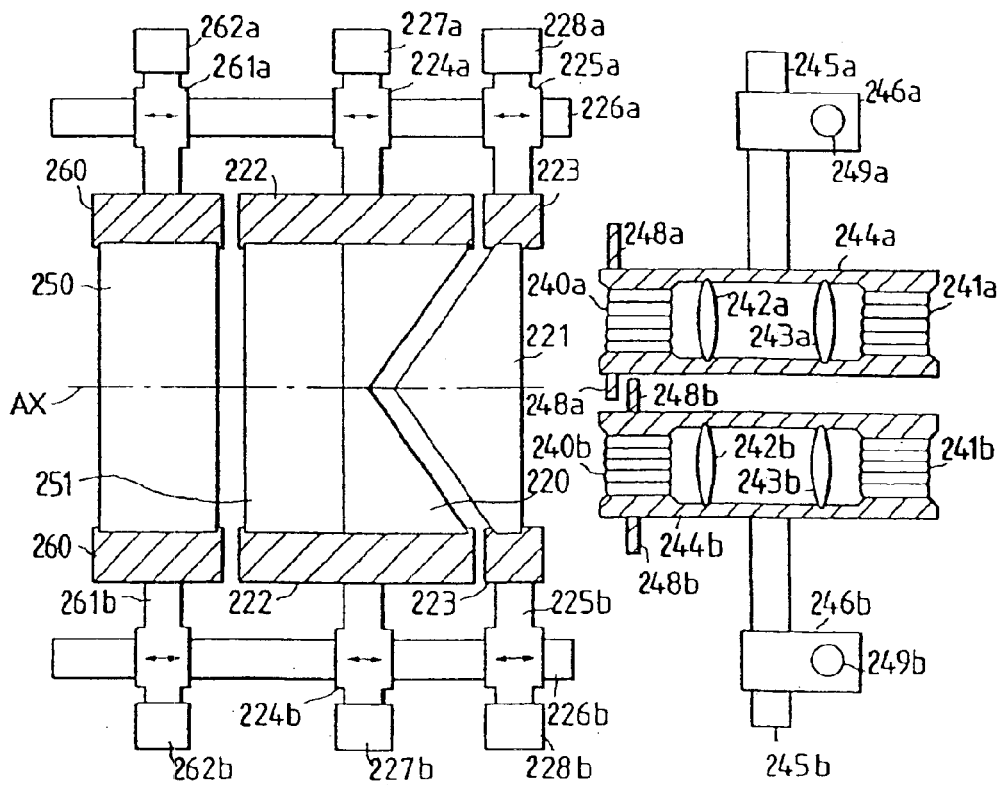
FIG. 56 is a view which illustrates the schematic structure of the irradiation optical system having the prism shown in FIG. 55.

FIG. 56 is an enlarged view which illustrates a portion from the light divider to the first fly-eye lenses 241a to 241d in a case where the light divider shown in FIG. 55 is used in the projection exposure apparatus (see FIG. 41). Assumptions are made here that the facing surfaces of the first prism 250 between the prism 251 and those between the prism 220 and the third prism 221 run parallel to each other, and the incidental surface of the first prism 250 and the emission surface of the third prism 221 are perpendicular to each other. In addition, the joined surfaces of the second prisms 251 and 220, that is, the emission surface of the prism 251 and the incidental surface of the prism 220 are perpendicular to optical axis AX. Referring to FIG. 56, the same reference numerals as those shown in FIG. 42 are given the same reference numerals and their descriptions are omitted here.

The first prism 250 is held by the holding member 260, the second prism (251 and 220) is held by the holding member 222, and the third prism 221 is held by the holding member 223. As an alternative to applying the prism 251 and 220 to each other, they may be simply hermetically held or stationarily held while positioning them away from each other by a predetermined interval. The holding member 260 is held by movable members 261a and 261b in such a manner that they are able to move on stationary members 226a and 226 in a direction from right to left when viewed in the drawing, that is, in a direction along optical axis AX. The aforesaid movement is enabled by activating members 262a and 262b such as motors.

Since the first to third prisms 250, (251 and 220) and 221 are able to move individually, the X-, and Y-directional intervals between the four light beams emitted to be emitted can be individually adjusted by arbitrarily changing the mutual distances between the three prisms in the direction of the optical axis. Hence, the positions of the four light beams can be arbitrarily, for example, can be radially changed relative to optical axis AX on a plane perpendicular to optical axis AX. For example, in a case where the reticle pattern 210 is a two-dimensional cyclic pattern and as well having different X- and Y-directional pitches, the centers of the four sets of the first fly-eye lenses must, on the pupil surface 217, coincide with the vertex of the rectangle relative to optical axis AX. Also in this case, by adjusting the mutual intervals between the three prisms 250, (251 and 220) and 221, the four emitted light beams are enabled to be accurately incident on the corresponding second fly-eye lenses 240a to 240d. Furthermore, the four emitted light beams can be shifted in the concentric directions relative to optical axis AX by arranging the structure an such a manner that the three prisms 250, (251 and 220) and 221 can be rotated relative to optical axis AX as described above.

Although four sets of the fly-eye lenses are used in the structure shown in FIG. 55, it is sufficient to use two sets of fly-eye lenses in a case where the reticle pattern is a one-dimensional cyclic pattern for example. In this case, two sets of fly-eye lenses are selected from the four sets and the centers of the two fly-eye lenses are made substantially coincide with positions deviated from optical axis AX by a quantity corresponding to the precision of the reticle pattern.

Furthermore, the three prisms are moved in accordance with the positions of the two second fly-eye lenses, thus selected, in such a manner that the two prisms are brought into contact with each other in a hermetical manner so as to make either of the distance from the first prism 250 to the second prism (251 and 220) or the distance from the second prism (251 and 220) to the third prism 221 to be zero. In a case where the second fly-eye lenses 240a and 240b are located substantially symmetric with respect to optical axis AX and as well as distant from each other by a predetermined distance in the direction X, the second prism (251 and 220) and the third prism 221 are brought into contact with each other in a hermetical manner so as to make the distance to be zero.

As a result, the irradiation light beams emitted from the light source 201 are divided into two portions by the first prism 250 and the second prism, that is the prism 251 and the irradiation light beams are not divided by the prism 220 and the third prism 221. Hence, the irradiation light beams emitted from the light source 201 are divided into two portions by the three prisms while preventing the light quantity loss and they are respectively and collectively incident on the two sets of the second fly-eye lenses even if only the two sets of the fly-eye lenses are used.

In a case where a reticle which is not adapted to the inclined irradiation method, for example, a phase shift reticle of a spatial frequency modulation type, is used, the irradiation must be performed in such a manner the light quantity distribution of the irradiation light beams on the pupil surface 217 must be limited to a circular (or a rectangular) region around the optical axis AX. In this case, the prisms are moved so that the first prism 250 and the second prism (251 and 220), and the second prism (251 and 220) and the third prism 221 are respectively hermetically held so as to make the interval in the direction of optical axis AX to be zero. Furthermore, the four sets of the fly-eye lenses are moved so as to be integrated relative to optical axis AX. As a result, the irradiation light beams emitted from the light source 201 are not divided by the three prisms 250, (251 and 220) and 221 but they can be incident on the four integrated fly-eye lenses while preventing the light quantity loss. Hence, even if the light divider shown in FIG. 55 is used, the conventional irradiation (hereinafter called an "ordinary irradiation") can be employed. In a case where the four sets of the fly-eye lenses must be moved and integrated (combined), it is preferable that four sets of holding members be structured in such a manner that the four sets of the holding members for integrally holding the first and the second fly-eye lenses and the guide optical system will not form a gap between contact portions of the four sets of the first fly-eye lenses.

As can be understood from above, the inclined irradiation and the ordinary irradiation can easily be changed over while eliminating the necessity of, for example, changing the optical member in a case where the light divider shown in FIG. 55 is used. In case of the inclined irradiation, switching can easily be performed between the case in which the four sets of the fly-eye lenses are used and the case where the two sets of the fly-eye lenses are used. If a zoom lens system is disposed between the input lens 204 and the first prism 250, for example, and as well if the diameter (the area) of the irradiation light beam to be incident on the first prism 250 can be varied, the light quantity loss can be prevented furthermore and a problem which takes place in that the light beams emitted from the third prism 221 are concentrically incident on a portion of the incidental surface of the second fly-eye lens can be prevented. In a case where the four sets of the fly-eye lenses are radially moved relative to optical axis AX for example, a necessity simply lies in that the diameter of the irradiation light beam to be incident on the first prism 250 is adjusted by the zoom lens system in accordance with the size (the X- and Y-directional widths) of the incidental surface of each second fly-eye lens. Furthermore, if a zoom lens of the aforesaid type is used, the coherence factor (value) of the irradiation optical system can be varied at the time of performing the ordinary irradiation.

Figure 57:
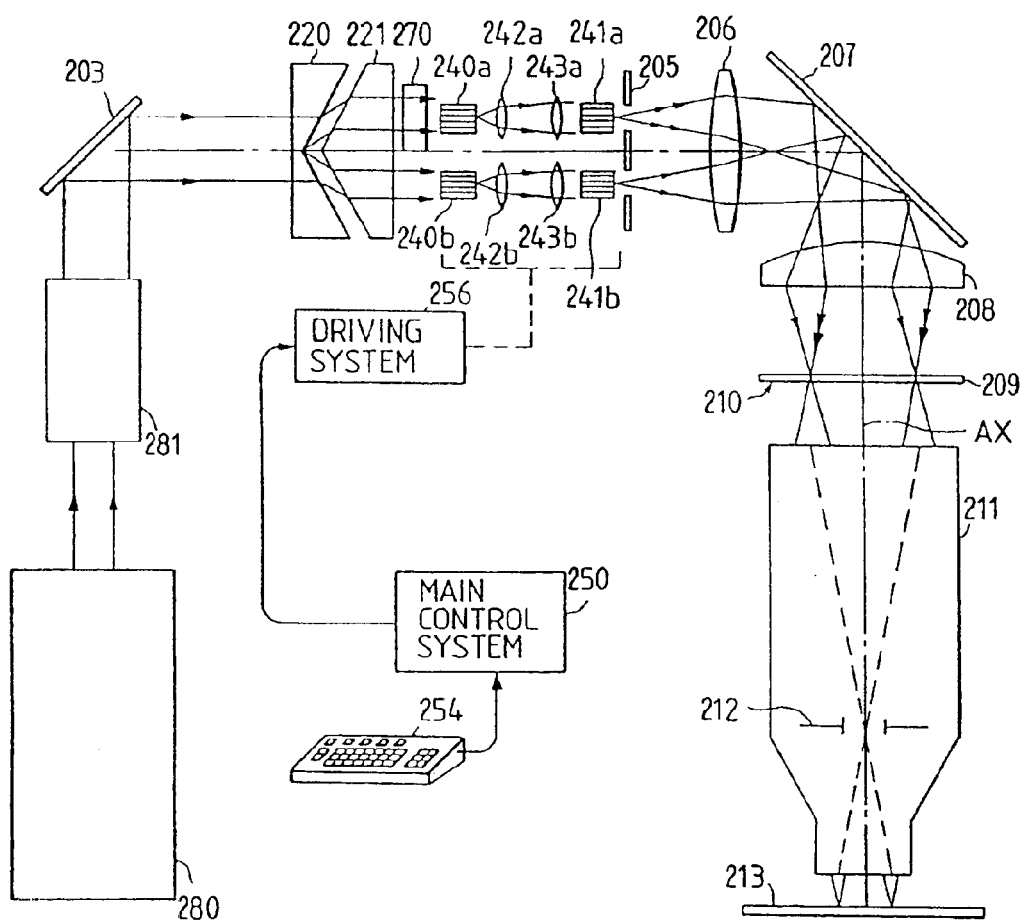
FIG. 57 is a view which illustrates the schematic structure of a seventh embodiment of the projection exposure apparatus according to the present invention.
Figure 58:
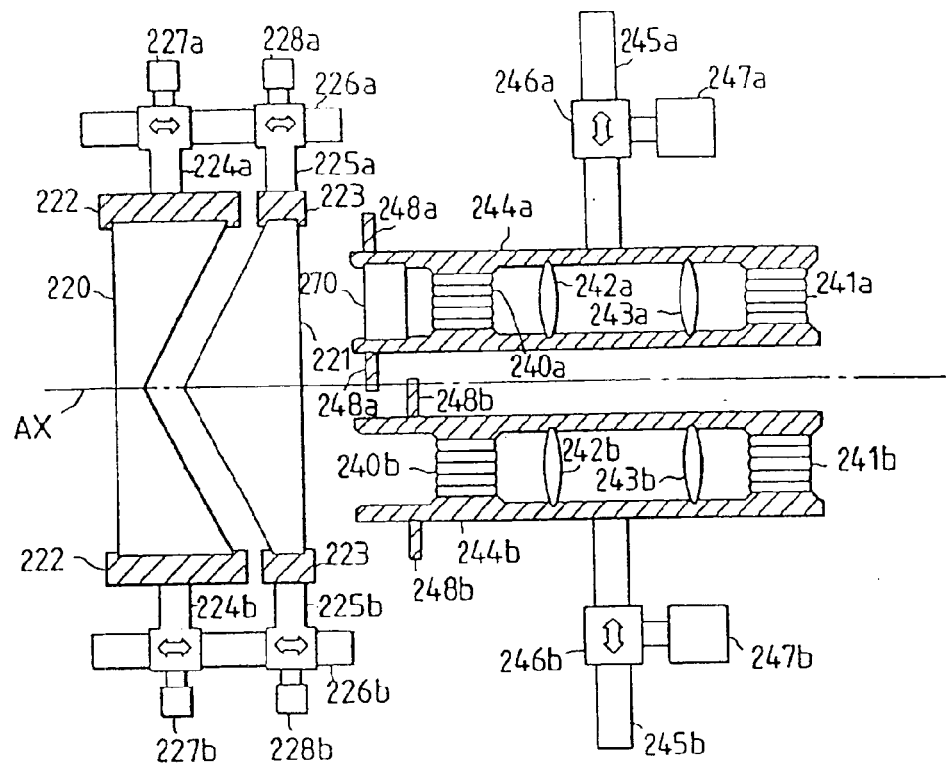
FIG. 58 is a view which illustrates the schematic structure of a portion of the irradiation optical system shown in FIG. 57.

A seventh embodiment of the projection exposure apparatus will now be described with reference to FIGS. 57 and 58. FIG. 57 is a view which illustrates the schematic structure of the projection exposure apparatus according to this embodiment. FIG. 58 is an enlarged view which illustrates a portion from the light dividers 220 and 221 to the first fly-eye lenses 241a and 241b. Referring to FIGS. 57 and 58, the same elements as those shown in FIGS. 41 and 42 are given the same reference numerals and their descriptions are omitted here.

As shown in FIG. 57, this apparatus according to this embodiment uses, as the exposure light source, a KrF or ArF excimer laser or harmonic waves such as a metal vapor laser or YAG laser. Therefore, the speckle interference fringes are prevented and the illuminance uniformity on the wafer is improved by disposing an optical path difference generating member (for example, a parallel and flat glass) 270 in the irradiation optical system. The above mentioned arrangement is different from the sixth embodiment (see FIG. 41) and therefore the description will now be given about it. It should be noted that a beam shaping optical system 281 shown in FIG. 57 includes a beam expander and the like and capable of shaping the cross section of the light beam into a proper shape (which is in the form of a square in usual).

As shown in FIG. 57, the parallel and flat glass 270 serving as the optical path difference generating member is disposed in either of the optical paths (in the structure shown in FIG. 57, the optical path for the light beam to be incident on the second fly-eye lens group 240a) for the light beams divided by the light dividers 220 and 221. Therefore, the light beam to be incident on the second fly-eye lens 240a is given a phase delay by a predetermined quantity from the light beam to be incident on the second fly-eye lens group 240b. That is, an optical path difference is generated between the two light beams. This embodiment is arranged in such a manner that the thickness of the parallel and flat glass 270 is determined so as to make the optical path difference between the two light beams to be longer than a coherent length LS (LS=λ2/D1). Although the parallel and flat glass 270 is disposed in the optical path for either of the two light beams, the parallel and flat glass may be disposed in each of the optical paths if the optical path difference between the two light beams is always longer than the coherent length LS. Furthermore, the optical path difference generating member may be, for example, a mirror in place of the parallel and flat glass if it is capable of turning the light beam to give an optical path difference.

The optical path difference generating member is not limited particularly if it is able to give a proper phase difference between the light beams. The number of the optical paths may be the same number as or a number smaller than the number of the second fly-eye lens groups by one in order to cause a plurality of light beams divided by the light divider to have different optical path differences (longer than the coherent length). For example, in a case where four second fly-eye lens groups are disposed, the light divider is composed of the first polyhedron prism 220 having a pyramid concave and the second polyhedron prism 221 having a pyramid convex (see FIG. 43). Furthermore, four (or three) parallel and flat glass each having an individual thickness to correspond to the coherent length LS may be disposed in the optical paths of the light beams in order to cause the four light beams to have different phase differences (optical path differences). The pyramid type prism may be replaced by a light divider arranged as shown in FIG. 55.

The parallel and flat glass 270, as shown in FIG. 58, is held by the holding member 244a integrally with the first and second fly-eye lenses 241a, 240a, and the guide optical systems 242a and 243a. Therefore, when the first fly-eye lens is shifted in accordance with the precision, the parallel and flat glass 270 is also moved.

An arrangement may be employed in which the parallel and flat glass 270 is not secured to the holding member 244a but it is made to be individually movable so as to drive the parallel and flat glass 270 in synchronization with the movement of the holding member 244a. By making the area of the parallel and flat glass 270 to be larger than the movable range of the light beams to be incident on the second fly-eye lens group 240a on a plane perpendicular to optical axis AX, the necessity of using the moving mechanism and the necessity of integrally securing it to the holding member 244a can be eliminated. In this case, the necessity simply lies in that it is mechanically secured to the apparatus.

When the light beams divided by the light dividers 220 and 221 are shifted to the concentrical direction relative to optical axis AX, it is preferable that also the parallel and flat glass 270 is rotated relative to optical axis AX. In a case where a plurality of the light beams emitted from the light dividers 220 and 221 are shifted in the radial direction and the concentrical direction relative to optical axis AX, and in particular in a case where the same are shifted in the concentrical direction, it is preferable that the positions of the second fly-eye lens groups 240a and 240b, on which the aforesaid light beams are incident, are shifted so as to make coincide the direction of the configuration of the elements which constitute the fly-eye lens group and the cyclic direction of the reticle pattern to each other. In this case, each of the fly-eye lens groups may be made rotative or a plurality of the synthetic fly-eye lenses (the holding members 244a and 244b) are made rotative around optical axis AX. The positions of a plurality of the light beams are shifted in the concentrical direction when the one-dimensional line-and-space pattern arranged regularly in the direction X has been changed to a one-dimensional line-and-space pattern arranged regularly in a direction inclined by 45° from the X and Y directions.

A modification of the optical path difference generating member according to the present invention will now be described with reference to FIGS. 59, 60 and 61. Referring to these drawings, elements having the same function and operation as those of the elements shown in FIG. 58 are given the same reference numerals.

Figure 59:
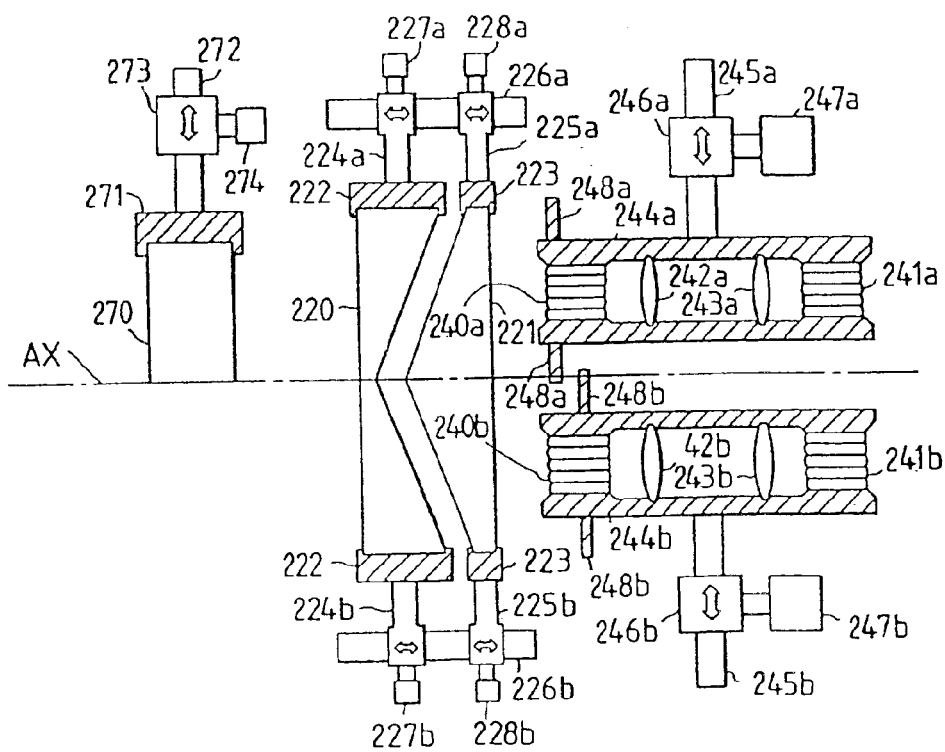
FIG. 59 is a view which illustrates a modification of the partial structure of the irradiation optical system shown in FIG. 57.

The modification shown in FIG. 59 is arranged in such a manner that the parallel and flat glass is used as the optical path difference generating member similarly to the aforesaid embodiment (see FIG. 58), and the parallel and flat glass 270 is disposed in a portion (an upper half portion above optical axis AX when viewed in the drawing) of the optical path for the irradiation light beams which corresponds to either of the two inclined surfaces of the light dividers 220 and 221 (the V-shaped prism) prior to the moment the irradiation light beams from the light source are incident on the light dividers 220 and 221. Therefore, the phase of only the light beam of the two light beams divided by the light dividers 220 and 221, which is incident on the second fly-eye lens group 240a, is delayed so that the optical path difference between the two light beams is made longer than coherent length LS. Referring to FIG. 59, the parallel and flat glass 270 is held by a holding member 271 and the holding member 271 is held by a movable member 272 so that the parallel and flat glass 270 is able to move with respect to a stationary member 273. The aforesaid operation Is performed by an activating member 274. Since the structure is arranged in such a manner that the parallel and flat glass 270 is movable in a direction perpendicular to optical axis AX, the parallel and flat glass 270 can be accurately disposed in the irradiation light beam path while making optical axis AX to be the boundary. Therefore, the phase (the length of the optical path) of only either of the two light beams can be changed. The portions of the apparatus shown in FIG. 59 are basically the same as those of the structure shown in FIG. 58 and therefore their descriptions are omitted here. In this modification, the parallel and flat glass 270 may be disposed at any position in the optical path between a light source 280 and the light dividers 220 and 221. As can be clearly seen from FIGS. 58 and 59, the parallel and flat glass 270 may be disposed at any position in the optical path between the light source 280 and the second fly-eye lens groups 240a and 240b. Although it may be disposed in an optical path between the first fly-eye lens groups 241a and 241b and the reticle 209, it must be disposed at a position at which the light beams from the first fly-eye lens groups 241a and 241b do not superpose (for example, a position adjacent to the emission side focal surfaces of the first fly-eye lens groups 241a and 241b or a position adjacent to their conjugated surface).

Figure 60:
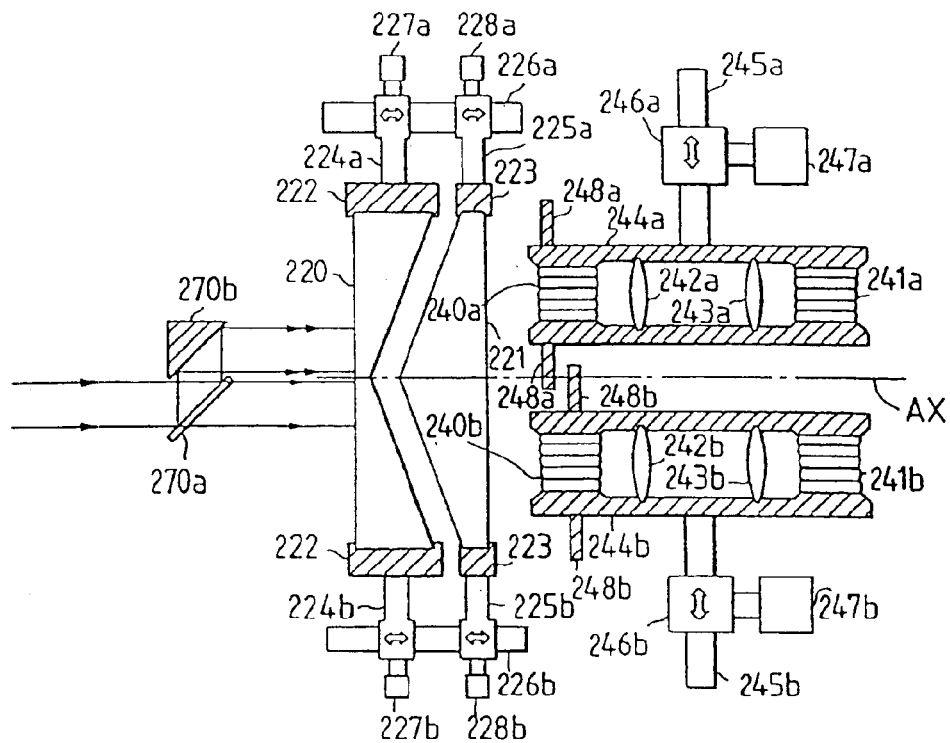
FIG. 60 is a view which illustrates a modification of the partial structure of the irradiation optical system shown in FIG. 57.

FIG. 60 illustrates a case in which a mirror is used as the optical path difference generating member in place of the parallel and flat glass. Also this embodiment is arranged in such a manner that the light beam portion, which corresponds to either of the two light beams to be divided, is caused to have a phase difference (the difference in the optical path length) prior to a moment the irradiation light beams emitted from the light source 280 are incident on the light dividers 220 and 221. Referring to FIG. 60, the irradiation light beams emitted from the light source 280 are divided into two light beams (the light quantity ratio: 1:1) by a beam splitter (a half mirror) 270a. The light beams, which have passed through it, then travel linearly before they are incident on the light dividers 220 and 221. On the other hand, the light beams reflected by the half mirror 270a are turned upwards when viewed in the drawing before they are again turned by the reflecting mirror 270b before they are incident on the light dividers 220 and 221. As a result, the light beams reflected by the half mirror 270a are delayed (the phase is delayed) by the distance from the half mirror 270a to the reflecting mirror 270b. Therefore, also this embodiment enables the optical path of only either of the two light beams divided by the light dividers 220 and 221 to be changed. The half mirror 270a and the reflecting mirror 270b are integrally secured by a holding member (omitted from illustration) while being disposed away from each other by a distance with which the optical path difference between the two light beams is longer than coherent length LS. Furthermore, they are disposed in the optical path for the irradiation light beams so as to cause the transmissive light beams and the reflected light beams from the half mirror 270a to be symmetrically incident on the light divider 220 with respect to optical axis AX. Since this embodiment uses the mirrors 270a and 270b as the optical path difference generating members, the irradiation light beams emitted from the light source are deflected with respect to optical axis AX of the irradiation optical system as can be understood from FIG. 60. It is preferable that the structure be arranged in such a manner that the mirrors 270a and 270b are able to move in a direction perpendicular to optical axis AX so as to be able to finely adjust the incidental positions at which the transmitted light beams and the reflected light beams are incident on the light divider 220. The residual portions of the apparatus shown in FIG. 60 are the same as those of the apparatus shown in FIG. 59.

Figure 61:
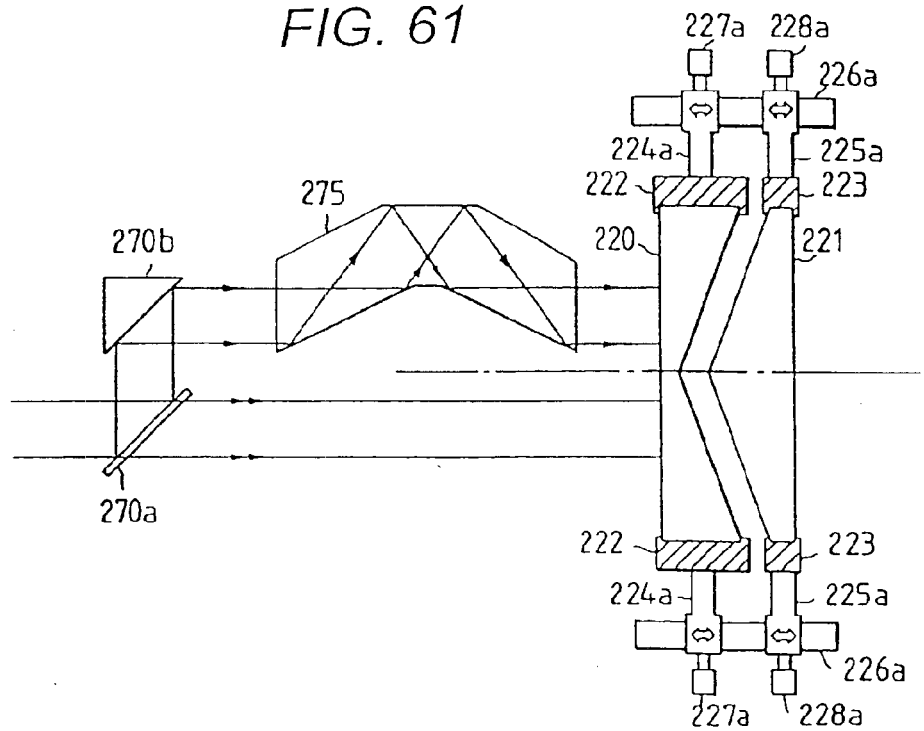
FIG. 61 is a view which illustrates a modification of the partial structure of the irradiation optical system shown in FIG. 57.

FIG. 61 illustrates an embodiment in which the structure including the optical path difference generating members 270a and 270b and the light dividers 220 and 221 is the same as that shown in FIG. 60 but an image rotator 275 is further disposed in an optical path for one light beam. By virtue of the image rotator 275, only either of the light beams (the reflected light beam in the structure shown in FIG. 61) divided by the half mirror 270a is rotated by, for example, 180° on a plane perpendicular to optical axis AX. As a result of the aforesaid structure, the coherence of the light beams can be further reduced and the contrast of the speckle interference fringes acting as noise components can be further lowered, causing a satisfactory advantage to be obtained. The image rotator is not limited to the structure shown in FIG. 61 and constituted by combining prisms.

If the image rotator 275 is disposed in the optical path as in this structure, the phase of the reflected light beams is somewhat delayed. Therefore, it is preferable that the distance (the interval) from the half mirror 270a and the reflecting mirror 270b be determined. The position of the image rotator 275 is not limited to the description about this embodiment, it may be disposed at any position if it is disposed on the optical path between the light source 280 and the reticle 209 similar to the optical path difference generating member. For example, it may be disposed in the rear of the light dividers 220 and 221 (adjacent to the second fly-eye lens). Furthermore, the image rotator 275 may be disposed more adjacent to the light source or the second fly-eye lens than the optical path difference generating member (270 or 270a and 270b). A similar effect can be also obtained in a case where the image rotator 275 is disposed in the structures shown in FIGS. 58 and 59. In other words, the conditions such as the position and the number required for the image rotators 275 are the same as those required for the optical path difference generating member. In a case where the irradiation light beams emitted from the light source 280 are divided into four portions, the image rotors are disposed in the optical paths for three light beams of the four divided light beams in such a manner that they are rotated 90°, 180° and 270° respectively (the residual one is rotated by 0°) from the direction of the optical axis. The image rotors may be disposed in the optical paths for the four light beams in such a manner that they are rotated by 90°, 180°, 270° and 360° from the direction of the optical axis.

Also the structure according to this embodiment may employ the light divider shown in FIGS. 45 to 48. In a case where the light divider shown in FIGS. 47 and 48 is used, the optical path difference generating member (the parallel and flat glass 270) may be disposed in an optical path between the fiber emission portions 221b and 221c and the second fly-eye lenses 240a and 240b, or in an optical path between the first mirror 220d and the second mirrors 221e and 221f (or the second fly-eye lenses 240a and 240b) similarly to the embodiment shown in FIG. 58, or in an optical path more adjacent to the light source than the fiber incidental portion 220f and the first mirror 220d similarly to the embodiment shown in FIG. 59. The number of divisions performed by each synthetic fly-eye lens and the light divider is not limited to two but the divisions may be made by an arbitrary number. In the structure shown in FIG. 47, the number of divisions (the number of emission portions) of the fiber 220c may be changed, while the pyramid mirror (for dividing into four portions) may be used as the first mirror 221d in the structure shown in FIG. 48.

The aforesaid embodiments are formed into a two-stage integrator structure in which the two sets of the fly-eye lenses are disposed in series to receive a plurality of the light beams divided by the light dividers 220 and 221. However, a square rod type optical integrator may be used as the optical integrator, or two sets of the rod type optical integrators are combined to each other, or the rod type optical integrator and the fly-eye type optical integrator may be combined to each other to constitute the aforesaid two-stage integrator structure. An example of employment of the rod type optical integrator has been disclosed in U.S. Pat. No. 4,952,815. As an alternative to the two-stage integrator structure, an arrangement may be employed in which each of a plurality of light beams divided by the light dividers 220 and 221 is then divided into a plurality of light beams by using a polyhedron prism or a mirror, and a plurality of the divided light beams are caused to be incident on the incidental surface of one fly-eye lens group (a rod type integrator may be used) in a superposed manner.

As a result of the aforesaid structure, the illuminance uniformity improvement effect can be somewhat obtained by using only one optical integrator. Furthermore, by reducing, for example, the size (the cross sectional area) of each element constituting the fly-eye lens, the illuminance uniformity can be improved to a certain degree by using only one mesh-type fly-eye lens. Although two sets of fly-eye lenses (240a and 241a) and (240b and 241b) are disposed to receive a plurality of the light beams divided by the light dividers 220 and 221 in the aforesaid embodiment, either of the first fly-eye lens and the second fly-eye lens may be formed into one large fly-eye lens which covers a region, through which the light beams pass, on a plane perpendicular to optical axis AX. In this case, it is preferable that size of the fly-eye lens be determined while considering the movable range of the light beams on the plane perpendicular to optical axis AX corresponding to the periodicity and the precision of the reticle pattern. This fact is also adapted to a case where only one set of the fly-eye lenses is used. If the light beams to be incident on each fly-eye lens in the irradiation optical system shown in FIGS. 58 to 61 and FIGS. 45 to 48 are used to irradiate an area which is externally wider than the incidental end of each fly-eye lens and if the distribution of the quantity of light to be incident on each fly-eye lens is uniform, a satisfactory effect can be obtained because the illuminance uniformity on the reticle pattern surface can be further improved.

As can be seen from the above, regardless of the structure of the light divider and that of the fly-eye lens, a projection exposure apparatus having the irradiation optical system for forming at least two light quantity distributions (the second light source image) on the pupil surface 217 of the irradiation optical system or on a plane adjacent to it enables the illuminance uniformity improvement effect to be obtained on the reticle pattern surface by generating an optical path difference longer than coherent length LS between the light beams by using the optical path difference generating member such as the parallel and flat glass.

Figure 62A:
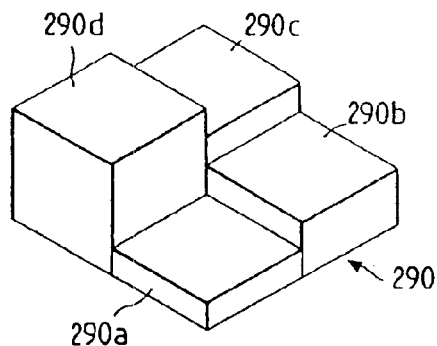
FIGS. 62A and 62B are views which illustrate a modification of the optical path difference generating member in the irradiation optical system.
Figure 62B:
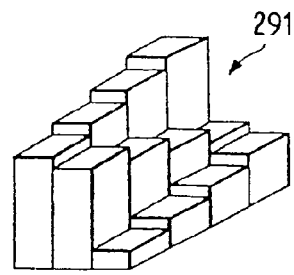

In the above mentioned embodiment, the parallel and flat glass 270 serving as the optical path difference generating member is disposed in the optical path for either of the two light beams divided by the light dividers 220 and 221. However, two parallel and flat glass members each having a thickness which causes the optical path difference between the two light beams to be longer than coherent length LS may be disposed in the optical paths. Furthermore, the two parallel and flat glass members may be integrally formed. In a case where the irradiation light beams are divided into four portions by the light dividers 220 and 221, an optical member 290 arranged as shown in FIG. 62A may be used which is constituted by integrally combining parallel and flat glass plates 290*a* to 290*d* having different thickness. In this case, the thickness of each parallel and flat glass is determined so as to make all of the mutual optical path differences between the light beams which pass through the parallel and flat glass members 290*a* to 290*d* to be longer than coherent length LS. It should be noted that the parallel and flat glass may be omitted from the optical path for one of the four light beams as described above. As an alternative to using the parallel and flat glass as the optical path difference generating member, a stepped prism 291 arranged as shown in FIG. 62B may be used. The stepped prism 291 is constituted by, for example, combining prisms in the form of a square rod by the same number as that of the elements which constitutes the fly-eye lens. The thickness of each prism is determined so as to make all of the mutual optical path differences between the light beams which pass through each prism to be longer than coherent length LS. If the aforesaid stepped prisms 291 is disposed in the optical path for one light beam, interference generated between elements for the fly-eye lens can be prevented and therefore the illuminance uniformity can be further improved. Although the optical path difference is generated by making the thickness (the length) of the optical member 290 or the stepped prism 291 to be different, a similar mutual optical path difference between the light beams can be generated by constituting each of the parallel and flat glass or the prism by optical material having different refractive factor as an alternative to employing the different thickness (lengths).

Figure 63A:
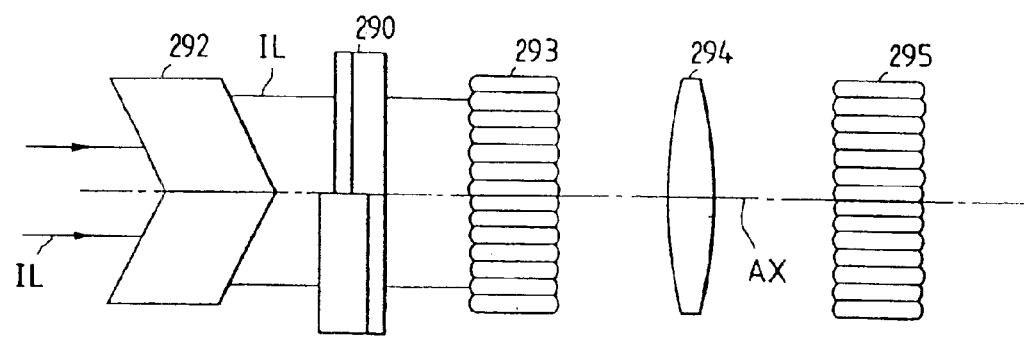
FIGS. 63A and 63B are views which illustrate an example in which an optical difference generating member is applied to the projection exposure apparatus adapted to an annular zone irradiation method.
Figure 63B:
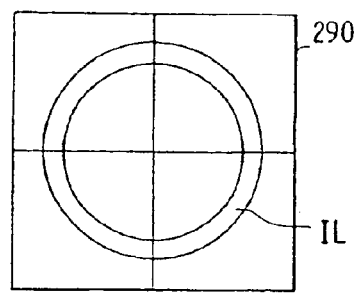

Although the aforesaid embodiment has been described about the projection exposure apparatus having the irradiation optical system for forming at least two light quantity distributions (the secondary light source image of the fly-eye lens) on the pupil surface 217 of the irradiation optical system or on a plane adjacent to it, the illuminance uniformity on the reticle pattern surface can be expected if the optical path difference generating member 290 shown in FIG. 62A is used in a projection exposure apparatus which is adapted to the annular zone irradiation method. Now the aforesaid improvement effect will be described in brief with reference to FIGS. 63A and 63B. Referring to FIG. 63A, irradiation light beam IL emitted from a light source (omitted from illustration) is incident on a prism 292 so as to be formed into an annular band shape, and then it is incident on a second fly-eye lens 293 via the optical path difference generating member 290. The irradiation light beams pass through a lens 294 and a first fly-eye lens 295 before being used to irradiate the reticle pattern by the condenser lenses 206 and 208 (see FIG. 57) with substantially uniform illuminance. The structures except for those shown in FIG. 63A are the same as those shown in FIG. 57. FIG. 63B illustrates a state where the optical path difference generating member 290 shown in FIG. 63A is viewed from the direction of the optical axis. The prism 292 is a so-called cone prism having conical shape inclined incidental surface and the emission surface so that the irradiation light beams are formed into the annular band shape by the refraction effect of the prism 292 before they are used to irradiate the optical path difference generating member 290. Both the first and second fly-eye lenses 293 and 295 are large fly-eye lenses extending, on a plane perpendicular to optical axis AX, to cover the region through which the annular band shape irradiation light beams pass, the first and second fly-eye lenses 293 and 295 having elements, the cross sectional shape of each of which is very small. By employing the aforesaid structure, that is, the two-stage integrator structure and by dividing the annular band shape irradiation light beams into four portions by the optical path difference generating member 290 and by making the mutual optical path difference between the divided light beams to be longer than coherent length LS, the illuminance uniformity on the reticle pattern surface can be improved. Although an example in which the annular band shape irradiation light beams are divided into four portions is illustrated in FIG. 63, the number of divisions may be determined arbitrarily (however two or more). If the optical path difference generating member 290 is rotated relative to optical axis AX during the exposure operation, the illuminance uniformity can be further improved. In a case where the inner or the outer diameter of the annular band shape irradiation light beams is changed to correspond to the periodicity or the precision of the reticle pattern, it is preferable that a plurality of cone prisms having different thicknesses are exchanged by being disposed in the irradiation optical path and the size (the diameter) of the circular irradiation light beams to be incident on the cone prism 292 can be varied by a variable aperture diaphragm.

Figure 64:
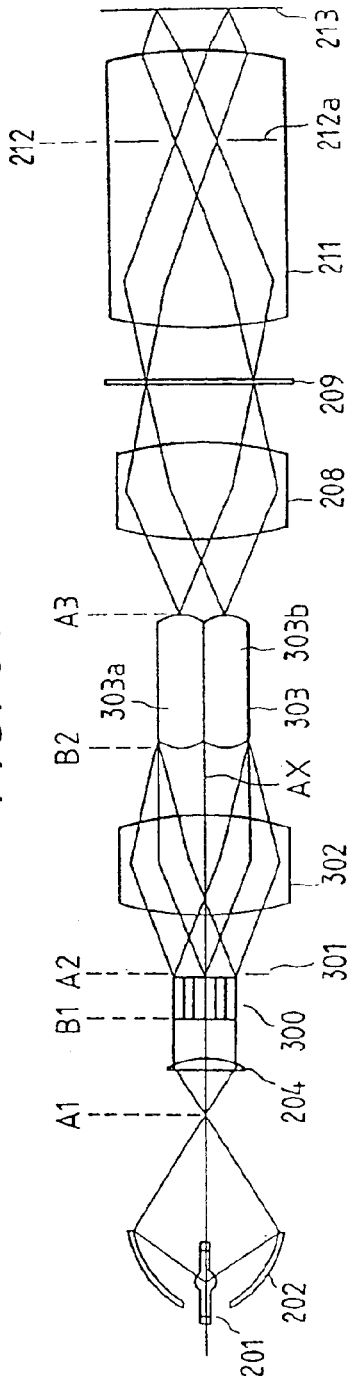
FIG. 64 is a view which illustrates the structure of an eighth embodiment of the projection exposure apparatus according to the present invention.
Figure 65:
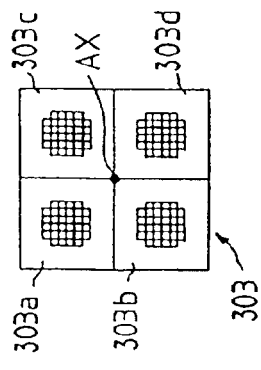
FIG. 65 illustrates a state of a light source image formed on the injection surface of a polyhedron light source forming optical system.

An eighth embodiment of the present invention will now be described with reference to FIG. 64. FIG. 64 illustrates the schematic structure of this embodiment of the projection exposure apparatus. Referring to FIG. 64, the same elements as those shown in FIGS. 41 and 57 are given the same reference numerals. Referring to FIG. 64, the irradiation light beams radiated from the light source such as a mercury lamp the brightness point of which is located at a first focal point of an elliptic mirror 202 are gathered at second focal point A1 so as to be substantially parallel beams by the input lens 204 (the collimator lens) before they are incident on a fly-eye lens 300 serving as the optical integrator (a plane light source forming optical system). The fly-eye lens 300 is constituted by an aggregation of a plurality of rod lens elements each having a rectangular cross section (for example, a square cross sectional shape), the fly-eye lens 300 having emission surface A2 disposed to be conjugate with a light source image formed at the second focal point position of the elliptic mirror 202. Therefore, a plurality of light source images by the same number as those of the rod lens elements constituting the fly-eye lens 300 are formed on the emission surface A2 of the fly-eye lens 210 and a secondary light source is substantially formed to serve as the plane light source. An aperture diaphragm 301 is disposed in the vicinity of the position at which the secondary light source is formed. The light beams, which have passed through the aperture diaphragm 301, are converged by a converging lens 302 before they are incident on a polyhedron light source forming optical system 303. The polyhedron light source forming optical system 303 (a lens array) is composed of four lens elements (303a, 303b, 303c and 303d) disposed in parallel. Although FIG. 64 illustrates only the lens elements 303a and 303b, the lens elements 303c and 303d are disposed in parallel to the lens elements 308a and 303b in a direction perpendicular to the surface of the drawing sheet on which FIG. 64 is drawn. Each of the lens elements 303a, 303b, 303c and 303d has lens surfaces on both the incidental side and the emission side and is disposed eccentrically so as to make the distance from its optical axis to optical axis AX of the irradiation optical system to be the same. The aforesaid lens elements 303a, 303b, 303c and 303d are disposed to make their emission surface A3 conjugate with the emission surface A2 of the fly-eye lens 300. Therefore, images (plane light source images) formed by again imaging the secondary light source are, as shown in FIG. 65, formed on the emission side of the polyhedron light source forming optical system 303 at four positions which are made to be eccentric with respect to optical axis AX of the irradiation optical system by a number which is the same as that of the lens elements. That is, four plane light sources divided by the four lens elements 303a to 303d are formed. As can be understood from FIGS. 64 and 65, also this embodiment employs the inclined irradiation method similarly to the first and the second embodiments, and therefore a plurality of the lens elements 303a to 303d are disposed at the optimum positions to correspond to the precision and the periodicity of the reticle pattern.

Referring back to FIG. 64, the four light beams formed on the emission surface A3 of each of the lens elements 303a, 303b, 303c and 303d are gathered by the condenser lens 208 so as to uniformly irradiate the reticle 209 while making a predetermined angle from optical axis AX of the irradiation optical system. As a result of the inclined irradiation thus performed, the light beams, which have passed through and diffracted on the pattern of the reticle 209, are gathered and imaged by the projection optical system 211. Hence, the image of the pattern of the reticle 209 is formed on the wafer 213.

It should be noted that the light source image A1 formed by the elliptic mirror 202, the emission surface A2 of the fly-eye lens 300 and the emission surface A3 of the polyhedron light source forming optical system 303 are disposed to be conjugated with the incidental pupil surface 212 (an aperture diaphragm 212a) of the projection optical system in the irradiation optical system shown in FIG. 64. In other words, A1 and A2 and A3 are Fourier transform surfaces of the object surfaces (the reticle 209 and the wafer 213). Furthermore, the incidental surface B1 of the fly-eye lens 300 and the incidental surface B2 of the polyhedron light source forming optical system 303 are made conjugate with the object surfaces (the reticle 209 and the wafer 213).

It is preferable that the position (the position on a plane perpendicular to the optical axis) of each lens element of the polyhedron light source forming optical system 303 be determined in accordance with the reticle pattern to be transferred. The method of determining the position is the same as that for determining the position of the first fly-eye lens according to the first embodiment (see FIGS. 51 and 52). That is, the position (incidental angle Φ on the reticle on which the irradiation light beams supplied from the polyhedron light source forming optical system 303 are incident may be determined so as to obtain the optimum resolution and an effect of improving the focal depth in accordance with the precision of the pattern to be transferred.

Figure 66:
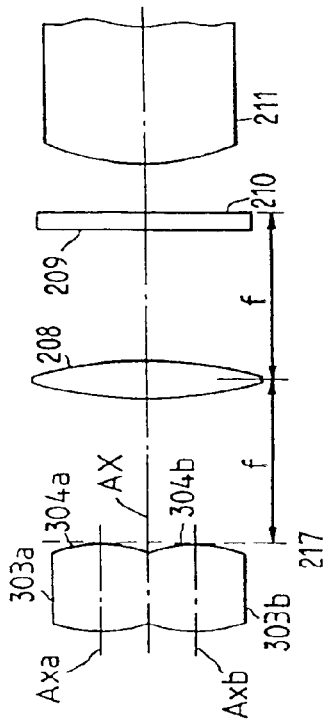
FIG. 66 illustrates the principle of configuration of the polyhedron light source forming optical system.

FIG. 66 schematically illustrates a portion from the polyhedron light source forming optical system 303 to the projection optical system 211, wherein the reticle side (rear side) focal planes 104a and 104b of the polyhedron light source forming optical system 303 coincide with the Fourier transform surface 217 of the reticle pattern 210. The condenser lens 208 for causing them to have the Fourier transform relationship is illustrated as one lens. Furthermore, both of the distance from the lens element side (front) principal point of the condenser lens 208 to the reticle side (rear) focal planes (104a and 104b) of the polyhedron light source forming optical system 303 and the distance from the reticle side (rear) principal point of the condenser lens 208 to the reticle pattern 210 are expressed by f.

As can be understood from FIGS. 51, 52 and 66, if optical axes Axa and Axb (that is, the center of gravity of the light quantity distribution of the secondary light source images formed by the lens elements) of each lens element of the polyhedron light source optical system 303 are located on line segments Lα and Lβ, two beams pass through positions which are distant from optical axis AX on the pupil surface 212 of the projection optical system 211 by substantially same distance, the two beams being composed of either of ±1-order diffracted light beams generated from the line-and-space pattern (see FIG. 52A) due to the irradiation of the irradiation light beams from each lens element and 0-order diffracted light beam. That is, the focal depth with respect to the line-and-space pattern shown in FIG. 52A can be made maximum and as well as high resolution can be obtained.

Assuming that half of the distance between optical axes Axa and Axb of the corresponding lens elements 303a and 303b in the cyclic direction (in the direction X) of the reticle pattern shown in FIG. 52 is L (=α=β), the focal distance of the emission (rear) side of the condenser lens 208 is f, the wavelength of the irradiation light beam is λ and the pitch of the reticle pattern is P, the two lens elements 303a and 303b must be structured (disposed) in such a manner that the positions of their optical axes Axa and Axb substantially satisfy an equation expressed by L=λf/2P.

In order to efficiently divide the irradiation light beams from the fly-eye lens 300 into two portions (to form two plane light sources) by the two lens elements 303a and 303b included in the polyhedron light source forming optical system 303, it is preferable that the cross sectional shape of the lens elements in the polyhedron light source forming optical system 303 is formed into a rectangle and as well as the cross sectional shape of the rod lens element in the fly-eye lens 300 is formed into a rectangle similar to the overall shape of the polyhedron light source forming optical system 303. Also the optimum positions for the four lens elements of the polyhedron light source forming optical system for use in the case of the two-dimensional pattern shown in FIG. 52C are the same as those in the first embodiment (see FIG. 52D). That is, since the X-directional pitch of the pattern shown in FIG. 52C is Px, the optical axes of the lens elements must be located on line segments Lα and Lβ which hold $\gamma=\epsilon=f\cdot(\frac{1}{2})\cdot(\lambda/Px)$ as shown in FIG. 52D so as to obtain the maximum focal depth in the X-directional component of the pattern. Similarly, the optical axes of the lens elements must be located on line segments Lα and Lβ which hold $\alpha=P=f\cdot(\frac{1}{2})\cdot(\lambda/Py)$ so as to obtain the maximum focal depth in the Y-directional component of the pattern.

In order to realize inclined irradiation balanced to an optimum degree by most efficiently utilizing (most efficiently utilizing the numerical aperture NA of the projection optical system) the size of the Fourier transform surface 217 in a case where the pitch in each direction of the two-dimensional pattern shown in FIG. 52 is the same (Px=Py=P), it is preferable that the structure be arranged to satisfy the relationship expressed by L=λf/2P assuming that half of the distance between the optical axes of each of the lens elements of the polyhedron light source forming optical system 303 in the directions X and Y of each cyclic reticle pattern is L ($\alpha=\beta=\gamma=\epsilon$), the emission side (rear) focal distance of the condenser lens 208 is f, the wavelength of the irradiation light beam is λ and the pitch of the reticle pattern is P.

In this case, assuming that the numerical aperture of the projection optical system 211 facing the reticle is $NA_R$, half of the distance between the optical axes of each lens element of the polyhedron light source forming optical system 303 in directions X and Y of each cyclic reticle pattern is L ($\alpha=\beta=\gamma=\epsilon$) and the emission side (rear) focal distance of the condenser lens 208 is f, the structure may be arranged to meet the following relationship:

$$0.35NA_R \leq L/f \leq 0.7NA_R$$

If the relationship becomes smaller than the lower limit of this equation, the effect obtainable by virtue of the inclined irradiation deteriorates and therefore high resolution cannot be realized while maintaining a large focal depth even if the inclined irradiation is performed. If the same exceeds the upper limit of the aforesaid equation, a problem arises in that the light beams supplied from a separated light source formed on the Fourier transform surface cannot pass through the projection optical system.

Figure 67:
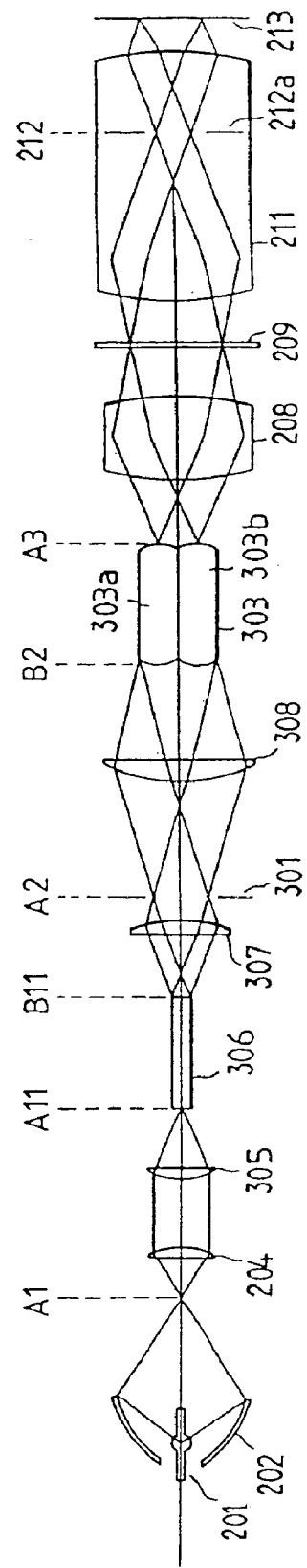
FIG. 67 is a view which illustrates the structure of a ninth embodiment of the projection exposure apparatus according to the present invention.

A ninth embodiment of the present invention will now be described with reference to FIG. 67. FIG. 67 is a view which illustrates the schematic structure of this embodiment of the projection exposure apparatus, wherein the elements having the same functions as those of the elements of the third embodiment shown in FIG. 64 are given the same reference numerals. The difference from the third embodiment lies in a fact that an optical function equivalent to the fly-eye lens 300 is realized by using a converging lens 305, a rod type optical integrator 306 and a converging lens 307.

In the structure according to this embodiment, the light source image converged at the second focal point A1 by the elliptic mirror 202 is relayed to the incidental surface A2 of a square rod type optical integrator 306 by the input lens 204 and the converging lens 305. The light beams emitted from the incidental surface A11 of the rod type optical integrator 306 are reflected by the inner surface of the rod type optical integrator 306 and then they are emitted from the emission surface B11. At this time, the light beams emitted from the emission surface B11 are substantially emitted as if there are a plurality of light source images (plane light surface) at the incidental surface A11 of the rod type optical integrator 306. As for details of this, refer to U.S. Pat. No. 4,952,815.

The light beams emitted from the rod type optical integrator 306 are converged by the converging lens 307 so that a plurality of light source images are formed at the emission side (rear) focal point A2. Hence, a substantially secondary plane light source is formed. Since the aperture diaphragm 301 is disposed at the secondary light source position, the light beams, which have passed through it, are converged by a converging lens 308. Then, four third plane light sources separated by the polyhedron light source forming optical system 303 are formed so that the reticle 209 is inclined-irradiated in the superposed manner via the condenser lens 208. As a result of the structure thus arranged, high resolution can be realized while maintaining a large focal depth similarly to the eighth embodiment.

It should be noted that the light source image A1 formed by the elliptic mirror 202, the incidental surface A11 of the rod type optical integrator 306, the emission side (rear) focal point position A2 of the converging lens 307 and the emission surface A3 of the polyhedron light source forming optical system 303 are disposed to hold the conjugate relationship with the incidental pupil 212 (the aperture diaphragm 212a) of the projection optical system 212. In other words, A1, A11, A2 and A3 are Fourier transform surfaces of the object surfaces (the reticle 209 and the wafer 213). Furthermore, the emission surface B11 of the rod type optical integrator 306 and the incidental surface B2 of the polyhedron light source forming optical system 303 are relayed by the converging lenses 307 and 308 so that they are disposed in conjugation with the object surface (the reticle 209 and the wafer 213).

As an alternative to the rod type optical integrator constituted by square rod optical members, a hollow and square rod reflecting optical member constituted by forming a reflecting member into a square rod shape may be used. Furthermore, the cross sectional shape of the rod type optical integrator is not limited to the rectangular. It may, of course, be formed into a polygonal or cylindrical shape.

The eighth embodiment shown in FIG. 64 is arranged in such a manner that the variable aperture diaphragm 301 the caliper of which can be varied is formed adjacent to the emission surface of the fly-eye lens 300, while the ninth embodiment shown in FIG. 67 is arranged in such a manner that the variable aperture diaphragm 301 is disposed at the emission side (rear) focal point position of the converging lens 307. The variable aperture diaphragm 301 is able to vary the size of the light source image to be formed on the emission surface of the polyhedron light source forming optical system 303 by varying its caliper. Therefore, by controlling the size of the light source image to be formed on the pupil surface of the projection optical system, the inclined irradiation can be performed with a proper a value. That is, it is preferable that the size of the light source image formed by each lens element included by the polyhedron light source forming optical system 303 be made in such a manner that the numerical aperture (the single width of the angular distribution on the reticle) per emitted light beam with respect to the numerical aperture of the projection optical system facing the reticle is about 0.1 to 0.3. If it is smaller than 0.1 times, the accuracy of the transferred pattern (image) deteriorates. If the same is 0.3 times or more, the effect of obtaining high resolution and a large focal depth become unsatisfactory.

The variable aperture diaphragm for varying the value a may be disposed adjacent to the emission side of the polyhedron light source forming optical system 303. In this case, it is preferable that a variable aperture diaphragm is used which has variable apertures by the number which is the same as that of the lens elements which constitute the polyhedron light source forming optical system 303.

Furthermore, for example, a so-called turret system in which a plurality of apertures having different calipers are formed in a disc in place of the variable aperture diaphragm and it is rotated as desired may be employed to vary the size of the light source image for the purpose of obtaining an optimum value σ.

In order to vary the value a while preventing the shielding operation performed by the aperture diaphragm, an afocal magnification-varying optical system 310 may be disposed in an optical path between the input lens 204 and the fly-eye lens 300 and the secondary light source image to be formed by the emission surface A2 of the fly-eye lens 300 may be efficiently varied by the operation of varying the magnification performed by the afocal magnification-varying optical system 310.

Figure 68A:
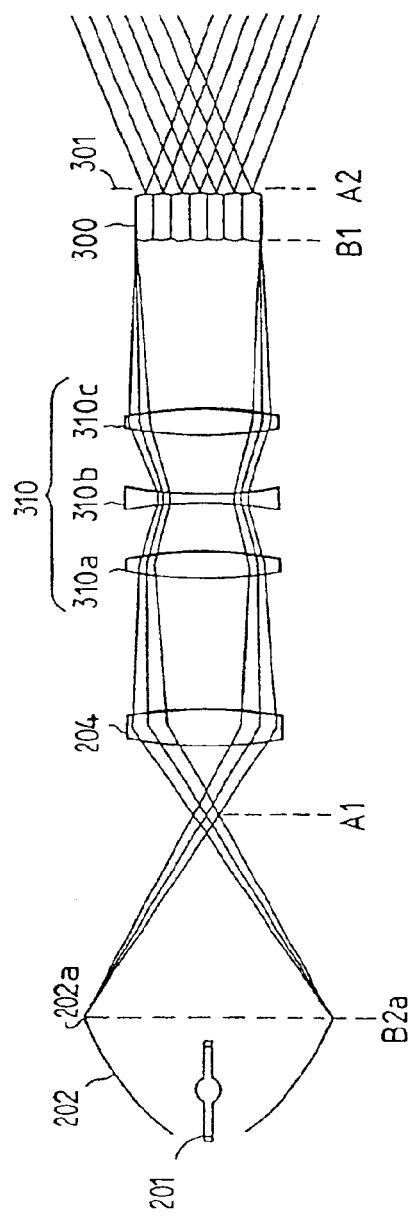
FIGS. 68A and 68B illustrate an example in which an afocal magnification-varying optical system is disposed between the input lens and the fly-eye lens in the irradiation optical system.
Figure 68B:
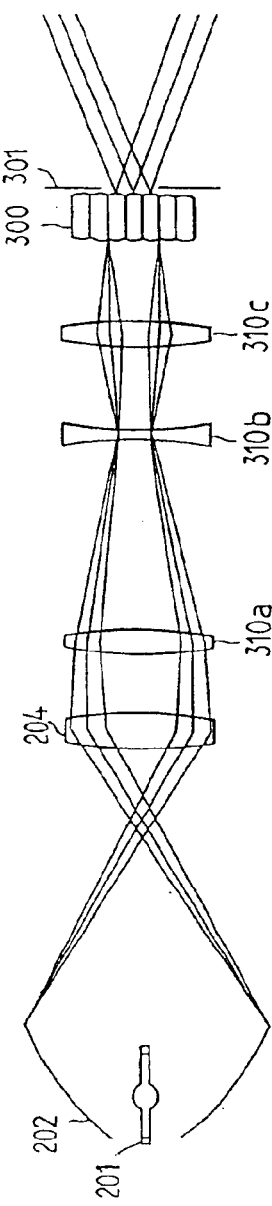

FIG. 68 illustrates the optical structure more adjacent to the light source than the fly-eye lens 300 shown in FIG. 65, wherein the afocal magnification-varying optical system 310 is composed of a positive first lens group 310a, a negative second lens group 310b and a positive first lens group 310c. As shown in FIGS. 68A and 68B, the magnification can be varied by moving each of the lens groups 310a to 310c so that the size of the secondary light source formed on the emission side of the fly-eye lens can be varied while preventing the fact that the light beams are shielded.

Also by virtue of the magnification variation performed by the afocal magnification-varying optical system 310, the incidental surface (B1) of the fly-eye lens is made substantially conjugate with aperture 202a (B2a) of the elliptic mirror with respect to the input lens 204 and the afocal magnification-varying optical system 310. As a result, the value a can be efficiently varied while maintaining the double conjugated relationship with the object surface and the pupil surface (Fourier transform surface).

In this case, an arrangement may be employed in which information such as the width of the lines of the reticle is supplied to input means and the drive system for varying the diameter of the aperture of the aperture diaphragm is driven in accordance with calculated information so as to automatically obtain the optimum value σ Furthermore, a structure may be employed in which a bar code or the like having information about the line width of the reticle pattern is fastened to the reticle, detection means for detecting information is provided and the drive system for varying the caliper of the aperture diaphragm is driven in accordance with detected information so as to set an optimum value σ.

Although the embodiments shown in FIGS. 64 and 67 are arranged in such a manner that the light beams from a source such as the mercury lamp are converged by the elliptic mirror and they are made into parallel beams by the input lens 204, another structure may be employed in which a light source such as an excimer laser for supplying parallel beams is used and the parallel beams from the laser beam source are caused to be incident on, in the structure shown in FIG. 64, the fly-eye lens 300, or, in the structure shown in FIG. 67, on the converging lens 305. In particular, in the eighth embodiment shown in FIG. 64, the shape of the emission surface A2 of the fly-eye lens 300 may be formed into a plane because the secondary light source image formed on the emission surface A2 of the fly-eye lens 310 is a spot light source having substantially no area. Furthermore, in a case where a light source such as the excimer laser capable of emitting large output is used, light energy is concentrated on the emission surface A2 of the fly-eye lens 300 and the emission surface A3 of each lens element of the polyhedron light source forming optical system 303. Therefore, it is preferable that the focal point positions of the incidental surfaces B1 and B2 be located in a space outer than the corresponding emission surfaces A1 and A3 in order to maintain the durability of the fly-eye lens 300 and the polyhedron light source forming optical system 303.

Furthermore, in order to realize the optimum inclined irradiation for each cyclic line width of the reticle pattern under a high irradiation efficiency, it is preferable that the structure be arranged in such a manner that an exchange is enabled for another polyhedron light source forming optical system composed of four lens elements having different size and the positions of optical axes with respect to the optical axis of the irradiation optical system form the four lens elements which constitute the polyhedron light source forming optical system. Furthermore, it is preferable to employ a structure to change the reticle side numerical aperture NA of the plane light source forming optical system (the fly-eye lens) for forming the plane light source more adjacent to the light source than the polyhedron light source forming optical system, the NA of the rod type optical integrator 306 and that of the converging lens 307.

As a preferred structure for changing the reticle side aperture NA of the plane light source forming optical system, it is preferable to employ a zoom lens type fly-eye lens in the structure shown in FIG. 64 or to arrange the structure in such a manner that exchange can be enabled for another focal distance. It is preferable to arrange the structure in such a manner that exchange is enabled for another rod type optical integrator having a different thickness and length from those of the rod type optical integrator 306 in the structure shown in FIG. 67. In particular, it is preferable to move the converging lens 305 in the direction of the optical axis by a distance corresponding to the change in the length of the rod type optical integrator when the rod type optical integrator is exchanged.

Furthermore, the illuminance uniformity of a plurality of the plane light sources to be formed by the polyhedron light source forming optical system 303 may be further improved by disposing another plane light source forming optical system more adjacent to the light source than the polyhedron light source forming optical system 303 in the irradiation optical system according to each embodiment.

Figure 69:
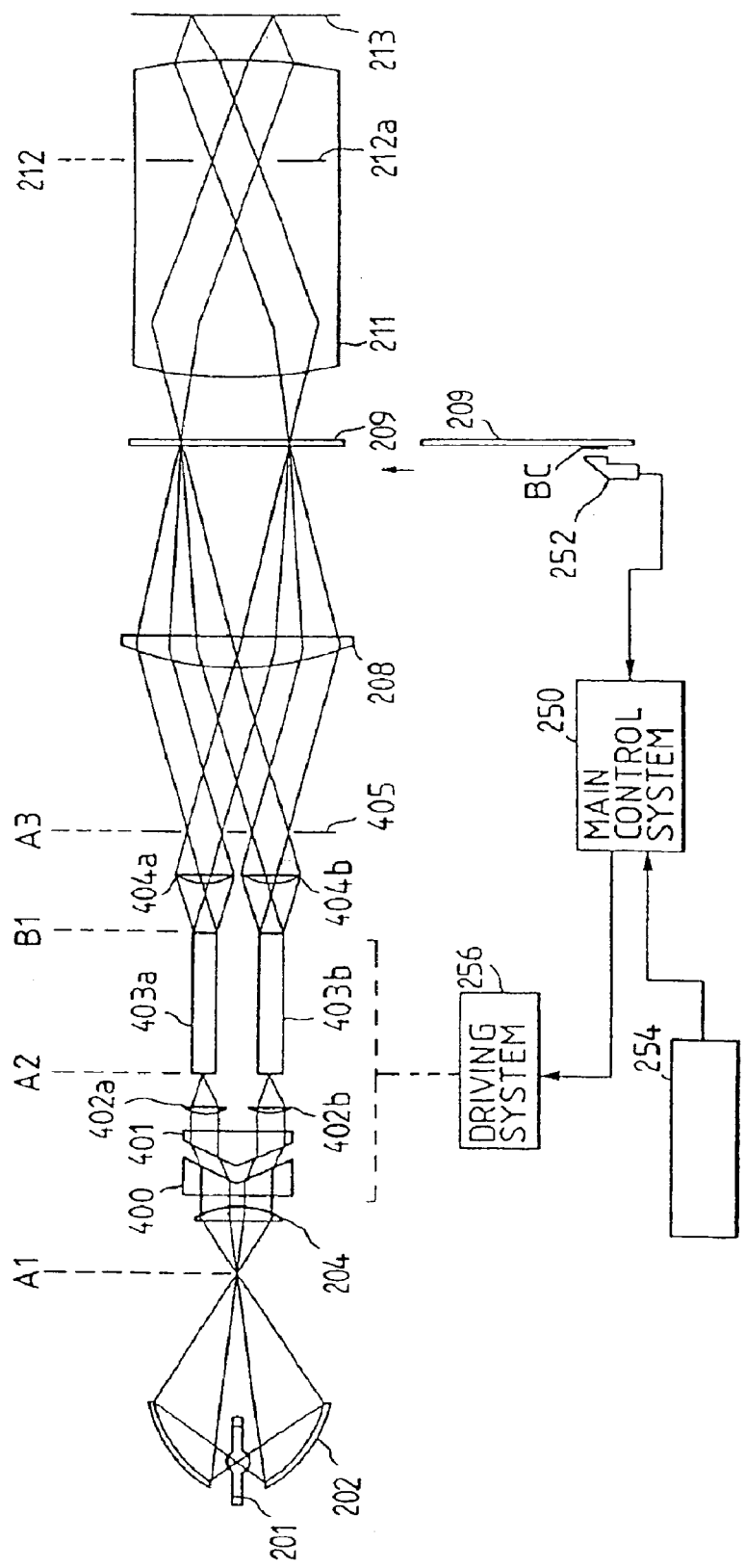
FIG. 69 is a view which illustrates the structure of a tenth embodiment of the projection exposure apparatus according to the present invention.

A tenth embodiment of the present invention will now be described with reference to FIG. 69. FIG. 69 is a view which illustrates the schematic structure of this embodiment of the projection exposure apparatus. Referring to FIG. 69, the same elements as those shown in FIG. 41 are given the same reference numerals. Referring to FIG. 69, the irradiation light beams radiated from the light source such as a mercury lamp are converged by the elliptic mirror 202, and then they are made into substantially parallel beams by the input lens (collimator lens) 204 before they are incident on the light dividing optical systems 400 and 401. The light dividing optical systems are composed of the first polyhedron prism 400 having a V-shaped concave and the polyhedron prism 401 having a V-shaped convex. As a result of the refraction effect of the two prisms, the irradiation light beams are divided into two beams. Each light beam is incident on an individual first plane light source forming optical system composed of elements 402a, 403a and 404a and a second plane light source forming optical system composed of elements 402b, 403b and 404b.

Figure 70A:
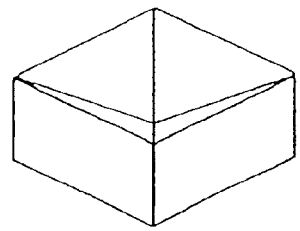
FIGS. 70A and 70B are views which illustrate an example of the light divider shown in FIG. 69.
Figure 70B:
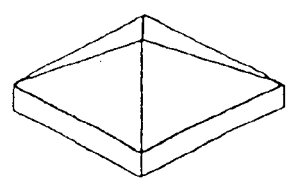

Although the two plane light source forming optical systems are used, the number of them may be determined arbitrarily. Furthermore, although the light dividing optical system is divided into two sections to correspond to the number of the plane light source forming optical systems, the number of divisions may be arbitrary determined to correspond to the number of the polyhedron light source forming optical system. For example, the light dividing optical systems 400 and 401 may respectively be composed of a first polyhedron prism (see FIG. 70A) having a pyramid concave and a second polyhedron prism (see FIG. 70B) having a pyramid convex.

Each plane light source forming optical system is composed of first converging lenses 402a and 402b, rod type optical integrators 403a and 403b and second converging lenses 404a and 404b. The light beams divided into two portions by the light dividing optical systems 400 and 401 are converged by the first converging lenses 402a and 402b before they are incident on the rod type optical integrators 403a and 403b. Each of the rod type optical integrators 403a and 403b is constituted by a square rod type optical member having the incidental surface A2 located at the converging point of the first converging lenses 402a and 402b or at a position adjacent to it, the incidental surface A2 being disposed substantially conjugate with the light source image position A1 of the image formed by the elliptic mirror 2. The light beams, which have been incident on the rod type optical integrators 403a and 403b are reflected by their inner surfaces before they are emitted from the emission surface B1. Hence, the emitted light beams from the emission surface B1 emit as if there are a plurality of light source images (plane light sources) on the incidental surface A2. The aforesaid function has been disclosed in U.S. Pat. No. 4,952,815 in detail.

The irradiation light beams emitted from the rod type optical integrators 403a and 403b are converged by the second converging lenses 404a and 404b so that two secondary light sources are formed at the emission side (rear) focal point position A3 of the aforesaid lens system. Therefore, substantially two plane light sources are formed. The aperture diaphragm 405 having two apertures is disposed at the position A3 at which the secondary light sources are formed so that each light beam, which has passed through each aperture of the aperture diaphragm 405 is converged by the condenser lens 208. As a result, the reticle 209 is inclined-irradiated at a predetermined inclination.

A predetermined circuit pattern is formed on the lower surface of the reticle 209 and the light beams, which have passed through and have been diffracted by the reticle pattern, are converged and imaged by the projection optical system 211. As a result, the pattern of the reticle 209 is formed on the wafer 213.

In the irradiation optical system shown in FIG. 69, the light source image A1 formed by the elliptic mirror 202, the incidental surfaces A2 of the rod type optical integrators 403a and 403b, and the emission side (rear) focal point positions A3 of the second converging lenses 404a and 404b are conjugate with the incidental pupil surface 212 (the aperture diaphragm 212a) of the projection optical system 211. In other words, A1, A2 and A3 are Fourier transform surfaces of the object surfaces (the reticle 209 and the wafer 213). Furthermore, the emission surfaces B1 of the rod type optical integrators 403a and 403b are conjugate with the object surfaces (the reticle 209 and the wafer 213).

As described above, the first plane light source forming optical system composed of the elements 402a, 403a and 404a and the second plane light source forming optical systems composed of the elements 402b, 403b and 404b are located away from optical axis AX. Therefore, the focal depth of a pattern of the patterns of the reticle 209 having a specific direction and a pitch can be considerably enlarged.

Figure 71:
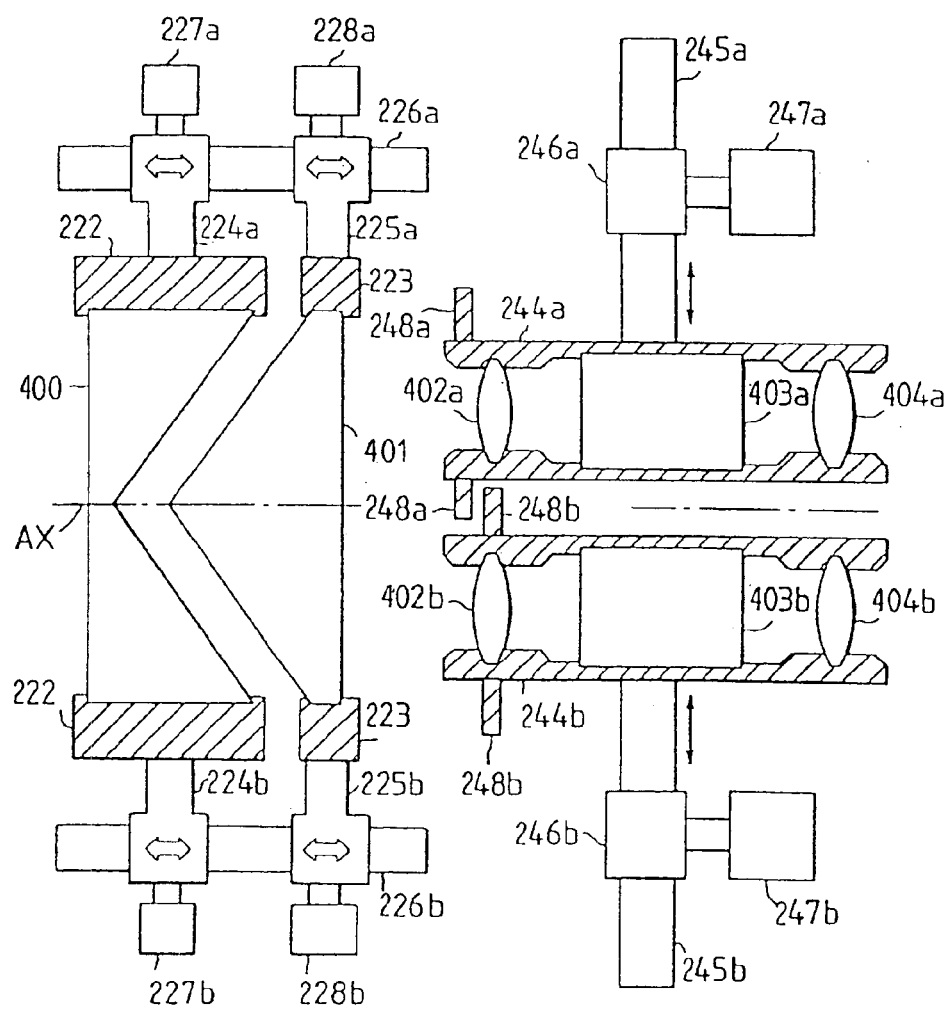
FIG. 71 is a view which illustrates a portion of the irradiation optical system shown in FIG. 69.

FIG. 71 is an enlarged view which illustrates a portion from the light dividing optical systems 400 and 401 to the second converging lenses 404a and 404b shown in FIG. 69. Assumptions are made here that the facing surface of the first polyhedron prism 400 and the second polyhedron prism 401 are parallel to each other and the incidental surface of the prism 400 and the emission surface of the prism 401 are perpendicular to optical axis AX. Referring to FIG. 71, the same elements as those shown in FIG. 42 are given the same reference numerals and their descriptions are omitted here. The first polyhedron prism 400 is held by the holding member 223.

A plurality of light beams emitted from the polyhedron prism 401 are incident on the first converging lenses 402a and 402b. Referring to FIG. 71, the first plane light source forming optical system composed of the elements 402a, 403a and 404a is held by the holding member 244a, while the second plane light source forming optical system composed of the elements 402b, 403b and 404b is held by the holding member 244b.

By integrally holding and moving the first plane light source forming optical system composed of the elements 402a, 403a and 404a and the second plane light source forming optical system composed of the elements 402b, 403b and 404b, the position of the light beams emitted from the second converging lenses 404a and 404b can be arbitrarily shifted on a plane perpendicular to optical axis AX.

Although the structure shown in FIG. 71 is arranged in such a manner that the position of each divided light beam can be radially shifted with respect to optical axis AX by changing the interval between the light dividing optical systems (the polyhedron prisms) 400 and 401 in the optical axial direction, each light beam may be shifted in the concentrical direction relative to optical axis AX.

Also in this embodiment similarly to the aforesaid embodiments, it is preferable that the positions (the positions on the plane perpendicular to the optical axis) of the first plane light source forming optical system composed of the elements 402a, 403a and 404a and the second plane light source forming optical system composed of the elements 402b, 403b and 404b be determined (changed) in accordance with the reticle pattern to be transferred. It is preferable in this case that the method of determining the positions be arranged as described above in such a manner that the positions (incidental angle Φ) on which the irradiation light beams form each plane light source forming optical system are incident on the reticle pattern are determined so as to realize the optimum resolution and obtain the effect of improving the focal depth with respect to the precision of the pattern to be transferred. The description about the optimum configuration of the plane light source forming optical systems is omitted here. As a result of the aforesaid structure, also this embodiment enables the focal depth to be made largest with respect to the reticle pattern while realizing high resolution.

Figure 72:
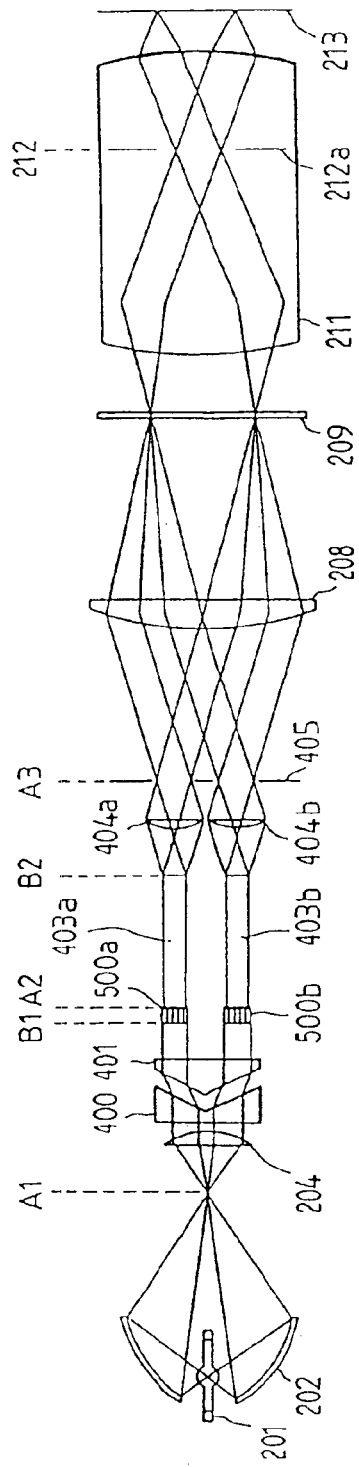
FIG. 72 is a view which illustrates the structure of an eleventh embodiment of the projection exposure apparatus according to the present invention.

An eleventh embodiment of the present invention will now be described with reference to FIG. 72. FIG. 72 is a view which illustrates the schematic structure of the projection exposure apparatus according to this embodiment. Referring to FIG. 72, the same elements as those of the tenth embodiment (see FIG. 69) are given the same reference numerals. The difference from the tenth embodiment lies in that fly-eye lenses 500a and 500b are disposed in plane of the first converging lenses 402a and 402b.

Referring to FIG. 72, the irradiation light beams radiated from the light source 201 such as a mercury lamp are converged by the elliptic mirror 202 and then they are made to be substantially parallel beams by the input lens (the collimator lens) 204 before they are divided by the light dividing optical systems 400 and 401. The two divided parallel beams are incident on the fly-eye lenses 500*a* and 500*b* made of aggregates of rod lens elements having a rectangular cross section (for example, a square cross section) so as to be converged on their emission surfaces A2 or portions adjacent to the emission surfaces A2. As a result, a plurality of spot light sources are formed. The plane light source substantially serving as the secondary light source is formed in the aforesaid position. The incidental surfaces of the rod type optical integrators 403*a* and 403*b* are located adjacent to the emission surfaces of the fly-eye lenses 500*a* and 500*b*. Therefore, the incidental surfaces of the rod type optical integrators 403*a* and 403*b* are disposed substantially conjugate with the light source image position A1 of the image formed by the elliptic mirror 202. The rod type optical integrators 403*a* and 403*b* are made of rectangular rod shape optical members so that the incidental light beams are reflected by their inner surfaces and emitted from the emission surface B1 as described above. Hence, the light beams are emitted from the emission surface B1 as if there are a plurality of the light source images (the plane light source) on the aforesaid incidental surface A2.

The irradiation light beams emitted from the rod type optical integrators 403*a* and 403*b* are converged by the converging lenses 404*a* and 404*b* so that two plane light source images serving as the third light sources are formed at eccentric positions from optical axis AX at the emission side focal point position of the lens. Therefore, the illuminance distribution of the light beams on the emission surfaces of the fly-eye lenses 500*a* and 500*b* are made uniform by the integration effect. Furthermore, the light beam illumination distribution at the emission side focal point position A3 of the converging lenses 404*a* and 404*b* can be further satisfactorily made uniform by the rod type optical integrators 403*a* and 403*b*.

The aperture diaphragm 405 having two apertures is disposed at the position A3 at which the two plane light sources serving as the third light sources are formed. Each light beam which has passed through the aperture diaphragm 405 is converged by the condenser lens 208 so that it is used to uniformly irradiate the reticle 209 at a predetermined angle. The light beams which have passed through and been diffracted by the reticle pattern in the inclined irradiation manner are converged and imaged by the projection optical system 211, so that the image of the pattern of the reticle 209 is formed on the wafer 213.

As described above, the first plane light source forming optical system composed of elements 500*a*, 403*a* and 404*a* and the second plane light source forming optical system composed of elements 500*b*, 403*b* and 404*b* are disposed away from optical axis AX. Therefore, the focal depth of the projected image of the pattern of the patterns of the reticle having a specific direction and pitch can be considerably enlarged.

In the irradiation optical system shown in FIG. 72, the light source image A1 formed by the elliptic mirror 202, the emission surfaces (the incidental surfaces of the rod type optical integrators 403*a* and 403*b*) A2 of the fly-eye lenses 500*a* and 500*b* and the emission side focal point positions A3 of the second converging lenses 404*a* and 404*b* are conjugate with the incidental pupil 212 (the aperture diaphragm 212*a*) of the projection optical system 211. In other words, A1, A2 and A3 are Fourier transform surfaces of the object surfaces (the reticle 209 and the wafer 213). Furthermore, the incidental surfaces B11 of the fly-eye lenses 500*a* and 500*b* and the emission surfaces B1 of the rod type optical integrators 403*a* and 403*b* are conjugate with the object surfaces (the reticle 209 and the wafer 213).

Although the eleventh embodiment shown in FIG. 72 is arranged in such a manner that the light beams are divided into two portions by the light dividing optical systems 400 and 401, another structure may be employed in which the prism shown in FIG. 70 is used and four plane light source forming optical systems are disposed in parallel to correspond to the prism facing the reticle so as to form four plane light sources on the Fourier transform surface.

Figure 73:
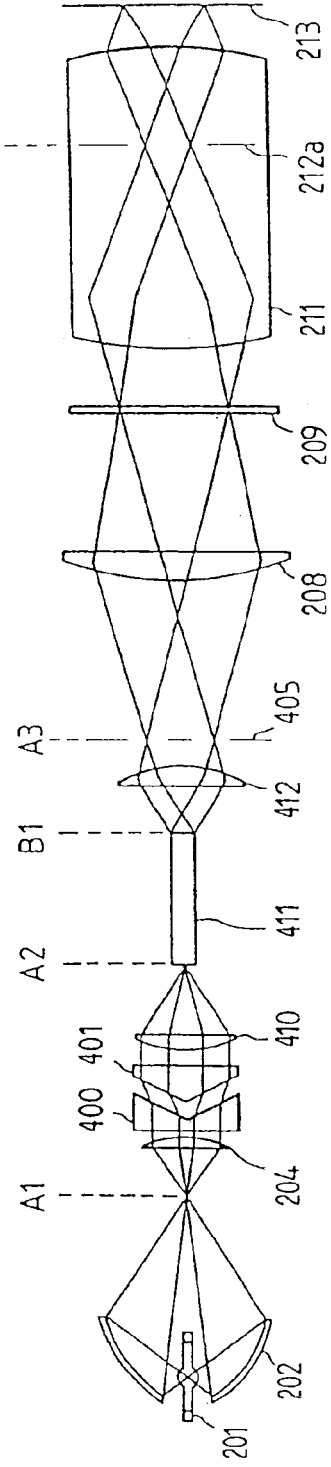
FIG. 73 is a view which illustrates the structure of a twelfth embodiment of the projection exposure apparatus according to the present invention.

A twelfth embodiment of the present invention will now be described with reference to FIG. 73. Referring to FIG. 73, the same elements as those of the eleventh embodiment shown in FIG. 72 are given the same reference numerals. The difference from the eleventh embodiment lies in that the function equivalent to that realized by the first plane light source forming optical systems composed of the elements 500*a*, 403*a* and 404*a* and the second plane light source forming optical system composed of the elements 500*b*, 403*b* and 404*b* is realized by one optical system composed of the first converging lens 410, the rod type optical integrator 411 and the second converging lens 412.

Referring to FIG. 73, the irradiation light beams radiated from the light source 201 such as a mercury lamp are converged by the elliptic mirror 202 and then they are made to be substantially parallel beams by the input lens (the collimator lens) 204 before they are divided into two portions by the light dividing optical systems 400 and 401. The two divided parallel beams are converged to the emission side (rear) focal point position by the first converging lens 410. The incidental surfaces of the rod type optical integrator 411 is located at the focal point position A2, the incidental surfaces being substantially conjugate with the light source image position A1 of the image formed by the elliptic mirror 202.

As described above, the light beams which have been incident on the rod type optical integrator 411 are reflected by the inner surface of it before they are emitted from the emission surface B1. Therefore, the light beams are emitted from the emission surface B1 as if there are a plurality of the light source images (the plane light sources) on the incidental surface A2. Then, the light beams are converged by the second converging lens 412 so that two plane light source images separated from each other and serving as the secondary light sources are formed at the emission side (rear) focal point position A3 of the lens 412. The reason for this lies in a fact that the light beams are incident on the rod type optical integrator in a state where they are separated from each other while making the same angle.

The aperture diaphragm 405 having two apertures is disposed at the position A3 at which the two plane light source images serving as the second light source are formed. The light beams which have passed through the aperture diaphragm 405 are converged by the condenser lens 208 so that the reticle 209 is uniformly irradiated with them while being inclined at a predetermined angle. A predetermined circuit pattern is formed on the lower surface of the reticle 209 so that the light beams which have passed through and been diffracted by the reticle pattern by the inclined irradiation method are converged and imaged by the projection optical system 211. Hence, the image of the pattern of the reticle 209 is formed on the wafer 213.

As described above, the positions of the centers of gravity of the two plane light sources (the secondary light sources) formed by the polyhedron light source forming optical systems 410, 411 and 412 are located distant from optical axis AX. Therefore, the focal depth of the projected image of the pattern of the patterns of the reticle 209 having a specific direction and pitch can be considerably enlarged.

According to this embodiment, by only changing the air interval between the two polyhedron prisms which constitute the light dividing optical systems 400 and 401, the incidental angle of the divided light beams to be incident on the incidental surface A2 of the rod type optical integrator can be varied. Hence, the position of the secondary light source image to be formed on the emission side (rear) focal point position A3 of the second converging lens 412 with respect to optical axis AX of the secondary light source image can be controlled.

In the irradiation optical system shown in FIG. 73, the light source image A1 formed by the elliptic mirror 202, the incidental surface A2 of the rod type optical integrator 411 and the emission side focal point position A3 of the second converging lens 412 are conjugate with the incidental pupil 212 (the aperture diaphragm 212a) of the optical projection system 211. In other words, A1, A2 and A3 are Fourier transform plane of the object surface (the reticle 209 and the wafer 213). Furthermore, the emission surface B1 of the rod type optical integrator 411 is conjugate with the object surface (the reticle 209 and the wafer 213).

Although the twelfth embodiment shown in FIG. 73 is arranged in such a manner that the light beams are divided into two portions by the light dividing optical systems 400 and 401, another structure may be employed in which the prism shown in FIG. 70 is used to form four plane light sources on the Fourier transform surface.

In the embodiments shown in FIGS. 69, 72 and 73, the variable aperture diaphragms 405 disposed at the two or three dimensional plane light source position formed by each polyhedron light source forming optical system are able to vary the size of the light source image by varying the caliper of the variable aperture diaphragm 405. Therefore, by controlling the size of the light source image to be formed on the pupil surface of the projection optical system 411, the optimum inclined irradiation with a proper value a can be performed.

As for the size of the plane light source image to be formed by each polyhedron light source forming optical system, it is preferable that the numerical aperture (a single width of the angle distribution on the reticle) per one emitted light beam be about 0.1 to about 0.3 with respect to the reticle side numerical aperture of the, projection optical system. If it is smaller than 0.1 times, the correctivity of the pattern transference deteriorates. If it is larger than 0.3 times, an effect of improving the resolution and that of realizing a large focal depth cannot be obtained.

As an alternative to the variable aperture diaphragm, a so-called turret system may be employed in which a disc having a plurality of apertures having different calipers is used so as to be rotated as desired for the purpose of obtaining the optimum value σ by changing the size of the light source image.

In the embodiments shown in FIGS. 69, 72 and 73, the structure is arranged in such a manner that the light beams form the light source 201 such as a mercury lamp are converged by the elliptic mirror 202 so as to make them the parallel beams by the input lens 204. As an alternative to this, an epoxy laser or the like for supplying parallel beams may be employed as the light source to cause the parallel light beams from the laser beam source to be incident on the light dividing optical systems 400 and 401.

In particular, in the eleventh embodiment shown in FIG. 72, spot light sources having substantially no size are formed as the light source image to be formed on the emission surfaces A2 of the fly-eye lenses 500a and 500b and therefore the shape of the emission surfaces A2 of the fly-eye lenses 500a and 500b may be formed into a flat shape. In a case where a large output light source such as the excimer laser is used, optical energy is concentrated on the emission surfaces A2 of the fly-eye lenses 500a and 500b. Hence, it is preferable that the focal points of the incidental surfaces B1 of the fly-eye lenses 500a and 500b are located in a space outside the emission surface A1 in order to maintain the durability of the fly-eye lenses 500a and 500b.

Figure 53:
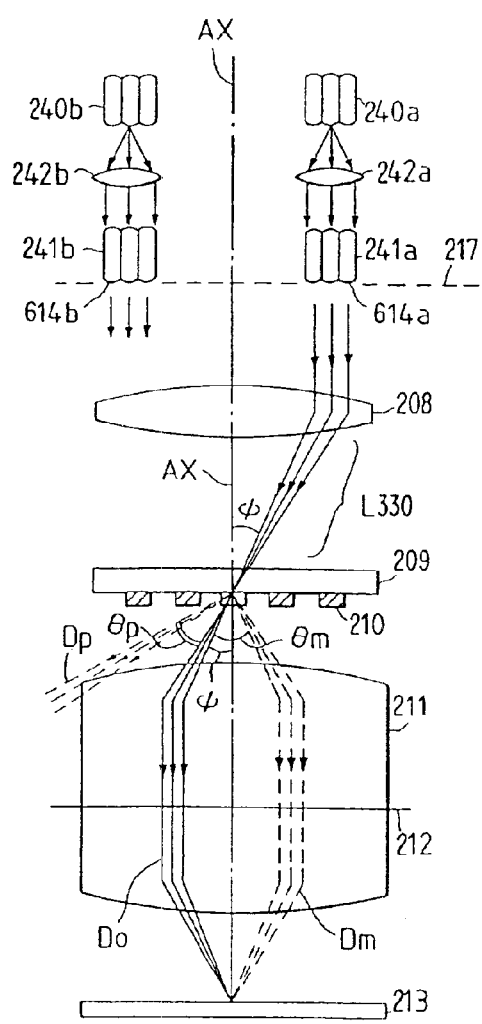
FIG. 53 is a view which illustrates the structure of the apparatus for describing the principle of the present invention.

The operation of an example of a projection exposure apparatus of the present invention in which a fly-eye type optical integrator (fly-eye lens) is disposed in the irradiation optical system will now be described with reference to FIG. 53, which illustrates the invention somewhat diagrammatically. Referring to FIG. 53, second fly-eye lens groups 240a and 240b corresponding to the second fly-eye lens according to the present invention are disposed on a plane perpendicular to optical axis AX. Light beams emitted from them are incident on first fly-eye lens groups 241a and 241b, which correspond to the first fly-eye lens according to the present invention, by guide optical systems 242a and 242b. The illuminance distribution on the incidental surface of the first fly-eye lens is made uniform by the second fly-eye lens group.

Light beams emitted from the first fly-eye lens group are applied to a reticle 209 by a condenser lens 208. The illuminance distribution on the reticle 209 is made to be uniform by the first and the second fly-eye lens groups to a satisfactory degree. Reticle side focal surfaces 614a and 614b of the first fly-eye lens groups 241a and 241b substantially coincide with a Fourier transform surface 217 of the reticle pattern 210. Therefore, the distance from optical axis AX to the center of the first fly-eye lens corresponds to the incidental angle of the light beams emitted from the first fly-eye lens on the reticle 209.

A circuit pattern 210 drawn on the reticle (the mask) includes a multiplicity of cyclic patterns. Therefore, the reticle pattern 210 irradiated with the irradiation light beams emitted from one fly-eye lens group 241a generates a 0-order diffracted light beam component Do, ±1-order diffracted light beam components Dp and Dm and higher diffracted light beam components in a direction corresponding to the precision of the pattern.

At this time, since the irradiation light beams (the main beams) are incident on the reticle while being inclined, also the diffracted light beam components are generated from the reticle pattern 210 while being inclined (having an angular deviation) in comparison to a case where the reticle 209 is irradiated perpendicularly. Irradiation light beam L330 shown in FIG. 53 is incident on the reticle 209 while being inclined by $\Phi$ from the optical axis.

Irradiation light beam L330 is diffracted by the reticle pattern 210 and the 0-order diffracted light beam Do travelling in a direction inclined by $\Phi$ from optical axis AX, +1-order diffracted light beam Dp inclined from the 0-order diffracted light beam by $\theta p$ and the −1-order diffracted light beam Dm travelling while being inclined from the 0-order diffracted light beam Do by $\theta m$ are gen rated. However, since irradiation light beam L330 is incident on the reticle pattern while being inclined from optical axis AX of the double telecentric projection optical system 211 by an angle $\Phi$, also the 0-order diffracted light beam Do also travels in a direction inclined by an angle $\Phi$ from optical axis of the projection optical system.

Therefore, the +1-order diffracted light beam Dp travels in a direction $\theta p + \Phi$ with respect to optical axis AX, while the −1-order diffracted light beam Dm travels in a direction $\theta m - \Phi$ with respect to optical axis AX.

At this time, the diffracted angles θp and θm respectively are expressed by:

$$\sin(\theta p+\Phi)-\sin \Phi=\lambda/P \quad (1)$$

$$\sin(\theta m-\Phi)+\sin \Phi=\lambda/P \quad (2)$$

Assumption is made here that both of the +1-order diffracted light beam Dp and the −1-order diffracted light beam Dm pass through a pupil surface 212 of the projection optical system 211.

When the diffraction angle is enlarged with the precision of the reticle pattern 210, the +1-order diffracted light beam Dp travelling in the direction θp+Φ cannot pass through the pupil 212 of the projection optical system 211. That is, a relationship expressed by sin (θp+Φ)>$NA_R$ is realized. However, since irradiation light beam L330 is incident while being inclined from optical axis AX, the −1-order diffracted light beam Dm is able to pass through the projection optical system 211 at the aforesaid diffraction angle. That is, a relationship expressed by sin (θm−Φ)<$NA_R$ is realized.

Therefore, interference fringes are generated on the wafer due to the 0-order diffracted light beam Do and the −1-order diffracted light beam Dm. The aforesaid interference fringes are the image of the reticle pattern 210. When the reticle pattern is formed into a line-and-space pattern having a ratio of 1:1, the image of the reticle pattern 210 can be patterned on the resist applied on the wafer 213 while having a contrast of about 90%.

At this time, the resolution limit is present when the following relationship is realized:

$$\sin(\theta m-\Phi)=NA_R \quad (3)$$

Therefore, the pitch on the reticle side of the minimum pattern which can be allowed to be transferred can be expressed by:

$$NA_R+\sin \Phi=\lambda/P \quad (4)$$

$$P\cong\lambda/(NA_R+\sin \Phi) \quad (5)$$

In a case where sin Φ is made to be about 0.5.times.$NA_R$, the minimum pitch of the pattern on the reticle which can be transferred becomes as follows:

$$P=\lambda/(NA_R+0.5\ NA_R)=2\lambda/3\ NA_R \quad (6)$$

Figure 54:
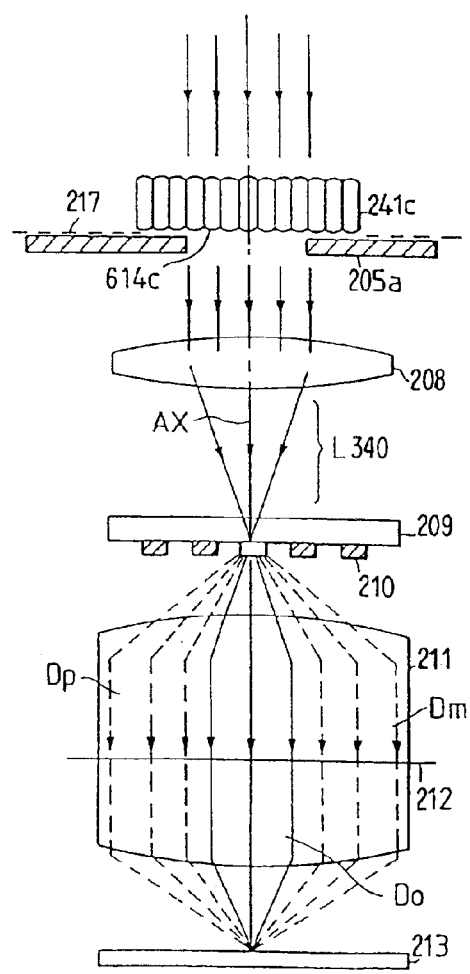
FIG. 54 is a view which illustrates the principle of projection performed by a conventional projection exposure apparatus.

In a case of a conventional exposure apparatus shown in FIG. 54 in which the irradiation light beam distribution on the pupil 217 is in a circular region relative to optical axis AX of the projection optical system 211, the resolution light is P=λ/$NA_R$. Therefore, the present invention enables a higher resolution in comparison to the conventional exposure apparatus.

Now, a description will be given about the reason why the focal depth can be enlarged by irradiating the reticle pattern with exposure light beams from a specific incidental direction and at a specific angle by a method in which the image pattern is formed on the wafer by using the 0-order diffracted light beam component and the 1-order diffracted light beam component.

In a case where the wafer 213 coincides with the focal point position (the best imaging surface) of the projection optical system 211, the diffracted light beams emitted from a point of the reticle pattern 210 and reaching a point on the wafer have the same optical path length regardless of the portion of the projection optical system 211 through which they pass. Therefore, even in the conventional case where the 0-order diffracted light beam component passes through substantially the center (adjacent to the optical axis) of the pupil surface 212 of the projection optical system 211, optical length for the 0-order diffracted light beam component and that for the other diffracted light beam component are substantially the same and the mutual wavelength aberration is zero. However, in a defocus state in which the wafer 213 does not coincide with the focal point position of the projection optical system 211, the optical path length for a higher diffracted light beam made incident diagonally becomes short in front of the focal point in comparison to the 0-order diffracted light beam which passes through a portion adjacent to the optical axis and as well as lengthened in the rear of the focal point (toward the projection optical system 211) by a degree corresponding to the difference in the incidental angle. Therefore, the diffracted light beams such as 0-order, 1-order and higher order diffracted light beams form mutual wave aberration, causing an out of focus image to be generated in front or in the rear of the focal point position.

The wave aberration generated due to the defocus is a quantity given by $\Delta Fr^2/2$ assuming that the quantity of deviation from the focal point position of the wafer 213 is ΔF and the sine of incidental angle θw made when each diffracted light b am is incident on one point of the wafer is r (r=sin θw), where r is the distance between each diffracted light beam and optical axis AX on the pupil surface 212. In the conventional projection exposure apparatus shown in FIG. 54, the 0-order diffracted light beam Do passes through a position adjacent to the optical axis. Therefore, r (0-order) becomes 0, while ±1-order diffracted light beams Dp and Dm hold a relationship expressed by r (1-order)=M·λ/P (where M is the magnification of the projection optical system). Therefore, the wave aberration between the 0-order diffracted light beam Do and ±1-order diffracted light beams Dp and Dm becomes: $\Delta F\cdot M^2(\lambda/P)^2/2$ In the projection exposure apparatus according to the present invention, the 0-order diffracted light component Do is generated in a direction inclined from optical axis AX by an angle Φ as shown in FIG. 53. Therefore, the distance between the 0-order diffracted light beam component and the optical axis AX on the pupil surface 212 holds a relationship expressed by r (0-order)=M·sin Φ.

The distance between the −1-order diffracted light beam component and the optical axis on the pupil surface becomes a value obtainable from r (−1-order)=M·sin (θm−Φ). If sin Φ=sin (θm−Φ) at this time, the relative wave aberration between the 0-order diffracted light beam component Do and the −1-order diffracted light beam component Dm due to defocus becomes zero. Hence, even if the wafer 213 is slightly deviated in the direction of the optical axis from the focal point position, the out of focus of the image of the pattern 210 can be prevented. That is, the focal depth can be enlarged. Furthermore, since sin (θm−Φ)+sin Φ=λ/P as expressed by the equation (2), the focal depth can be significantly enlarged by causing the incident angle Φ for the irradiation light beam L330 on the reticle 209 to hold a relationship expressed by sin Φ=λ/2P with the pattern having pitch P.

Although illustrative embodiments of present invention have been described in detail with reference to the accompanying drawings, it is to be understood that the present invention is not limited to those embodiments. Various changes or modifications may be effected therein by one skilled in the art without departing from the scope or spirit of the invention.

What is claimed is:

1. An illumination apparatus provided in an exposure apparatus which exposes an object with an illumination beam via a mask to illuminate with the illumination beam an area on a predetermined plane on which a pattern surface of the mask is placed, comprising:

an illumination optical system provided on an optical path through which the illumination beam passes, that includes a plurality of optical members arranged along an optical axis substantially perpendicular to the predetermined plane of which the area is illuminated via the plurality of optical members with the illumination beam having any one of plural intensity distributions different from each other on a pupil plane of the illumination optical system; and a shaping optical system provided on the optical path in the illumination optical system to shape the plural intensity distributions of which one has an increased intensity portion apart from the optical axis relative to a portion of the one intensity distribution on the optical axis, that includes prisms provided on the optical axis, of which at least one is movable in a direction along the optical axis and between which an interval in the direction is variable by the at least one prism to change the one intensity distribution.

2. An apparatus according to claim 1, wherein at least one of a position, relative to said optical axis, and a size of the increased intensity portion of said one intensity distribution is variable.

3. An apparatus according to claim 1, wherein said shaping optical system includes zoom lenses on said optical axis relatively movable in said direction along the optical axis to change at least a size of the increased intensity portion of said one intensity distribution.

4. An apparatus according to claim 3, wherein said shaping optical system changes at least one of a position and a size of said increased intensity portion by at least one of said prisms and said zoom lenses.

5. An apparatus according to claim 1, wherein said one intensity distribution has increased intensity portions, apart from said optical axis relative to said portion on said optical axis, of which distances from said optical axis are substantially equal.

6. An apparatus according to claim 5, wherein each of said increased intensity portions is variable in orthogonal first and second directions on said pupil plane by said prisms.

7. An apparatus according to claim 5, wherein said shaping optical system includes zoom lenses on said optical axis relatively movable in said direction along the optical axis, and changes at least one of positions and sizes of said increased intensity portions by at least one of said prisms and the zoom lenses.

8. An apparatus according to claim 1, wherein said illumination optical system includes a shielding member provided on said optical path to prevent from reaching said mask unwanted light generated in said shaping optical system.

9. An apparatus according to claim 1, wherein said one intensity distribution is shaped in an off-axis illumination mode that includes a multipole mode in which said one intensity distribution has increased intensity portions, apart from said optical axis relative to said portion on said optical axis, of which distances from said optical axis are substantially equal.

10. An apparatus according to claim 9, wherein each of said increased intensity portions is variable in orthogonal first and second directions on said pupil plane by said prisms.

11. An apparatus according to claim 9, wherein said multipole mode includes at least one of a dipole mode in which said increased intensity portions are two to illuminate a mask of which a pattern includes features periodically arranged in one direction with said illumination beam of which said one intensity distribution has two increased intensity portions and a quadrupole mode in which said increased intensity portions are four to illuminate a mask of which a pattern includes features periodically arranged in two different directions with said illumination beam of which said one intensity distribution has four increased intensity portions.

12. An apparatus according to claim 11, wherein said two increased intensity portions in said dipole mode are respectively arranged at positions, on said pupil plane, of which distances from said optical axis with respect to said one direction are substantially equal.

13. An apparatus according to claim 11, wherein said four increased intensity portions in said quadrupole mode are respectively arranged at positions, on said pupil plane, of which first distances from said optical axis with respect to one of said two different directions are substantially equal and of which second distances from said optical axis with respect to another of said two different directions are substantially equal.

14. An apparatus according to claim 9, wherein said increased intensity portions are defined so that an optical gravity center of said one intensity distribution is substantially coincident with said optical axis.

15. An apparatus according to claim 9, wherein said increased intensity portions are defined so that an incident angle of the illumination beam from each one of said increased intensity portions satisfies the following relation:

$$\sin \phi = \lambda/2P$$

where $\phi$ is the incident angle, $\lambda$ is a wavelength of the illumination beam, and P is a pitch of a pattern on said mask.

16. An apparatus according to claim 9, wherein said increased intensity portions are disposed on a pair of first line segments substantially parallel to a first direction perpendicular to a second direction in which features of a pattern on said mask are periodically arranged, the pair of first line segments being defined apart from said optical axis by a first distance in the second direction.

17. An apparatus according to claim 16, wherein said increased intensity portions are disposed on said pair of first line segments and a pair of second line segments substantially parallel to said second direction, the pair of second line segments being defined apart from said optical axis by a second distance in said first direction.

18. An apparatus according to claim 17, wherein said increased intensity portions are disposed on crossing points of said pair of first line segments and said pair of second line segments.

* * * * *